(12) United States Patent
Chen

(10) Patent No.: US 8,720,611 B2
(45) Date of Patent: May 13, 2014

(54) PDC BITS WITH CUTTERS LAID OUT IN BOTH SPIRAL DIRECTIONS OF BIT ROTATION

(75) Inventor: Shilin Chen, The Woodlands, TX (US)

(73) Assignee: Halliburton Energy Services, Inc., Houston, TX (US)

(*) Notice: Subject to any disclaimer, the term of this patent is extended or adjusted under 35 U.S.C. 154(b) by 673 days.

(21) Appl. No.: 12/969,054

(22) Filed: Dec. 15, 2010

(65) Prior Publication Data

US 2012/0152623 A1 Jun. 21, 2012

(51) Int. Cl.
*E21B 10/43* (2006.01)

(52) U.S. Cl.
USPC ............ 175/398; 175/327; 175/394; 175/412

(58) Field of Classification Search
USPC ......... 166/377, 428, 327, 394, 398, 400, 412; 175/377, 428, 327, 394, 398, 400, 412
See application file for complete search history.

(56) References Cited

U.S. PATENT DOCUMENTS

| | | | | |
|---|---|---|---|---|
| 4,889,017 | A | 12/1989 | Fuller et al. | 76/108 |
| 5,595,252 | A | 1/1997 | O'Hanlon | 175/57 |
| 5,787,022 | A | 7/1998 | Tibbitts et al. | 364/578 |
| 6,003,623 | A | 12/1999 | Miess | 175/430 |
| 6,302,224 | B1 | 10/2001 | Sherwood, Jr. | 175/397 |
| 6,435,058 | B1 | 8/2002 | Matthias et al. | 76/108.2 |
| 6,481,511 | B2 | 11/2002 | Matthias et al. | 175/431 |
| 6,834,733 | B1 * | 12/2004 | Maouche et al. | 175/378 |
| 6,845,828 | B2 | 1/2005 | Boyce | 175/420.2 |
| 7,083,010 | B2 | 8/2006 | Eppink et al. | 175/325.2 |
| 7,455,125 | B2 | 11/2008 | Sinor et al. | 175/40 |
| 7,729,895 | B2 | 6/2010 | Chen | 703/6 |
| 7,778,777 | B2 | 8/2010 | Chen | 702/2 |
| 2005/0273302 | A1 | 12/2005 | Huang et al. | 703/10 |
| 2006/0162968 | A1 | 7/2006 | Durairajan et al. | 175/431 |
| 2009/0090556 | A1* | 4/2009 | Chen | 175/45 |

FOREIGN PATENT DOCUMENTS

| | | | |
|---|---|---|---|
| WO | 2009/067263 | 6/2010 | G06G 7/48 |
| WO | WO 2010/068646 | 6/2010 | G06G 7/48 |
| WO | WO 2011/000618 | 7/2011 | E21B 10/56 |

OTHER PUBLICATIONS

Brett J.F, Warren T.M. and Behr S.M., "Bit Whirl: A new Theory of PDC bit Failure", SPE 19571, Oct. 1989.
Clayton et al., "Development of a Whirl—Resistant PDC Bit", *SPE 26594*, (1994) 625-637.

(Continued)

*Primary Examiner* — Brad Harcourt
(74) *Attorney, Agent, or Firm* — Baker Botts L.L.P.

(57) ABSTRACT

Downhole drilling tools designed and manufactured to reduce bit axial force and torque and to enhance drilling efficiency comprising laying out some cutters in one spiral direction of rotation about a bit rotational axis and other cutters in an opposite spiral direction of rotation; evaluating forces acting on cutters during simulated engagement with a downhole formation (straight and transitional drilling); and modifying cutter layout with respect to a spiral direction of rotation. Some embodiments further comprise, prior to simulation, placing cutters in cutter groups/sets at respective locations to obtain a level of force balance. Multilevel force balanced downhole drilling tools may be designed using five respective simulations: cutter group level, neighbor cutter group level, cutter set level, group of N (N=3 or N=4) consecutive cutters level and all cutters level. Cutter layout procedures and algorithms to minimize respective bit forces and in some embodiments to obtain force balance are described.

30 Claims, 69 Drawing Sheets

(56) References Cited

OTHER PUBLICATIONS

Weaver G.E., Clayton R., "A New PDC Cutting Structure Improves Bit Stabilization and Extends Application into Harder Rock Types", SPE/IADC 25734, 1993.

Besson A., et al., "On the Cutting Edge", Oilfield Review, Autumn, 2000, p. 36-57.

TransFormation Bits, ReedHycalog, 2004.

Glowka D.A., "Use of Single-Cutter Data in the Analysis of PDC Bit Designs: Part 1—Development of a PDC Cutting Force Model," *SPE Journal of Petroleum Technology*, 41 (1989) pp. 797-849.

Behr S.M., Warren T.M., Sinor L.A., Brett, J.F, "3D PDC Bit Model Predicts Higher Cutter Loads", SPE Drilling & Completion, No. 4, vol. 8, Mar. 1993.

Clayton R., Chen S. and Lefort G., "New Bit Design, Cutter Technology Extend PDC Applications to Hard Rock Drilling", SPE / IADC 91840, Feb. 2005.

Chen S., Arfele R., Glass K., "Modeling of the Effects of Cutting Structure, Impact Arrestor, and Gage Geometry on PDC Bit Steerability", paper AADE-07-NTCE-10 presented at 2007 AADE Technical Conference held in Houston, TX, Apr. 10-12, 2007.

Chen S., Collins G.J., Thomas M.B., "Reexamination of PDC Bit Walk in Directional and Horizontal Wells", IADC/SPE 112641, Mar. 2008.

International Search Report and Written Opinion; PCT/US2011/064611; pp. 12, Jul. 25, 2012.

International Preliminary Report on Patentability and Written Opinion; PCT/US2011/064611; pp. 8, Jun. 27, 2013.

\* cited by examiner

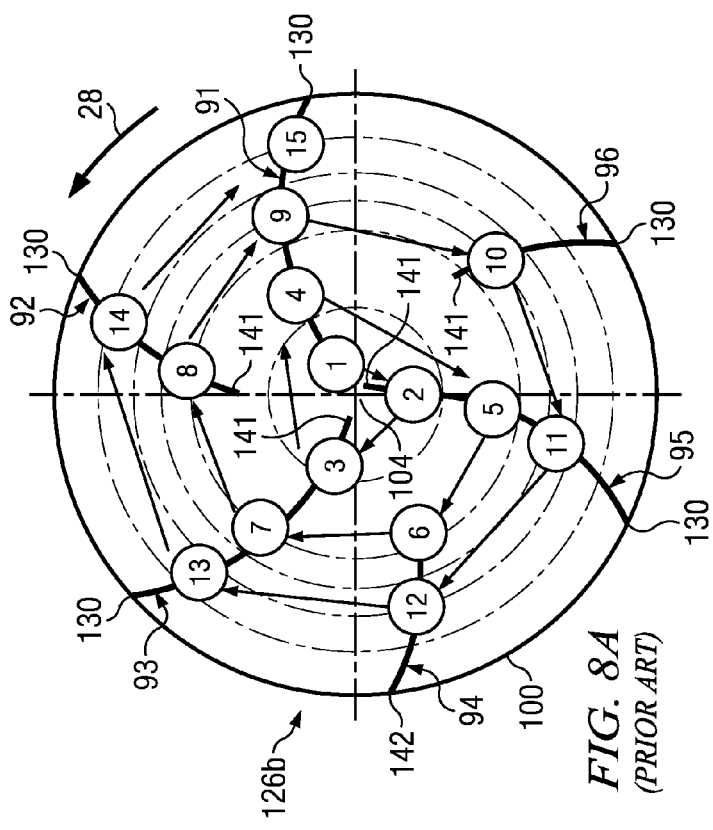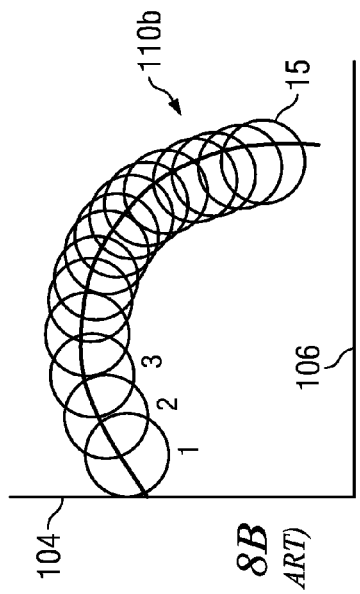
*FIG. 8A (PRIOR ART)*
*FIG. 8B (PRIOR ART)*
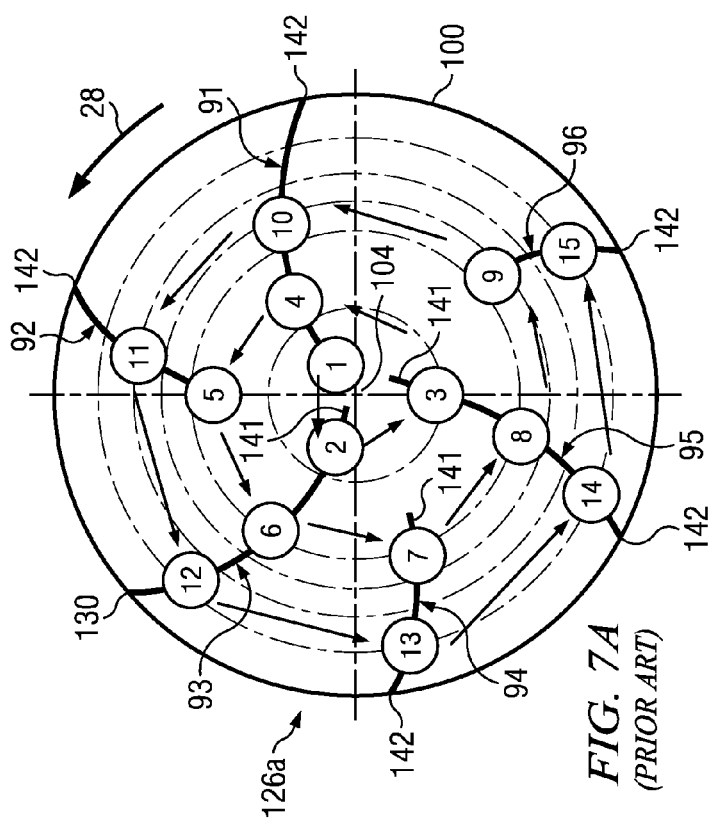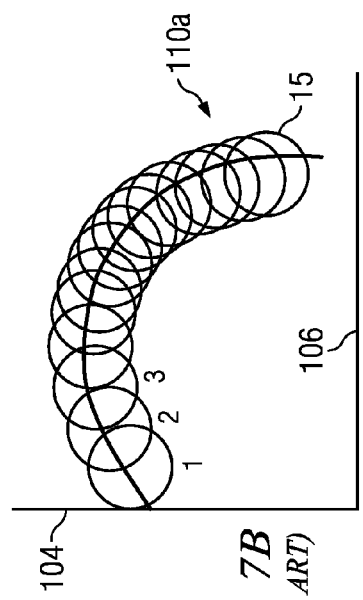
*FIG. 7A (PRIOR ART)*
*FIG. 7B (PRIOR ART)*

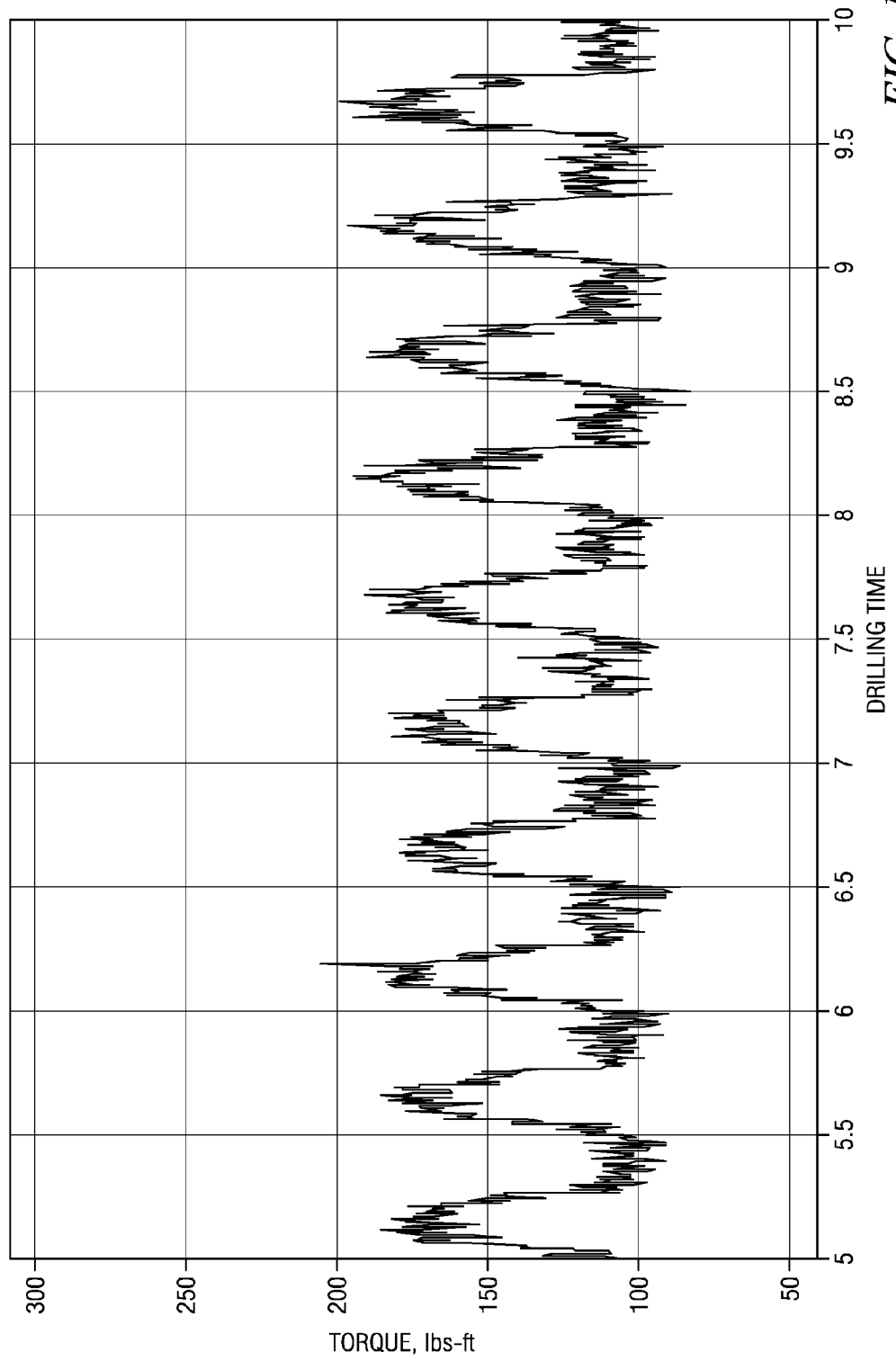

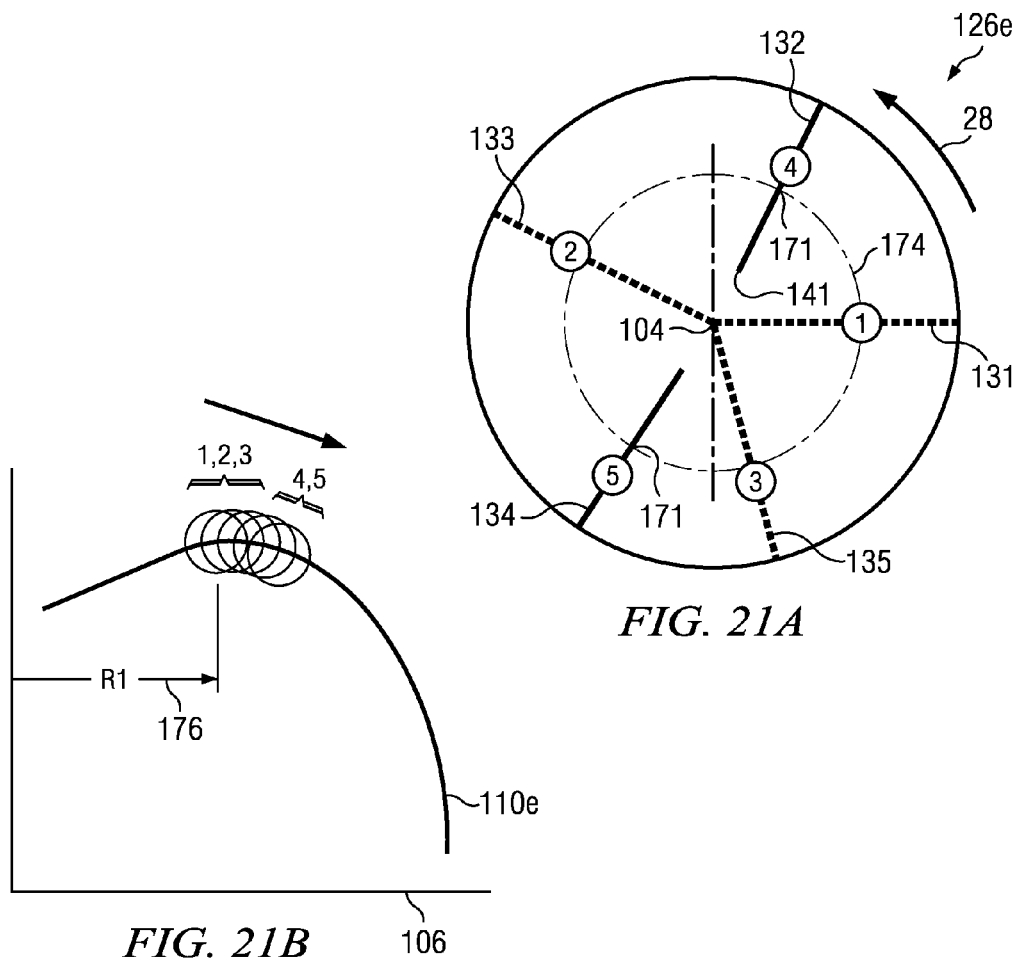
FIG. 21A
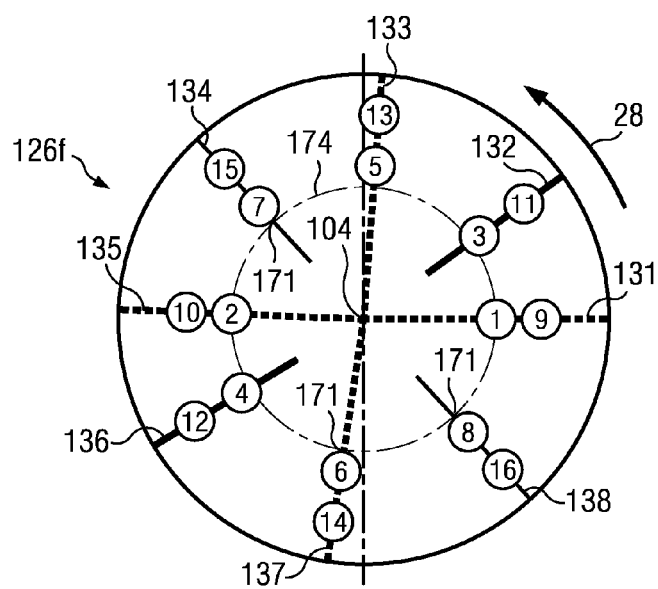
FIG. 21B
FIG. 22A

EXAMPLE MATCH OF MAJOR BLADES, ALGORITHMS AND CUTTER SETS

| N. BLD | MAJOR BLADES | ALGORITHM | BLADE GROUPS | CUTTER SET | PREFERRED MATCH |
|---|---|---|---|---|---|
| 4 | 1,3 | TWO GROUP | (1,3), (2,4) | [(1,3), (2,4)] | YES |
| 5 | 1,3,5 | TWO GROUP | (1,3,5), (2,4) | [(1,3,5), (2,4)] | YES |
|  | 1,3,4 | TWO GROUP | (1,3,4), (2,5) | [(1,3,4), (2,5)] |  |
| 6 | 1,3,5 | TWO GROUP | (1,3,5), (2,4,6) | [(1,3,5), (2,4,6)] | YES |
|  | 1,4 | PAIR GROUP | (1,4), (2,5), (3,6) | [(1,4), (3,6), (2,5)] | YES |
| 7 | 1,3,5,7 | TWO GROUP | (1,3,5,7), (2,4,6) | [(1,3,5,7), (2,4,6)] | YES |
|  | 1,3,5 | TWO GROUP | (1,3,5), (2,4,6,7) | [ (1,3,5), (2,4,6,7)] | YES |
|  | 1,4,6 | TWO GROUP | (1,4,6), (2,5,3,7) | [(1,4,6), (2,5,3,7)] |  |
|  | 1,4,6 | THREE GROUP | (1,4,6), (2,5), (3,7) | [(1,4,6), (2,5), (3,7)] |  |
| 8 | 1,3,5,7 | TWO GROUP | (1,3,5,7), (2,4,6,8) | [(1,3,5,7), (2,4,6,8)] |  |
|  | 1,3,5,7 | PAIR GROUP | (1,5), (2,6), (3,7), (4,8) | [(1,5), (3,7), (2,6), (4,8)] | YES |
|  | 1,4,7 | THREE GROUP | (1,4,7), (2,6), (3,5,8) | [(1,4,7), (3,5,8), (2,6)] |  |
| 9 | 1,4,7 | THREE GROUP | (1,4,7), (2,5,8), (3,6,9) | [(1,4,7), (2,5,8), (3,6,9)] | YES |
|  | 1,4,7 | FOUR GROUP | (1,4,7), (2,6), (3,8), (5,9) | [(1,4,7), (3,8), (5,9), (2,6)] |  |
| 10 | 1,4,6,9 | PAIR GROUP | (1,6), (2,7), (3, 8), (4,9), (5,10) | [(1, 6), (4,9), (2,7), (5,10), (3,8)] | YES |
|  | 1,4,6,9 | THREE GROUP | (1,4,6,9), (2, 5, 8), (3,7,10) | [(1,4,6,9), (3,7,10), (2, 5, 8)] |  |
|  | 1,4,7 | FOUR GROUP | (1,4,7),(2,6,9), (3, 8), (5,10) | [(1,4,7), (3, 8), (5,10), (2,6,9)] |  |
| 11 | 1,3,7,9 | THREE GROUP | (1,3,7,9), (2,5,8,11), (4,6,10) | [(1,3,7,9), (2,5,8,11), (4,6,10)] | YES |
|  | 1,5,9 | FOUR GROUP | (1,5,9), (2,8), (3,6,10), (4,7,11) | [(1,5,9), (3,6,10), (4,7,11), (2,8)] |  |
|  | 1,4,7,10 | FIVE GROUP | (1,7), (2,5,9), (3,8), (4,10), (6,11) | [(1,7), (4,10), (6,11), (3,8), (2,5,9)] |  |

EXAMPLE MATCH OF MAJOR BLADES, ALGORITHMS AND CUTTER SETS

| N. BLD | MAJOR BLADES | ALGORITHM | BLADE GROUPS | CUTTER SET | PREFERRED MATCH |
|---|---|---|---|---|---|
| 12 | 1,4,7,10 | PAIR GROUP | (1,7), (2,8), (3,9), (4,10), (5,11), (6,12) | [(1,7), (4,10), (2,8), 5,11), (3,9), (6,12 )] | YES |
| | 1,4,7,10 | THREE GROUP | (1,4,7,10), (2,5,8,11), (3,6,9,12) | [(1,4,7,10), (2,5,8,11), (3,6,9,12)] | |
| | 1,5,9 | FOUR GROUP | (1,5,9), (2, 6,10), (3,7,11), (4,8,12), | [(1,5,9), (2, 6,10), (3,7,11), (4,8,12)] | YES |
| | 1,4,7,10 | FIVE GROUP | (1,7), (4,10), (6,12), (2,5,9), (3,8,11) | [(1,7), (4,10), (6,12), (3,8,11), (2,5,9)] | |
| 13 | 1,5,8,11 | FOUR GROUP | (1, 5, 8,11), (2,6,10), (3,7,12), (4, 9,13 ) | [(1, 5, 8,11), (4, 9,13 ), (3,7,12), (2,6,10)] | |
| | 1,5,10 | FIVE GROUP | [(1,5,10), (3,9), (6,12), (4,8,13), (2,7,11)] | [(1,5,10), (3,9), (4,8,13), (6,12), (2,7,11)] | YES |
| | 1,5,9 | SIX GROUP | (1,5,9), (2,8), (3,10), (4,11), (6,12) , (7,13) | [ (1,5,9), (3,10), (4,11), (6,12) , (7,13), (2,8) ] | |
| 14 | 1,5,8,12 | PAIR GROUP | (1, 8), (2,9), (3,10), (4.,11), (5,12), (6,13), (7,14) | [(1,8), (5,12), (3,10), (6,13), (2,9), (7,14), (4.,11)] | YES |
| | 1,5,8,12 | FOUR GROUP | (1,5,8,12), (2,6,9,13), (3,7,11), (4,10,14) | [(1,5,8,12), (3,7,11), (4,10,14), (2,6,9,13)] | |
| | 1,5,10 | FIVE GROUP | (1,5,10), (2,9), (3,7,12), (4,8,13),(6,11,14) | [(1,5,10), (3,7,12), (4,8,13),(6,11,14), (2,9)] | |
| | 1,5,10 | SIX GROUP | (1,5,10), (2,9), (3,8,12), (4,11), (6,13), (7,14) | [(1,5,10), (4,11), (3,8,12), (6,13), (7,14) , (2,9)] | YES |
| 15 | 1,5,9,13 | FOUR GROUP | (1, 5, 9, 13), (2, 6,11), (3,7,10,14), (4, 8,12,15) | [(1, 5, 9, 13), (3,7,10,14), (4, 8,12,15), (2, 6,11)] | |
| | 1,6,11 | FIVE GROUP | (1,6,11), (2,7,12), (3,8,13), (4,9,14), (5,10,15) | [(1,6,11), (2,7,12), (3,8,13), (4,9,14), (5,10,15)] | YES |
| | 1,6,11 | SIX GROUP | (1,6,11), (2,9), (4,12), (3,8,13), (5,10,15), (7,14) | [(1,6,11), (2,9), (4,12), (3,8,13), (5,10,15), (7,14)] | |
| | 3,8,13 | SEVEN GROUP | (1,9), (2,10), (3,8,13), (4,11), (5,12), (6,14), (7,15) | [(3,8,13), (7,15), (5,12), (6,14), (4,11), (1,9), (2,10)] | |

FIG. 28B

PREFERRED MATCH OF MAJOR BLADES, ALGORITHMS
AND FOUR-LEVEL FORCE BALANCED CUTTER SETS

| N. BLD | MAJOR BLADES | ALGORITHM | LEVEL FOUR FORCED BALANCED CUTTER SET | CONSECUTIVE CUTTERS IN A CUTTER SET WITH MINIMIZED IMBALANCE FORCE |
|---|---|---|---|---|
| 5 | 1,3,5 | TWO GROUP | [(1,3,5), (2,4)] | 1,2,3; 2,3,4; 3,4,5; |
| 6 | 1,4 | PAIR GROUP | [(1,4),(3,6), (2,5)] | 1,2,3,4; 2,3,4,5; 3,4,5,6; |
| 7 | 1,3,5,7 (OR 1,3,5) | TWO GROUP | [(1,3,5,7), (2,4,6)] | 1,2,3,4; 2,3,4,5; 3,4,5,6; 4,5,6,7; |
| 8 | 1,3,5,7 | PAIR GROUP | [(1,5), (3,7), (2,6), (4,8)] | 1,2,3,4; 2,3,4,5; 3,4,5,6; 4,5,6,7; |
| 9 | 1,4,7 | THREE GROUP | [(1,4,7), (2,5,8), (3,6,9,)] | 1,2,3; 2,3,4; 3,4,5; 4,5,6; 5,6,7; 6,7,8; 7,8,9; |
| 10 | 1,4,6,9 | PAIR GROUP | [(1, 6), (4,9), (2,7), (5,10), (3,8)] | 1,2,3,4; 2,3,4,5; 3,4,5,6; 4,5,6,7; 5,6,7,8; 6,7,8,9; 7,8,9,10; |
| 11 | 1,3,7,9 | THREE GROUP | [(1,3,7,9), (2,5,8,11), (4,6,10)] | 1,2,3,4; 2,3,4,5; 3,4,5,6; 4,5,6,7; 5,6,7,8; 6,7,8,9; 7,8,9,10; 8,9,10,11; |
| 12 | 1,4,7,10 | PAIR GROUP | [(1,7), (4,10), (2,8), (5,11), (3,9), (6,12 )] | 1,2,3,4; 2,3,4,5; 3,4,5,6; 4,5,6,7; 5,6,7,8; 6,7,8,9; 7,8,9,10; 8,9,10,11; 9,10,11,12; |
| 12 | 1,5,9 | FOUR GROUP | [(1,5,9), (2, 6,10), (3,7,11), (4,8,12)] | 1,2,3; 2,3,4; 3,4,5; 4,5,6; 5,6,7; 6,7,8; 7,8,9; 8,9,10; 9,10,11; 10,11,12; |
| 13 | 1,5,10 | FIVE GROUP | [(1,5,10), (3,9), (6,12), (4,8,13), (2,7,11)] | 1,2,3,4; 2,3,4,5; 3,4,5,6; 4,5,6,7; 5,6,7,8; 6,7,8,9; 7,8,9,10; 8,9,10,11; 9,10,11,12; 10,11,12,13; |
| 14 | 1,5,8,12 | PAIR GROUP | [(1, 8), (5,12), (3,10), (6,13), (2,9), (7,14), (4.,11)] | 1,2,3,4; 2,3,4,5; 3,4,5,6; 4,5,6,7; 5,6,7,8; 6,7,8,9; 7,8,9,10; 8,9,10,11; 9,10,11,12; 10,11,12,13; 11,12,13,14; |
| 15 | 1,6,11 | FIVE GROUP | [(1,6,11), (2,7,12), (3,8,13), (4,9,14), (5,10,15)] | 1,2,3; 2,3,4; 3,4,5; 4,5,6; 5,6,7; 6,7,8; 7,8,9; 8,9,10; 9,10,11; 10,11,12; 11,12,13; 12,13,14; 13,14,15; |

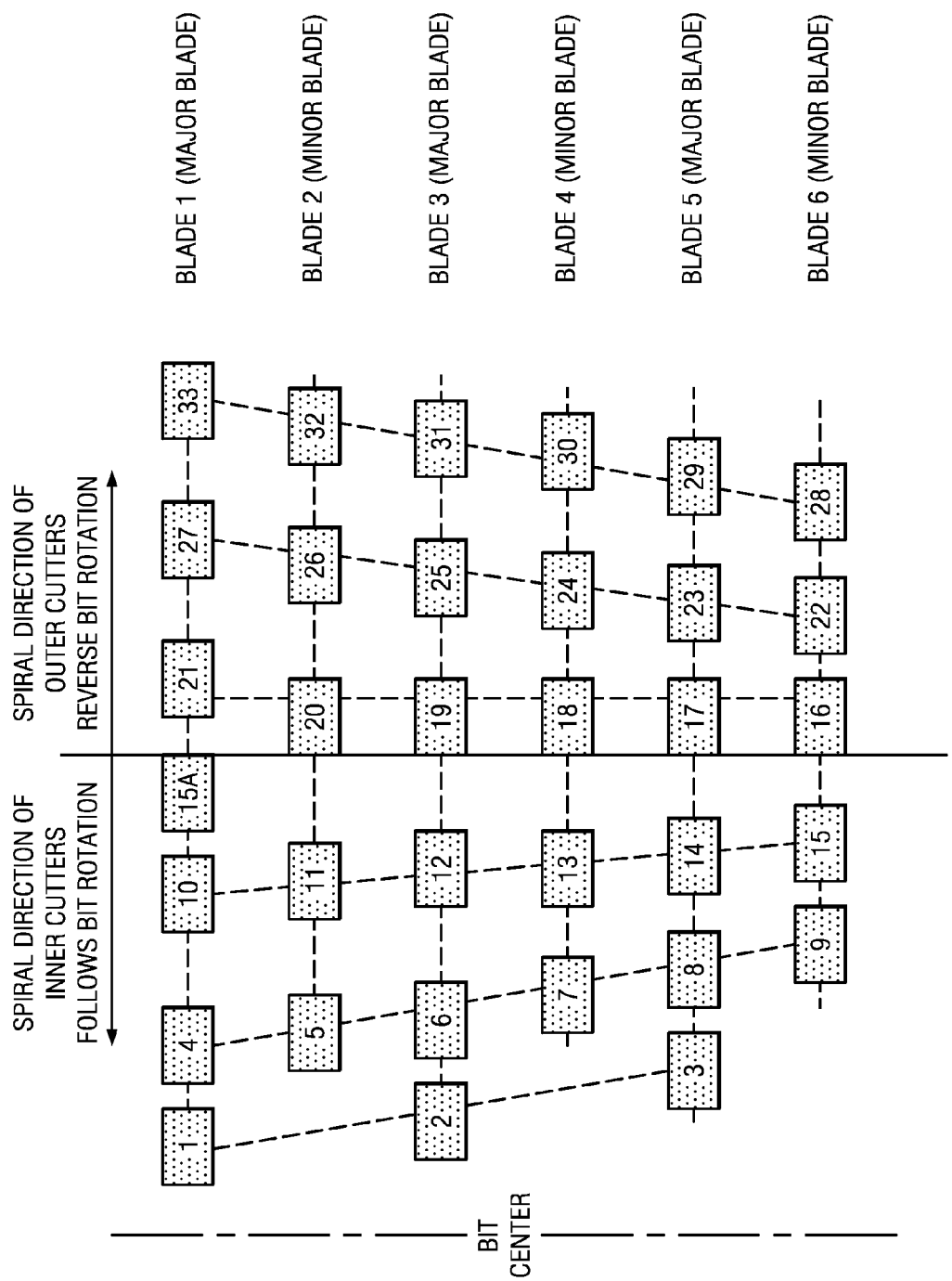

PDC BITS WITH CUTTERS LAID OUT IN BOTH SPIRAL DIRECTIONS OF BIT ROTATION

FIELD OF THE DISCLOSURE

The present disclosure is related to downhole drilling tools including, but not limited to, rotary drill bits, core bits, and reamers and more particularly to design, manufacture and/or selection of such downhole drilling tools based at least in part on cutter layout of certain cutters in spiral directions following bit rotation and cutter layout of certain other cutters in spiral directions reversing bit rotation. In some embodiments, design, manufacture and/or selection of such downhole drilling tools may be further based at least in part on balancing forces acting on associated cutting elements during initial contact with the downhole end of a wellbore and/or transition drilling through a first downhole formation and into a second downhole formation.

BACKGROUND OF THE DISCLOSURE

Various types of downhole drilling tools including, but not limited to, rotary drill bits, reamers, core bits, and other downhole tools have been used to form wellbores in associated downhole formations. Examples of such rotary drill bits include, but are not limited to, fixed cutter drill bits, drag bits, PDC drill bits, and matrix drill bits associated with forming oil and gas wells extending through one or more downhole formations.

Various techniques and procedures have been used to stabilize such downhole drilling tools and improve their drilling performance. See for example: Brett J. F, Warren T. M. and Behr S. M., "Bit Whirl: A new Theory of PDC bit Failure", SPE 19571, October, 1989; Warren T. M, Brett J. F. and Sinor L. A., "Development of a Whirl—Resistant Bit", *SPE Drilling Engineering*, 5 (1990) 267-274; Weaver G. E., Clayton R., "A New PDC Cutting Structure Improves Bit Stabilization and Extends Application into Harder Rock Types", SPE/IADC 25734, 1993; Besson A., et al., "On the Cutting Edge", Oilfield Review, Autumn, 2000, p 36-57; and TransFormation Bits, ReedHycalog, 2004.

Prior techniques for forming drill bits comprised laying all cutters in one spiral direction of bit rotation. In most prior methods all cutters were disposed in a spiral direction following bit rotation. Other prior methods attempted to lay cutters on drill bits in a direction opposite to bit rotation. However, the latter attempts generated large torque forces on bits so formed and resulted in slower and inefficient drilling. Prior techniques used to force balance fixed cutter rotary drill bits and other downhole drilling tools often assume that all cutting elements are engaged with a generally uniform downhole formation. Various computer programs and computer models are available to simulate drilling a wellbore based at least in part on such an assumption.

SUMMARY

In accordance with teachings of the present disclosure, rotary drill bits and other downhole drilling tools may be designed and manufactured with various characteristics and features including, but not limited to, certain cutting elements disposed in spiral directions following bit rotation and certain other cutting elements disposed in spiral directions opposite to bit rotation.

In some embodiments, the layout of cutting elements with regard to a spiral direction of bit rotation may be determined in part based on the location of each cutting element with regard to the bit face profile of a downhole drilling tool. For example, a bit face profile may include an outer zone and an inner zone. In some embodiments, a bit face profile may include without limitation various zones within an outer zone and an inner zone such as a nose zone, a cone zone, a shoulder zone, a gage zone and a transit zone. In some embodiments, zones such as a nose zone and a transit zone may encompass portions of an outer zone and portions of an inner zone. Accordingly, in some embodiments of the present disclosure, cutting elements in some zones may be disposed in one spiral direction of bit rotation (e.g., a spiral direction following bit rotation) and cutting elements in some other zones may be disposed in the opposite spiral direction (e.g., a spiral direction opposite to bit rotation). In some embodiments, a downhole drilling tool of the disclosure may comprise, at least two or more cutting elements disposed in a spiral direction following bit rotation and at least two or more cutting elements disposed in a spiral direction opposite to bit rotation.

In some embodiments, cutting elements may further be disposed at selected locations to provide substantially uniform force balancing during initial contact with the downhole end of a wellbore and/or during transition drilling through a first downhole formation and into an adjacent second downhole formation. Respective forces acting on each cutting element may be evaluated as a function of drilling distance as the respective cutting element engages the end of a wellbore or as each cutting element engages a second downhole formation after drilling through an adjacent first downhole formation. Such drill bits and other downhole drilling tools may sometimes be described as having a level of force balance. Several levels of force balance including a first level, a second level, a third level, a fourth level, a fifth level and multilevel force balancing are described in copending PCT Patent Application entitled "Multilevel Force Balanced Downhole Drilling Tools and Methods," Serial No. PCT/US09/067,263 filed Dec. 4, 2009.

Accordingly, some embodiments of the present disclosure describe drill bits and other downhole tools having some cutting elements disposed in a spiral directions following bit rotation, some cutting elements disposed in a spiral directions opposite to bit rotation, the cutting elements further having one or multiple levels of force balance which may be referred to as having "a level of force balance" or "multilevel force balanced."

Teachings of the present disclosure may be used to optimize the design of various features of a rotary drill bit and other downhole drilling tools in combination with other features of a downhole drilling tool including but not limited to, the number of blades, dimensions and configurations of each blade, configuration and dimensions of cutting elements, the number, location, orientation and type of cutting elements disposed on each blade and any other feature of an associated cutting structure.

In accordance to the present teachings, layout of different cutting elements in different spiral directions of bit rotation based on the location of each cutting element with respect to bit face profile may advantageously reduce torque and axial forces of the drill bit. In accordance with some embodiments, further multilevel force balancing rotary drill bits and other downhole drilling tools incorporating teachings of the present disclosure may be satisfactorily used to form a wellbore extending through multiple downhole formations in less time and with greater stability as compared with rotary drill bits and other downhole drilling tools designed based, at least in part, on assuming that all associated cutting elements are engaged with a generally uniform downhole formation.

Embodiments comprising levels of force balancing may improve bit lateral stability by minimizing lateral imbalance forces including drag lateral imbalance forces and radial lateral forces. Vibration and/or force imbalances associated with initial contact with the downhole end of a wellbore, transition drilling from a first downhole formation layer into a second downhole formation layer or drilling through other types of non-uniform downhole formations may be substantially reduced by use of multilevel force balanced downhole drilling tools incorporating teachings of the present disclosure.

Downhole drilling tools including, but not limited to, fixed cutter rotary drill bits, core bits and reamers may be designed and manufactured in accordance with teachings of the present disclosure with certain associated cutting elements disposed in a spiral direction of bit rotation and certain other associated cutting elements disposed in another spiral direction of bit rotation and in some embodiments, associated groups of cutting elements disposed at selected locations to balance lateral forces acting on such downhole drilling tools during initial contact with the downhole end of a wellbore or while drilling from a first downhole formation into a second downhole formation.

For some embodiments fixed cutter rotary drill bits and other downhole drilling tools may be designed and manufactured based on methods comprising simulations comprising placing cutting elements on various portions of a bit face profile laid out in a spiral direction of bit rotation. Such simulations may include assigning associated cutting elements to locations or zones on a bit face profile such as but not limited to "outer cutters" placed in an outer zone, "inner cutters" placed in an inner zone, "nose cutters" placed in a nose zone, "shoulder cutters" placed in a shoulder zone, "cone cutters" placed in a cone zone, "transit cutters" placed in a transit zone and "gage cutters" placed on gage zone.

Cutting elements in a first such zone may be laid out in a direction of spiral rotation, for example, a spiral direction following bit rotation, by inputting criteria for placement of cutters into a computer and various forces such as but not limited to drag forces, radial forces, penetration forces or axial forces, bit axial force, bit torque, bit imbalance force and bit moment may be measured in a simulated drilling using a computer. The cutting elements in the first such zone may then be laid out in the opposite spiral direction and drilling simulations and measurements of forces may be repeated. Simulations according to the present teachings may be used to determine spiral directions for laying out cutting elements in each zone based on locations of the cutting elements in a bit face profile such that forces during simulated drilling are optimized (minimized or maximized) to achieve and/or maximize efficient drilling. Simulations may also include force balancing cutting elements to achieve a level of force balance according to multilevel force balancing criteria. Such simulations may further include assigning associated cutting elements to respective "cutter groups" such as two cutter groups or pair cutter groups, three cutter groups, four cutter groups, five cutter groups, etc. as described in PCT Patent Application entitled "Multilevel Force Balanced Downhole Drilling Tools and Methods," Serial No. PCT/US09/067,263 filed Dec. 4, 2009.

According to multilevel force balancing criteria, cutting elements in each cutter group may be force balanced, which may be referred to as "level one force balancing." Cutting elements in each neighbor cutter group may also be force balanced, which may be referred to as "level two force balancing." Cutting elements disposed on exterior portions of the associated rotary drill bit or other downhole drilling tool may then be divided into respective cutter sets. Each cutter set may include at least two force balanced cutter groups. Cutting elements in each cutter set may also be force balanced, which may be referred to as "level three force balancing." Neighbor cutting elements disposed on an associated bit face profile or cutting face profile may be divided into respective groups of either three or four consecutive cutting elements per group. The cutting elements in each neighbor cutter group may be force balanced, which may be referred to as "level four force balancing." A final level or "level five force balancing" may include simulating forces acting on all cutting elements when engaged with a generally uniform and/or a generally non-uniform downhole formation, which may be referred to as "all cutter level force balancing." Simulations may comprise evaluating force balancing after each level.

Further aspects of the present disclosure may include one or more algorithms or procedures for laying out or selecting locations for installing respective cutting elements on exterior portions of a rotary drill bit or other downhole drilling tool based on the present teachings. A fixed cutter rotary drill bit, core bit, reamer, down hole opener, a fixed cutter drill bit, a drag bit, a PDC drill bit, a matrix drill bit, a steel body PDC drill bit, and/or any other downhole drilling tool designed in accordance to the present disclosure may have some cutting elements disposed in a spiral direction of bit rotation (some cutting elements being disposed in the direction of bit rotation and some cutting elements being disposed in a direction opposite to bit rotation) such that torque forces and axial forces associated with the downhole drilling tool are minimized or reduced and wherein the downhole drilling tool may be further multilevel force balanced to have increased stability and a higher rate of penetration for the same general downhole drilling conditions (weight on bit, rate of rotation, etc.) as compared with more traditional forced balanced drilling tools especially during transition drilling between a first formation layer and a second formation layer.

Some embodiments of the disclosure may provide one or more of the following technical advantages. A technical advantage of some embodiments may include substantially decreasing, reducing or minimizing torque forces of cone cutters when deposited in a spiral direction following bit rotation. A technical advantage of some embodiments may include substantially decreasing, reducing or minimizing axial forces of cone cutters when deposited in a spiral direction following bit rotation.

A technical advantage of some embodiments may include substantially reducing or minimizing torque forces on each cutting element of shoulder cutters when deposited in a spiral direction opposite to bit rotation. A technical advantage of some embodiments may include substantially decreasing or minimizing axial forces of shoulder cutters when deposited in a spiral direction opposite to bit rotation.

A technical advantage of some embodiments may include substantially reducing or minimizing torque forces of gage cutters when deposited in a spiral direction opposite to bit rotation. A technical advantage of some embodiments may include substantially decreasing or minimizing axial forces of gage cutters when deposited in a spiral direction opposite to bit rotation.

A technical advantage of some embodiments may include an increased toolface controllability in directional drilling due to reduced bit torque and bit torque variation. A technical advantage of particular embodiments of the present disclosure may include an increased bit stability due to balanced bit lateral force in transit drilling. Further technical advantages of particular embodiments of the present disclosure may include an increased bit steerability in directional drilling due to reduced axial and torque forces of shoulder and gage cutters.

Various embodiments of the disclosure may include none, some, or all of the above technical advantages. One or more other technical advantages may be readily apparent to one skilled in the art from the figures, descriptions, and claims included herein.

This summary contains only a limited number of examples of various embodiments and features of the present disclosure. For a better understanding of the disclosure and its advantages, reference may be made to the description of exemplary embodiments that follows.

BRIEF DESCRIPTION OF THE DRAWINGS

A more complete and thorough understanding of the various embodiments and advantages thereof may be acquired by referring to the following description taken in conjunction with the accompanying drawings, in which like reference numbers indicate like features, and wherein:

FIGS. 7A and 7B are schematic drawings showing one example of prior techniques for installing cutting element on a fixed cutter rotary drill bit relative to an associated bit rotational axis wherein the spiral direction of installing cutting elements follows bit rotation and wherein FIG. 7A shows a schematic face view of a bit with cutting elements installed in a spiral direction following bit rotation and FIG. 7B depicts a bit face profile of cutting elements on bit face of FIG. 7A showing location of cutting elements on different zones along the bit face profile;

FIGS. 8A and 8B are schematic drawings showing one example of prior techniques for installing cutting element on a fixed cutter rotary drill bit relative to an associated bit rotational axis wherein the spiral direction of installing cutting elements is opposite to bit rotation and wherein FIG. 8A shows a schematic face view of a bit with cutting elements installed in a spiral direction opposite to bit rotation and FIG. 8B depicts a bit face profile of cutting elements on bit face of FIG. 8A showing location of cutting elements on different zones along the bit face profile;

FIGS. 9A and 9B are schematic drawings show examples of a bit face profile of a fixed cutter rotary drill bit wherein FIG. 9A shows a bit face profile of a blade (blade No. 1) with cutting elements installed in a spiral direction following bit rotation (such as in FIG. 7A) and FIG. 9B shows a bit face profile of a blade (blade No. 1) with cutting elements installed in a spiral direction opposite to bit rotation (such as in FIG. 8A);

FIGS. 9C and 9D are schematic drawings show examples of a bit face profile of a fixed cutter rotary drill bit wherein FIG. 9C shows a bit face profile of a blade (blade No. 4) with cutting elements installed in a spiral direction following bit rotation (such as in FIG. 7A) and FIG. 9D shows a bit face profile of a blade (blade No. 4) with cutting elements installed in a spiral direction opposite to bit rotation (such as in FIG. 8A);

FIGS. 10A and 10B are schematic drawings showing examples of cutting zone of a cutter wherein, FIG. 10A shows a cutting zone of a cutter (cutter No. 4) following bit rotation and FIG. 10B shows a cutting zone of a cutter (cutter No. 4) of blade No. 1 when cutting elements are installed on the bit in a spiral direction opposite to bit rotation;

FIGS. 10C and 10D are schematic drawings showing examples of cutting zone of a cutter wherein FIG. 10C shows a cutting zone of a cutter (cutter No. 9) of blade No. 1 with cutting elements installed on the bit in a spiral direction following bit rotation and FIG. 10D shows a cutting zone of a cutter (cutter No. 9) of blade No. 1 with cutting elements installed on the bit in a spiral direction opposite to bit rotation;

FIGS. 11A and 11B are schematic drawings showing examples of cutting zone of a cutter wherein FIG. 11A shows a cutting zone of a cutter (cutter No. 4) of blade No. 4 with cutting elements installed on the bit in a spiral direction following bit rotation and FIG. 11B shows a cutting zone of a cutter (cutter No. 4) of blade No. 4 with cutting elements installed on the bit in a spiral direction opposite to bit rotation;

FIGS. 11C and 11D are schematic drawings showing examples of cutting zone of a cutter wherein FIG. 11C shows a cutting zone of a cutter (cutter No. 8) of blade No. 4 with cutting elements installed on the bit in a spiral direction following bit rotation and FIG. 11D shows a cutting zone of a cutter (cutter No. 8) of blade No. 4 with cutting elements installed on the bit in a spiral direction opposite to bit rotation;

FIGS. 12A and 12B are schematic drawings showing example axial force of cone cutters of a fixed cutter rotary drill bit, according to teachings of the present disclosure, wherein, FIG. 12A shows an example axial force of cone cutters wherein the cutting elements are installed on portions of blades in the cone zone in a spiral direction following bit rotation and FIG. 12B shows an example axial force of cone cutters wherein the cutting elements are installed on portions of blades in the cone zone in a spiral direction opposite to bit rotation;

FIGS. 12C and 12D are schematic drawings showing example torque forces of cone cutters of a fixed cutter rotary drill bit, according to teachings of the present disclosure, wherein, FIG. 12C shows an example torque force of cone cutters wherein the cutting elements are installed on portions of blades in the cone zone in a spiral direction following bit rotation and FIG. 12D shows an example torque force of cone cutters wherein the cutting elements are installed on portions of blades in the cone zone in a spiral direction opposite to bit rotation;

FIGS. 13A and 13B are schematic drawings showing example axial force of shoulder cutters of a fixed cutter rotary drill bit, according to teachings of the present disclosure, wherein, FIG. 13A shows an example axial force of shoulder cutters wherein the cutting elements are installed on portions of blades in the shoulder zone in a spiral direction following bit rotation and FIG. 13B shows an example axial force of shoulder cutters wherein the cutting elements are installed on portions of blades in the shoulder zone in a spiral direction opposite to bit rotation;

FIGS. 13C and 13D are schematic drawings showing example torque forces of shoulder cutters of a fixed cutter rotary drill bit, according to teachings of the present disclosure, wherein, FIG. 13C shows an example torque force of shoulder cutters wherein the cutting elements are installed on portions of blades in the shoulder zone in a spiral direction following bit rotation and FIG. 13D shows an example torque force of shoulder cutters wherein the cutting elements are installed on portions of blades in the shoulder zone in a spiral direction opposite to bit rotation;

FIGS. 14A and 14B are schematic drawings showing example axial force of gage cutters of a fixed cutter rotary drill bit, according to teachings of the present disclosure, wherein, FIG. 14A shows an example axial force of gage cutters wherein the cutting elements are installed on portions of blades in the gage zone in a spiral direction following bit rotation and FIG. 14B shows an example axial force of gage cutters wherein the cutting elements are installed on portions of blades in the gage zone in a spiral direction opposite to bit rotation;

FIGS. 14C and 14D are schematic drawings showing example torque forces of gage cutters of a fixed cutter rotary drill bit, according to teachings of the present disclosure, wherein, FIG. 14C shows an example torque force of gage cutters wherein the cutting elements are installed on portions of blades in the gage zone in a spiral direction following bit rotation and FIG. 14D shows an example torque force of gage cutters wherein the cutting elements are installed on portions of blades in the gage zone in a spiral direction opposite to bit rotation;

FIGS. 21A and 21B are schematic drawings showing various techniques to select or layout locations for installing respective cutting elements in a cutter set used to multilevel force balance a downhole drilling tool in accordance with teachings of the present disclosure;

FIGS. 22A-22D are schematic drawings showing various techniques to select or layout locations for installing respective cutting elements in a cutter set which may be used to multilevel force balance a downhole drilling tool (four respective cutter sets) in accordance with teachings of the present disclosure;

FIGS. 26J-1 and 26J-2 are graphs showing level four force balancing of the drill bit shown in FIGS. 25A and 25B in accordance with teachings of the present disclosure;

FIGS. 28A and 28B are tables showing examples of matching major blades, cutter groups, blade groups and cutter sets for use in multilevel force balancing of fixed cutter rotary drill bits or other downhole drilling tools in accordance with teachings of the present disclosure;

FIG. 29 is a table showing preferred matches of major blades, cutter groups, blade groups and cutter sets during design of multilevel force balance fixed cutter rotary drill bits or other downhole drilling tools in accordance with teachings of the present disclosure;

FIG. 39 shows a schematic drawings showing an example for selecting locations to install cutting elements on exterior portions of a downhole drilling tool having six blades wherein inner cutters are disposed in a spiral direction following bit rotation and outer cutters are disposed in a spiral direction opposite to bit rotation, in accordance with teachings of the present disclosure;

DETAILED DESCRIPTION

Figure 1A:
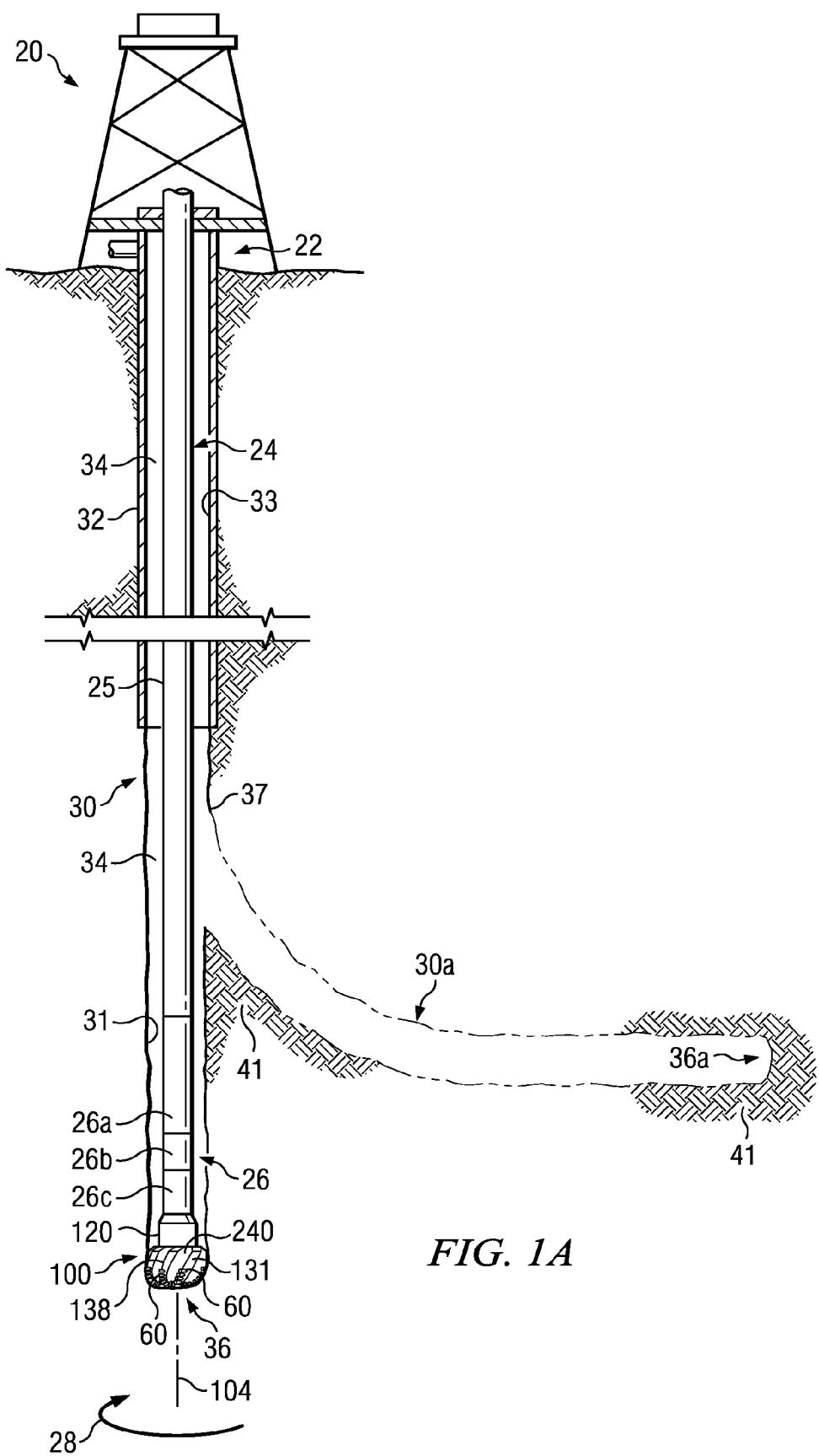
FIG. 1A is a schematic drawing in section and in elevation with portions broken away showing examples of wellbores which may be formed in downhole formations by a rotary drill bit or other downhole drilling tools incorporating teachings of the present disclosure.

Preferred embodiments and various advantages of the disclosure may be understood by reference to FIGS. 1A-45 wherein like numbers refer to same and like parts.

The terms "downhole" and "uphole" may be used in this application to describe the location of various components of a downhole drilling tool relative to portions of the downhole drilling tool which engage the bottom or end of a wellbore to remove adjacent formation materials. For example an "uphole" component may be located closer to an associated drill string or bottom hole assembly as compared to a "downhole" component which may be located closer to the bottom or end of an associated wellbore.

The terms "downhole drilling tool" or "downhole drilling tools" may include rotary drill bits, matrix drill bits, drag bits, reamers, near bit reamers, hole openers, core bits and other downhole tools having cutting elements and/or cutting structures operable to remove downhole formation materials while drilling a wellbore.

The term "rotary drill bit" may be used in this application to include various types of fixed cutter drill bits, fixed cutter rotary drill bits, PDC bits, drag bits, matrix drill bits, steel body drill bits and core bits operable to form at least portions of a wellbore in a downhole formation. Rotary drill bits and associated components formed in accordance with teachings of the present disclosure may have many different designs, configurations and/or dimensions.

The terms "reamer" and "reamers" may be used in the application to describe various downhole drilling tools including, but not limited to, near bit reamers, winged reamers and downhole openers.

The terms "bottom hole assembly" or "BHA" may be used in this application to describe various components and assemblies disposed proximate one or more downhole drilling tools disposed proximate the downhole end of a drill string. Examples of components and assemblies (not expressly shown) which may be included in various cutting structures such as in a bottom hole assembly or BHA include, but are not limited to, a bent sub, a downhole drilling motor, sleeves, stabilizers and downhole instruments. A bottom hole assembly may also include various types of well logging tools (not expressly shown) and other downhole tools associated with directional drilling of a wellbore. Examples of such logging tools and/or directional drilling tools may include, but are not limited to, acoustic, neutron, gamma ray, density, photoelectric, nuclear magnetic resonance, rotary steering tools and/or any other commercially available well tool.

The term "gage" or "gage pad" as used in this application may include a gage, gage segment, gage portion or any other portion of a rotary drill bit. Gage pads may be used to help define or establish a nominal inside diameter of a wellbore formed by an associated rotary drill bit. The layout of locations for installing cutting elements on exterior portions of a blade may terminate proximate an associated gage pad.

The terms "cutting element" "cutting elements" and "cutters" may be used in this application to include, but are not limited to, various types of cutters, compacts, buttons, and inserts satisfactory for use with a wide variety of rotary drill bits and other downhole drilling tools. Impact arrestors, gage cutters, secondary cutters and/or back up cutters may also be included as part of the cutting structure of rotary drill bits and other downhole drilling tools formed in accordance with teachings of the present disclosure. Polycrystalline diamond compacts (PDC) and tungsten carbide inserts are often used to form cutting elements for rotary drill bits, reamers, core bits and other downhole drilling tools. Various types of other hard, abrasive materials may also be satisfactorily used to form cutting elements for rotary drill bits.

The terms "cutting face," "bit face profile," "bit profile" "cutting face profile" and "composite cutting face profile" describe various components, segments or portions of a downhole drilling tool operable to engage and remove formation materials to form an associated wellbore. The cutting face of a downhole drilling tool may include various cutting structures such as one or more blades with respective cutting elements disposed on exterior portions of each blade. A cutting face may also include impact arrestors, back up cutters, gage cutters and/or an associated gage pad. The cutting face of a fixed cutter rotary drill bit may also be referred to as a "bit face."

The terms "cutting face profile," "composite cutting face profile," "cutting face," "bit face profile," and "bit profile" may also describe various cutting structures including blades and associated cutting elements projected onto a radial plane extending generally from an associated bit rotational axis. The cutting face profile of a fixed cutter rotary drill bit and/or a core bit may also be referred to as a "bit face profile" or "composite bit face profile." A bit face profile may be comprised of various segments or zones that represent structures on the bit such as but not limited to an outer zone, an inner zone, cone, nose, shoulder, gage and transit zones. Some zones may comprise portions of other zones or overlap one or more zones.

The term "cutting structure" may be used in this application to include various combinations and arrangements of cutting elements, impact arrestors, backup cutters and/or gage cutters formed on exterior portions of a rotary drill bit or other downhole drill tools. Some rotary drill bits and other downhole drilling tools may include one or more blades extending from an associated bit body with respective cutting elements disposed of each blade. Such blades may sometimes be referred to as "cutter blades."

Various computer programs and computer models may be used to design cutting elements, blades, cutting structure and/or associated downhole drilling tools in accordance with teachings of the present disclosure. Examples of such programs and models which may be used to design and evaluate performance of downhole drilling tools incorporating teachings of the present disclosure are shown in U.S. Patent Applications entitled "Methods and Systems for Designing and/or Selecting Drilling Equipment Using Predictions of Rotary Drill Bit Walk," application Ser. No. 11/462,898, filing date Aug. 7, 2006 (now U.S. Pat. No. 7,778,777); U.S. patent application entitled "Methods and Systems for Designing and/or Selecting Drilling Equipment With Desired Drill Bit Steerability," application Ser. No. 11/462,918, filed Aug. 7, 2006 (now U.S. Pat. No. 7,729,895); U.S. patent application entitled "Methods and Systems for Design and/or Selection of Drilling Equipment Based on Wellbore Simulations," application Ser. No. 11/462,929, filing date Aug. 7, 2006 (now U.S. Pat. No. 7,827,014); and PCT Patent Application entitled "Multilevel Force Balanced Downhole Drilling Tools and Methods," Serial No. PCT/US09/067,263 filed Dec. 4, 2009.

Various aspects of the present disclosure may be described with respect to downhole drilling tools such as shown at least in FIGS. 1A, 1B, 3A, 3B, 4, 5 and 18. Examples of such downhole drilling tools may include, but are not limited to, rotary drill bits 90, 100, 100a, and 100b, core bit 500 and reamer 600. Teachings however recognize that the disclosure is not limited to these downhole drilling tools.

Rotary drill bits 100, 100*a*, 100*b* and 100*c*, core bit 500 and reamer 600 may include a plurality of blades with respective cutting elements disposed at selected locations on associated blades in accordance with teachings of the present disclosure. The teachings of the present disclosure are not limited to rotary drill bits 90 and/or 100*a*, 100*b* and 100*c*, core bit 500 or reamer 600.

FIG. 1A shows examples of wellbores or bore holes which may be formed by downhole drilling tools incorporating teachings of the present disclosure. Rotary drill bit 100 may be designed and manufactured in accordance with teachings of the present disclosure by selecting locations for laying out cutting elements 60 on different zones (locations or segments) of a bit face profile in relation to a spiral direction of bit rotation 28 about bit rotational axis 104. In some embodiments, rotary drill bit 100 may be further designed and manufactured based on multilevel force balancing techniques in accordance with teachings of the present disclosure to substantially reduce and/or minimize imbalance forces which may result from contact between rotary drill bit 100 and downhole end 36 of wellbore 30 or downhole end 36*a* of wellbore 30*a*, including one or multiple downhole formations as may be seen in transitional drilling.

Various aspects of the present disclosure may be described with respect to drilling rig 20, drill string 24 and attached rotary drill bit 100 as shown in FIG. 1A. Cutting elements 60, according to the present disclosure, may be disposed at selected locations on exterior portions of blades such as 131-138 to substantially reduce bit axial force, bit torque and bit imbalance forces of rotary drill bit 100 during uniform downhole drilling, non-uniform downhole drilling conditions and/or transition drilling conditions.

Bit imbalance forces associated with non-uniform downhole drilling conditions are discussed in more detail with respect to rotary drill bit 90 in FIG. 18, and rotary drill bit 90*a* in FIGS. 7A-8B. Bit imbalance forces may cause vibration of drill string 24 when rotary drill bit 100 initially contacts end 36 of wellbore 30 or end 36*a* of horizontal wellbore 30*a*. See FIG. 1A. Such vibration may extend from rotary drill bit 100 throughout the length of drill string 24. See FIG. 18. Imbalance forces acting on a downhole drilling tool may also result during transition drilling from a first generally soft formation layer into a second, generally harder downhole formation layer. See, for example, FIG. 1B and FIG. 18. Imbalance forces acting on a downhole drilling tool may also result from drilling from a first downhole formation into a second downhole formation where the second downhole formation may be tilted at an angle other than normal to a wellbore formed by a downhole drilling tool. See, for example, FIGS. 19A, 19B and 19C.

Figure 1B:
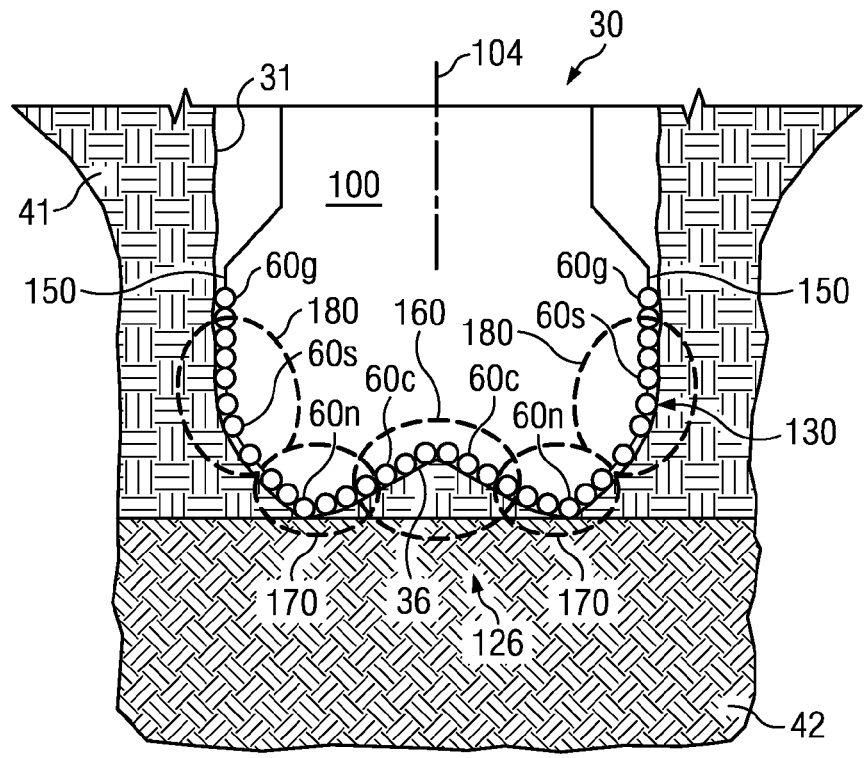
FIG. 1B is a schematic drawing in section and in elevation with portions broken away showing the rotary drill bit of FIG. 1A drilling a wellbore through a first downhole formation and into an adjacent second downhole formation.

Wellbores 30 and/or 30*a* may often extend through one or more different types of downhole formation materials or formation layers. As shown in FIG. 1B, rotary drill bit 100 may be used to extend wellbore 30 through first formation layer 41 and into second formation layer 42. For some applications, first formation layer 41 may have a compressive strength or hardness less than the compressive strength or hardness of second formation layer 42.

During transition drilling between first layer 41 and second harder layer 42, significant imbalance forces may be applied to a downhole drill tool resulting in undesired vibration of an associated downhole drill string. Vibration and/or imbalance forces associated with initial contact with a downhole formation at the end of a wellbore, transition drilling from a first formation layer into a second formation layer and other non-uniform downhole drilling conditions will be discussed in more detail.

Various types of drilling equipment such as a rotary table, mud pumps and mud tanks (not expressly shown) may be located at well surface or well site 22. Drilling rig 20 may have various characteristics and features associated with a "land drilling rig". However, downhole drilling tools incorporating teachings of the present disclosure may be satisfactorily used with drilling equipment located on offshore platforms, drill ships, semi-submersibles and drilling barges (not expressly shown).

Bottomhole assembly (BHA) 26 may be formed from a wide variety of components. For example, components 26*a*, 26*b* and 26*c* may be selected from the group consisting of, but not limited to, drill collars, rotary steering tools, directional drilling tools and/or downhole drilling motors. The number of components such as drill collars and different types of components included in a BHA will depend upon anticipated downhole drilling conditions and the type of wellbore which will be formed by drill string 24 and rotary drill bit 100.

Drill string 24 and rotary drill bit 100 may be used to form a wide variety of wellbores and/or bore holes such as generally vertical wellbore 30 and/or generally horizontal wellbore 30*a* as shown in FIG. 1A. Various directional drilling techniques and associated components of BHA 26 may be used to form horizontal wellbore 30*a*. For example, lateral forces may be applied to rotary drill bit 100 proximate kickoff location 37 to form horizontal wellbore 30*a* extending from generally vertical wellbore 30.

Excessive amounts of vibration or imbalance forces applied to a drill string while forming a directional wellbore may cause significant problems with steering drill string and/or damage one or more downhole components. Such vibration may be particularly undesirable during formation of directional wellbore 30*a*. Designing and manufacturing rotary drill bit 100 and/or other downhole drilling tools by selecting locations for laying out cutting elements 60 on different zones (locations) of a bit face profile in relation to a spiral direction of bit rotation about bit rotational axis 104 and in some embodiments further using multilevel force balancing techniques incorporating teachings of the present disclosure may substantially enhance stability and steerability of rotary drill bit 100 and other downhole drilling tools.

Figure 3A:
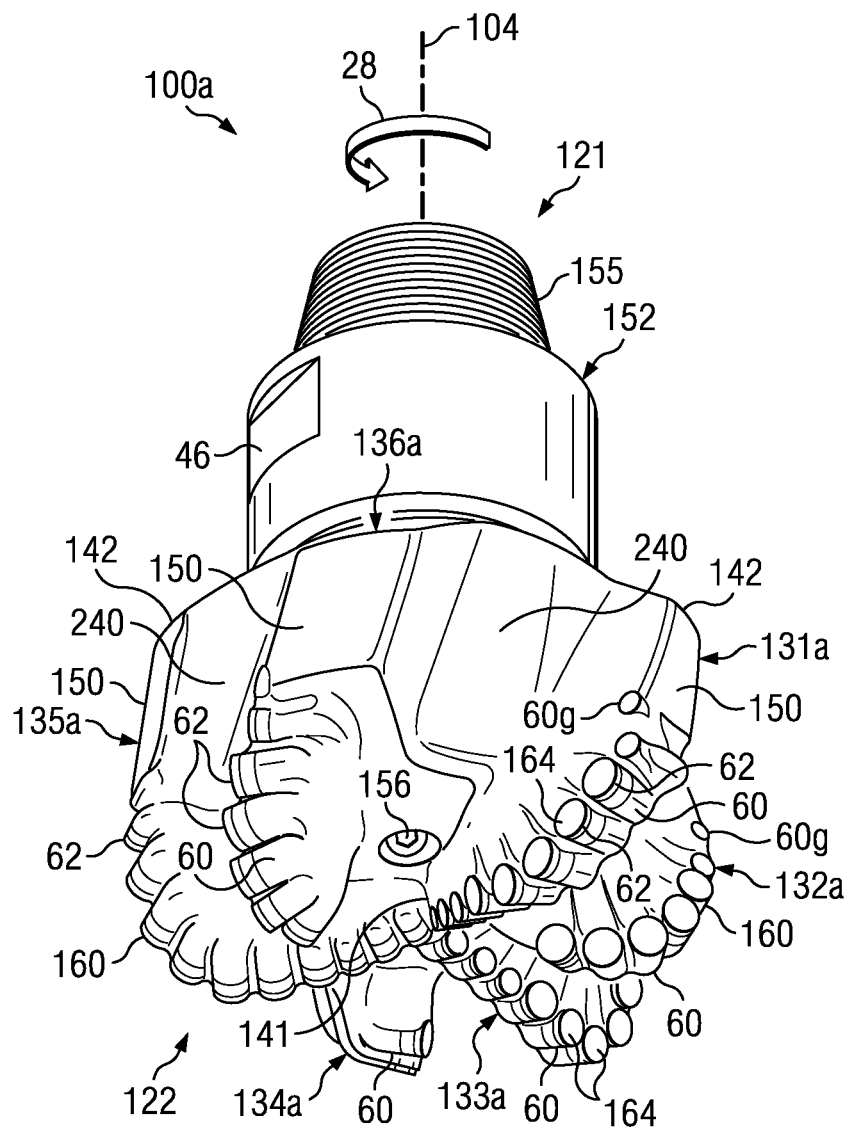
FIG. 3A is a schematic drawing showing an isometric view of a fixed cutter drill bit oriented in a generally downhole direction which may incorporate teachings of the present disclosure.
Figure 3B:
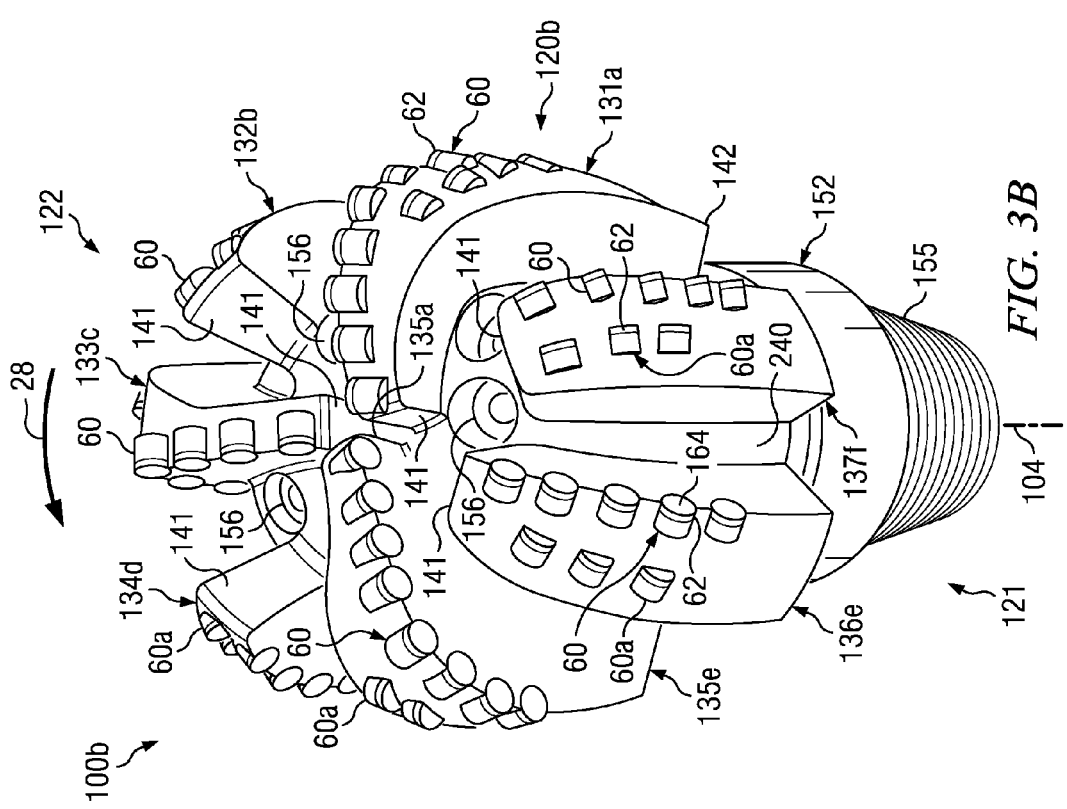
FIG. 3B is a schematic drawing showing an isometric view of a fixed cutter drill bit incorporating teachings of the present disclosure and oriented upwardly in a manner often used to model or design fixed cutter drill bits.

Wellbore 30 defined in part by casing string 32 may extend from well surface 22 to a selected downhole location. Portions of wellbore 30 as shown in FIG. 1A which do not include casing 32 may be described as "open hole". Various types of drilling fluid may be pumped from well surface 22 through drill string 24 to attached rotary drill bit 100. Such drilling fluids may be directed to flow from drill string 24 to respective nozzles 156 provided in rotary drill bit 100. Nozzles 156 are depicted in FIGS. 3A and 3B. The drilling fluid may be circulated back to well surface 22 through annulus 34 defined in part by outside diameter 25 of drill string 24 and inside diameter 31 of wellbore 30. Inside diameter 31 may also be referred to as the "sidewall" of wellbore 30. Annulus 34 may also be defined by outside diameter 25 of drill string 24 and inside diameter 33 of casing string 32. Drilling fluids may also flow through junk slots 240 that are disposed between two adjacent blades on a drill bit.

Rate of penetration (ROP) of a rotary drill bit is often a function of both weight on bit (WOB) and revolutions per minute (RPM). Drill string 24 may apply weight on drill bit 100 and also rotate drill bit 100 to form wellbore 30. For some applications a downhole motor (not expressly shown) may be provided as part of BHA 26 to also rotate rotary drill bit 100.

FIG. 1B shows rotary drill bit 100 forming wellbore 30 through first formation layer 41 into second formation layer 42. Formation layer 41 may be described as "softer" or "less hard" when compared with downhole formation layer 42. Various details associated with designing and manufacturing rotary drill bit 100 by selecting locations for laying out cutting elements 60 on different zones (locations) of a bit face profile in relation to a spiral direction of bit rotation about bit rotational axis 104 and in some embodiments by further using multilevel force balancing techniques incorporating teachings of the present disclosure will be further discussed at least with respect to FIGS. 2, 7A-16B and 23A-31B.

As shown in FIG. 1B, exterior portions of rotary drill bit 100 which contact adjacent portions of a downhole formation may be described as a "bit face." Bit face 126 of rotary drill bit 100 may include various zones or segments such as but not limited to inner zone 200, outer zone 210, a generally cone shaped segment or cone zone 160, nose segment or nose zone 170, shoulder or outer segment 180, gage or gage zone 150 and transit zone (not expressly depicted). A transit zone may refer to an area in a bit face profile where the spiral direction of cutter layout changes from a first spiral direction to a second spiral direction about bit rotation. Cutting elements in a transit zone may be referred to as transit cutters 60t since such cutters mark the transition of cutter layout direction from following a direction of bit rotation to reversing the direction of bit rotation or vice versa. There may be more than one transit cutters 60t on a bit face profile. A transit zone may be located anywhere on a bit face profile. In some embodiments, a transit zone may be located between an inner zone and an outer zone. Each zone or segment on a bit face defined in part by respective portions of associated blades. Blades 131-138 are shown in FIGS. 3A-3B.

Generally convex or outwardly curved nose segment or nose zone 170 may be formed on exterior portions of each blade 131-138 adjacent to and extending from cone shaped segment 160. Respective shoulder segments 180 may be formed on exterior portions of each blade 131-138 extending from respective nose segments 170. Each shoulder segment 180 may terminate proximate a respective gage cutter 60g or gage pad 150 on each blade 131-138. In accordance with teachings of the present disclosure, as shown in FIG. 1B, a plurality of cone cutters 60c may be disposed on cone or cone zone 160, a plurality of nose cutters 60n may be disposed on nose segment or nose zone 170, a plurality of shoulder cutters 60s may be disposed on shoulder or shoulder zone or outer segment 180 and a plurality of gage cutters 60g may be disposed on gage or gage zone 150.

Exterior portions of blades 131-138 and cutting elements 60 may be projected rotationally onto a radial plane to form a bit face profile or a composite bit face profile. Composite bit face profile 110 associated with rotary drill bit 100 are shown at least in FIGS. 2, 6A, 6C, 7B, 8B, 9A-9D, 16B, 17B, 19A-19C, 20A, 20C, 20F, 20H, 21B, 23B, 23D, and 25B.

Figure 2:
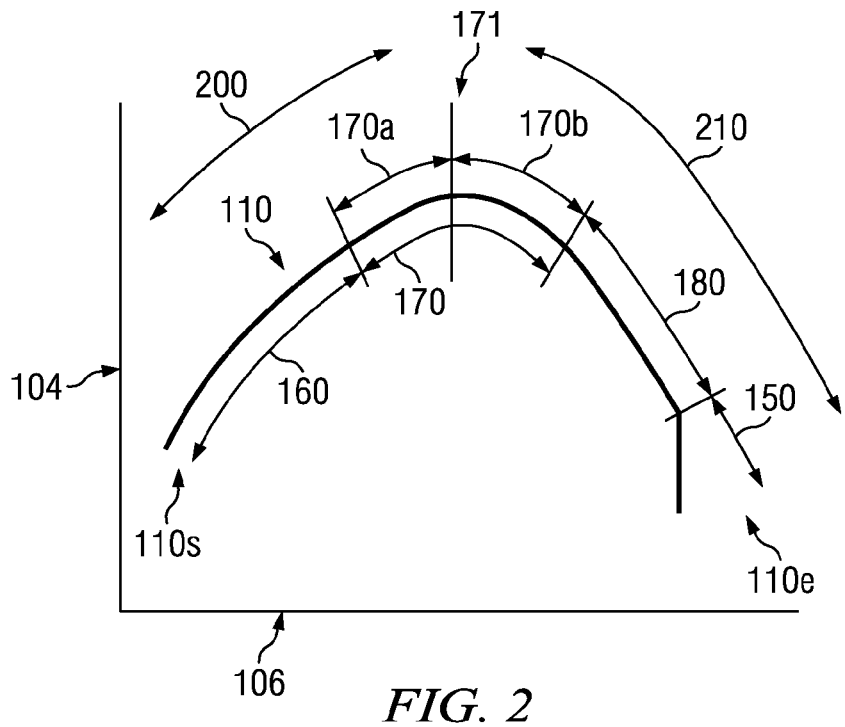
FIG. 2 is a schematic drawing showing an example bit face profile, during downhole drilling, having various zones and depicting the location of outer cutters and inner cutters in various zones which may effect bit imbalance forces acting on an associated rotary drill bit, incorporating teachings of the present disclosure.

FIG. 2 depicts a bit face profile 110 also referred to as a cutting face profile describing various cutting structures including blades and associated cutting elements projected rotationally onto a radial plane extending generally from an associated bit rotational axis 104 and depicts various zones on a bit face including but not limited to cone zone 160, nose zone 170, shoulder zone 180 and gage zone 150 with respect to bit rotational axis 104 and nose point 171. Nose point 171 may be defined as the location on bit face profile 110 within nose zone 170 with maximum elevation as measured on bit rotational axis 104 (y axis) from reference line 106 (x axis). Nose zone 170 may be comprise at least two portions, a first portion 170a comprising locations from the nose point toward the bit rotational axis 104 or the beginning of bit face profile 110s and a second portion 170b comprising locations from nose point 171 toward end of the bit face profile 110e. "Inner zone" 200 may comprise portions of bit face profile 110 beginning from 110s up to nose point 171 and "outer zone" 210 may comprise portions of bit profile 110 beginning from nose point 171 up to 110e.

According to teachings of the present disclosure "inner cutters" 60i may be described as cutters that are placed on the inner side of nose point 171, (i.e., cutters 60 that may be placed on bit face profile 110 from beginning of bit profile 110s to nose point 171), and may include cutters 60c of cone zone 160 and nose cutters 60na that are located on first portion 170a of nose zone 170. According to teachings of the present disclosure "outer cutters" 60o may be described as cutters that are placed on the outer side of nose point 171, (i.e., cutters 60 that may be placed on bit face profile 110 from nose point 171 to the end of bit profile 110e), and may include nose cutters 60nb that are located on second portion 170b of nose zone 170, cutters 60s of shoulder zone 180, and gage cutters 60g.

Cutting elements or nose cutters 60n may be disposed at selected locations on nose segments 170 of respective blades 131-138 in accordance with teachings of the present disclosure to initially contact a downhole formation and avoid creating undesired imbalance force acting on drill bit 100. In some embodiments, two or more cutting elements may be optimally located on respective blades to make approximately simultaneous contact with the downhole end of a wellbore and substantially reduce imbalance forces and/or vibrations acting on an associated drill bit and drill string.

FIGS. 3A and 3B show rotary drill bits 100a and 100b which may be designed and manufactured using laying out inner cutters and outer cutters in different spiral directions in relation to bit rotation around bit rotational axis 104 to substantially reduce imbalance forces and torque acting on cutters of a drill but and in some embodiments further based on multilevel force balancing techniques in accordance with teachings of the present disclosure. Rotary drill bits 100a and 100b have respective bit bodies 120a and 120b. Respective blades 131a-136a and 131b-136b may be disposed on exterior portions of bit bodies 120a and 120b.

For some applications, bit bodies 120a and 120b may be formed in part from a respective matrix of very hard materials associated with matrix drill bits. For other applications, bit bodies 120a and 120b may be machined from various metal alloys satisfactory for use in drilling wellbores in downhole formations.

First end or uphole end 121 of each bit body 120a and 120b may include shank 152 with American Petroleum Institute (API) drill pipe threads 155 formed thereon. Threads 155 may be used to releasably engage respective rotary drill bit 100a and 100b with BHA 26 whereby each rotary drill bit 100a and 100b may be rotated relative to bit rotational axis 104 in response to rotation of drill string 24. Bit breaker slots 46 may be formed on exterior portions of upper portion or shank 152 for use in engaging and disengaging each rotary drill bits 100a and 100b with drill string 24. An enlarged bore or cavity (not expressly shown) may extend from first end 121 through shank 152 and into each bit body 120a and 120b. The enlarged cavity may be used to communicate drilling fluids from drill string 24 to one or more nozzles 156.

Second end or downhole end 122 of each bit body 120a and 120b may include a plurality of blades 131a-136a and 131b-136b with respective junk slots or fluid flow paths 240 disposed therebetween. Exterior portions of blades 131a-136a and 131b-136b and respective cutting elements 60 disposed thereon may define in part bit face disposed on exterior portions of bit body 120a and 120b respective proximate second end 122.

Blades 131a-136a may extend from second end or downhole end 122 towards first end or uphole end 121 of bit body 120a at an angle relative to exterior portions of bit body 120 and associated bit rotational axis 104. Blades 131a-136a may be described as having a spiral or a spiraling configuration relative to associated bit rotational axis 104. Blades 131b-136b disposed on exterior portions of bit body 120b may extend from second end or downhole end 122 towards first end or uphole end 121 aligned in a generally parallel configuration with respect to each other and associated bit rotational axis 104. See FIG. 3B.

Respective cutting elements 60 may be disposed on exterior portions of blades 131a-136a and 131b-136b in accordance with teachings of the present disclosure. Rotary drill bit 100b may include a plurality of secondary cutters or backup cutters 60a disposed on exterior portions of associated blades 131b-136b. For some applications each cutting element 60 and backup cutting element 60a may be disposed in a respective socket or pocket (not expressly shown) formed on exterior portions of associated blade 131a-136a or 131b-136b at locations selected in accordance with teachings of the present disclosure. Impact arrestors (not expressly shown) may also be disposed on exterior portions of blades 131a-136a and/or 131b-136b in accordance with teachings of the present disclosure. Additional information concerning impact arrestors may be found in U.S. Pat. Nos. 6,003,623, 5,595,252 and 4,889,017.

Fixed cutter rotary drill bits 100 and 100a may be described as having a "single blade" of cutting elements 60 disposed on the leading edge of each blade. Fixed cutter rotary drill bits 100b may be described as having "dual blades" of cutting elements disposed on exterior portions of each blade. Many of the features of the present disclosure will be described with respect to fixed cutter rotary drill bits and other downhole drilling tools having a "single blade" of cutting elements. However, teachings of the present disclosure may also be used with fixed cutter rotary drill bits and downhole drilling tools such as reamers and hole openers which have "dual blades" of cutting elements disposed on associated blades. See FIGS. 3B and 5.

Cutting elements 60 and 60a may include respective substrates (not expressly shown) with respective layer 62 of hard cutting material disposed on one end of each respective substrate. Layer 62 of hard cutting material may also be referred to as "cutting layer" 62. Cutting surface 164 on each cutting layer 62 may engage adjacent portions of a downhole formation to form wellbore 30. Each substrate may have various configurations and may be formed from tungsten carbide or other materials associated with forming cutting elements for rotary drill bits.

Tungsten carbides include monotungsten carbide (WC), ditungsten carbide ($W_2C$), macrocrystalline tungsten carbide and cemented or sintered tungsten carbide. Some other hard materials which may be used include various metal alloys and cermets such as metal borides, metal carbides, metal oxides and metal nitrides. For some applications, cutting layers 62 and an associated substrate may be formed from substantially the same materials. For some applications, cutting layers 62 and an associated substrate may be formed from different materials. Examples of materials used to form cutting layers 62 may include polycrystalline diamond materials including synthetic polycrystalline diamonds. One or more of cutting element features including, but not limited to, materials used to form cutting elements 60 may be modified based on simulations using method 400.

For some applications respective gage pads 150 may be disposed on exterior portions of each blade 131a-136a and 131b-136b proximate respective second end 142. For some applications gage cutters 60g may also be disposed on each blade 131a-136a. Additional information concerning gage cutters and hard cutting materials may be found in U.S. Pat. Nos. 7,083,010, 6,845,828, and 6,302,224.

Rotary drill bit 100a as shown in FIG. 3A may be generally described as having three primary blades 131a, 133a and 135a and three secondary blades 132a, 134a and 136a. Blades 131a, 133a and 135a may be described as "primary blades" or "major blades" because respective first ends 141 of each blade 131a, 133a and 135a may be disposed closely adjacent to associated bit rotational axis 104. Blades 132b, 134b and 136b may be generally described as "secondary blades" or "minor blades" because respective first ends 141 may be disposed on downhole end 122 spaced from associated bit rotational axis 104.

Rotary drill bit 100b as shown in FIG. 3B may be generally described as having three primary blades 131b, 133b and 135b. Rotary drill bit 100b may also include four secondary blades 132b, 134b, 136b and 137b. However the present disclosure is not limited to drill bits having the described number of primary or secondary blades and additional numbers of primary or secondary blades may be present.

Blades 131a-136a and 131b-137b may be generally described as having an arcuate configuration extending radially from associated bit rotational axis 104. The arcuate configuration of the blades 131a-136a and 131b-137b may cooperate with each other to define in part generally cone shaped or recessed portion 160 disposed adjacent to and extending radially outward from associated bit rotational axis 104. Recessed portion 160 may also be described as generally cone shaped. Exterior portions of blades 131-136 associated with rotary drill bit 100 along with associated cutting elements 60 disposed thereon may also be described as forming portions of the bit face or cutting disposed on second or downhole end 122.

Various configurations of blades and cutting elements may be used to form cutting structures for a rotary drill bit or other downhole drilling tool in accordance with teachings of the present disclosure. See, for example, rotary drill bits 100, 100a and 100b, core bit 500 and reamer 600. For some applications, the layout or respective locations for installing each cutting element on an associated blade may start proximate a nose point on one of the primary blades. For example see FIGS. 16A, 17A, and 25A-25B.

Figure 4:
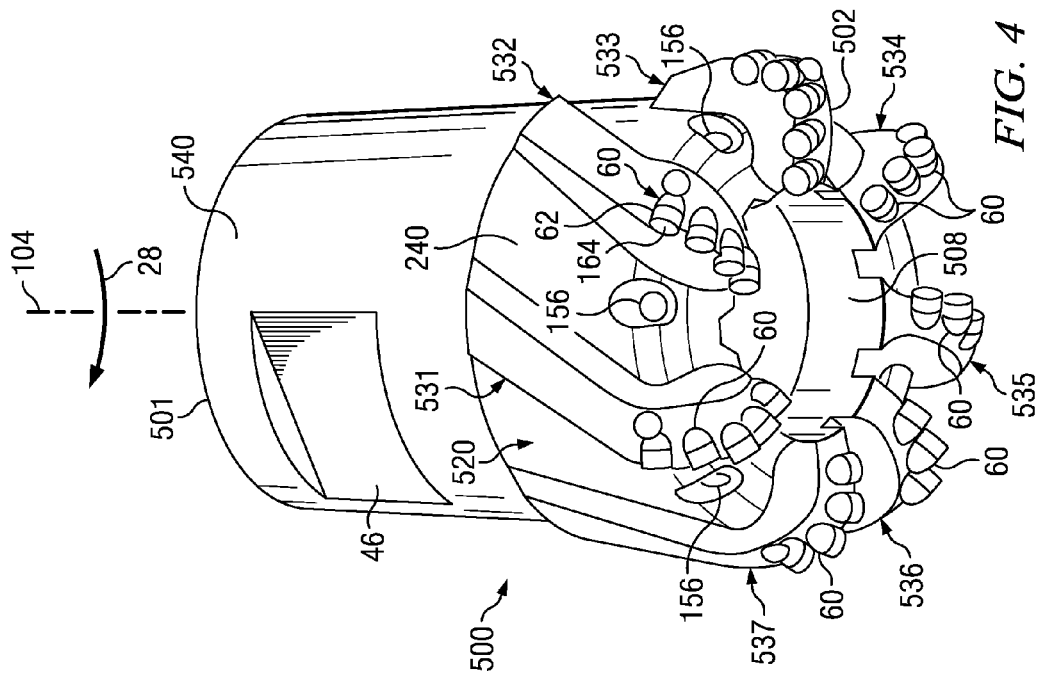
FIG. 4 is a schematic drawing in elevation showing one example of a core bit incorporating teachings of the present disclosure.

Core bit 500 as shown in FIG. 4 may be generally described as having bit body 520 with shank 540 extending therefrom. Core bit 500 may have a generally longitudinal bore or passageway 508 extending from first end 501 through core bit 500 to second end 502. The longitudinal bore 508 may be generally aligned and disposed consistent with associated bit rotational axis 104. Interior portions of longitudinal bore 508 (not expressly shown) may be modified to retain a sample or "core" from a downhole formation therein. A plurality of blades 531-537 may be disposed on exterior portions of bit body 520. A plurality of cutting elements 60 may be disposed on exterior portions of blades 531-537 in accordance with teachings of the present disclosure. Placing cutting elements on exterior portions of respective blades 531-537 in zones using teachings of the present disclosure in different combinations of spiral directions of rotation about the bit axis and in some embodiments further in combination with multilevel force balancing techniques such as those described in copending PCT Patent Application entitled "Multilevel Force Balanced Downhole Drilling Tools and Methods," Serial No. PCT/US09/067,263 filed Dec. 4, 2009, may substantially reduce bit imbalance forces and excessive vibration of the drill string.

Figure 5:
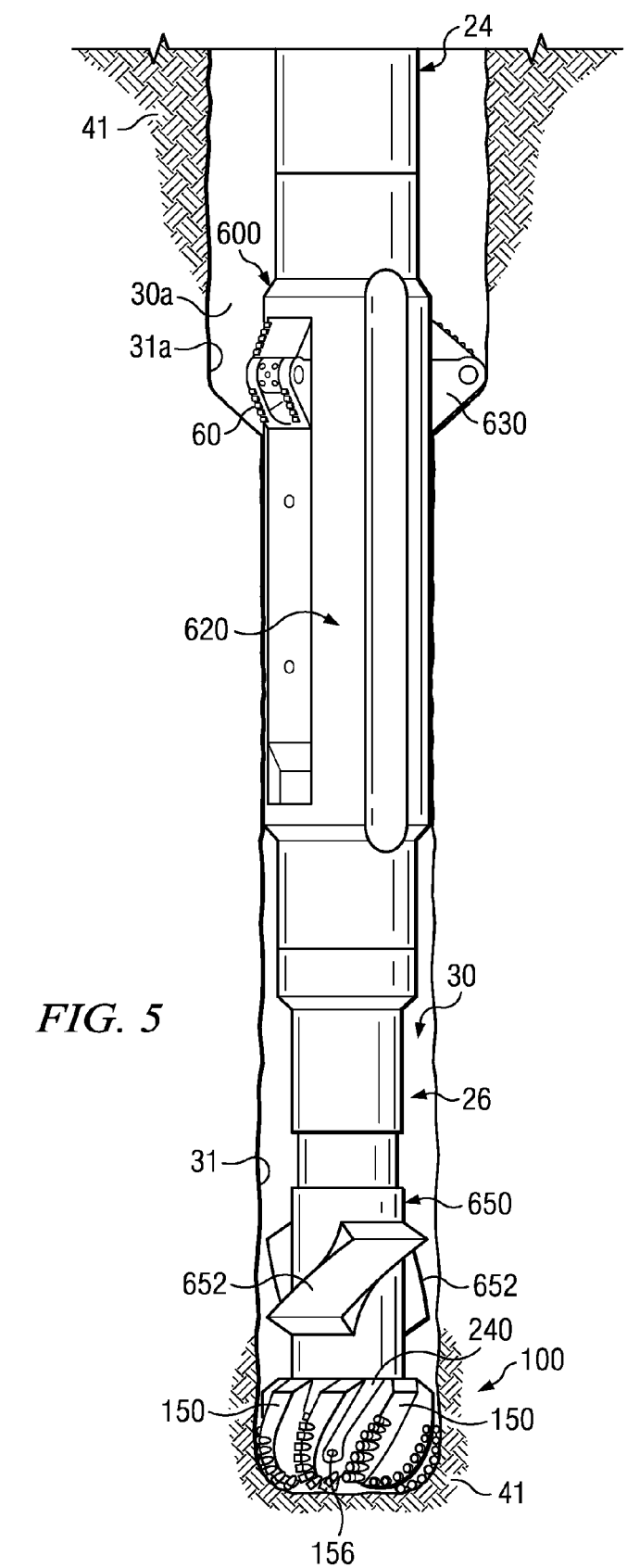
FIG. 5 is a schematic drawing in elevation and in section with portions broken away showing various downhole drilling tools including, but not limited to, a reamer or hole opener and a fixed cutter drill bit incorporating teachings of the present disclosure.

Reamer 600 as shown in FIG. 5 may sometimes be referred to as a "hole opener". Reamer 600 may include generally cylindrical body 620 with a plurality of retractable arms 630 may be disposed on exterior portions thereof. Generally cylindrical body 620 may include a longitudinal bore extending therethrough (not expressly shown) to communicate drilling fluids from drill string 24 to rotary drill bit 100. Cylindrical body 620 may also include a rotational axis (not expressly shown) generally aligned with rotational axis 104 of rotary drill bit 100 while drilling portions of a straight wellbore such as wellbore 30 shown in FIG. 1A. Various mechanisms and techniques may be satisfactorily used to extend and retract retractable arms 630 relative to generally cylindrical body 620.

Respective cutting elements 60 may be disposed on each retractable arm 630 at respective locations based at least in part on multilevel force balancing techniques incorporating teachings of the present disclosure. Retractable arms 630 may extend radially outward so that engagement between cutting elements 60 and adjacent portions of downhole formation may large or increase the diameter of wellbore 30. The increased diameter portion is designated as 31a in FIG. 5.

Various downhole drilling tools including, but not limited, near bit sleeve or near bit stabilizer 650 may be disposed between reamer 600 and rotary drill bit 100. Stabilizer 650 may include a plurality of blades 652 extending radially therefrom. Engagement between exterior portions of blades 652 and adjacent portions of wellbore 30 may be used to maintain desired alignment between rotary drill bit 100 and adjacent portions of BHA 26.

Figure 6A:
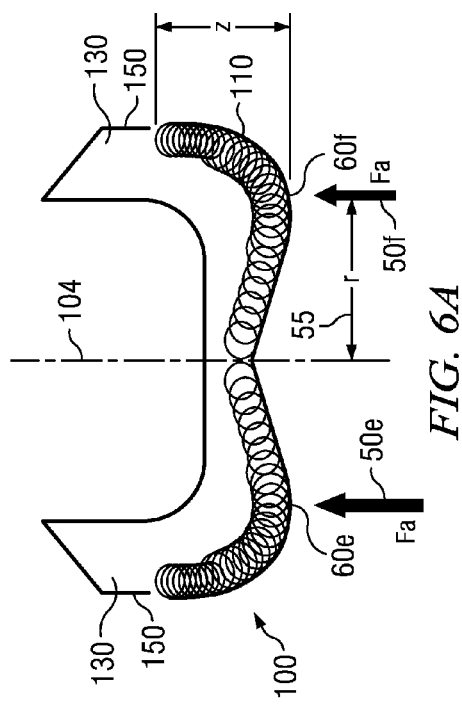
FIGS. 6A and 6B are schematic drawings showing examples of forces which may act on respective cutting elements while forming a wellbore using fixed cutter rotary drill bit.
Figure 6B:
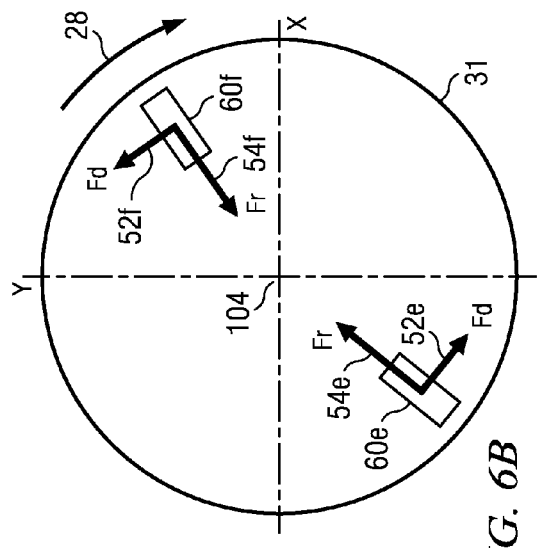
Figure 6C:
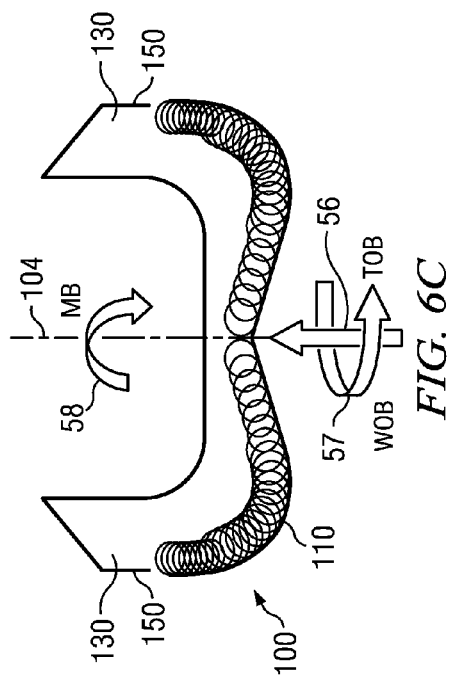
FIGS. 6C and 6D are schematic drawings showing a summation of forces or resulting forces such as bit axial force, torque on bit (TOB), moment on bit (MB) and bit lateral force acting on the rotary drill bit of FIGS. 6A and 6B.
Figure 6D:
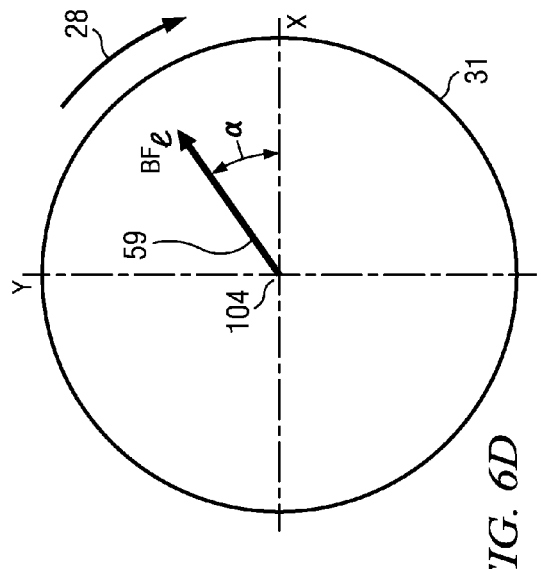

FIGS. 6A and 6B are schematic drawings showing basic forces which act on respective cutting elements 60 disposed on exterior portions of fixed cutter rotary drill bit 100. FIGS. 6C and 6D are schematic drawings showing resulting bit forces or reactive bit forces acting on fixed cutter rotary drill bit 100. FIGS. 6A and 6C show a composite bit face profile 110 associated with fixed cutter rotary drill bit 100. Composite bit face profile 110 may be generally described as a projection of blades 131-136 and associated cutting element 60 onto a radial plane passing through bit rotational axis 104.

Three basic forces (penetration force or axial force ($F_a$), cutting force or drag force ($F_d$), and side force or radial force ($F_r$)) generally act on each cutting element of a downhole drilling tool engaged with adjacent portions of a downhole formation. For cutting elements 60e and 60f respective penetration forces or axial forces ($F_a$) are represented by arrows, 50e and 50f. See FIG. 6A. Respective cutting forces or drag forces ($F_d$) acting on cutting elements 60e and 60f are represented by arrows 52e and 52f. Respective side forces or radial forces ($F_r$) acting on cutting elements 60e and 60f are represented by arrows 54e and 54f. See FIG. 6B.

Resulting bit forces or reactive bit forces acting on rotary drill bit 100 include bit axial force ($BF_a$) represented by arrow 56. The bit axial force ($BF_a$) may correspond generally with weight on bit (WOB). Resulting forces or reactive forces acting on rotary drill bit 100 also include torque on bit (TOB) represented by arrow 57 and bit moment (MB) represented by arrow 58. See FIG. 6C. Bit lateral force ($BF_l$) represented by arrow 59 in FIG. 6D in the summation of cutting element 60 drag forces and radial forces. Reactive forces acting on bit 100 correspond with the summation of respective forces ($F_a$, $F_d$ and $F_r$) applied to each cutting element 60 disposed on exterior portions of fixed cutter rotary drill bit 100.

Bit lateral force ($BF_l$) represented by arrow 59 in FIG. 6D may be further divided into two component vectors bit lateral drag force ($BF_d$) and bit lateral radial force ($BF_l$). Bit lateral drag force ($BF_d$) represents the sum of all drag forces ($F_d$) acting on all cutting elements 60 and bit lateral radial force ($BL_r$) represents the sum of all radial forces ($F_r$) acting on all cutting elements 60.

Bit moment (MB) may be divided into two vectors: bit axial moment ($MB_a$) corresponding with the sum of axial moments acting on all cutting elements 60 and bit lateral moment ($MB_l$) corresponding with the sum of all lateral moments acting on all cutting elements 60. The respective axial moment associated with each cutting element 60 may be determined by multiplying the radius from each cutting element to bit rotational axis 104 by the respective axial force ($F_a$). For cutting element 60f, the associated cutting element axial moment is equal to radius 55 multiplied by axial force ($F_a$). See FIG. 6A.

The lateral moment for each cutting element 60 is equal to the respective radial force ($F_r$) applied to each cutting element multiplied by a distance from each cutting element 60 to a pre-determined point on bit rotational axis 104.

Forces acting on each cutting element may be a function of respective cutting element geometry, location and orientation relative to associated bit body 120, bit rotational axis 104, respective downhole formation properties and associated downhole drilling conditions. See Appendix A. For some applications each cutting element 60 may be divided into multiple cutlets and the bit forces summarized for each cutlet on the associated cutting element 60. Design and manufacture of fixed cutter rotary drill bit 100 with cutting elements 60 disposed at selected locations to reduce or minimize both bit lateral forces and bit moments based at least in part on laying out inner cutters 60i and outer cutters 60o in different spiral directions in relation to bit rotation around bit rotational axis 104 to substantially reduce imbalance forces and torque acting on a rotary drill bit and other downhole drilling tools and, in some embodiments, further based on multilevel force balancing may result in satisfactorily managing associated bit imbalance forces.

FIGS. 7A-7B and FIGS. 8A-8B show examples of prior layout procedures or techniques used to select locations for placing all cutting elements on exterior portions of blades disposed on an associated bit body starting from an associated bit rotational axis and extending radially outward in a spiral direction following bit rotation (FIGS. 7A-7B) or installing all cutting elements starting from an associated bit rotational axis and extending radially outward in a spiral direction opposite to bit rotation (FIGS. 8A-8B). FIGS. 7A and 8A are schematic drawings showing downhole end or cutting face 126a and 126b. Portions of corresponding composite cutting face profiles or bit face profile 110a and 110b are shown in FIGS. 7B and 8B.

Blades 91, 93 and 95 may be described as "primary blades" or "major blades" because respective first end 141 of each blade 91, 93 and 95 is disposed closely adjacent to bit rotational axis 104. Blades 92, 94 and 96 may be described as "secondary blades" or "minor blades" because respective first end 141 of each blade 92, 94 and 96 is spaced radially from bit rotational axis 104. Respective second end 142 of each blade 91-96 is radially spaced from bit rotational axis 104 proximate the outside diameter of bit body 100.

For prior fixed cutter rotary drill bits such as represented by cutting face 110a the location for installing the first cutting element was typically selected on the first end of a primary blade closely adjacent to the bit rotational axis. Locations selected for installing additional cutting elements were generally selected in either the direction of bit rotation or in a reverse to bit rotation.

For cutting face 110a in FIG. 7A, the location for installing first cutting element 1 was selected closely adjacent to both bit rotational axis 104 and first end 141 of blade 91. The location for installing second cutting element 2 was selected at a somewhat greater radial distance from bit rotational axis 104 as compared with cutting element 1. Exterior portions of blade 93 provide desired radial spacing from bit rotational axis 104. The difference between the radial spacing of cutting elements 1 and 2 determine the amount of overlap between respective cutting surfaces of cutting elements 1 and 2 on composite cutting face profile 126. See FIG. 7B. The location for installing cutting element 3 was selected at a greater radial distance from bit rotational axis 104 to provide satisfactory overlap with cutting element 2. See FIG. 7B.

For the example represented by cutting face 110a in FIG. 7A, cutting element 3 may be disposed proximate exterior portions of blade 95 spaced from bit rotational axis 104 at a radial distance greater than the radial distance between cutting element 2 and bit rotational axis 104. Again, the difference between the radial spacing from cutting element 3 and bit rotational axis 104 and the radial spacing between element 2 and bit rotational axis 104 determines the amount of overlap between cutting surfaces of cutting elements 2 and 3. See FIG. 7B. The remaining cutting elements 4-15 may be disposed on exterior portions of blades 91-96 continuing in a direction corresponding with a spiral direction of rotation following bit rotation relative to bit rotational axis 104. See arrow 28.

FIGS. 8A and 8B show one example for installing all cutting elements 1-15 on exterior portions of associated blades 91-96 in a generally reverse direction relative to the direction of rotation shown by arrow 28. FIGS. 7B and 8B show composite cutting face profiles 126a and 126b depicting cutter locations and overlaps.

Tables 1 and 2 below describe example algorithms used to analyze steerability and other forces acting on example rotary drill bits such as those shown in FIG. 7A and FIG. 8A respectively. In general, gage cutters were found to be more steerable in the reverse cutter layout.

TABLE 1

Analysis of Bit Steerability and Forces on a Rotary Drill Bit (Bit A) wherein all Cutting Elements have been Laid out in a Spiral Direction Following Bit Rotation (e.g., bit depicted in FIG. 7A) Direction By Design: Major Results of PDC Bit Steerability PDC Bit Name: Bit A, Bit Size: 12.25 inch; Hole Size: 12.25 inch Input Bit Operational Parameters Drilling Mode: Kick Off Drilling; BHA System = RSS-Push
Input Type = RPM-ROP-DLS
Bit RPM = 120; Bit ROP = 60 ft/hr, DLS = 5 deg/100 ft
Tilt length from bit fact top = 245 inch; Bit face top to sleeve top = 3.9692 inch
Input Rock Information First Layer Rock = 18000 psi; Second Layer Rock = 18000 psi
Rock Dip Angle = 0 Degrees
Calculated Average Bit ROP, WOB and TOB Input ROP = 60 ft/hr; Calculated WOB = 25978.6523 lbs; Calculated TOB = 5863.3398 lb-ft.

TABLE 1-continued

Analysis of Bit Steerability and Forces on a Rotary Drill Bit (Bit A) wherein all Cutting Elements have been Laid out in a Spiral Direction Following Bit Rotation (e.g., bit depicted in FIG. 7A) Direction By Design: Major Results of PDC Bit Steerability PDC Bit Name: Bit A, Bit Size: 12.25 inch; Hole Size: 12.25 inch Calculated Average Bit Walk Information Bit Walk Tendency = Neutral Walk with Walk Angle-2.7917 deg
Average Bit Walk Force = 33.5345 lbs; Average Bit Walk Rate-0.27531 deg/100 ft
Calculated Average Bit Steerability Information Calculated Bit Steer Index (Lateral/Axial Aggressiveness) = 76.041%
Required Side Force to Steer the Entire Bit = 608.6971 lbs
Required Side Force to Steer All Cutters = 608.6971 lbs
Required Side Force to Steer Cone Cutters = 80.9839 lbs
Required Side Force to Steer Shoulder Cutters = 135.5694 lbs
Required Side Force to Steer Gage Cutters = 392.1441 lbs
Required Side Force to Steer Drop-Ins = 0 lbs
Required Side Force to Steer R1 Cutters = 0 lbs
Required Side Force to Steer Bit Gage Pad = 0 lbs
Required Side Force to Steer 1st Part Sleeve = 0 lbs
Required Side Force to Steer 2nd Part Sleeve = 0 lbs
Calculated Torque Variation Minimal TOB = 5730.1401; Maximal TOB = 5985.2539; TOB Range 255.1138 lb-ft

TABLE 2

Figure 9A:
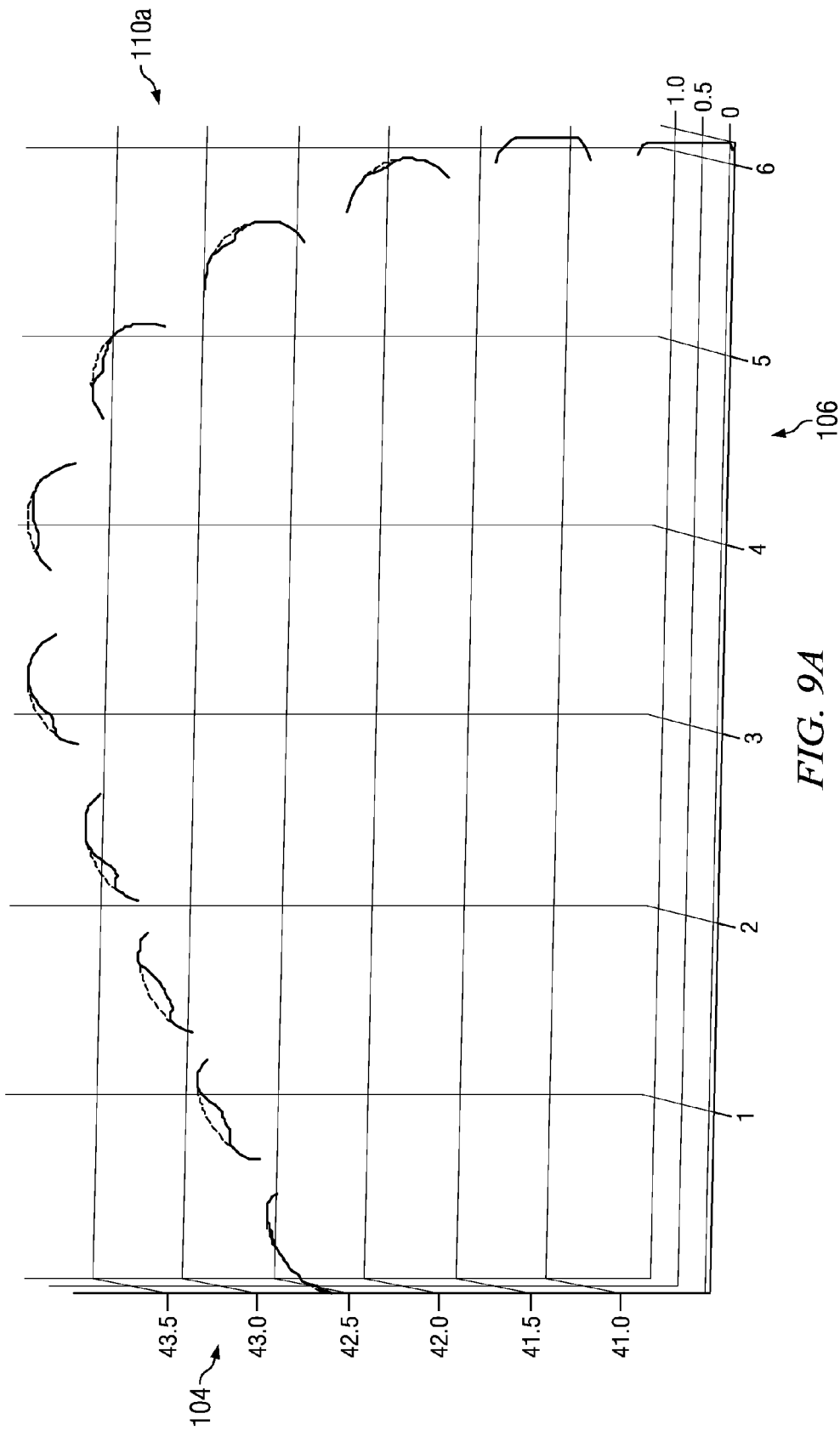
Figure 9B:
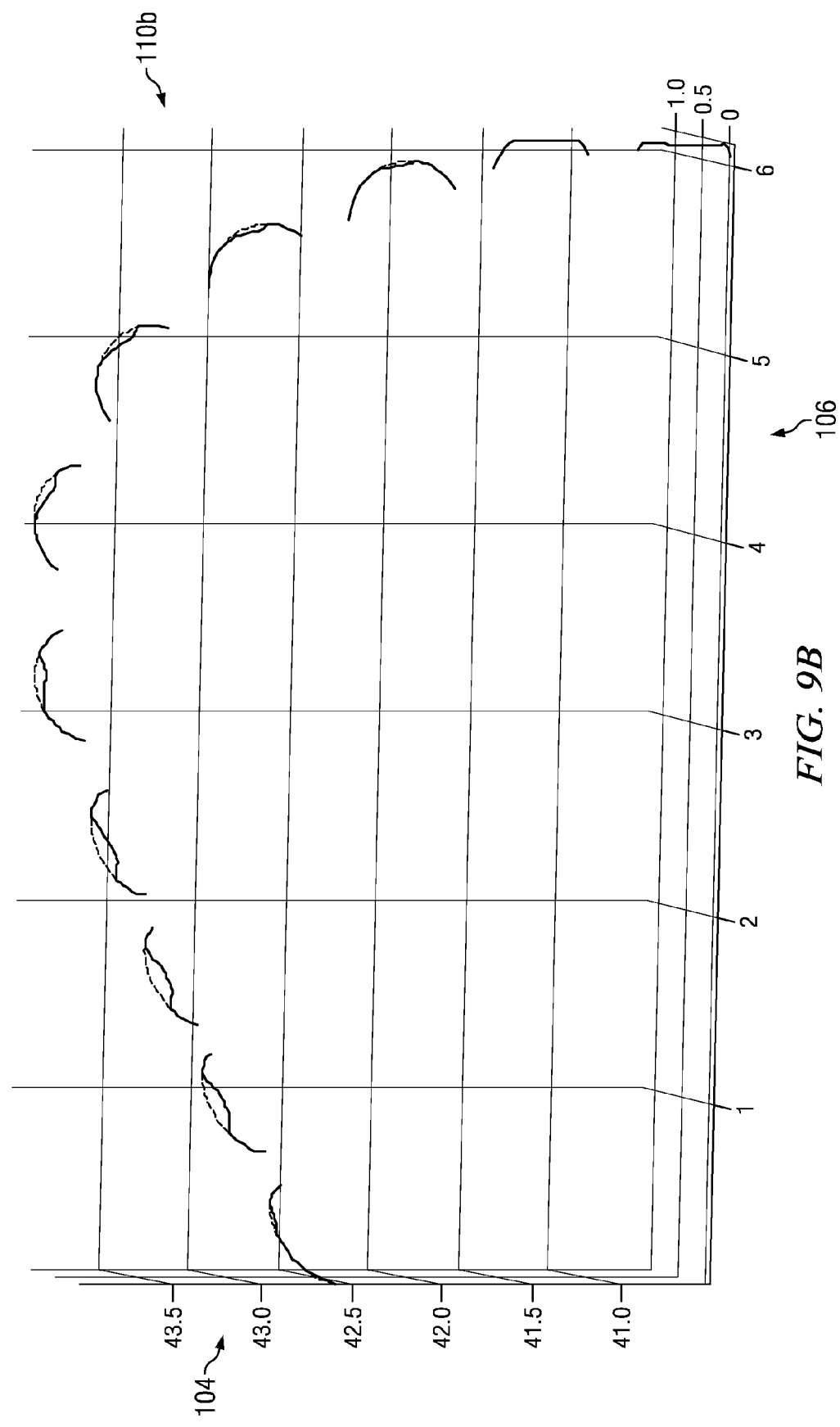

Analysis of Bit Steerability and Forces on a Rotary Drill Bit (Bit B) wherein all Cutting Elements have been Laid out in a Spiral Direction Reversing Bit Rotation (e.g., bit depicted in FIG. 8A) Direction By Design: Major Results of PDC Bit Steerability PDC Bit Name: Bit B, Bit Size: 12.25 inch; Hole Size: 12.25 inch Input Bit Operational Parameters Drilling Mode: Kick Off Drilling; BHA System = RSS-Push
Input Type = RPM-ROP-DLS
Bit RPM = 120; Bit ROP = 60 ft/hr, DLS = 5 deg/100 ft
Tilt length from bit face top = 245 inch; Bit face top to sleeve top = 3.9675 inch
Input Rock Information First Layer Rock = 18000 psi; Second Layer Rock = 18000 psi
Rock Dip Angle = 0 Degrees
Calculated Average Bit ROP, WOB and TOB Input ROP = 60 ft/hr; Calculated WOB = 28530.416; Calculated TOB = 5975.2739 lb-ft.
Calculated Average Bit Walk Information Bit Walk Tendency = Neutral Walk with Walk Angle-4.9232 deg
Average Bit Walk Force = 54.761 lbs; Average Bit Walk Rate-0.47 deg/100 ft
Calculated Average Bit Steerability Information Calculated Bit Steer Index (Lateral/Axial Aggressiveness) = 87.483%
Required Side Force to Steer the Entire Bit = 581.0543 lbs
Required Side Force to Steer All Cutters = 581.0543 lbs
Required Side Force to Steer Cone Cutters = 77.3504 lbs
Required Side Force to Steer Shoulder Cutters = 161.7207 lbs
Required Side Force to Steer Gage Cutters = 341.9833 lbs
Required Side Force to Steer Drop-Ins = 0 lbs
Required Side Force to Steer R1 Cutters = 0 lbs
Required Side Force to Steer Bit Gage Pad = 0 lbs
Required Side Force to Steer 1st Part Sleeve = 0 lbs
Required Side Force to Steer 2nd Part Sleeve = 0 lbs
Calculated Torque Variation Minimal TOB = 5846.5396; Maximal TOB = 6110.9092; TOB Range 264.3696 lb-ft FIG. 9A is a schematic drawing showing cutting zones or cutting areas of cutters on blade No. 1 with cutting elements installed in a spiral direction following bit rotation (i.e., having a cutting face similar to shown in FIG. 7A). FIG. 9B is a schematic drawing showing comparable cutting zones or cutting areas of cutters on blade No. 1 with cutting elements installed in a spiral direction opposite to bit rotation (i.e., having a cutting face 126b as shown in FIG. 8A).

Figure 9C:
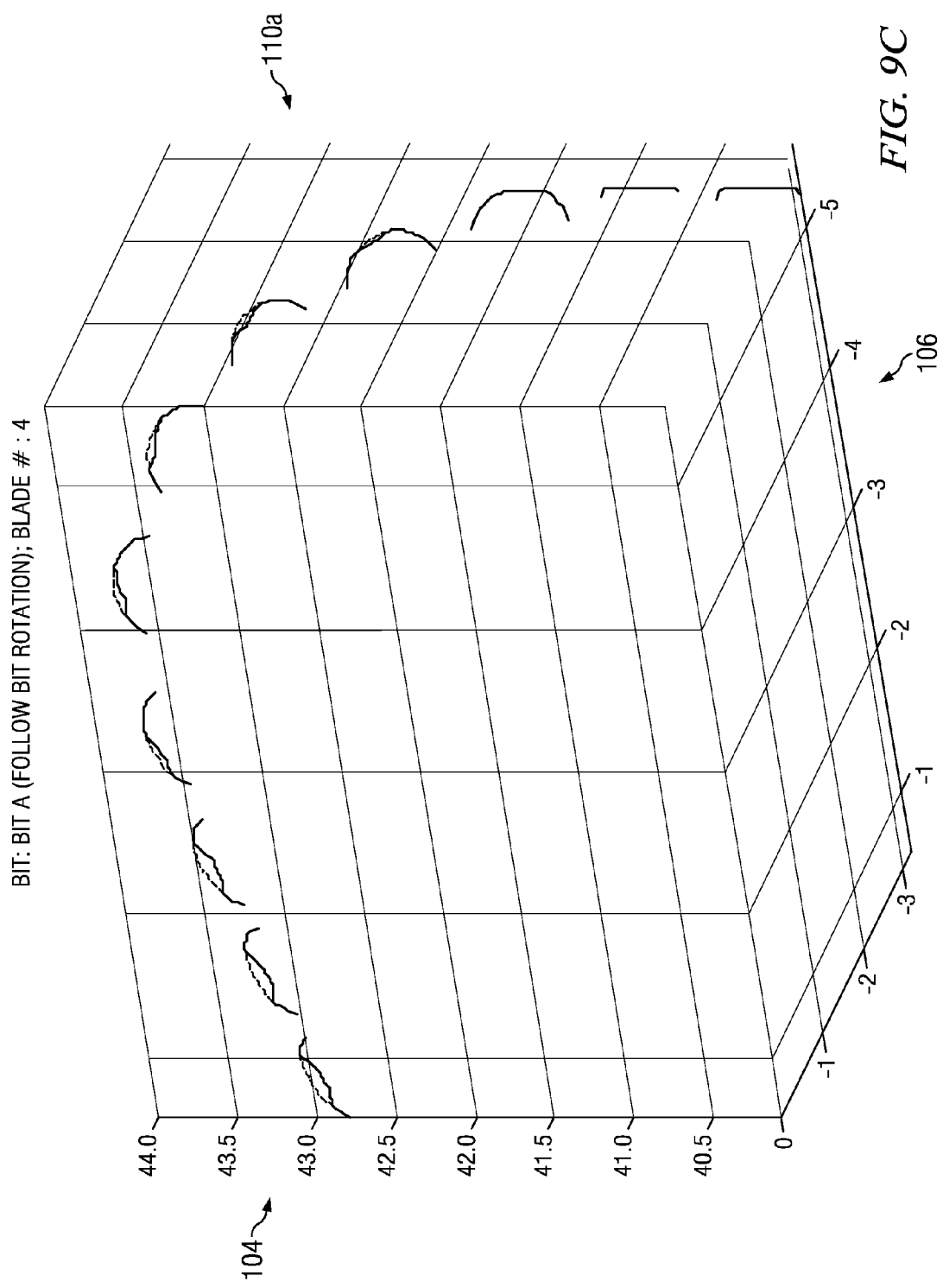
Figure 9D:
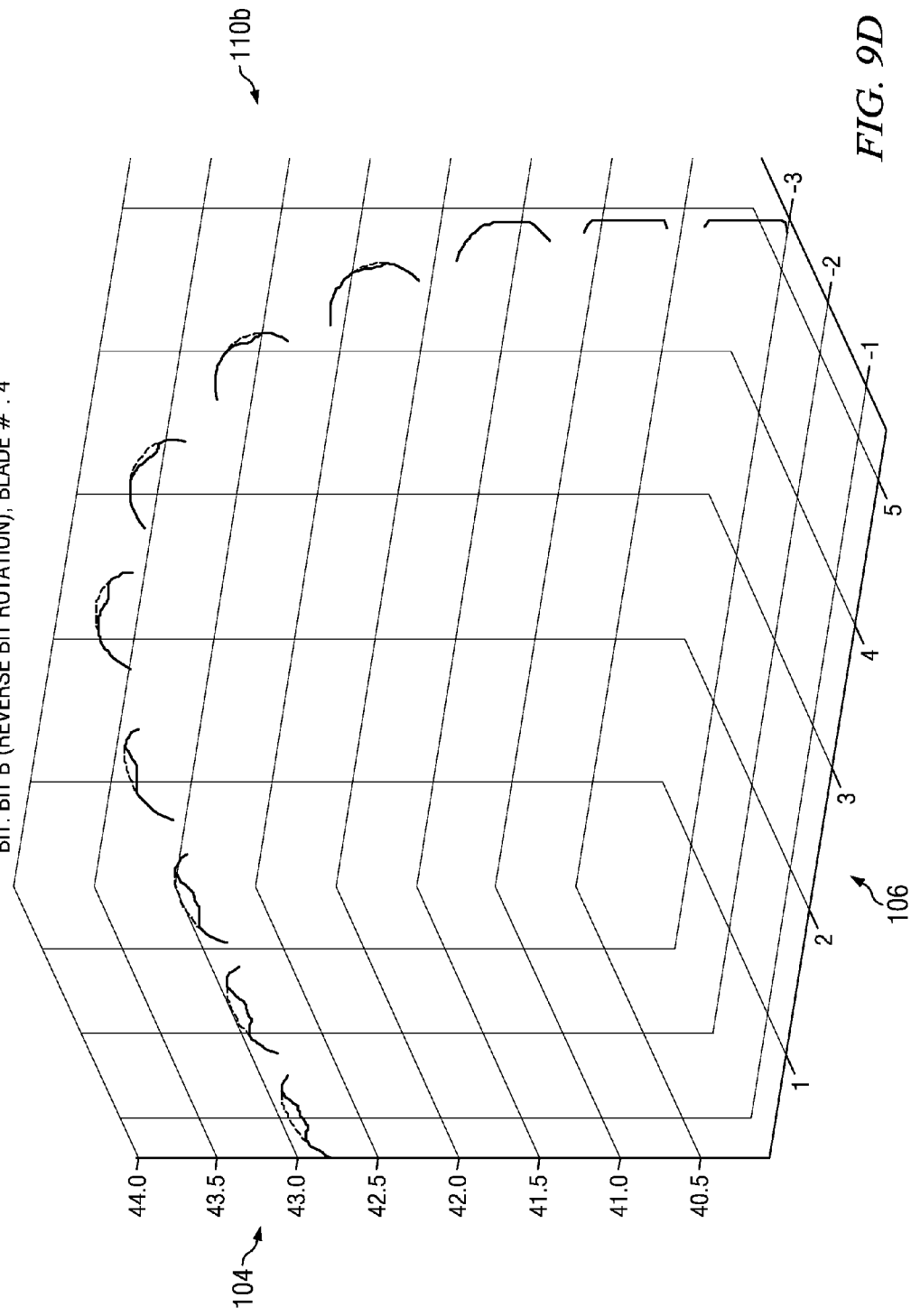

FIG. 9C is a schematic drawing showing cutting zones or cutting areas of cutters on blade No. 4 with cutting elements installed in a spiral direction following bit rotation (i.e., having a cutting face similar to shown in FIG. 7A). FIG. 9D is a schematic drawing showing comparable cutting zones or cutting areas of cutters on blade No. 4 with cutting elements installed in a spiral direction opposite to bit rotation (i.e., having a cutting face similar to those shown in FIG. 8A).

Figure 10A:
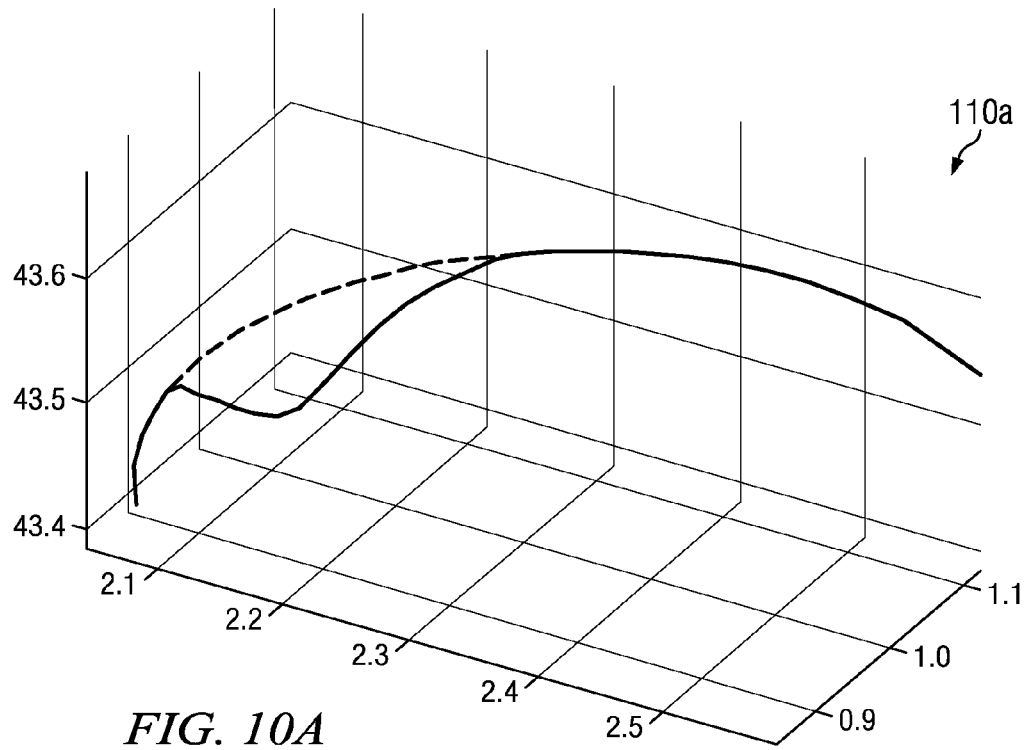
Figure 10B:
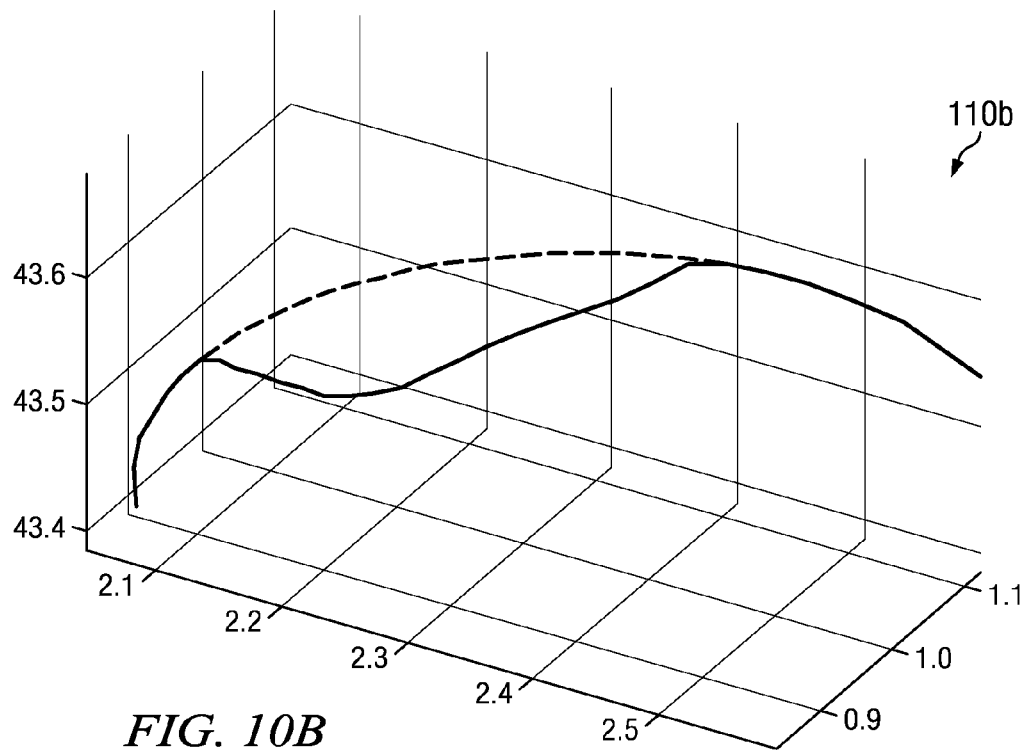

FIG. 10A shows a cutting zone or cutting area of cutter No. 4 on blade No. 1 with cutting elements installed in a spiral direction following bit rotation (i.e., having a cutting face similar to shown in FIG. 7A) and FIG. 10B shows cutting zone or cutting area of cutter No. 4 on blade No. 1 with cutting elements installed in a spiral direction opposite to bit rotation (i.e., having a cutting face similar to shown in FIG. 8A).

Figure 10C:
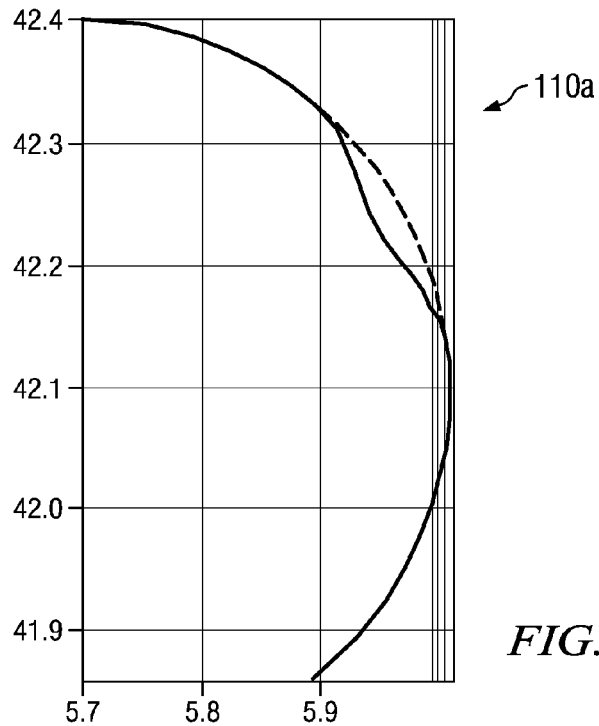
Figure 10D:
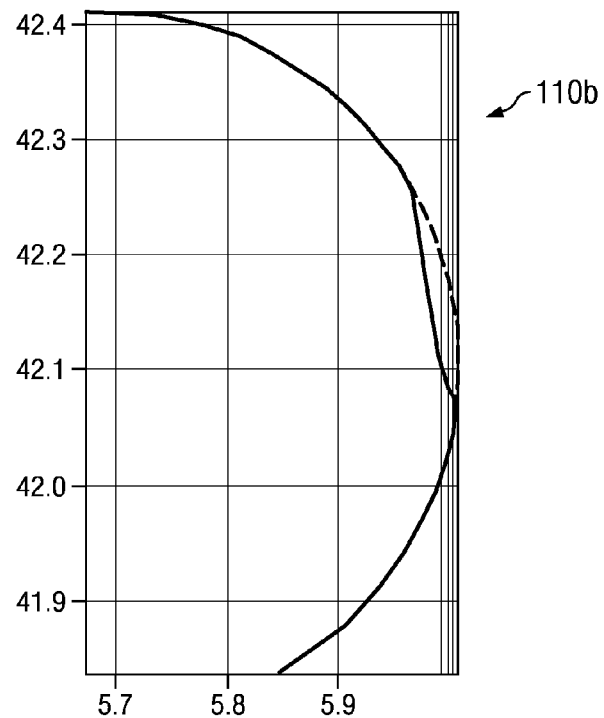

FIG. 10C shows a cutting zone or cutting area of cutter No. 9 on blade No. 1 with cutting elements installed in a spiral direction following bit rotation and FIG. 10D shows a cutting zone or cutting area of cutter No. 9 on blade No. 1 with cutting elements installed in a spiral direction opposite to bit rotation.

Figure 11A:
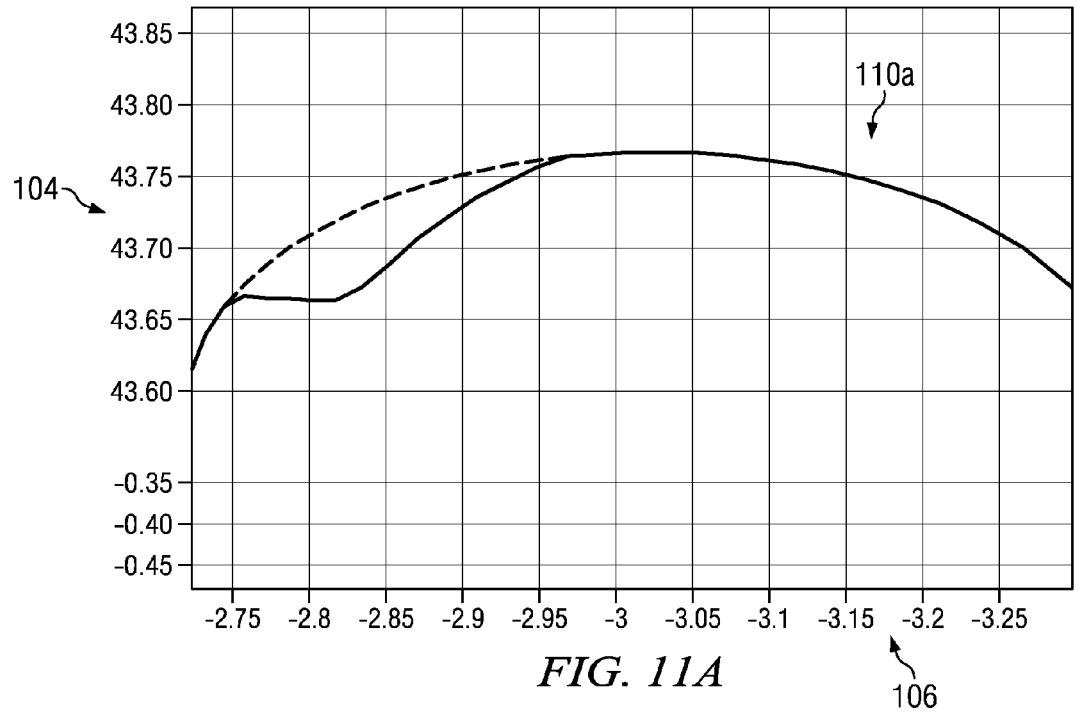
Figure 11B:
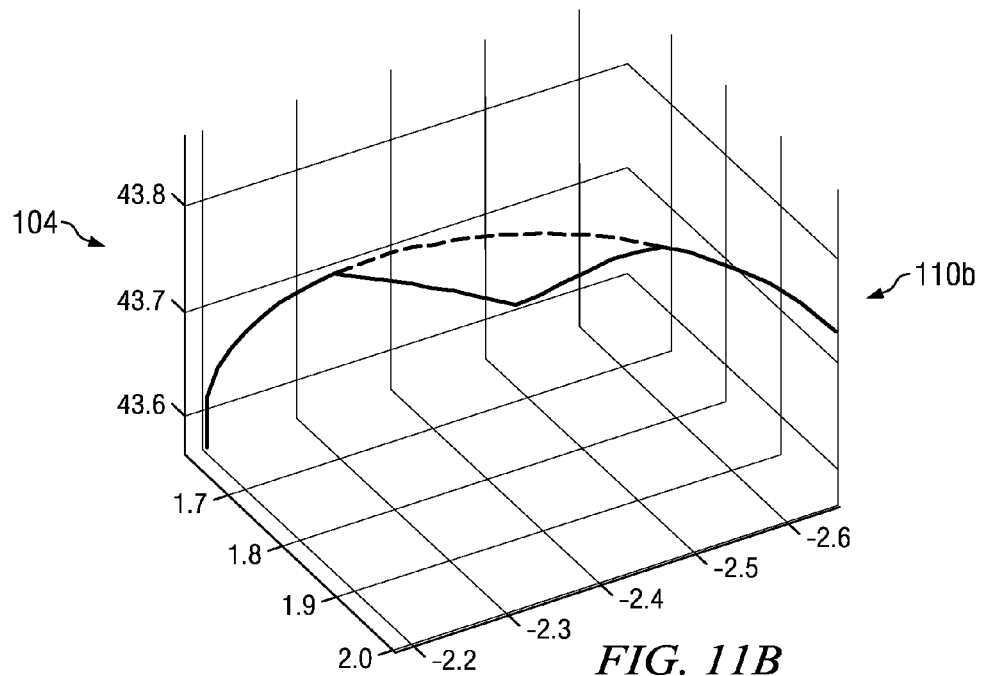

FIG. 11A shows cutting zone or cutting area of cutter No. 4 on blade No. 4 with cutting elements installed on a blade in a spiral direction following bit rotation and FIG. 11B shows a cutting zone or cutting area of cutter No. 4 on blade No. 4 with cutting elements installed on a blade in a spiral direction opposite to bit rotation.

Figure 11C:
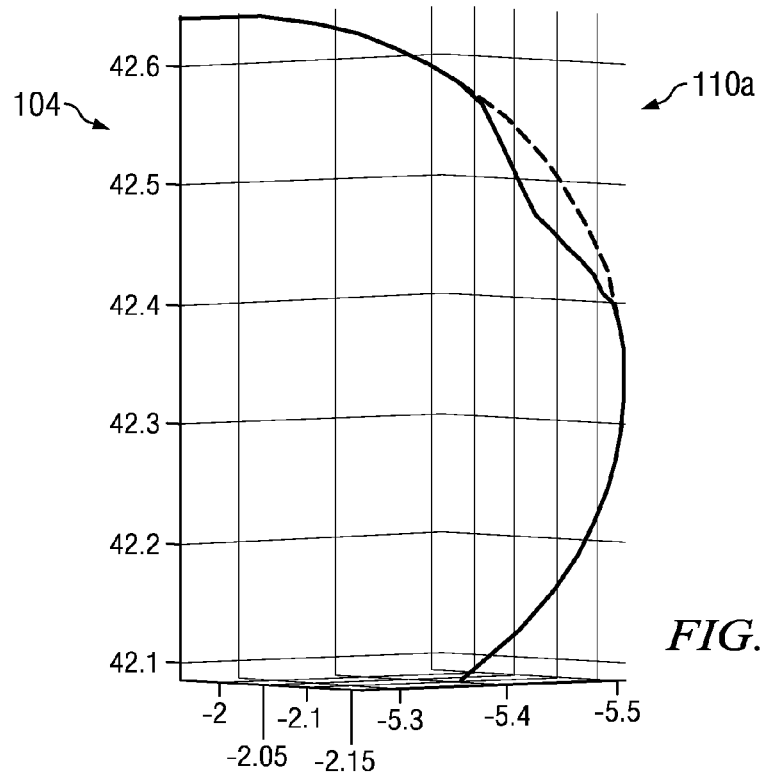
Figure 11D:
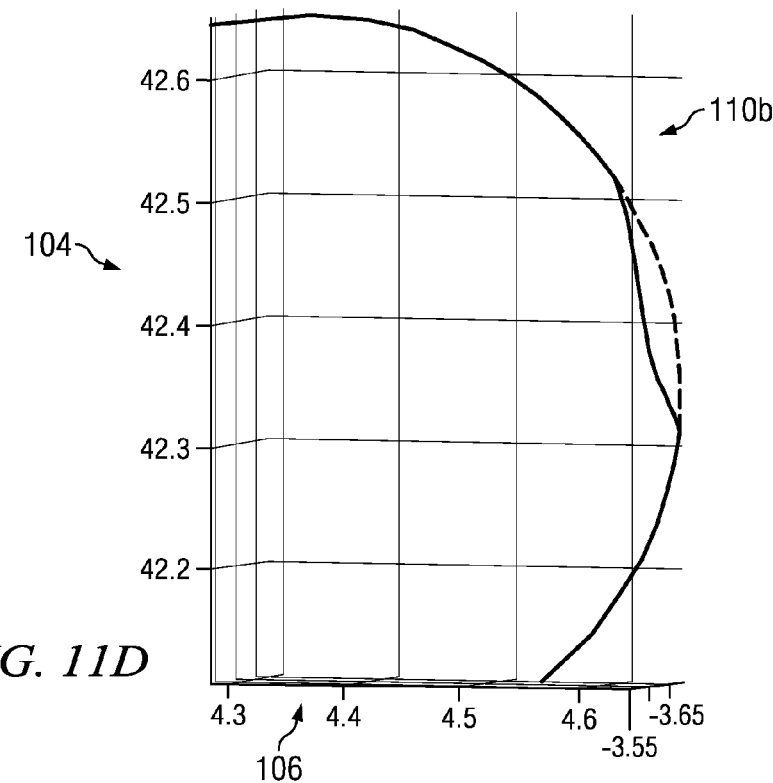

FIG. 11C shows a cutting zone or cutting area of cutter No. 8 on blade No. 4 with cutting elements installed in a spiral direction following bit rotation and FIG. 11D shows cutting zone or cutting area of cutter No. 8 on blade No. 4 with cutting elements installed in a spiral direction opposite to bit rotation;

Comparison of FIGS. 10A and 10B, or FIGS. 10C and 10D, or FIGS. 11A and 11B, or FIGS. 11C and 11D, indicates that the shape and the spatial location of a cutting zone of a cutter may be affected by the layout of cutters on a bit in a respective spiral direction of rotation. In general, when respective cutters are laid out in a spiral direction opposite to bit rotation, the respective cutting zone of each cutter moves outwardly.

Figure 12A:
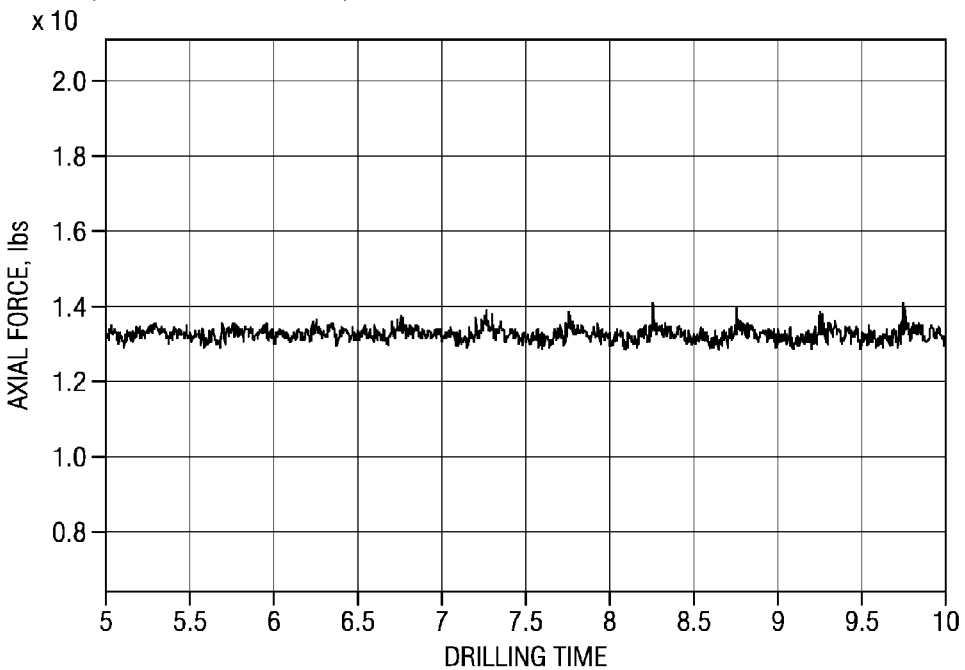
Figure 12B:
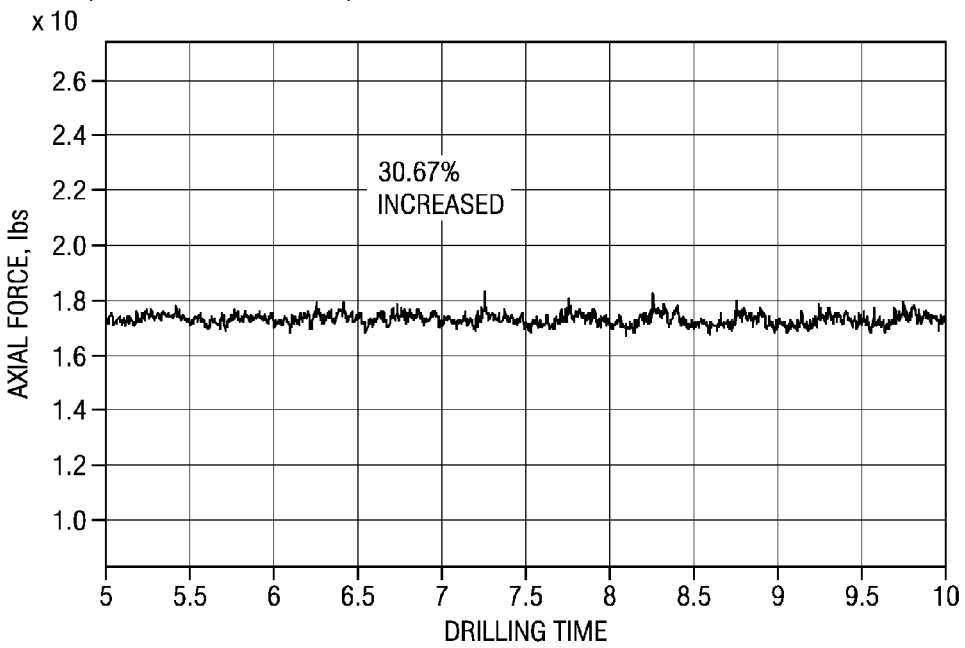

FIGS. 12A and 12B compare the axial forces of cone cutters of two bits with cone cutters laid out in spiral directions following bit rotation and opposite bit rotation, respectively. As shown in this example embodiment the average axial force in the embodiment of FIG. 12A is 13240.1836 lbs and the average axial force in the embodiment of FIG. 12B is 17301.0508 lbs. Average axial forces increased by about 30.67% when cone cutters 60c were laid out in a spiral direction opposite to bit rotation in cone zone 160. Accordingly, in this example embodiment, the drilling efficiency of cone cutters if installed in a spiral direction opposite to bit rotation is significantly reduced.

Figure 12C:
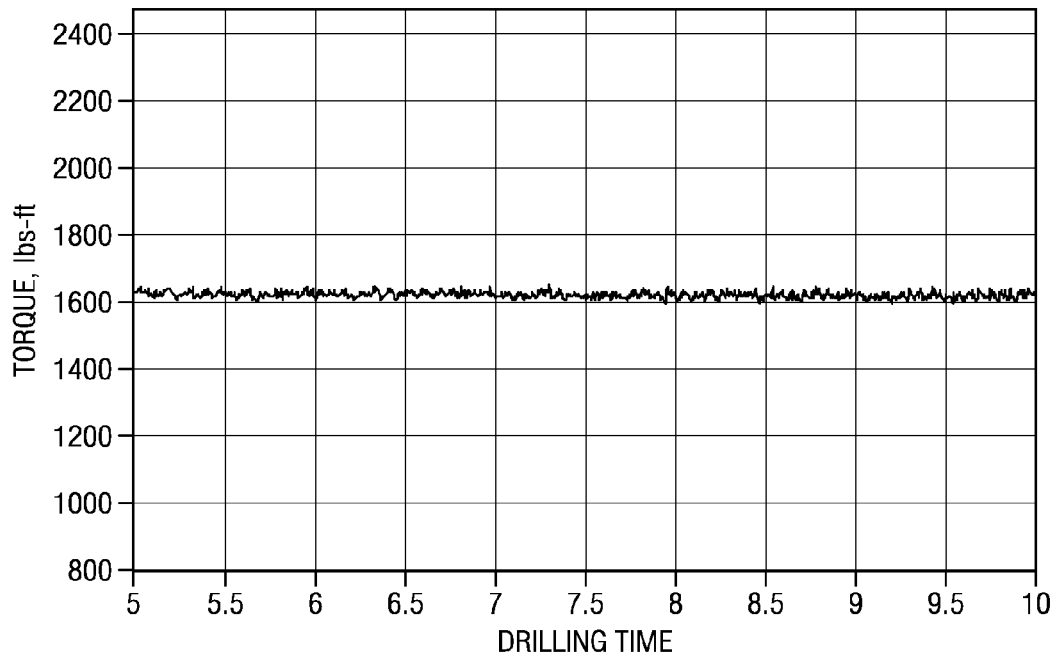
Figure 12D:
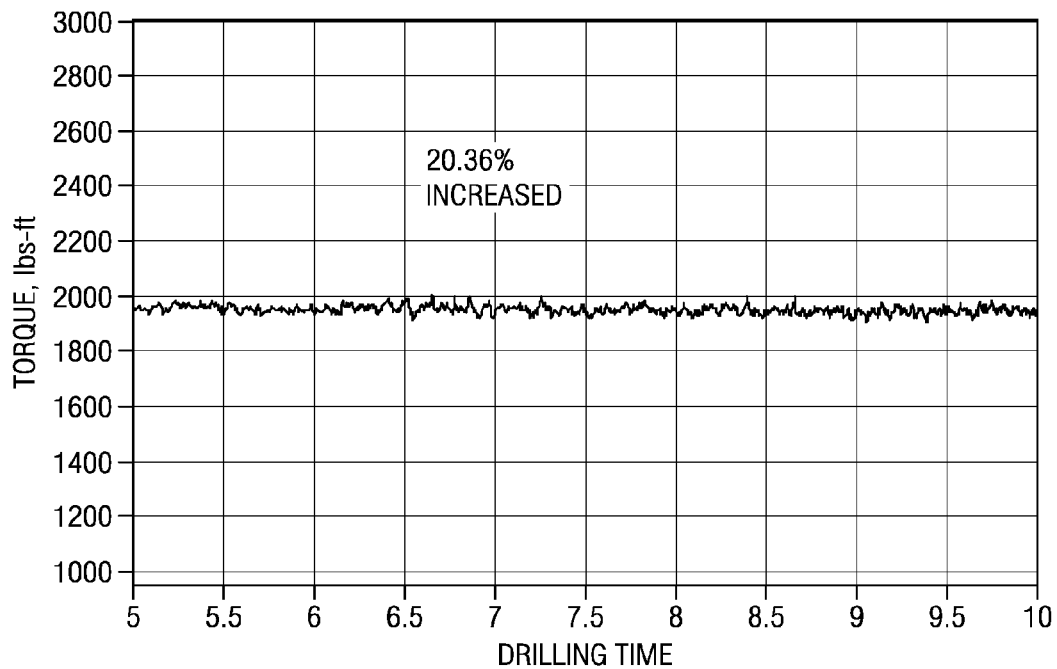

FIGS. 12C and 12D compare the torque force of cone cutters of two bits with cone cutters laid out in spiral directions following bit rotation and opposite bit rotation, respectively. As shown in this example embodiment the average torque in the embodiment of FIG. 12C is 1620.9086 and the average torque in the embodiment of FIG. 12D is 1951.3386. Average torque increased by about 20.39% when cone cutters 60c were laid out in a spiral direction opposite to bit rotation in cone zone 160. Accordingly, in this example embodiment, the drilling efficiency of cone cutters if installed in a spiral direction opposite to bit rotation is significantly reduced.

Figure 13A:
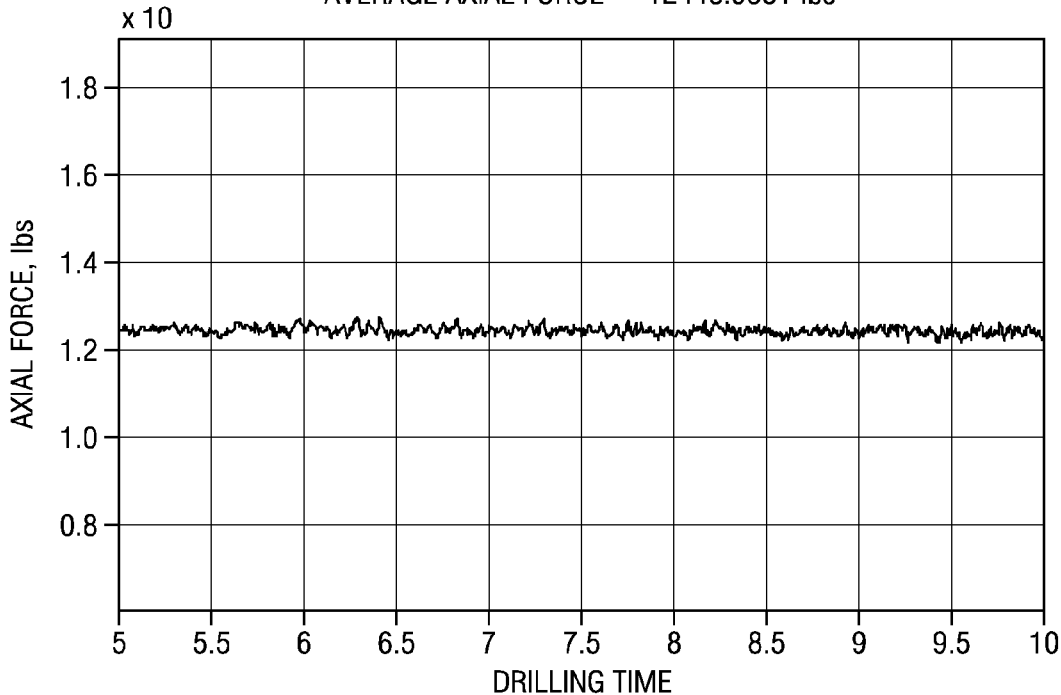
Figure 13B:
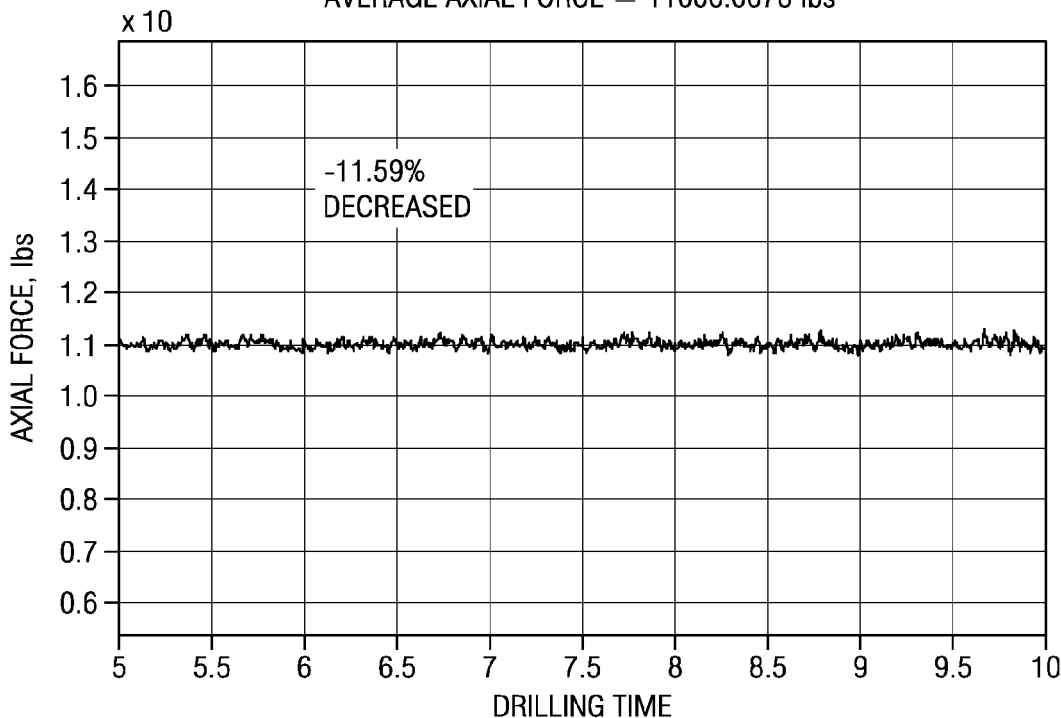

FIGS. 13A and 13B compare the axial forces of shoulder cutters of two bits with shoulder cutters laid out in spiral directions following bit rotation and opposite bit rotation, respectively. As shown in this example embodiment the average axial force in the embodiment of FIG. 13A is 12448.9531 lbs and the average axial force in the embodiment of FIG. 13B is 11006.0078 lbs. Average axial forces decreased by about 11.59% when shoulder cutters 60s were laid out in a spiral direction opposite to bit rotation in shoulder zone 160. Accordingly, in this example embodiment, the drilling efficiency of shoulder cutters if installed in a spiral direction opposite to bit rotation is significantly increased.

Figure 13C:
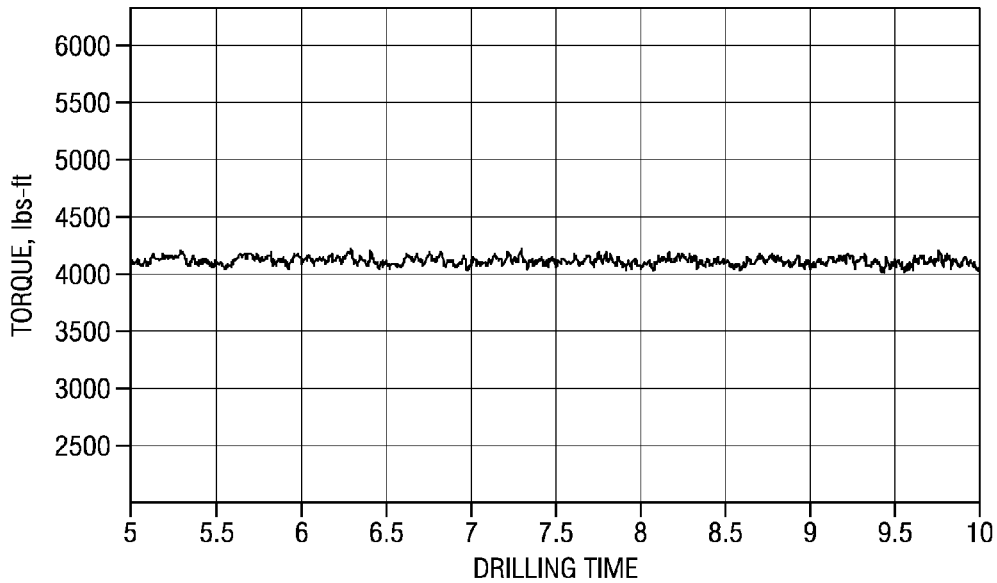
Figure 13D:
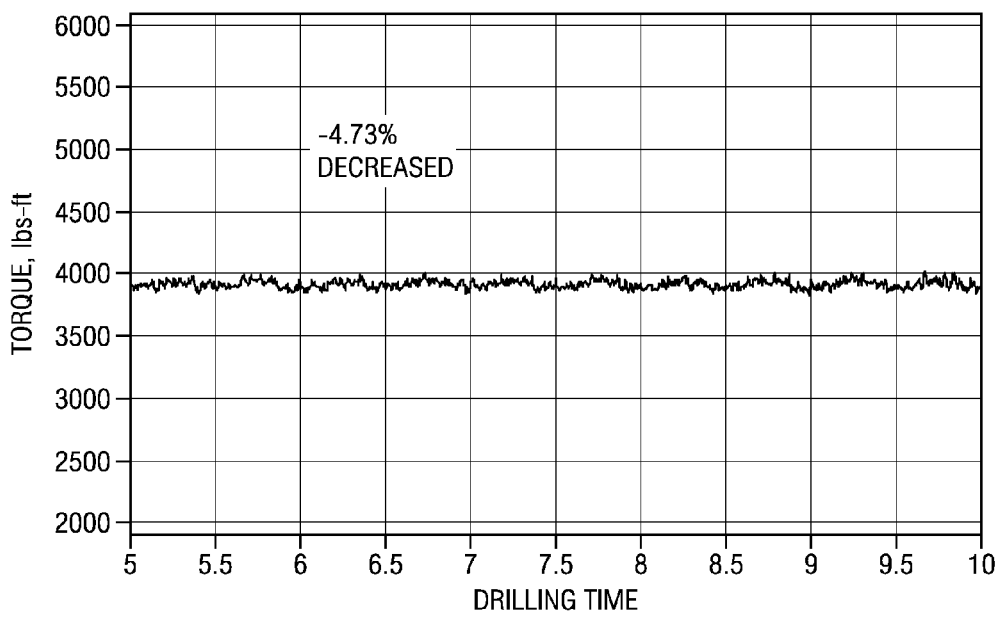

FIGS. 13C and 13D compare the torque forces of shoulder cutters of two bits with shoulder cutters laid out in spiral directions following bit rotation and opposite bit rotation, respectively. As shown in this example embodiment the average torque in the embodiment of FIG. 13C is 4109.4771 and the average torque in the embodiment of FIG. 13D is 3915.0735. Average torque decreased by about 4.73% when shoulder cutters 60s were laid out in a spiral direction opposite to bit rotation in shoulder zone 180. Accordingly, in this example embodiment, the drilling efficiency of shoulder cutters if installed in a spiral direction opposite to bit rotation is increased.

Figure 14A:
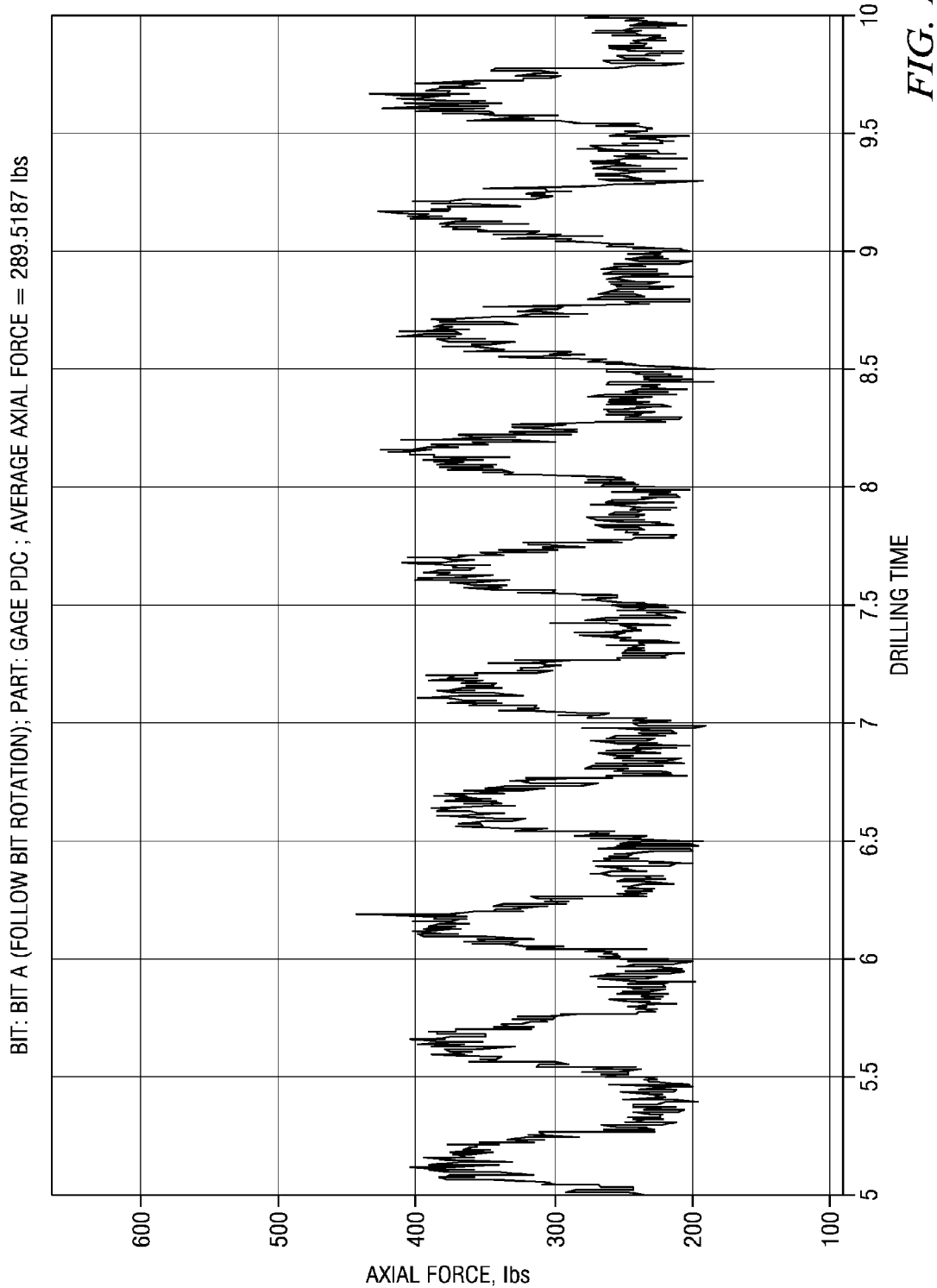
Figure 14B:
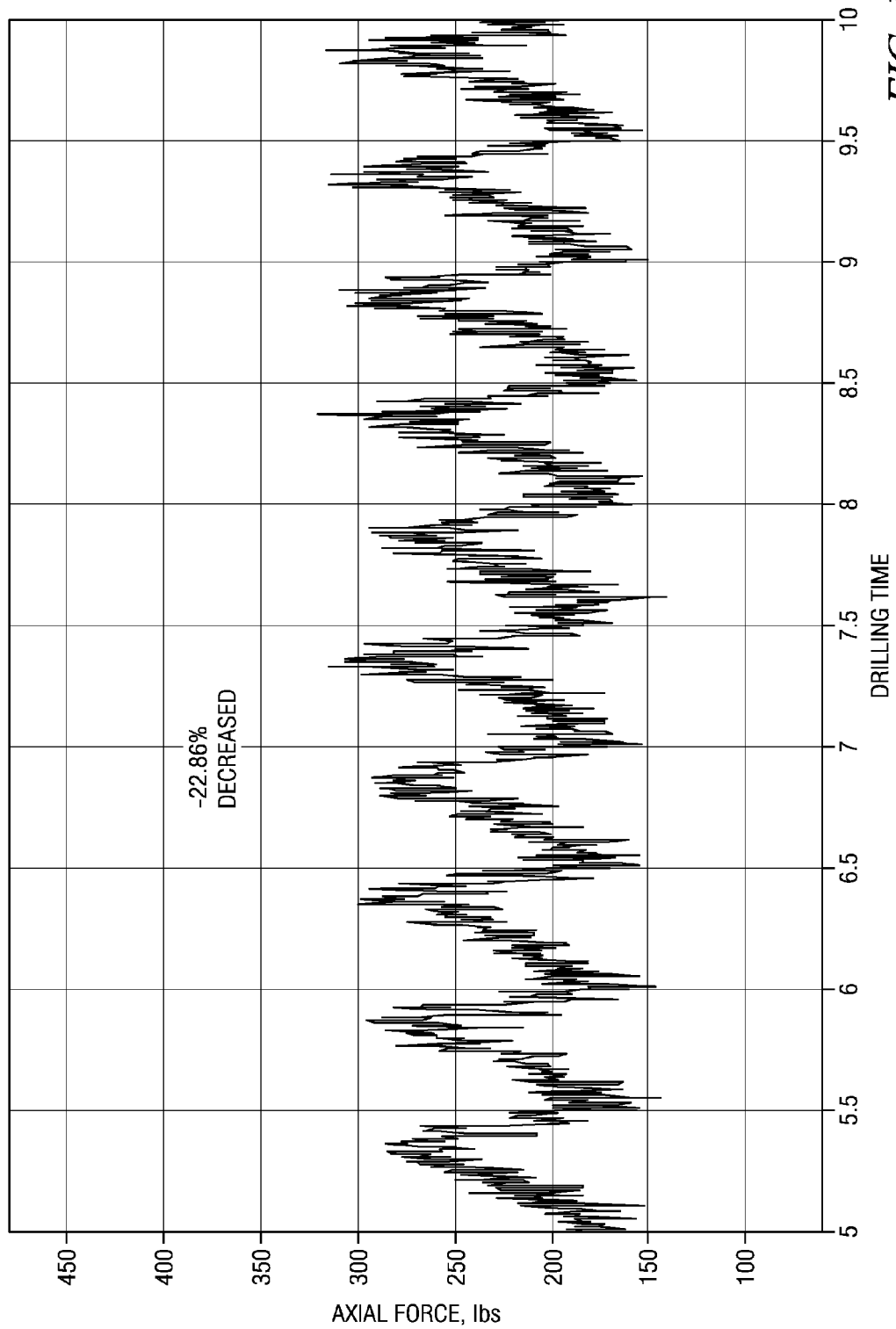

FIGS. 14A and 14B compare the axial forces of gage cutters of two bits with gage cutters laid out in spiral directions following bit rotation and opposite bit rotation, respectively. As shown in this example embodiment the average axial force in the embodiment of FIG. 14A is 289.5187 lbs and the average axial force in the embodiment of FIG. 14B is 223.3335 lbs. Average axial forces decreased by about 22.86% when gage cutters 60g were laid out in a spiral direction opposite to bit rotation in gage zone 150. Accordingly, in this example embodiment, the drilling efficiency of gage cutters if installed in a spiral direction opposite to bit rotation is significantly increased.

Figure 14D:
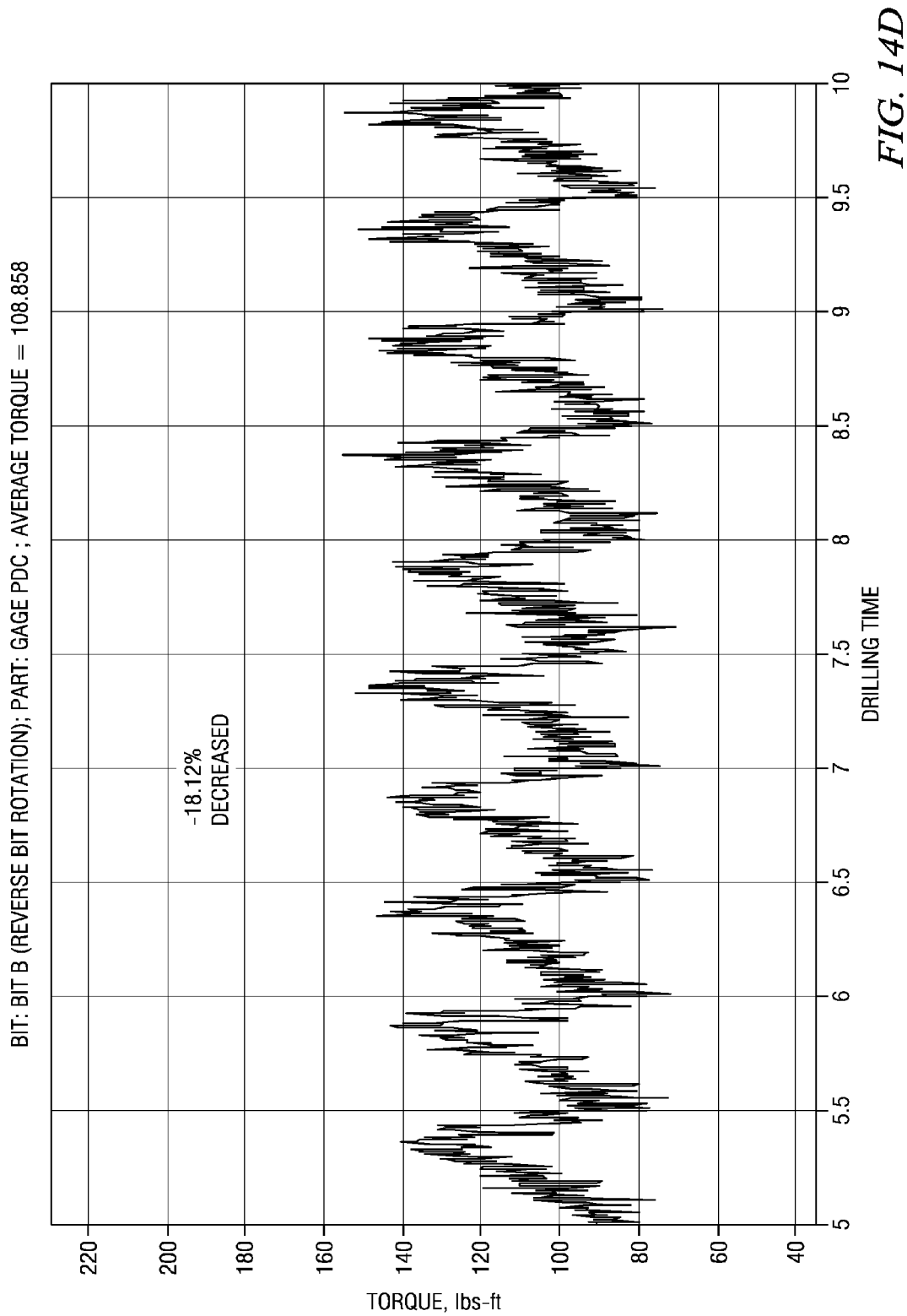

FIGS. 14C and 14D compare the torque forces of gage cutters of two bits with gage cutters laid out in spiral directions following bit rotation and opposite bit rotation, respectively. As shown in this example embodiment the average torque in the embodiment of FIG. 14C is 132.951 and the average torque in the embodiment of FIG. 14D is 108.858. Average torque decreased by about 18.21% when gage cutters 60g were laid out in a spiral direction opposite to bit rotation in gage zone 150. Accordingly, in this example embodiment, the drilling efficiency of gage if installed in a spiral direction opposite to bit rotation is significantly increased.

The results shown in FIGS. 12-14 indicate that, according to some embodiments, drilling efficiency of a bit, measured by both: 1) the required axial force, and 2) torque for a given ROP and RPM, may be significantly increased by laying out inner cutters in a spiral direction following bit rotation and laying out outer cutters in a spiral direction opposite bit rotation.

The present disclosure, in some embodiments, describes design methods for designing rotary drill bits and other well bore tools comprising simulations of rotary drill bits 90 and 100 or other downhole drilling tools such as core bit 500 or reamer 600 for forming wellbores that may comprise: 1) defining various parameters including (but not limited to) layout of cutters on a bit body in accordance to the present teachings; and 2) simulating downhole drilling motion based on these parameters. Function of rotary drill bits and other downhole drilling tools, including forces acting on a downhole tool, and performance and/or efficiency of a downhole tool may then be evaluated based on such a simulation. According to some embodiments, a series of iterative simulations may be performed comprising laying out different cutters, such as cone cutters 60c, nose cutters 60n, shoulder cutters 60s and gage cutters 60g, transit cutters 60t (or in some embodiments outer cutters 60o and inner cutters 60i) in different combinations of spiral direction following or reversing bit rotation 28 to obtain a rotary drill bit with highest (maximum) drilling efficiency and minimal (or reduced) average lateral forces or imbalance forces thereby obtaining locations and directions for laying out cutters on a well tool having an optimum and/or improved performance.

In general, simulations of rotary drill bits 90 and 100 or other downhole drilling tools such as core bit 500 or reamer 600 forming wellbores may use at least six parameters to define or describe downhole drilling motion. See FIG. 15 and also FIGS. 35, 36A and 36B. These parameters include rotational speed in revolutions per minutes (RPM) and rate of penetration (ROP) relative to an associated rotational axis. Tilt rate relative to an x axis and a y axis extending from an associated rotational axis 104 may be used during simulation of directional drilling. See wellbore 30a in FIG. 1A. The rate of lateral penetration along an x axis and the rate of lateral penetration along a y axis may also be used to simulate forming a wellbore in accordance with teachings of the present disclosure. The x axis and y axis may extend perpendicular from each other and from an associated bit rotational axis. For simulation purposes, rate of penetration may remain constant and weight on bit (WOB) may vary. During actual drilling of a wellbore at a field location, weight on bit may often be maintained relatively constant and rate of penetration may vary accordingly depending upon various characteristics of associated downhole formations.

Figure 15:
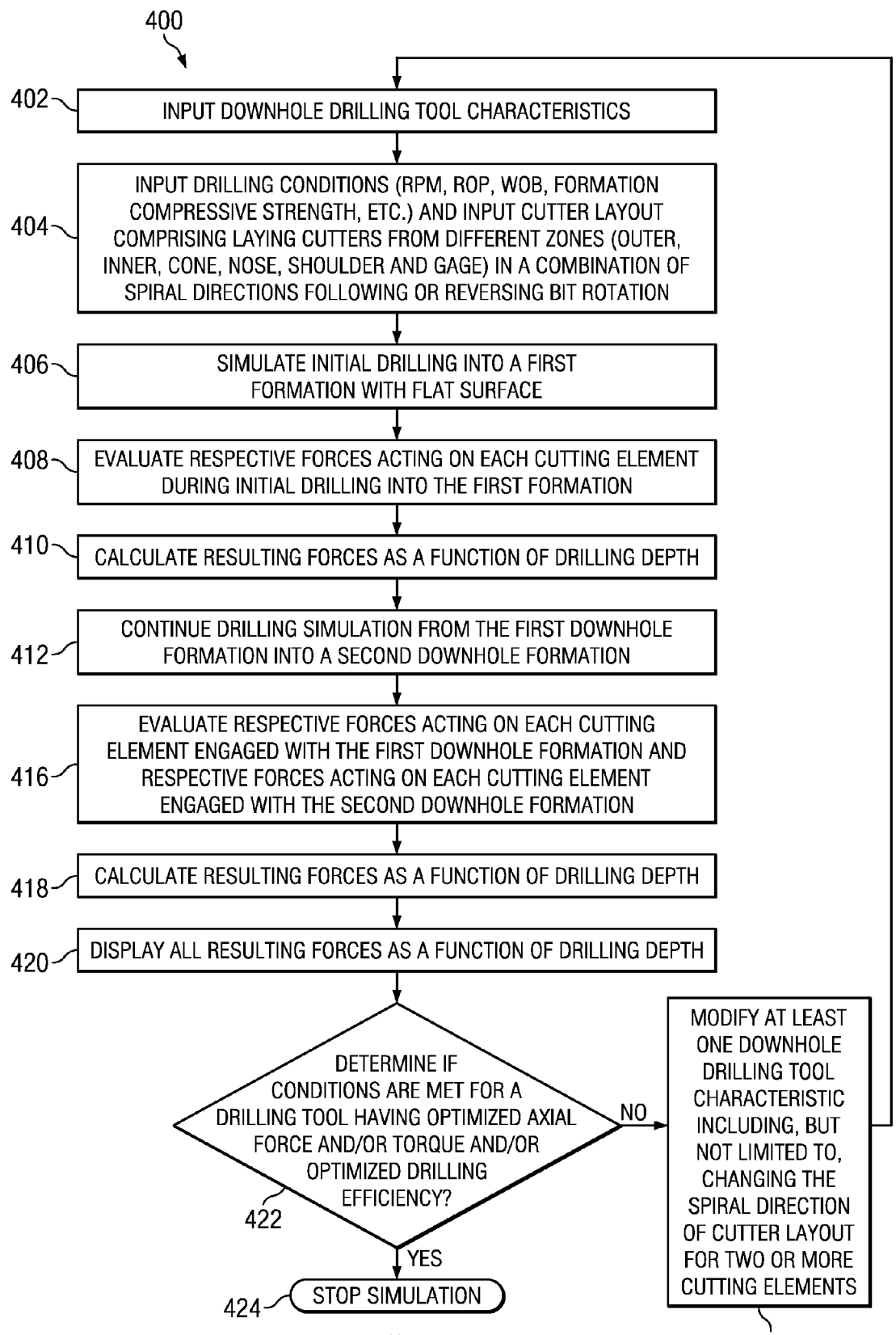
FIG. 15 is a process diagram showing one example of techniques or procedures which may be used to design various downhole drilling tools in accordance with teachings of the present disclosure.

FIG. 15 shows one example embodiment simulation method which may be used to design fixed cutter rotary drill bits and other downhole drilling tools based at least in part on laying out inner cutters 60i and outer cutters 60o in different spiral directions in relation to bit rotation 28 around bit rotational axis 104 to increase bit drilling efficiency and substantially reduce imbalance forces acting on a rotary drill bit and other downhole drilling tools.

Accordingly, in some embodiments, the present disclosure describes methods to design and manufacture a rotary drill bit operable to form a wellbore. As shown in FIG. 15, an example method 400 may begin at step 402 by inputting into a computer (a general purpose computer or a special purpose computer (not expressly shown)) various characteristics of a downhole drilling tool such as rotary drill bits 100, core bit 500 and/or reamer 600. Examples of such downhole drilling tool characteristics are shown in Appendix A at the end of this Written Description.

At step 404 various downhole drilling conditions may be inputted into a computer (such as a general purpose computer or a special purpose computer). Examples of such downhole drilling conditions are shown in Appendix A. According to the present teachings, at step 404, additional conditions that may be inputted into a computer may comprise laying out different cutters, such as cone cutters 60c, nose cutters 60n, transit cutters 60t, shoulder cutters 60s and gage cutters 60g (or outer cutters 60o and inner cutters 60i) in different combinations of spiral directions following or reversing bit rotation 28. Accordingly, cutters in different bit profile zones may be laid out in different combinations of spiral directions of bit rotation.

At step 406 a drilling simulation may start with initial engagement between one or more cutters of a fixed cutter drill bit or other downhole drilling tool and a generally flat surface of a first downhole formation layer at the downhole end of a wellbore. A standard set of drilling conditions may include one hundred twenty (120) revolutions per minute (RPM), rate of penetration (ROP), thirty (30) feet per hour, first formation strength 5,000 psi and second formation strength 18,000 psi.

Respective forces acting on cutting elements disposed on the fixed cutter drill bit or other downhole drilling tool may be evaluated during initial contact between each cutting element and the first downhole formation. Respective forces acting on each cutting element may be evaluated versus depth of penetration of the rotary drill bit or other downhole drilling tool into the first downhole formation. The resulting forces acting on the associated rotary drill bit or other downhole drilling tool may then be calculated as a function of drilling depth at step 410. Respective forces in some embodiments may comprise lateral forces, axial forces and/or torque forces. In some embodiments, well tool design may comprise having a well tool with optimized axial and torque forces. In some embodiments, optimized forces may comprise minimized axial forces and/or minimized torque forces and/or maximized drilling efficiency. Optimization of forces may depend on the bit face profile zone in which a cutter is located.

The drilling simulation may continue to step 412 corresponding with forming the wellbore through the first downhole formation and into a second downhole formation. Respective forces acting on each cutting element engaged with the first downhole formation and respective forces acting on each cutting element engaged with the second downhole formation may then be evaluated at step 416. Resulting forces acting on the fixed cutter rotary drill bit or other downhole drilling tool may then be evaluated as a function of drilling depth in step 418. At step 420, resulting forces acting on the fixed cutter rotary drill bit or other downhole drilling tool may be displayed as a function of drilling depth.

If the resulting forces acting on the fixed cutter rotary drill bit or other downhole drilling tool meet design requirements for optimized axial forces, optimized torque forces and/or optimized drilling efficiency at step 422, the simulation may stop. The downhole drill tool characteristics may then be used to design and manufacture the fixed cutter rotary drill bit or other downhole drilling tool in accordance with teachings of the present disclosure.

If the resulting forces acting on the fixed rotary cutter drill bit or other downhole drilling tool do not meet design requirements for a drilling tool having optimized axial forces, optimized torque forces and/or optimized drilling efficiency at step 422, the simulation may proceed to step 426 and at least one downhole drilling tool characteristic may be modified. For example, the spiral direction of layout with respect to bit rotation in one or more bit face profile zones of cutting elements may be modified. Additionally, the configuration, dimensions and/or orientation of one or more blades disposed on exterior portions of the downhole drilling tool may be modified. In addition, the number of cutters, location or cutters may also be modified.

The simulation may then return to step 402 and method 400 may be repeated. If the simulations based on the modified downhole drilling tool characteristics are satisfactory at step 422, the simulation may stop. If the conditions for a drilling tool having optimized axial forces and/or optimized torque forces and/or optimized drilling efficiency are not satisfied at step 422, further modifications may be made in step 426 such as but not limited to: laying out different cutters, such as cone cutters 60c, nose cutters 60n, transit cutters 60t, shoulder cutters 60s and gage cutters 60g (or outer cutters 60o and inner cutters 60i) in a different combination of spiral directions following or reversing bit rotation 28 as compared to in step 404; and/or modifying the layout of one or more cutters in one or more bit profile zones as compared to the first layout in step 404; modifying at least one downhole drilling tool characteristic in step 404; and the simulation may be repeated with the modified parameters of step 426 starting at step 402 and method 400 repeated until the conditions for optimized axial forces and/or optimized torque forces and/or optimized drilling efficiency of a downhole drilling tool are met at step 422.

In some embodiments, torque forces variations may be minimized or substantially reduced for better toolface control in directional drilling. In some embodiments of the present disclosure, bit stability may be increased due to reduced torque variation and axial force variation from gage cutters. In some embodiments of the present disclosure, bit steerability may be increased due to reduced torque and reduced axial force of outer cutters.

Figure 16A:
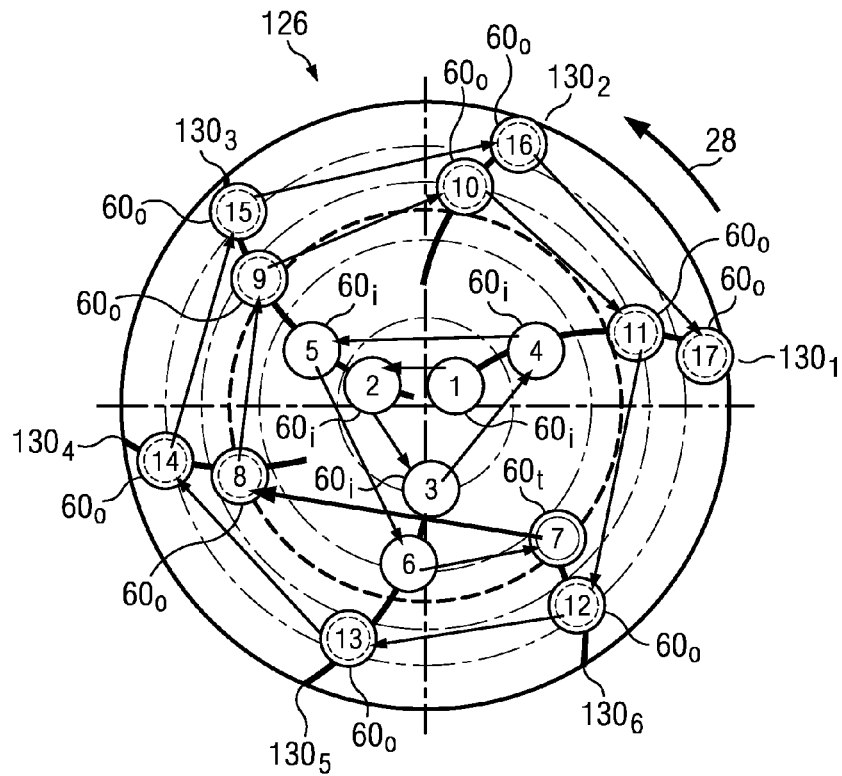
FIGS. 16A and 16B are schematic drawings showing examples of selecting or laying out locations for installing cutting elements relative to a spiral direction of bit rotation, wherein inner cutters are disposed in a direction following bit rotation and outer cutters are disposed in a direction opposite to bit rotation, on an associated composite bit face profile (or cutting face profile) in accordance with one embodiment of the present disclosure.
Figure 16B:
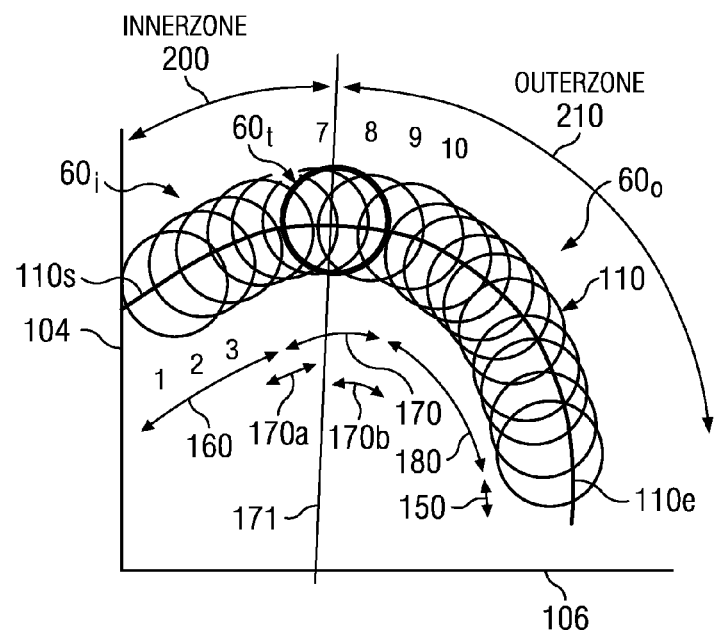

FIGS. 16A and 16B are schematic drawings showing an example embodiment of a drill bit 126 or a well drilling tool made according to a method of the present disclosure (such as method 400 described above) and may comprise selecting or laying out locations for installing cutting elements 60 relative to a spiral direction of bit rotation, wherein inner cutters 60i may be disposed in a direction following bit rotation 28 and outer cutters 60o may be disposed in a direction opposite to bit rotation. FIG. 16A depicts a schematic drawing showing an example composite bit face 126 (or cutting face) in accordance with teachings of the present disclosure comprising portions of bit body (e.g., bit body 100 as shown in FIG. 1B) contacting adjacent portions of a downhole formation. Layout of cutting elements 60 following or reversing a spiral direction of bit rotation 28 is shown. Each cutting element 60 is shown numbered 1-17 in FIG. 16A. In FIG. 16A, outer cutters are depicted as 60o, inner cutters are depicted as 60i and transit cutters are depicted as 60t.

As shown in the embodiment in the cutting face shown in FIG. 16A, a plurality of inner cutters 60i comprising cutting elements 1, 2, 3, 4, 5, and 6 may be disposed on respective portions of associated blades 130 ($130_1$-$130_6$) located in inner zone 200 (shown in FIG. 16B) in a spiral direction following bit rotation 28. As also depicted in the embodiment in FIG. 16A, are a plurality of outer cutters 60o comprising cutting elements 8-17 that may be disposed on respective portions of associated blades 130 ($130_1$-$130_6$) located in outer zone 210 (shown in FIG. 16B) in a spiral direction opposite to bit rotation. Cutting element 7 is referred to as a transit cutter 60t since it marks the transition of cutter layout direction from following the direction of bit rotation to reversing the direction of bit rotation.

FIG. 16B shows a schematic drawing of a bit face profile 110 as measured with respect to bit rotational axis 104 (y axis) from reference line 106 (x axis). FIG. 16B shows beginning of bit face profile 110s, end of bit face profile 110e, cone zone 160, nose zone 170, shoulder zone 180 and gage zone 150, each zone located on respective portions of one or more associated blades 130 ($130_1$-$130_6$). FIG. 16B also shows nose zone 170 having nose point 171 at a location on bit face profile 110 having maximum elevation on bit rotational axis 104 (y axis) from reference line 106 (x axis). Nose zone 170 may comprise a first portion 170a comprising locations on bit face profile 110 from nose point 171 toward the beginning of the bit face profile 110s and a second portion 170b comprising locations from nose point 171 toward end of the bit face profile 110e. In this embodiment there is only one transit cutter 60t, cutter No. 7, which is located within nose zone 170. However, there may be more than one transit cutters 60t in other embodiments and may be located in various zones, not limited to the nose zone, on a bit face profile.

Accordingly, the present disclosure according to some embodiments describes a rotary drill bit (such as but not limited to 90, 100, 100a and 100b) operable to form a wellbore comprising: a bit body with a bit rotational axis 104 extending through the bit body, a plurality of blades 130 disposed on exterior portions of the bit body, each blade having respective cutting elements 60 disposed thereon, a bit face 126 and a bit face profile 110 comprising portions of the bit body contacting adjacent portions of a downhole formation, the bit face profile comprising a cone zone 160, a nose zone 170, a shoulder zone 180 and a gage zone 150, each zone located on respective portions of associated blades, the nose zone 170 having a nose point 171 at a location on the bit face profile having maximum elevation, the nose zone 170 having a first portion of the nose zone 170a comprising locations from the nose point 171 to the beginning of the bit face profile 110s; the nose zone 170 having a second portion of the nose zone 170b comprising locations from the nose point 171 toward the end of the bit face profile 110e; a plurality of inner cutters 60i comprising cutting elements disposed on respective portions of associated blades located in the cone zone 160 and the first portion of the nose zone 170a; the inner cutters 60i disposed in a spiral direction following bit rotation 28; a plurality of outer cutters 60o comprising cutting elements disposed on respective portions of associated blades located in the shoulder zone 180, the gage zone 150, and the second portion of the nose zone 170b; the outer cutters 60o disposed in a spiral direction opposite to bit rotation.

In some embodiments, a downhole drilling tool of the disclosure may be designed to comprise, at least two or more cutting elements may be disposed in a spiral direction following bit rotation and at least two or more cutting elements disposed in a spiral direction opposite to bit rotation.

Figure 17A:
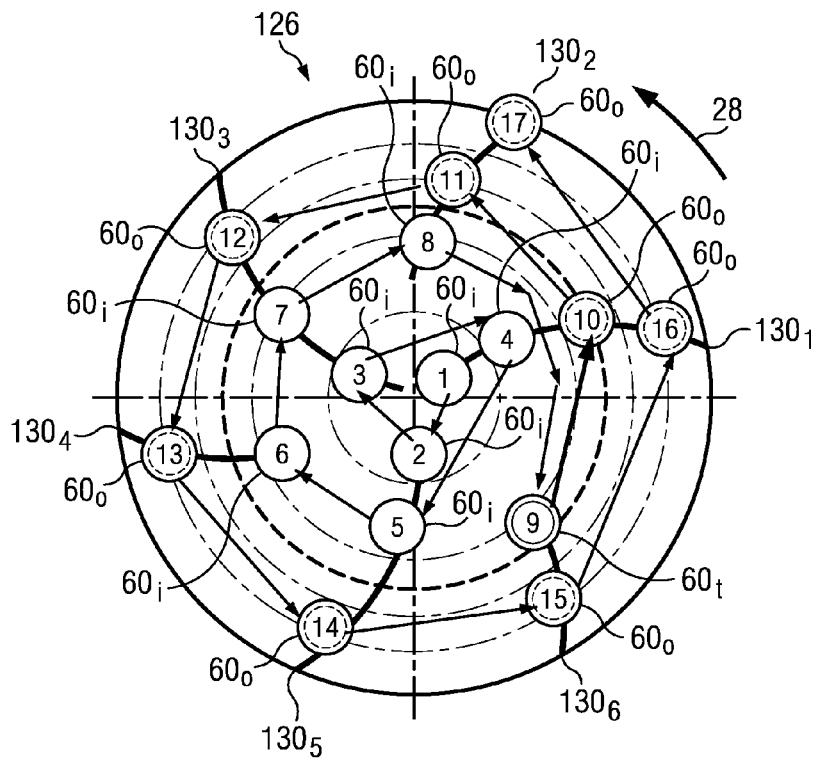
FIGS. 17A and 17B are schematic drawings showing examples of selecting or laying out locations for installing cutting elements relative to the bit rotational axis, wherein inner cutters are disposed in a direction opposite to bit rotation and outer cutters are disposed in a direction following bit rotation, on an associated composite bit face profile (or cutting face profile) in accordance with one embodiment of the present disclosure.
Figure 17B:
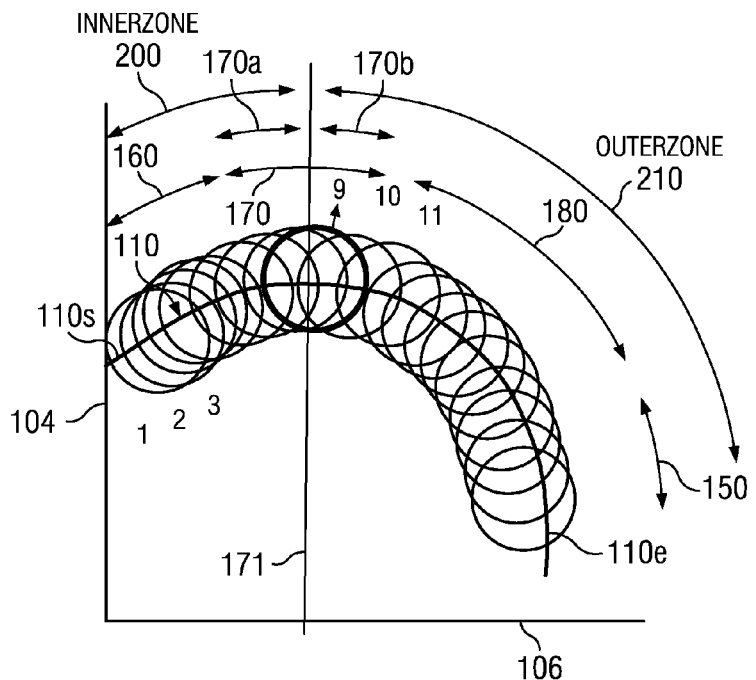

FIGS. 17A and 17B are schematic drawings showing another example embodiment of the present disclosure for selecting or laying out locations for installing cutting elements 60 relative to a spiral direction of bit rotation, wherein inner cutters 60i may be disposed in a direction opposite to bit rotation 28 and outer cutters 60o may be disposed in a direction following bit rotation. FIG. 17A depicts a schematic drawing showing an example composite bit face 126 (or cutting face) in accordance with teachings of the present disclosure comprising portions of bit body (e.g., bit body 100 as shown in FIG. 1B) contacting adjacent portions of a downhole formation. Layout of cutting elements 60 following or reversing a spiral direction of bit rotation 28 is shown. Each cutting element 60 is shown numbered 1-17 in FIG. 17A. In FIG. 17A, outer cutters are depicted as 60o, inner cutters are depicted as 60i and transit cutters are depicted as 60t.

As shown in the embodiment in the cutting face 126 shown in FIG. 17A, a plurality of inner cutters 60i comprising cutting elements 1-8 may be disposed on respective portions of associated blades 130 ($130_1$-$130_6$) located in inner zone 200 (shown in FIG. 17B) in a spiral direction opposite to bit rotation 28. As also depicted in the embodiment in FIG. 17A, are a plurality of outer cutters 60o comprising cutting elements 10-17 that may be disposed on respective portions of associated blades 130 ($130_1$-$130_6$) located in outer zone 210 (shown in FIG. 17B) in a spiral direction following bit rotation. Cutting element 9 is referred to as a transit cutter 60t since it marks the transition of cutter layout direction from reversing the direction of bit rotation to following the direction of bit rotation.

FIG. 17B shows a schematic drawing of a bit face profile 110 as measured with respect to bit rotational axis 104 (y axis) from reference line 106 (x axis). FIG. 17B shows beginning of bit face profile 110s, end of bit face profile 110e, cone zone 160, nose zone 170, shoulder zone 180 and gage zone 150, each zone located on respective portions of one or more associated blades 130 (130$_1$-130$_6$). FIG. 17B also shows nose zone 170 having nose point 171 at a location on bit face profile 110 having maximum elevation on bit rotational axis 104 (y axis) from reference line 106 (x axis). Nose zone 170 may comprise a first portion 170a comprising locations on bit face profile 110 from nose point 171 toward the beginning of the bit face profile 110s and a second portion 170b comprising locations from nose point 171 toward end of the bit face profile 110e. In this embodiment there is only one transit cutter 60t, cutter No. 9, which is located within nose zone 170. However, there may be more than one transit cutters 60t in other embodiments and may be located in various zones on a bit face profile.

Accordingly, the present disclosure according to some embodiments describes a rotary drill bit (such as but not limited to 90, 100, 100a and 100b) operable to form a wellbore comprising: a bit body with a bit rotational axis 104 extending through the bit body, a plurality of blades 130 disposed on exterior portions of the bit body, each blade having respective cutting elements 60 disposed thereon, a bit face 126 and a bit face profile 110 comprising portions of the bit body contacting adjacent portions of a downhole formation, the bit face profile comprising a cone zone 160, a nose zone 170, a shoulder zone 180 and a gage zone 150, each zone located on respective portions of associated blades, the nose zone 170 having a nose point 171 at a location on the bit face profile having maximum elevation, the nose zone 170 having a first portion of the nose zone 170a comprising locations from the nose point 171 to the beginning of the bit face profile 110s; the nose zone 170 having a second portion of the nose zone 170b comprising locations from the nose point 171 toward the end of the bit face profile 110e; a plurality of inner cutters 60i comprising cutting elements disposed on respective portions of associated blades located in the cone zone 160 and the first portion of the nose zone 170a; the inner cutters 60i disposed in a spiral direction opposite to bit rotation 28; a plurality of outer cutters 60o comprising cutting elements disposed on respective portions of associated blades located in the shoulder zone 180, the gage zone 150, and the second portion of the nose zone 170b; the outer cutters 60o disposed in a spiral direction following bit rotation.

Accordingly, in some embodiments, FIGS. 17A-B depict an example of a rotary drill bit or a well tool comprising selecting or laying out locations for installing cutting elements relative to a bit rotational axis, wherein inner cutters 60i may be disposed in a direction opposite to bit rotation and outer cutters 60o may be disposed in a direction following bit rotation.

In some embodiments, the disclosure further provides rotary drill bits and other downhole tools that in addition to having cutters placed at locations based on a spiral direction of bit rotation following or reversing bit rotation, may further comprise placing one or more groups of cutters in a level of force balanced groups and may be balanced at one or more levels. The terms "force balanced" and "force balancing" may be used in this application to describe various methods, procedures and techniques associated with designing rotary drill bits and other downhole drilling tools. Force balancing and levels of force balance are described in detail in copending PCT Patent Application entitled "Multilevel Force Balanced Downhole Drilling Tools and Methods," Serial No. PCT/US09/067,263 filed Dec. 4, 2009.

Fixed cutter rotary drill bits have often been designed to be force balanced based in part on computer models or programs which assume that all associated cutting elements are engaged with a generally uniform downhole formation while forming a wellbore. This traditional type of force balancing generally provides only one level of force balancing. As a result rotary drills and other downhole drilling tools may experience large imbalance forces during transition drilling when all associated cutting elements are not engaged with a generally uniform downhole formation.

Figure 18A:
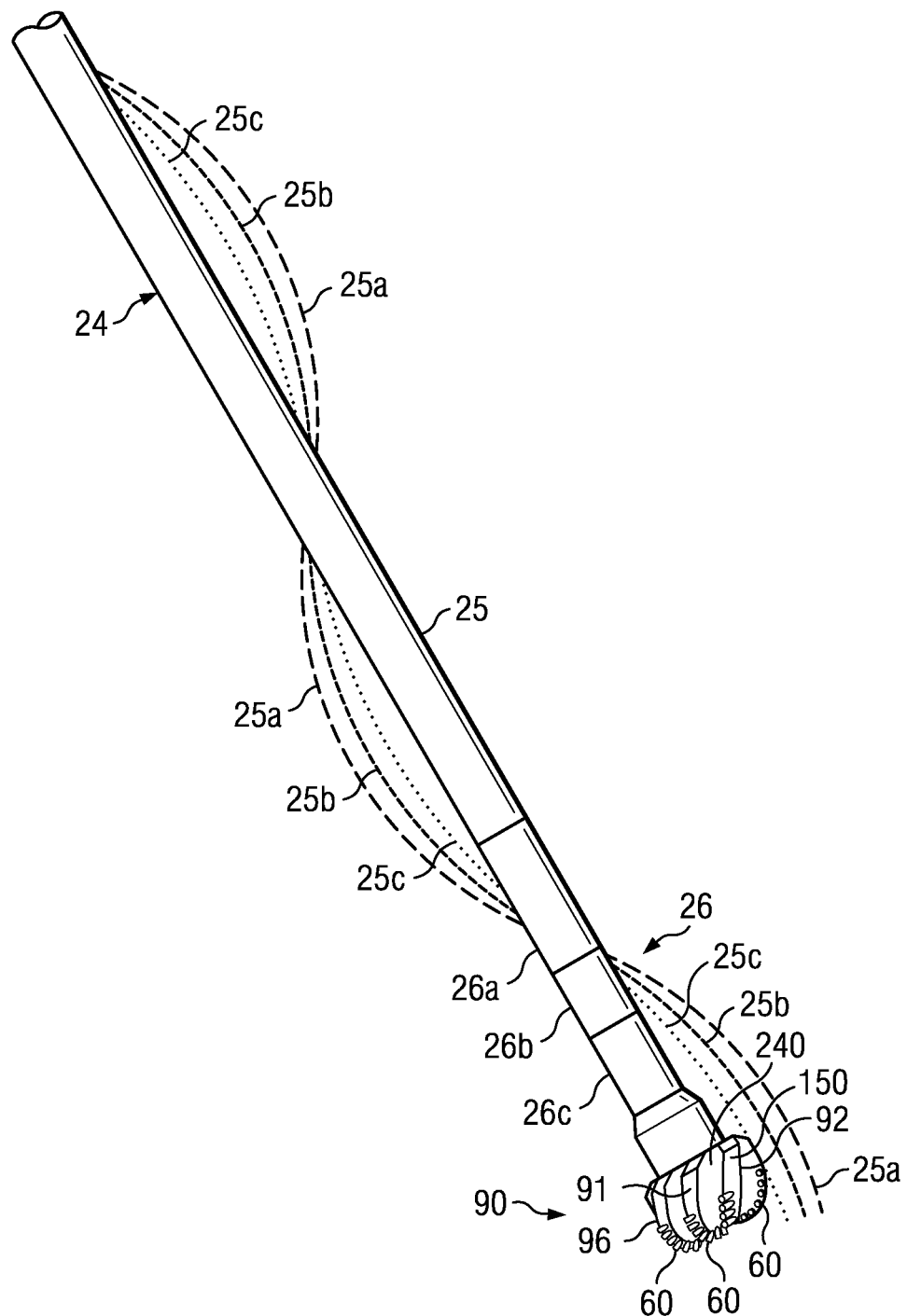
FIG. 18A is a schematic drawing in elevation with portions broken away showing one example of possible effects from bit imbalance forces applied to a prior art rotary drill bit which has not been multilevel force balanced.

FIG. 18A depicts the effect of imbalance forces on rotary drill bit 90 during transitional drilling. Vibration and/or bit imbalance forces may be transmitted from rotary drill bit 90 to drill string 24. Undesirable changes in inside diameter 31 of wellbore 30 and/or excessive wear on rotary drill bit 90 and/or components of drill string 24 may occur. Such vibration may even damage equipment located at well surface 22. Dotted lines 25a, 25b and 25c show examples of vibration which may occur based in part on the magnitude of imbalance forces applied to rotary drill bit 90. See also FIGS. 18B and 18C-8F. Since rotary drill bit 90 and BHA 26 are generally disposed in a wellbore that limits lateral movement, the potential for damage to rotary drill bit 90 and/or components of BHA 26 may significantly increase as imbalance forces applied to rotary drill bit 90 increase. Fixed cutter rotary drill bit 90 may remain generally force balanced during drilling conditions such as all cutting elements 60 engaged with generally uniform downhole formation layer 42 (see FIG. 1B).

Figure 18B:
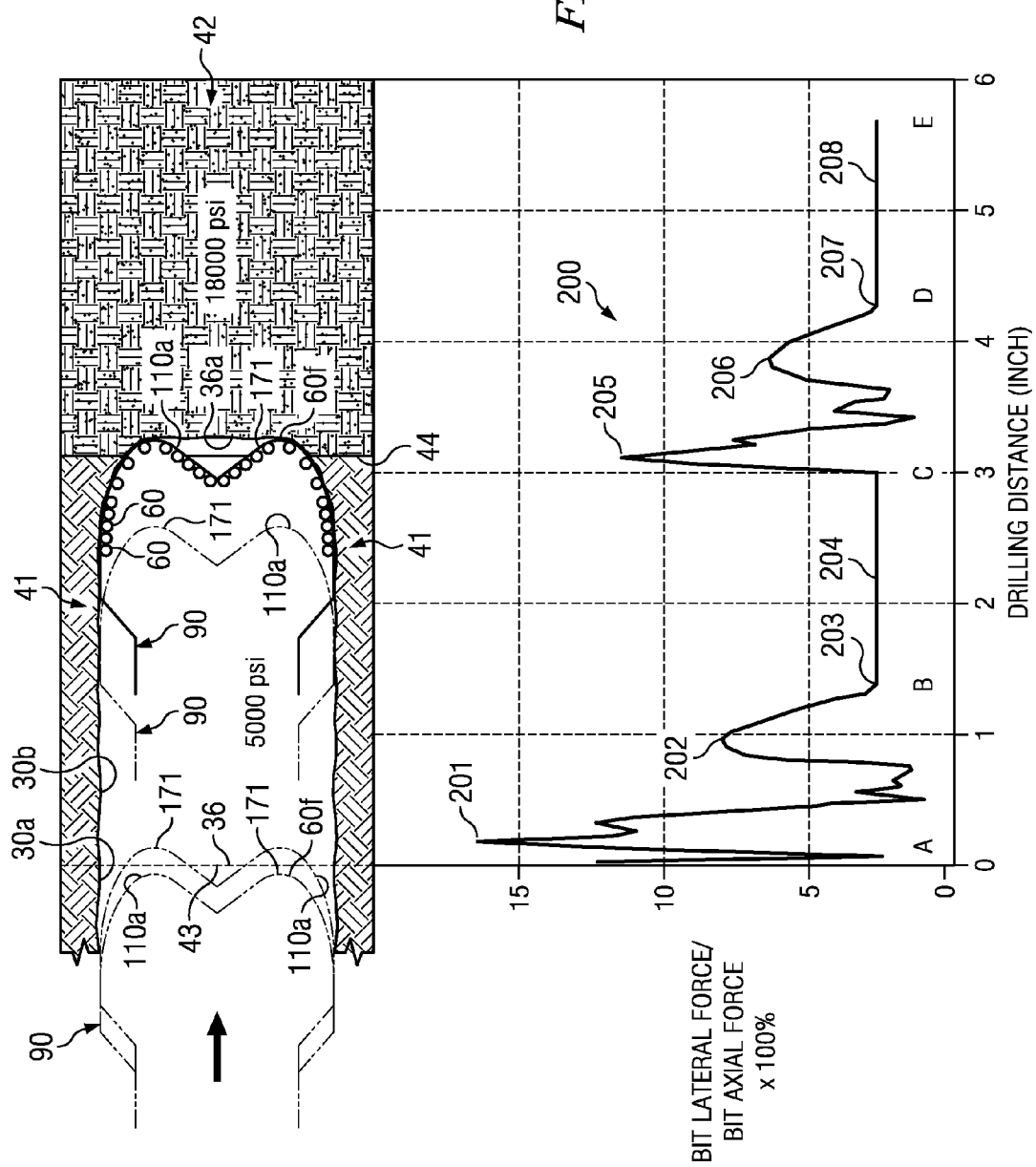
FIG. 18B is a schematic drawing showing one example of a fixed cutter drill bit which has not been multilevel force balanced forming a wellbore and a chart showing imbalance forces versus drilling depth associated with transition drilling or non-uniform downhole drilling conditions.

FIG. 18B is a schematic drawing showing portions of wellbore 30 and various locations of a prior art fixed cutter rotary drill bit 90 within wellbore 30. FIG. 18B also includes graph 200 showing initial engagement of drill bit 90 with a first formation layer 41 and imbalance forces associated with drill bit 90 contacting a second downhole formation layer 42 adjacent to first downhole formation layer 41. Graph 200 demonstrates that prior rotary drill bits with only one level of force balancing, such as all cutting elements engaged with a generally uniform downhole formation, may experience substantial lateral imbalance forces during initial contact with the downhole end of a wellbore and/or during transition drilling from a first downhole formation into a second downhole formation. Transient imbalance forces (bit drag lateral imbalance, bit radial lateral imbalance, bit lateral imbalance and bit axial moment) are typically used with traditional one level force balancing techniques associated with fixed cutter rotary drill bits and other downhole drilling tools.

Chart or graph 200 is also shown adjacent to the schematic drawing of wellbore segments 30a and 30b and downhole formation layers 41 and 42 in FIG. 18B. Graph 200 shows substantial imbalance forces that may be applied to a fixed cutter rotary drill bit when a single cutter or a few cutters engage a downhole formation or when the rotary drill bit transits from a first downhole formation into a second downhole formation. Imbalance forces (bit drag lateral imbalance, bit radial lateral imbalance, bit lateral imbalance and bit axial moment) are typically evaluated with traditional one level force balancing techniques associated with fixed cutter rotary drill bits and other downhole drilling tools. Design criteria used to evaluate traditional force balanced fixed cutter rotary drill bits and other downhole drilling tools may include:

bit drag lateral imbalance force less than 2.5% of total bit axial force;

bit radial lateral imbalance force less than 2.5% of bit axial force;

bit lateral imbalance force less than 4% of bit axial force; and bit axial moment less than 4% of bit torque.

Various computer models and computer programs such as listed in Appendix A at the end of the present application are available to evaluate forces acting on each cutting element 60 and any bit imbalance forces.

Chart or graph 200 is also shown adjacent to the schematic drawing of wellbore segments 30a and 30b and downhole formation layers 41 and 42 in FIG. 18B. Graph 200 shows substantial imbalance forces that may be applied to a fixed cutter rotary drill bit when a single cutter or a few cutters engage a downhole formation or when the rotary drill bit transits from a first downhole formation into a second downhole formation. See also FIG. 24A.

The portion of wellbore 30 designated as 30a may have been drilled or formed prior to inserting rotary drill bit 90. Simulations were conducted based on inserting rotary drill bit 90 and an associated drill string through previously formed wellbore portion 30a until the extreme downhole end of rotary drill bit 90 contacts surface 43 to drill or form wellbore segment 30b extending through first downhole formation layer 41 and into second downhole formation layer 42. Surface 43 may be described as generally flat and extending substantially normal relative to rotary drill bit 90.

Various techniques may be used to simulate drilling wellbore 30b using rotary drill bit 90 and an attached drill string (not expressly shown) starting with contact between the extreme downhole end of rotary drill bit 90 and surface 43 of first layer 41.

First downhole formation layer 41 may have compressive strength less than the compressive strength of the second downhole formation layer 42. For some simulations, first downhole formation layer 41 may have a compressive strength of approximately 5,000 psi. During the simulation the thickness of the first downhole formation layer 41 may be greater than the length of rotary drill bit 90 such that all cutting elements 60 may be fully engaged with first downhole formation layer 41 prior to the downhole end or rotary drill bit 90 contacting second downhole formation layer 42.

Second downhole formation layer 42 may have a compressive strength greater than the compressive strength of the first downhole formation layer 41. For some simulations second downhole formation layer 42 may have a compressive strength of approximately 18,000 psi. The thickness of the second downhole formation may be greater than the length of rotary drill bit 90 such that all cutting elements may be fully engaged with second downhole formation layer 42.

Some prior fixed cutter drill bits such as rotary drill bit 90 may have only one cutting element 60f disposed on one blade at or near associated nose point 171. If single cutting element 60f is the only point of initial contact between rotary drill bit 90 and generally flat surface 43 at the downhole end of wellbore segment 30a, substantial lateral impact forces may be applied to rotary drill bit 90 and drill string 24. See FIG. 18.

As drilling depth of rotary drill bit 90 increases into first downhole formation layer 41, substantial imbalance forces may occur as additional cutters 60 engage adjacent portions of first formation layer 41. See peak 201 on graph 200. Peaks 201 and 202 on graph 200 correspond with substantial increases in bit lateral imbalance forces as compared with bit axial force. With increasing depth of drilling or penetration into first formation layer 41, imbalance forces acting on fixed cutter rotary drill bit 90 may gradually reduce. See point 203 on graph 200. A substantially force balanced condition may be met when all cutting elements 60 are engaged with adjacent portions of generally uniform first formation layer 41.

For the example shown in FIG. 18B, the ratio of bit lateral imbalance forces relative to total bit axial force applied to rotary drill bit 90 may be relatively constant at a value of approximately 2.5% as represented by generally flat segment 204 of graph 200. Rotary drill bit 90 may be generally be described as force balance for only one level or one condition when all cutting elements 60 are engaged with a generally uniform downhole formation.

Peaks 201, 202, 205 and 206 are representative of the magnitude of transient imbalance forces which may be applied to rotary drill bit 90 during transition drilling through non-uniform downhole drilling conditions represented by first layer 41 and second layer 42 as shown in FIG. 18B.

The one level used to force balance rotary drill bit 90 may be violated when downhole end 122 of rotary drill bit 90 initially contacts second downhole formation layer 42. See peak 205 on graph 200. As shown by graph 200, bit lateral imbalance forces may spike or peak if only one cutting element 60 or a relatively small number of cutting elements 60 engage generally harder second formation layer 42 and the other cutting elements 60 remain engaged with relatively softer first downhole formation layer 41.

Simulations show that lateral imbalance force applied to rotary drill bit 90 may occur at peaks 205 and 206 as the depth of drilling increases with additional cutting element 60 engaging harder second downhole formation layer 42. At point 207 on graph 200 all cutting elements 60 disposed on exterior portions of rotary drill bit 90 may be engaged with generally uniform second downhole formation layer 42. Generally horizontal or flat segment 208 of graph 200 represents a generally constant, relatively low amount of bit lateral imbalance force as compared with bit axial force applied to rotary drill bit 90.

Forces on each cutting element 60 engaged with adjacent formation material may be evaluated. Forces acting on various cutter groups which are engaged with the formation material may also be evaluated. Associated bit forces including bit lateral force, bit axial force and bit axial moment may also be calculated and graphed as a function of drilling distance.

The graphs may start from the time the associated rotary drill bit 90 first touches generally flat surface 43 and/or generally flat surface 44. A visual display of all bit forces as a function of drilling distance may then be displayed. See Graph 200 in FIG. 18B. Standard default downhole drilling conditions which in step 402 may include RPM equal to 120, rate of penetration equal to 30 ft. per hour, compressive strength of the first downhole formation equal to 5,000 psi and compressive strength of a second formation equal to 18,000 psi.

FIGS. 18C-18F show various imbalance forces acting on fixed cutter rotary drill bit 90 during initial contact with the downhole end of wellbore 30a and imbalance forces associated drilling from first downhole formation layer 41 into harder, second downhole formation layer 42.

Figure 18C:
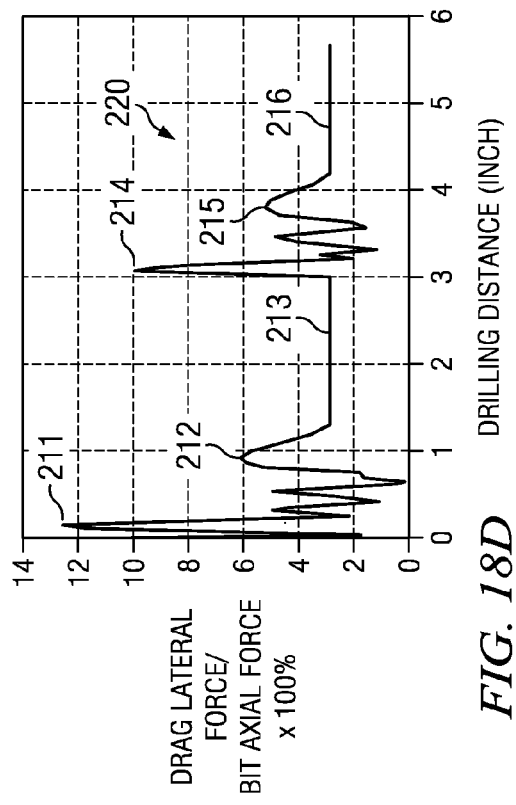
FIGS. 18C-18F are graphical representations of imbalance forces associated with transition drilling such as shown in FIG. 18B.

FIG. 18C shows graph 200 of total transient bit lateral imbalance forces as a percentage of transient bit axial force as FIG. 18B. The maximum lateral imbalance force represented by peak 201 may be greater than fifteen percent (15%) of total bit axial force.

Figure 18D:
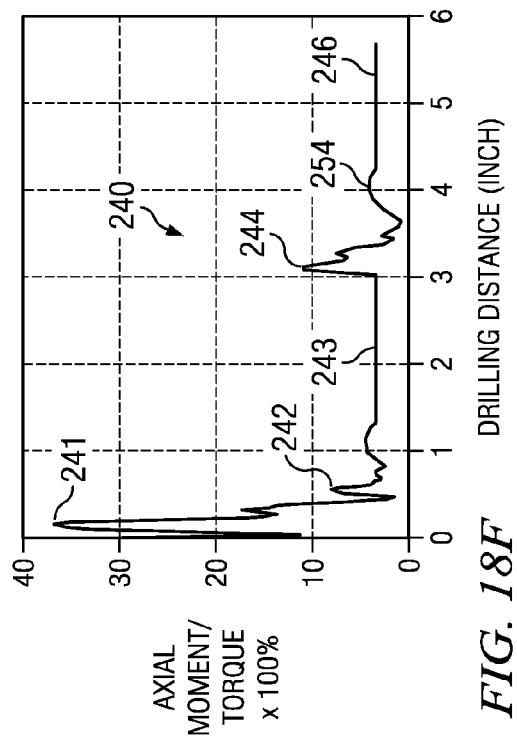

FIG. 18D shows graph 220 of transient bit drag lateral force as a percentage of transient bit axial force versus drilling distance. The maximum drag lateral imbalance force represented by peak 211 may be greater than 12% of total bit axial force. Peaks 212, 214 and 215 correspond generally with similar peaks shown in FIG. 18C.

Figure 18E:
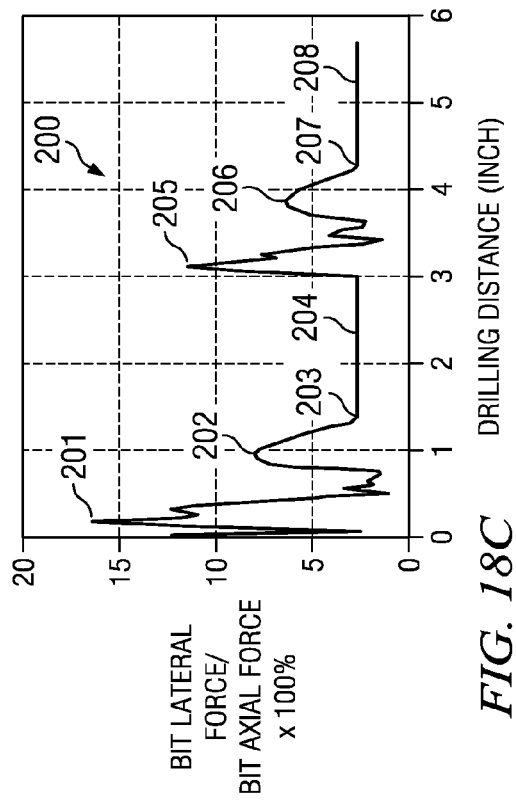

FIG. 18E shows graph 230 of transient bit radial lateral force as a percentage of transient bit axial force versus drilling distance. Peak 231 indicates that maximum transient radial lateral force may be greater than 8% of total bit axial force. Again, peaks 232, 234 and 235 correspond generally with peaks 202, 205 and 206 in FIG. 18C.

Figure 18F:
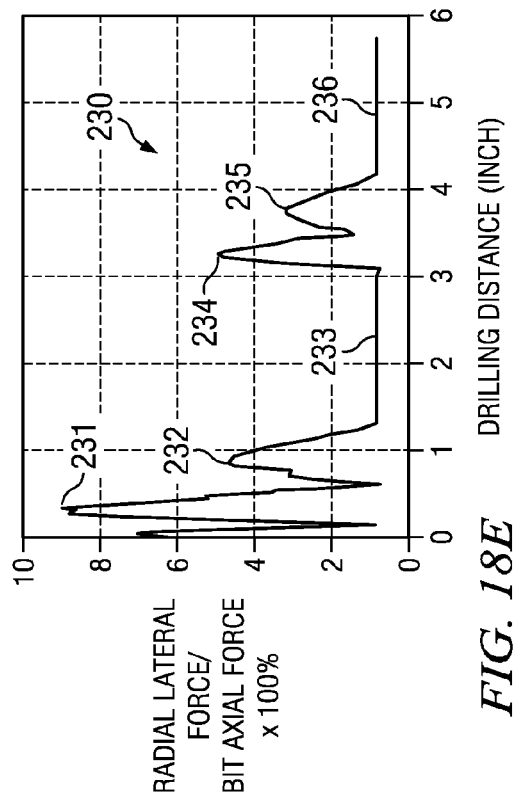

FIG. 18F shows graph 240 of transient bit axial moment as a percentage of transient bit torque versus drilling distance. Peak 241 indicates that the maximum transient axial bending moment may be as high as 35% of bit torque during initial engagement with downhole formation layer 41. Peaks 242 and 244 of graph 240 generally correspond with similar peaks shown in FIG. 18C. Graphs 220, 230 and 240 indicate that fixed cutter rotary drill bit 90 may be described as relatively balanced when all cutting elements are engaged with a generally uniform downhole formation. See for example generally flat segments 213 and 216 in FIG. 18D, generally flat segments 233 and 236 in FIG. 18E and generally flat segments 243 and 246 in FIG. 18F.

Figure 19A:
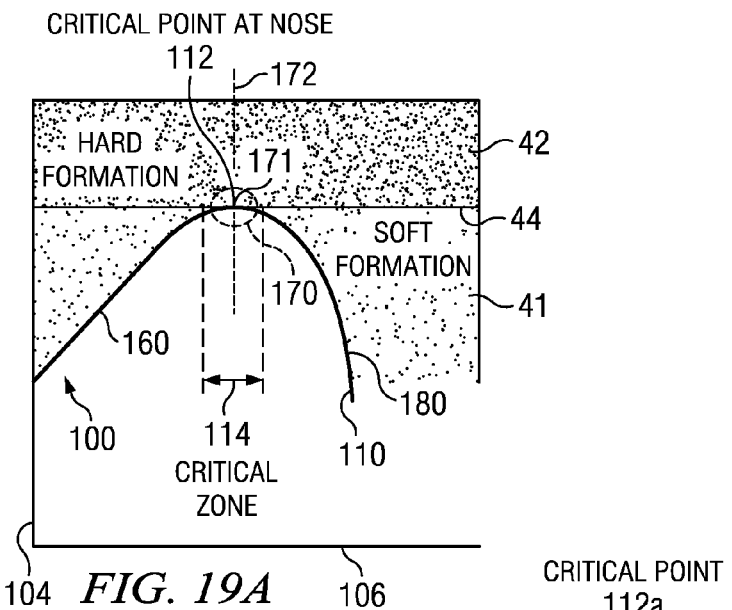
FIGS. 19A, 19B and 19C are schematic drawings showing examples of non-uniform downhole drilling conditions or transition drilling conditions which may effect bit imbalance forces acting on an associated rotary drill bit.
Figure 19B:
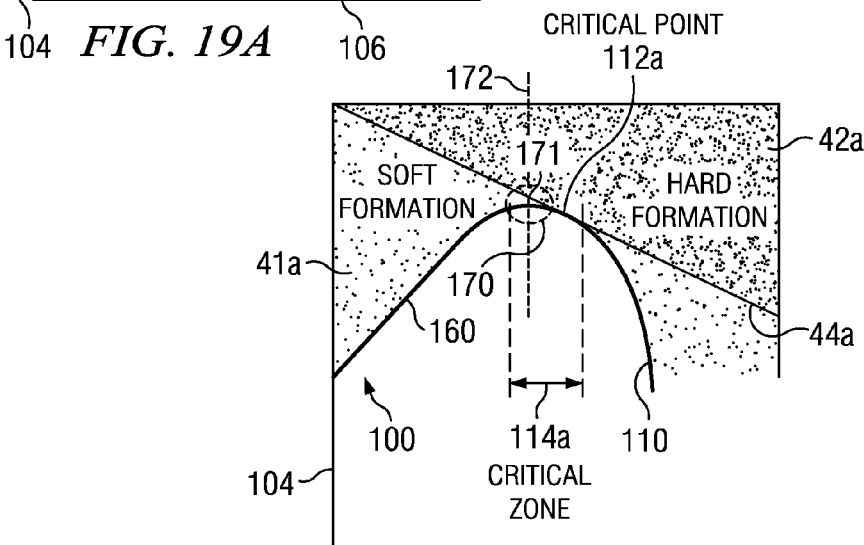
Figure 19C:
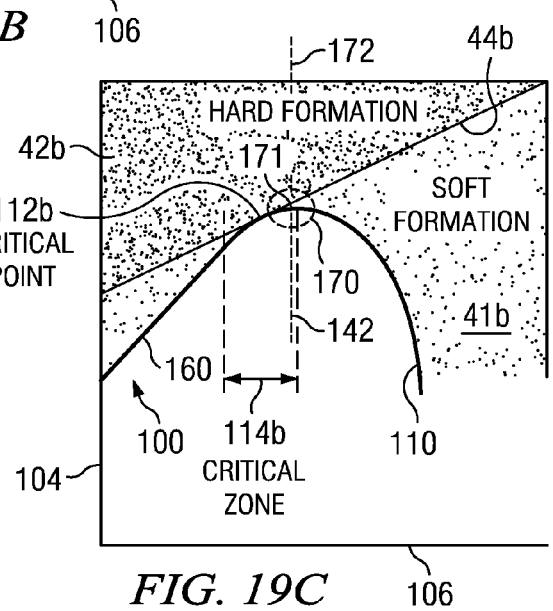

FIGS. 19A, 19B and 19C show examples of a downhole drilling tool engaging a first, softer downhole formation and an adjacent, harder downhole formation. FIGS. 19A, 19B and 19C show examples of a "critical point" or an initial point of contact between a downhole drilling tool and downhole formation layers disposed at various angles with respect to each other. Multilevel force balancing techniques may satisfactorily determine selected locations for installing cutting elements on exterior portions of blades on the downhole drilling tool based at lease in part on variations in the hardness of adjacent downhole formations and/or variations in the angle of contacting the two adjacent downhole formations.

A critical point of contact between a downhole drilling tool and respective downhole formations may depend upon orientation of the layers with respect to each other and with respect to the cutting face of a downhole drilling tool during engagement with the respective downhole formations. The critical point may be determined based on dip angle (up dip or down dip) of a transition between a first downhole formation and a second downhole formation relative to the cutting face of the downhole drilling tool.

Simulations of contact between the cutting face of a downhole drilling tool and a first downhole formation layer and a second downhole formation layer may indicate a critical zone with respect to the critical point. See critical zones 114, 114*a* and 114*b* in FIGS. 19A, 19B and 19C. The dimensions and location of each critical zone relative to the point of initial contact may depend on various characteristics of the respective downhole formations and characteristics of the cutting face profile on the downhole drilling tool.

Composite bit face profile 110, as shown in FIGS. 19A-19C, extending from bit rotational axis 104 may include various segments defined relative to nose point 171 and nose axis 172 extending therethrough. Nose axis 172 may be aligned generally parallel with bit rotational axis 104. As described earlier bit face profile 110 may be divided into various segments or zones starting from nose point 171 and/or nose axis 172. Such segments or zones may include, but are not limited to, cone zone 160, nose segment 170 represented by a dotted oval and outer segment 180 and each zone may have respective cutting elements 60 disposed thereon including "inner cutters" 60*i* and "outer cutters" 60*o* as described in sections above.

In FIG. 19A, first downhole formation layer 41 and second downhole formation layer 42 are shown disposed generally parallel with each other and extending generally perpendicular relative to associated bit rotational axis 104 and nose axis 172. For such downhole drilling actions critical point 112 or the initial point of contact between fixed cutter drill bit 100 and surface 44 on second downhole formation layer 42 may correspond approximately with the location of nose point 171 on composite bit face profile 110. As discussed later in this application, the present teachings, in some embodiments, may be substantially benefited by placing one or more groups of cutting elements within nose segment 170 symmetrically or pseudo-symmetrically aligned with each other relative to nose axis 172. Embodiments relating to placing one or more groups of cutting elements within nose segment 170 symmetrically or pseudo-symmetrically aligned with each other relative to nose axis 172 may be also found in copending U.S. Provisional Patent Application entitled "Fixed Cutter Drill Bits With Improved Stability," Ser. No. 61/121,723 filed Dec. 11, 2008 and to U.S. Provisional Application entitled "Instant Balancing Fixed Cutter Drill Bits, Reamers, Core Bits and Design Methods," Ser. No. 61/174,769 filed May 1, 2009 and in copending PCT Patent Application entitled "Multilevel Force Balanced Downhole Drilling Tools and Methods," Serial No. PCT/US09/067,263 filed Dec. 4, 2009.

For downhole drilling conditions represented by FIG. 19B, first downhole formation layer 41*a* and second downhole formation layer 42*a* may be inclined relative to each other and with respect to bit rotational axis 104. Surface 44*a* disposed between first layer 41*a* and second layer 42*a* may be generally described as having a "up dip" angle relative to bit rotational axis 104 and an associated wellbore (not expressly shown) formed by rotary drill bit 100.

For downhole drilling conditions such as represented by FIG. 19B, initial point of contact 112*a* between rotary drill bit 100 and surface 44*a* may move radially outward from nose point 171 as measured from bit rotational axis 104. The location of critical point 112*a* may depend in part on the up dip or angle of inclination of surface 44*a* relative to bit rotational axis 104 and the dimensions and configuration of blades 131-138 and cutting element 60 disposed on rotary drill bit 100.

For downhole drilling conditions such as shown in FIG. 19C, first formation 41*b* and second formation 42*b* may be inclined at an angle described as a "down dip" relative to each other and with respect to bit rotational axis 104 and an associated wellbore formed by rotary drill bit 100. As a result, critical point 112*b* may move radially inward as measured from bit rotational axis 104.

Prior force balancing techniques which use 1) only one spiral direction of rotation around a bit axis for placing all cutting elements and 2) only one level of force balancing (such as all cutting elements engaged with a generally uniform downhole formation) may not adequately describe forces acting on a rotary drill bit or other downhole drilling tools during initial contact with the downhole end of a wellbore, during transition drilling between a first downhole formation and a second downhole formation and any other downhole drilling conditions which do not include all cutting elements engaged with a generally uniform downhole formation. Rotary drill bits designed at least in part based on this assumption may experience significant imbalance forces during non-uniform downhole drilling conditions.

The terms "multilevel force balanced" and "multilevel force balancing" may include, but are not limited to, various methods, techniques and procedures to simulate or evaluate imbalance forces acting on downhole drilling tools while forming a wellbore with non-uniform downhole drilling conditions. Multilevel force balancing generally includes the use of respective cutter groups and cutter sets and is not limited to a single set of all cutting elements of a downhole drilling tool engaged with a generally uniform downhole formation. Multilevel force balancing may also include evaluating bit imbalance forces as a function of drilling depth.

The terms "multilevel force balance" and "multilevel force balancing" may also include, but are not limited to, various levels of force balancing such as level one through level five. First level or level one may include balancing forces acting on all cutting elements in each respective cutter group in accordance with teachings of the present disclosure. Each cutter group may have 2, 3, 4 or 5 cutters.

In addition to layout of different cutters in different spiral directions according to the present disclosure, when additionally performing level one force balancing according to some embodiments, the cutters in each cutter group may be in a uniform formation. For some applications multilevel force balancing may be conducted with respective groups of more than five neighbor cutters. FIGS. 20A-20H depict a first level or level one balancing.

Second level or level two force balancing may include balancing forces acting on each cutting element in any two neighbor cutter groups on an associated composite cutting face profile. In addition to layout of different cutters in different spiral directions according to the present disclosure, when performing level two force balancing, the cutters in the two groups may be in a uniform formation. Imbalance forces resulting from any two neighbor cutter groups on an associated composite cutting face profile may be substantially minimized or eliminated (balanced). FIGS. 21A, 21B depict a second level or level two balancing. Respective imbalance forces resulting from any two neighbor cutter groups may be substantially minimized or eliminated (balanced). See FIG. 26H.

Third level or level three force balancing may include balancing forces acting on all cutting elements in each cutter set. The number of cutters within each cutter set may equal the number of blades on an associated downhole drilling tool. A cutter set may include at least two force balanced neighbor cutter groups. In addition to layout of different cutters in different spiral directions according to the present disclosure, when performing level three force balancing, the cutters in the set may be in a uniform formation. Imbalance forces resulting from all cutters in each cutter set are minimized or eliminated (balanced). FIGS. 22A-22D depict third level balancing. Depending on the number of primary blades and the starts of secondary blades, one or more cutter sets may be incomplete due to minor blades. For example, the first cutter set listed in FIG. 26I has only two cutters (1,2) on blades (3,7), respectively.

Fourth level or level four force balancing may include balancing forces acting on any group of N (N=3 or N=4) consecutive cutters on an associated composite cutting face profile. In addition to layout of different cutters in different spiral directions according to the present disclosure, when performing level four force balancing, the cutters may be in a uniform formation. Respective imbalance forces resulting from each group of N (N=3 or N=4) neighbor cutters may be substantially minimized or eliminated (e.g., balanced). See FIGS. 26J-1 and 26J-2. The number of N (N=3 or N=4) depends on the number of blades and the cutter set used to layout the cutters. See FIG. 29.

In embodiments where, in addition to layout of different cutters in different spiral directions according to the present disclosure, fifth level or level five force balancing may include balancing forces acting on all cutting elements of a composite bit face profile based on simulating all cutting elements engaged with a generally uniform and/or a generally non-uniform downhole formation. When a generally uniform formation is drilled, level five force balancing may be similar to prior one level force balancing techniques.

In some embodiments, for designing and manufacturing some downhole drilling tools, in addition to layout of different cutters in different spiral directions, only levels one, two, three and five force balancing may be conducted. However, following layout of different cutters in different spiral directions according to the present disclosure, level four force balancing may be preferred for many downhole drilling tools. Levels one, two, three and five force balancing may be accomplished using cutter layout algorithms as shown in FIGS. 28A, 28B and 29 starting from the nose point of an associated composite cutting face profile. These algorithms are also described in copending PCT Patent Application entitled "Multilevel Force Balanced Downhole Drilling Tools and Methods," Serial No. PCT/US09/067,263 filed Dec. 4, 2009.

Level One Force Balancing

FIGS. 20A, 20C, 20E and 20G are schematic drawings showing various components of respective bit faces or cutting faces 126a, 126b, 126c and 126d disposed on the downhole end of a fixed cutter rotary drill bit or other downhole drilling tool. FIGS. 20B, 20D, 20F and 20H are schematic drawings showing portions of a composite bit face profile or composite cutting face profile corresponding with the components shown in respective FIGS. 20A, 20C, 20E and 20G. Blades and associated cutting elements discussed with respect to FIGS. 20A-20H may be disposed on exterior portions of fixed cutter rotary drill bit 100, core bit 500 and/or reamer 600, following layout of cutters in different zones in different spiral directions according to the present disclosure. FIGS. 20A-20H show various examples of selecting respective cutter groups for level one multilevel force balancing on associated downhole drilling tool in accordance with teaching of the present disclosure in addition to layout of different cutters in different spiral directions of bit rotation.

Pair Cutter Group

Figure 20C:
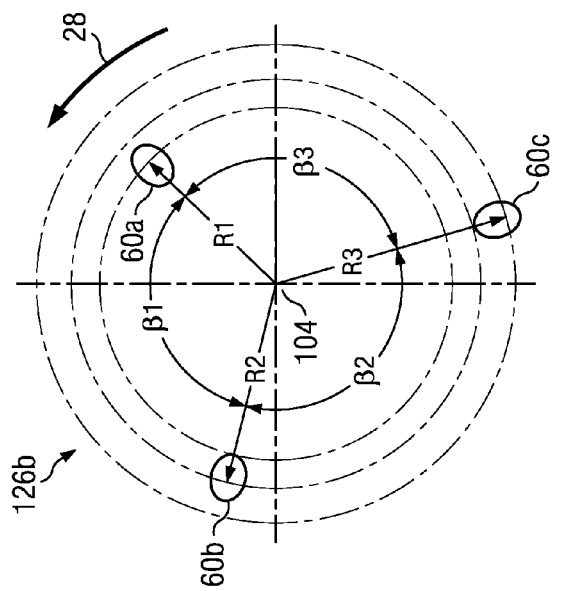
FIGS. 20C and 20D are schematic drawings showing various techniques to select a three cutter group which may be used to multilevel force balance a downhole drilling tool in accordance with teachings of the present disclosure.
Figure 20D:
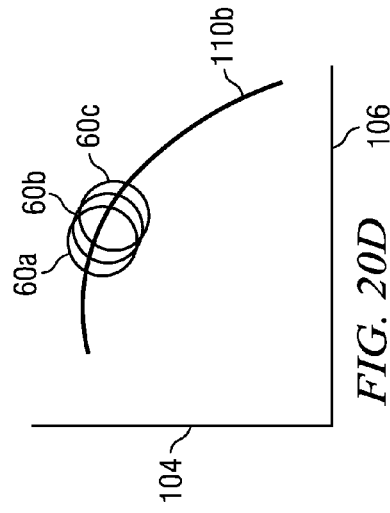
Figure 20A:
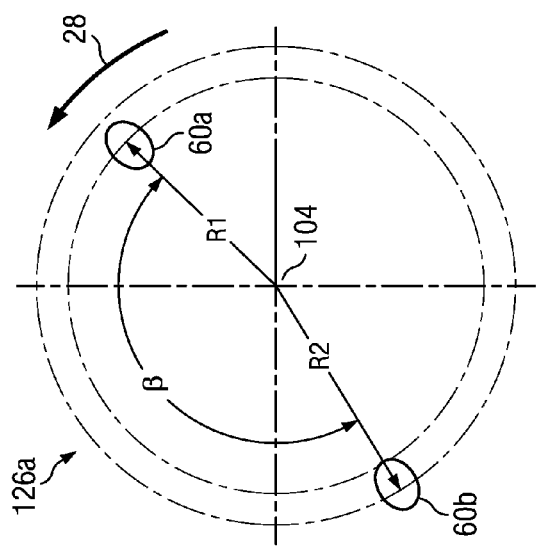
FIGS. 20A and 20B are schematic drawings showing various techniques to select a pair group of cutters which may be used to multilevel force balance a downhole drilling tool in accordance with teachings of the present disclosure.

A pair cutter group such as shown in FIG. 20A, may be defined as a pair of cutting elements disposed on exterior portions of an associated cutting face spaced radially between approximately 160° and 200° from each other relative to an associated bit rotational axis. The preferred angular spacing or optimum angle of separation for the first and second cutting elements in a pair cutter group is approximately 180°. The first cutting element and the second cutting element selected for a pair cutter group must be neighbor cutters on an associated composite cutting face profile with less than 100% overlap between associated cutting surfaces. Cutting elements 60a and 60b are laid out either in a spiral direction following bit rotation when R2>R1 or in a spiral direction opposite to bit rotation when R2<R1.

Figure 20B:
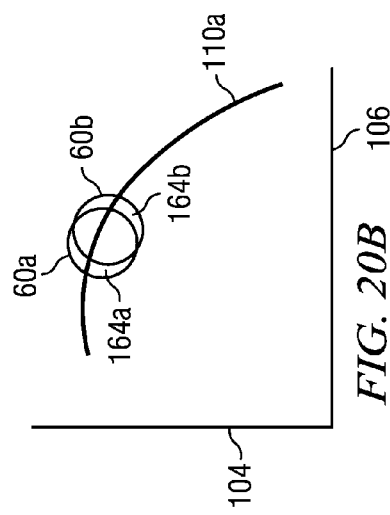

FIGS. 20A and 20B show one example of a "pair cutter group" represented by cutting elements 60a and 60b which may be disposed on exterior portions of respective blades (not expressly shown) in a spiral direction following bit rotation in such a way that R2>R1 according to the present disclosure. As shown in FIG. 20A, angle β between cutting element 60a and 60b relative to rotational axis 104 is approximately 170° which is greater than 160° and less than 200°.

As shown in FIG. 20B, cutting elements 60a and 60b satisfy the definition of "neighbor cutters" because cutting element 60a and cutting element 60b are disposed immediately adjacent to each other on cutting face profile 110a with less than 100% overlap between respective cutting surfaces 164 and cutting elements 60a and 60b.

Three Cutter Group

For some embodiments, in addition to layout of different cutting elements 60 (such as 60i, 60o, 60s, 60g, 60c, 60n, 60na, 60nb, 60t) in different spiral directions (some cutting elements following and some cutting elements reversing direction of bit rotation) according to the present disclosure, cutting elements on a bit face or cutting face may be assigned to respective three cutter groups for multilevel force balancing an associated downhole drilling tool. A three cutter group (cutting elements 60a, 60b, and 60c) as shown in FIG. 20C may be defined as three cutting elements disposed on exterior portions of an associated cutting face spaced radially from each other between approximately 100° and 140° relative to an associated bit rotational axis. The preferred angular spacing or optimum angle of separation for the cutting elements in a three cutter group is approximately 120°. The first, second and third cutting elements selected for a three cutter group must be neighbor cutters on an associated composite cutting face profile with less than 100% overlap between associated cutting surfaces. Cutting elements 60a, 60b and 60c are laid out either in a spiral direction following bit rotation when R3>R2>R1 or in a spiral direction opposite to bit rotation when R3<R2<R1.

FIGS. 20C and 20D show one example of a "three cutter group" represented by cutting elements 60a, 60b and 60c which may be disposed on exterior portions of respective blades (not expressly shown) in a spiral direction following bit rotation in such a way that R3>R2>R1 according to the present disclosure. Cutting elements 60a, 60b and 60c represent only one example of a three cutter group satisfactory for use in level one force balancing and associated downhole drilling tools using multilevel force balancing procedures in addition to layout of different cutting elements 60 (such as 60i, 60o, 60s, 60g, 60c, 60n, 60na, 60nb, 60t) in different spiral directions (some cutting elements following and some cutting elements reversing direction of bit rotation) according to the present disclosure. Angle $\beta_1$ between cutting elements 60a and 60b, angle $\beta_2$ between cutting elements 60a and 60c and angle $\beta_3$ between cutting element 60c and 60a are each greater than 100° and less than 140°. As shown in FIG. 20C radial distance $R_3$ from third cutting element 60c and bit rotational axis 104 is greater than radial distance $R_2$ from second cutting element 60b and bit rotational axis 104. Radial distance $R_2$ between cutting element 60c and bit rotational axis 104 is greater than radial distance $R_1$ between cutting element 60a and bit rotational axis 104.

As shown in FIG. 20D, cutting elements 60a, 60b and 60c satisfy the definition of "neighbor cutters" since cutting elements 60a, 60b and 60c are disposed adjacent to each other on composite cutting face profile 110b with less than 100% overlap to respective cutting surfaces 164 on the associated composite bit face profile 110.

Four Cutter Group

For some applications, in addition to layout of different cutting elements 60 (such as 60i, 60o, 60s, 60g, 60c, 60n, 60na, 60nb, 60t) in different spiral directions (some cutting elements following and some cutting elements reversing direction of bit rotation) according to the present disclosure, cutting elements disposed on the cutting face of a downhole drilling tool may be divided into respective four cutter groups. A four cutter group such as shown in FIG. 20E, may be defined as four cutting elements disposed on exterior portions have an associated cutting face spaced radially from each other with approximately with the angle of separation between the first and second cutter and approximately equal to the angle of separation between the third and fourth cutting element. The angle of separation between the second and third cutting element should be approximately equal to the angle of separation between the fourth cutting element and the first cutting element.

The first, second, third and fourth cutting elements of a four cutter group should be neighbor cutters on the associated cutting face profile with less than 100% overlap. Cutting elements 60a, 60b, 60c and 60d are laid out either in a spiral direction following bit rotation when R4>R3>R2>R1 or in a spiral direction opposite to bit rotation when R4<R3<R2<R1.

Figure 20G:
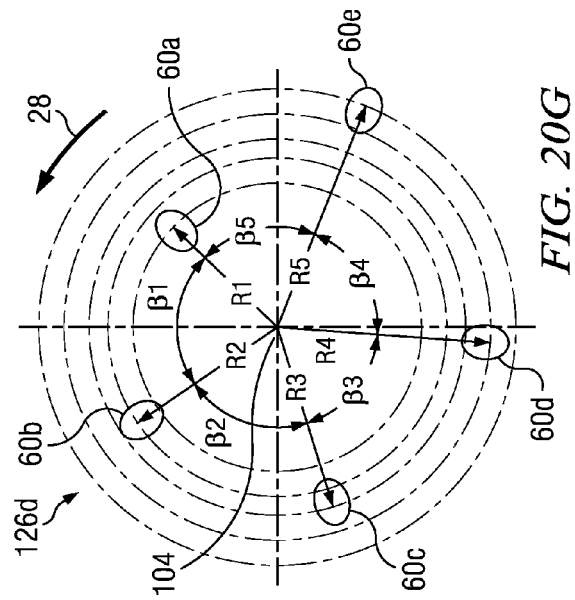
FIGS. 20G and 20H are schematic drawings showing various techniques to select a five cutter group which may be used to multilevel force balance a downhole drilling tool in accordance with teachings of the present disclosure.
Figure 20H:
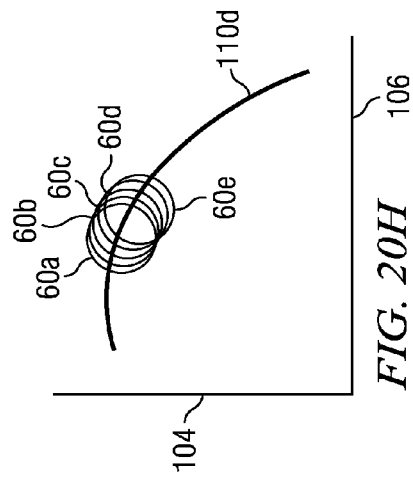
Figure 20E:
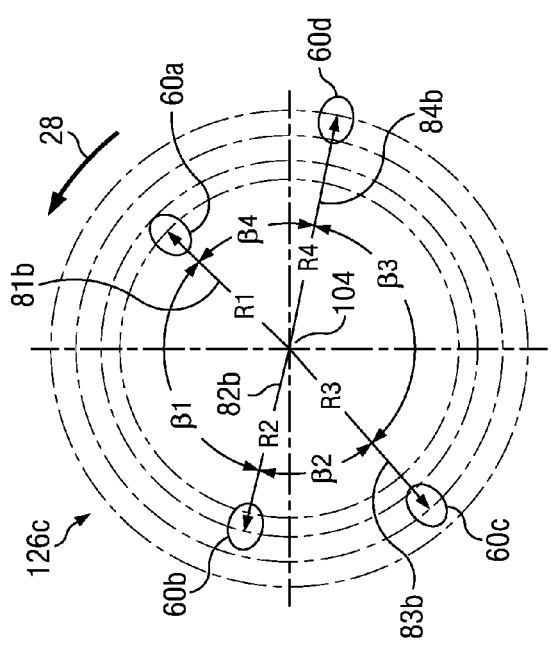
FIGS. 20E and 20F are schematic drawings showing various techniques to select a four cutter group which may be used to multilevel force balance a downhole drilling tool in accordance with teachings of the present disclosure.
Figure 20F:
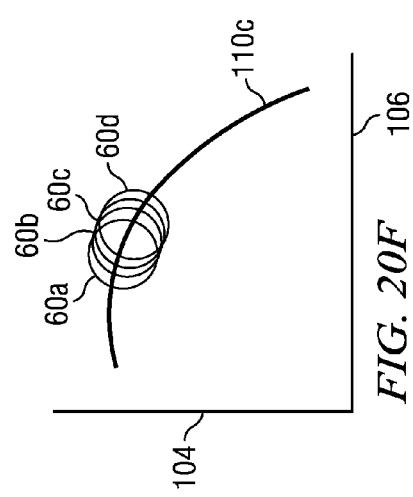

As shown in FIGS. 20E and 20F angle $\beta_1$ between cutting element 60a and 60b may be approximately equal to angle $\beta_3$ between cutting elements 60c and 60d. Angle $\beta_2$ between cutting element 60b and 60c may be approximately equal to angle $\beta_4$ between cutting elements 60d and 60a. Cutting elements 60a, 60b, 60c and 60d are laid out in a spiral direction following bit rotation in such a way that radius R4 extending between bit rotational axis 104 and cutting element 60d is greater than radius R3 extending from bit rotational axis to cutting element 60c, radius R3 associated with cutting element 60c is greater than radius R2 from bit rotational axis 104 and cutting element 60b and radius R2 between bit rotational axis 104 and cutting element 60b is greater than radius R1 extending between bit rotational axis 104 and cutting element 60a. Cutters 60a-60d on bit face profile 110c as shown in FIG. 20H have less than 100% overlap. Cutting elements 60a, 60b, 60c and 60d are neighbor cutters on the associated bit face profile 110c. See FIG. 20F.

Five Cutter Group

For some applications, in addition to layout of different cutting elements 60 (such as 60i, 60o, 60s, 60g, 60c, 60n, 60na, 60nb, 60t) in different spiral directions (some cutting elements following and some cutting elements reversing direction of bit rotation) according to the present disclosure, the cutting elements disposed on exterior portions of downhole drilling tool may be divided into five cutter groups. The angle of separation ($\beta$) between each cutting element and a five cutter group may be approximately 72° plus or minus 20°. The first, second, third, fourth and fifth cutting elements of a five cutter group should be neighbor cutters on an associated cutting face profile with less than 100% overlap. Cutting elements 60a, 60b, 60c, 60d and 60e are laid out either in a spiral direction following bit rotation when R5>R4>R3>R2>R1 or in a spiral direction opposite to bit rotation when R5<R4<R3<R2<R1.

As shown in FIGS. 20G AND 20G, cutting elements 60a, 60b, 60c, 60d and 60e are laid out in a spiral direction following bit rotation such that the fifth cutting element should be spaced a greater radial distance from the associated bit rotational axis than the fourth cutting element, the fourth cutting element should be spaced at a greater radial distance from the associated bit rotational axis than the third cutting element, the third cutting element should be spaced at a greater radial distance from the associated bit rotational axis than the second cutting element and the second cutting element should be spaced at a greater radial distance from the associated bit rotational axis than the first cutting element.

Blade Groups

In addition to layout of different cutting elements 60 (such as 60i, 60o, 60s, 60g, 60c, 60n, 60na, 60nb, 60t) in different spiral directions (some cutting elements following and some cutting elements reversing direction of bit rotation) according to the present disclosure, the number of blades on a downhole drilling tool may be divided into groups depending on the type of cutter groups used for level one force balancing. See Table 301 in FIGS. 28A and 28B. The following examples demonstrate dividing blades into blade groups.

Example 1

The blades of a five blade downhole drilling tool as shown in FIG. 21A may be divided into two blade groups: (1,3,5) and (2,4), where blades 131, 133 and 135 form the first blade group and blades 132 and 134 form the second blade group. The preferred match for a five blade downhole drilling tool is (1,3,5) (2,4) on Table 301 in FIG. 28A. A three cutter group may be laid out on the first blade group (1,3,5). Imbalance forces created by the three cutter group may be balanced or minimized. A pair cutter group may be laid out on the second blade group (2,4). Imbalance forces created by the pair cutter group may be balanced or minimized.

Example 2

The blades of an eight blade downhole drilling tool as shown in FIGS. 22A-D may be divided into four blade groups: (1,5), (2,6), (3,7), (4,8). Four pair cutter groups may be laid out on the four blade groups. Imbalance forces created by each pair cutter group may be balanced or minimized.

Cutter Set

In addition to layout of different cutting elements 60 (such as 60*i*, 60*o*, 60*s*, 60*g*, 60*c*, 60*n*, 60*na*, 60*nb*, 60*t*) in different spiral directions (some cutting elements following and some cutting elements reversing direction of bit rotation) according to the present disclosure, cutter sets may be force balanced according to the multilevel balancing embodiments. A cutter set includes at least two force balanced neighbor cutter groups. The number of cutters in one cutter set may equal the number of blades on an associated downhole drilling tool. As shown in Table 301 of FIG. 28A, a cutter set for a five blade downhole drilling tool may be [(1,3,5) (2,4)] and a cutter set for a eight blade downhole drilling tool may be [(1,5) (2,6) (3,7) (4,8)].

FIGS. 21A and 21B show one example of cutting elements laid out for cutter set [(1,3,5) (2,4)]. FIGS. 21A and 21B are schematic drawings showing portions of cutting face 126*e* and composite cutting face profile 110*e* of a downhole drilling tool with five blades 131-135 disposed thereon. Cutting elements 1, 2 and 3 in the first cutter group may be installed on primary blades 131, 133 and 135 and cutting elements 4 and 5 in the second cutter group may be installed on secondary blades 132 and 134.

Cutting elements 1, 2, 3 of the first cutter group are neighbor cutters. Cutting elements 4, 5 in the second cutter group are also neighbor cutters. See composite cutting face profile 110*e* in FIG. 21B. Imbalance forces created by respective cutting elements in each cutter group may be balanced or minimized by adjusting respective cutter locations, cutter orientations such as back rake, side rake, cutter size and phase angle. See for example arrows 188*a* and 188*b* in FIG. 25A.

The term "neighbor cutters" may be used in this application to include cutting elements disposed immediately adjacent to each other (e.g., consecutively numbered) on an associated cutting face profile or bit face profile with less than 100% overlap between respective cutting surfaces of the immediately adjacent cutting elements.

The term "force balanced cutter group" includes, but is not limited to, that the magnitude of the imbalance forces associated with the cutters in the group is smaller than that associated with each individual cutter in the same group.

The term "force balanced two neighbor cutter groups" includes, but is not limited to, that the magnitude of the imbalance forces associated with the two neighbor cutter groups is smaller than that associated with each individual cutter in the same two neighbor cutter groups.

The term "force balanced cutter set" includes, but is not limited to, that the magnitude of the imbalance forces associated with the cutters in the set is smaller than that associated with each individual cutter in the same set.

The term "force balanced N (N=3 or N=4) consecutive neighbor cutters" includes, but is not limited to, that the magnitude of the imbalance forces associated with N consecutive neighbor cutters is smaller than the maximum imbalance forces associated with each cutter of N consecutive cutters.

Level Three and Level Four Force Balanced Cutter Sets

In addition to layout of different cutting elements 60 (such as 60*i*, 60*o*, 60*s*, 60*g*, 60*c*, 60*n*, 60*na*, 60*nb*, 60*t*) in different spiral directions (some cutting elements following and some cutting elements reversing direction of bit rotation) according to the present disclosure, imbalance forces associated with each cutter set may be balanced at three levels in accordance with teachings of the present disclosure similar to level four force balanced drilling tools. Level one force balancing of a cutter set balances forces associated with the cutting elements in each cutter group. See, for example, FIGS. 20A-20H. Level two force balancing of a cutter set balances forces associated with the cutting elements in any two neighbor cutter groups in the cutter set. See, for example, FIGS. 21A and 21B. Level three force balancing of a cutter set balances forces associated with all cutting elements in the cutter set.

For example, cutter set [(1,3,5) (2,4)] of a five blade downhole drilling tool shown in FIGS. 21A AND 21B and cutter set [(1,5) (2,6) (3,7) (4,8)] of an eight blade downhole drilling tool shown in FIG. 22A are level three force balanced cutter sets.

In addition to layout of different cutting elements 60 (such as 60*i*, 60*o*, 60*s*, 60*g*, 60*c*, 60*n*, 60*na*, 60*nb*, 60*t*) in different spiral directions (some cutting elements following and some cutting elements reversing direction of bit rotation) according to the present disclosure, some cutter sets may in addition be level four force balanced cutters sets. Level four force balancing of a cutter set calls for balancing forces associated with an N (N=3 or N=4) consecutive cutting elements in the cutter set. As shown in FIGS. 22A-22D, a downhole drilling tool with eight blades 131-138 has four basic pair blade groups [(1,5), (2,6), (3,7), (4,8)]. Depending on the order of the blade groups in each cutter set, at least six cutter sets may be formed if blade group (1,5) is always kept as the first group:

Cutter Set A: [(1,5) (2,6) (3,7) (4,8)]
Cutter Set B: [(1,5) (2,6) (4,8) (3,7)]
Cutter Set C: [(1,5) (3,7) (4,8) (2,6)]
Cutter Set D: [(1,5) (3,7) (2,6) (4,8)]
Cutter Set E: [(1,5) (4,8) (3,7) (2,6)]
Cutter Set F: [(1,5) (4,8) (2,6) (3,7)]

The following description discusses imbalance forces associated with any four consecutive cutting elements (1,2,3,4), (2,3,4,5), (3,4,5,6), (4,5,6,7), (5,6,7,8).

As shown in FIG. 22A, cutter set A [(1,5) (2,6) (3,7) (4,8)] is used to layout cutters on bit face 126*f*. Imbalance forces associated with cutters (2,3,4,5) may not be balanced because these four cutters are located on one side of the bit face 126*f*. Imbalance forces associated with cutters (4,5,6,7) also may not be balanced for the same reason. Therefore, cutter set A [(1,5) (2,6) (3,7) (4,8)] is not a level four force balanced cutter set.

Figure 22B:
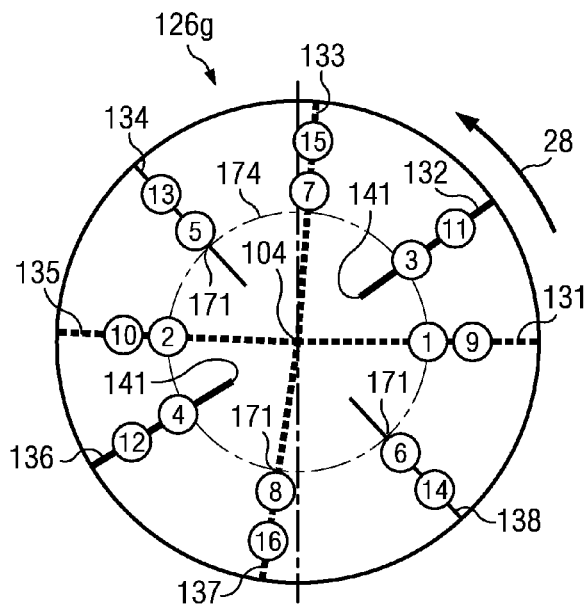

As shown in FIG. 22B, cutter set B [(1,5) (2,6) (4,8) (3,7)] is used to layout cutters on bit face 126*g*. Imbalance forces associated with cutters (2,3,4,5) and imbalance forces associated with cutters (6,7,8,9) may not be balanced because these cutters are located on one side of bit body, respectively. Therefore, cutter set B [(1,5) (2,6) (4,8) (3,7)] is not a level four force balanced cutter set.

Figure 22C:
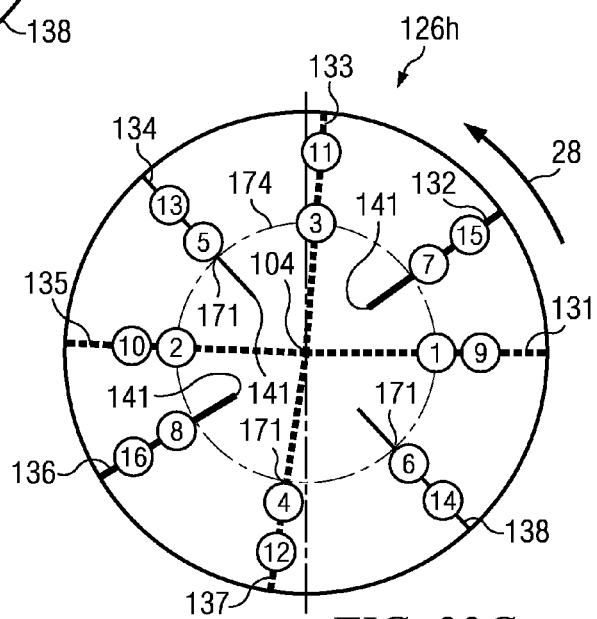

As shown in FIG. 22C, cutter set C [(1,5) (3,7) (4,8) (2,6)] is used to layout cutters on bit face 126*h*. Imbalance forces associated with cutters (2,3,4,5) and imbalance forces associated with cutters (6,7,8,9) may not be balanced because these cutters are located on the same side of cutting face 126*h*. Therefore, cutter set C [(1,5) (3,7) (4,8) (2,6)] is not a level four force balanced cutter set.

Figure 22D:
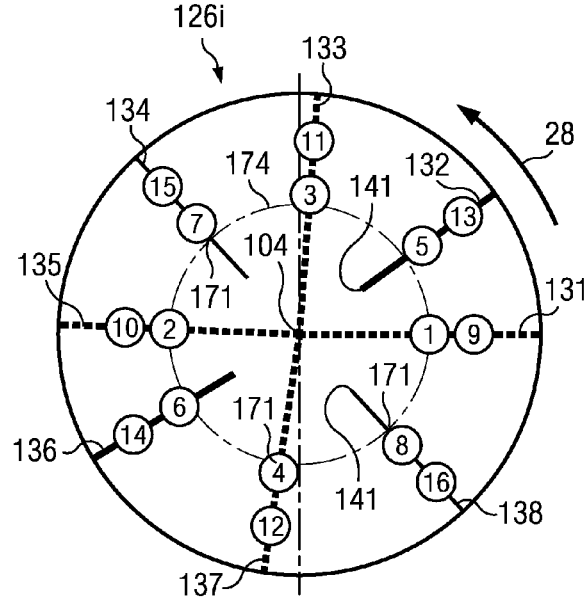

As shown in FIG. 22D, cutter set D [(1,5) (3,7) (2,6) (4,8)] is used to layout cutters on bit face 126*i*. Imbalance forces associated with neighbor cutter groups (1,2,3,4), (3,4,5,6) and (5,6,7,8) may be well balanced. Respective imbalance forces associated with cutters (2,3,4,5) and (4,5,6,7) may be minimized because the angle between these cutters is over 220 degrees. Therefore, cutter set D [(1,5) (3,7) (2,6) (4,8)] may be a level four force balanced cutter set.

Table 302 in FIG. 29 shows the preferred match for an eight blade downhole drilling tool. In addition to layout of different cutting elements 60 (such as 60*i*, 60*o*, 60*s*, 60*g*, 60*c*, 60*n*, 60*na*, 60*nb*, 60*t*) in different spiral directions (some cutting elements following and some cutting elements reversing direction of bit rotation) according to the present disclosure, cutter layout using cutter set D for an eight blade downhole drilling tool may lead to more stable balanced drilling than cutter sets A, B and C and therefore is the preferred cutter set.

The cutting faces shown in FIG. 22A-22D demonstrate that the order of neighbor cutter groups within a cutter set may play a significant role in design of multilevel force balanced downhole drilling tools in accordance with the present disclosure. If several cutter sets exist for a given number of blades, then level four force balanced cutter sets should first be considered for laying out cutter locations. For downhole drilling tools with only three or four blades, level four force balanced cutter sets may not exist. Only level three force balanced cutter sets may be available.

For a given number of blades, Table 301 in FIGS. 28A and 28B lists possible cutter sets. Table 302 in FIG. 29 lists preferred level four force balanced cutter sets for a given number of blades. The number of consecutive cutting elements N (N=3 or N=4) used for level four force balancing depends on the number of blades and cutter sets. For example, for a nine blade drill bit, if cutter set [(1,4,7) (2,5,8) (3,6,9)] is used to layout cutters, then N=3. See FIG. 29.

Outer Cutter Set

Figure 23A:
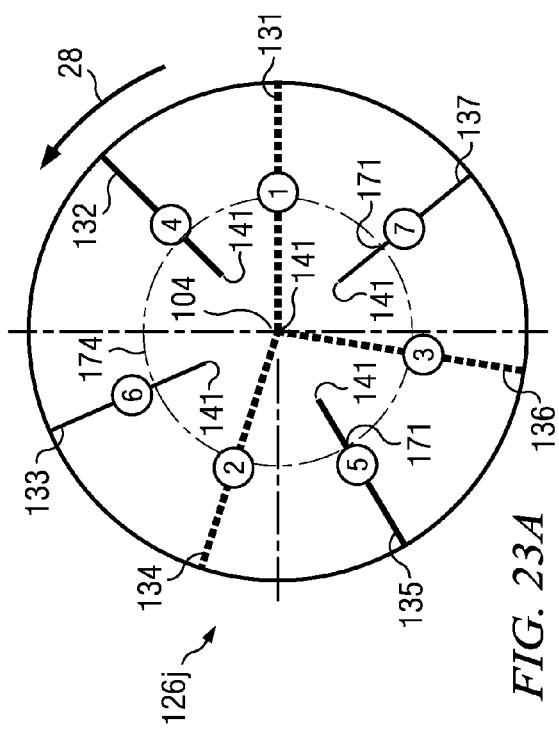
FIGS. 23A and 23B are schematic drawings showing one example of an outer cutter set of multilevel force balanced cutting elements disposed on a fixed cutter rotary drill bit incorporating teachings of the present disclosure.
Figure 23B:
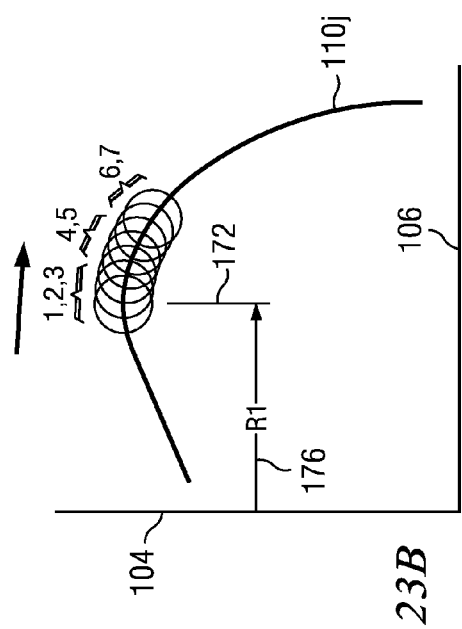

If cutter layout is outwards such as from a nose point to an associated gauge pad, then the outer cutter set is the same as the cutter set defined above. For example, for a seven blade bit using three cutter groups, outer cutter set may be [(1,4,6) (2,5) (3,7)]. FIGS. 23A and 23B show the cutter distributions on bit face 126*j* and bit face profile 110*j* for cutters in an outer cutter set.

Inner Cutter Set

Figure 23C:
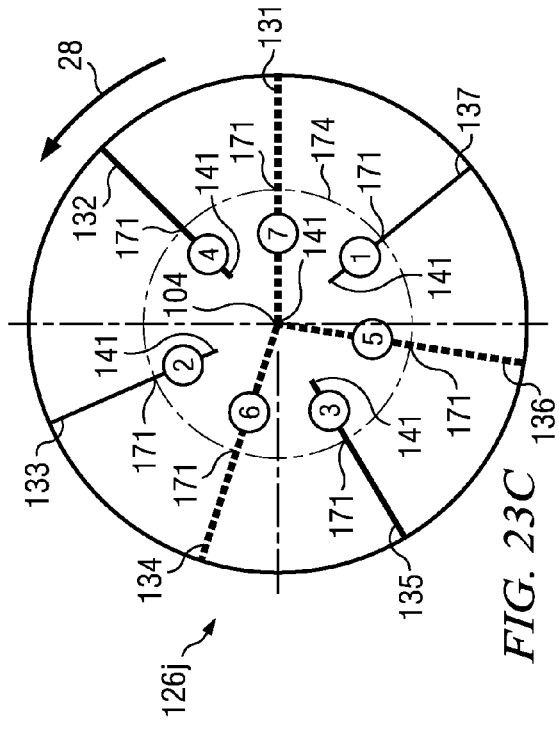
FIGS. 23C and 23D are schematic drawing showing one example of an inner cutter set of multilevel force balanced cutting elements disposed on a fixed cutter rotary drill bit incorporating teachings of the present disclosure.
Figure 23D:
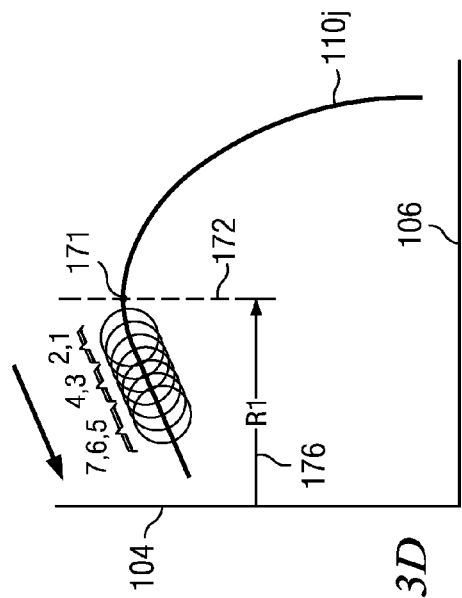

If cutter layout is inwards such as from nose point to bit center, then the blade order in an inner cutter set is reverse of the blade order of the outer cutter set. For example, if the outer cut set is [(1,4,6) (2,5) (3,7)], then the inner cutter set is: [(7,3) (5,2) (6,4,1)]. FIGS. 23C and 23D show the cutter distributions on bit face and on bit profile for cutters in an inner cutter set.

Blade Order for all Outer Cutters

If cutter layout is outward from a nose point on a cutting face profile and more than one outer cutter set is required, the blade order for all outer cutters is a repeat of the first outer cutter set. For example, for an eight blade bit using cutter set [(1,5) (3,7) (2,6) (4,8)], the blade order for all outer cutters is: [1 5 3 7 2 6 4 8, 1 5 3 7 2 6 4 8, 1 5 3 7 2 6 4 8, ... ]

Blade Order for all Inner Cutters

If cutter layout is inward from a nose point on a cutting face profile and more than one inner cutter set is required, the blade order for all inner cutters is a repeat of the first inner cutter set. For an eight blade bit using cutter set [(1,5) (3,7) (2,6) (4,8)], the blade order for all inner cutter sets is: [8 4 6 2 7 3 5 1, 8 4 6 2 7 3 5 1, 8 4 6 2 7 3 5 1, ... ]

Figure 30:
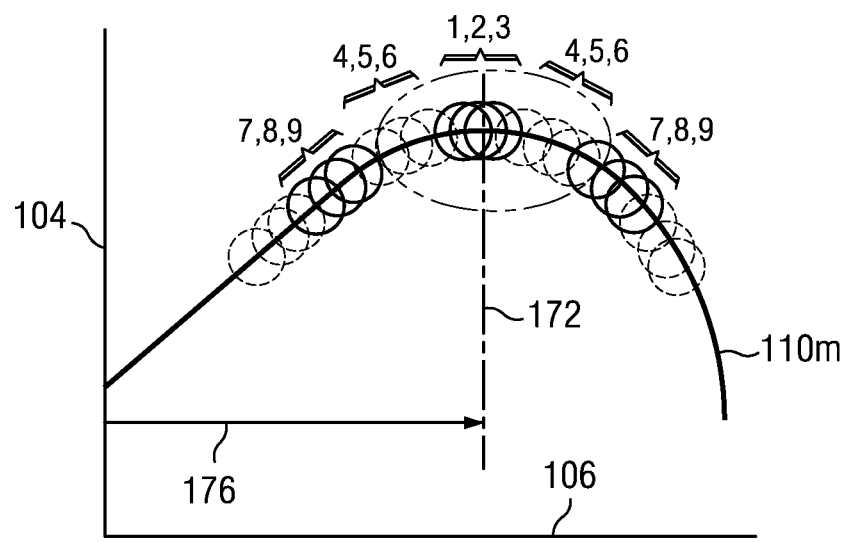
FIG. 30 is a schematic drawings showing an example for selecting or laying out locations for installing cutting elements relative to a nose point on an associated composite cutting face profile in accordance with teachings of the present disclosure.
Figure 31:
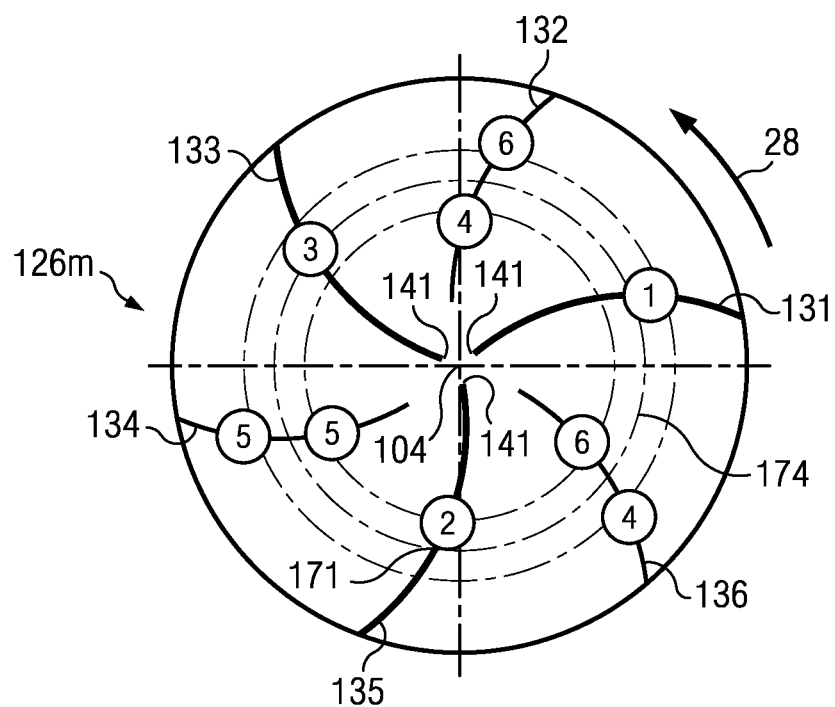
FIG. 31 is a schematic drawing showing an example for selecting or laying out locations for installing cutting elements relative to a nose point on an associated composite cutting face profile in accordance with teachings of the present disclosure.

FIGS. 30 and 31 shows examples of selecting or laying out cutting elements starting at or near a nose point on an associated composite cutting face profile. The resulting cutter groups may be arranged pseudo-symmetrical relative to the nose point on the composite cutting face profile which is also described in copending PCT Patent Application entitled "Multilevel Force Balanced Downhole Drilling Tools and Methods," Serial No. PCT/US09/067,263 filed Dec. 4, 2009.

Portions of cutting face shown in FIGS. 30 and 31 may include primary blades 131, 133 and 135. First end 141 of each primary blade may be spaced closely adjacent to associated bit rotational axis 104. The location for installing cutting element 1 on primary blade 131 may be selected to be closely adjacent to nose point 171 and associated nose circle 174. The location for installing second cutting element 2 may be selected on primary blade 135 spaced radially inward relative to cutting element 1 and also in a radial direction opposite from the direction of rotation indicated by arrow 28. Cutting element 3 may also be disposed proximate the associated nose point. As a result, cutting elements 1, 2 and 3 may be disposed generally symmetrical to each other around nose axis 172 on the associated composite cutting face profile 110*m* as shown in FIG. 30. A first group of outer cutting elements 4, 5 and 6 may be disposed or at locations on exterior portions of associated blades extending at a greater radial distance from the nose point 171. Cutting elements 4, 5 and 6 may be laid out outwardly from nose point 171 to an associated gage pad or gage cutter. The blade order for installing the outer cutting elements 4, 5 and 6 may follow the predefined order so that transient imbalance forces associated with all outer cutter elements may be balanced. After layout of the location for all outer cutting elements, a first group of inner cutting elements 4, 5 and 6 may then be disposed at locations spaced radially inward relative to dotted circle 174 as shown in FIG. 31 and nose axis 172 as shown in FIG. 30. The locations for additional inner cutting elements may also be laid out extending from nose point 171 to bit rotational axis 104. The resulting gaps may be substantially minimized and desired overlap provided with respect to the inner cutters and the outer cutters (as shown in FIGS. 30 and 31).

For some embodiments not expressly shown, the initial location for installing the first cutting element may be selected on a secondary blade such as secondary blade 132, 134 or 136. Since the location for installing the first cutting element is no longer required to be immediately adjacent to the bit rotational axis, the locations for installing the first cutting element may be selected on the secondary blades. The blade order for secondary locations for respective cutting elements may proceed in the predefined order to minimize transient imbalance forces. The importance of selecting locations for laying out or installing cutting elements from a nose point or near a nose point are shown in FIGS. 24A-24D.

For examples as explained in FIG. 30, cutting elements 1, 2 and 3 may be disposed at locations generally symmetrically or arranged relative to nose point 171 and nose axis 172. The first group of outer cutters (4,5,6) may also be balanced with respect to each other and with respect to nose cutters (1,2,3). The first group of inner cutters (4,5,6) may be balanced with respect to each other and with respect to nose cutters (1,2,3). As a result, contact between downhole drilling tool having a composite cutting face profile such as in FIG. 30 may substantially reduce imbalance forces resulting in engagement with downhole formations during transition drilling such as shown in FIGS. 18A and 26.

One aspect of the present disclosure may include laying out cutting elements starting from the nose or near nose of a composite bit face profile. If cutter layout starts from the nose point, then outwards to bit gauge pad, blade order of all outer cutters can follow exactly the pre-defined order so that transient imbalance forces associated with all outer cutters can be balanced. After layout outer cutters, inner cutters are layout from nose point inwards to bit center. In this way, some naked portion may be covered by cutters because cutters are usually first considered to be located close to nose point.

Cutter layout may also start near the nose point. For example, the start layout point may be the start point of the secondary blade and the first cutter may be located on the secondary blade. In this way, blade order of cutters outside of the start point can follow exactly the pre-defined order so that transient imbalance force can be balanced for these outside cutters.

The importance of starting layout cutters from a nose point or near a nose point on an associated composite cutting face profile may be further demonstrated by comparing FIGS. 7A, 7B and 24A-24G with FIGS. 25A, 25B and 26A-26J. If cutter layout starts from the nose point, then cutter groups on left and right sides of nose point may be first placed so imbalance forces associated with these cutters may be balanced.

Cutter Arrangement within Nose Zone

FIG. 30 shows the benefits of placing at least three cutter groups proximate an associated nose zone in accordance with some embodiments of the present disclosure. The first cutter group, cutters (1,2,3), is located around the nose point, the second cutter group, cutters (4,5,6), is on the outside of the first group and the third cutter group, inner cutters (4,5,6), is on the inner side of the first cutter group. The cutter groups should be arranged so that imbalanced forces associated with each cutter group are balanced and imbalance forces associated with the three groups are also balanced. This type of cutter arrangement may be called pseudo-symmetrical cutter groups around nose point.

Usually if bit hydraulics is allowed, at least three cutter sets should be placed around nose zone. The first cutter set is located around the nose point, the second cutter set is on the outside of the first cuter set and the third cutter set is on the inner side of the first cutter set. These cutter sets should be arranged so that imbalance forces associated with each cutter set are balanced and imbalance forces associated with these three cutter sets are also balanced.

Generally, placing more pseudo-symmetrical cutter sets around a nose point may improve force balancing of a downhole drilling tool. Carefully selecting the location of the first end of secondary blades may be important to ensure that a resulting cutter layout includes pseudo-symmetrical arrangement of cutting elements relative to a nose axis. This usually requires at least the first end of secondary blades associated with the third cutter group or cutter set is within the nose radius.

Figure 27A:
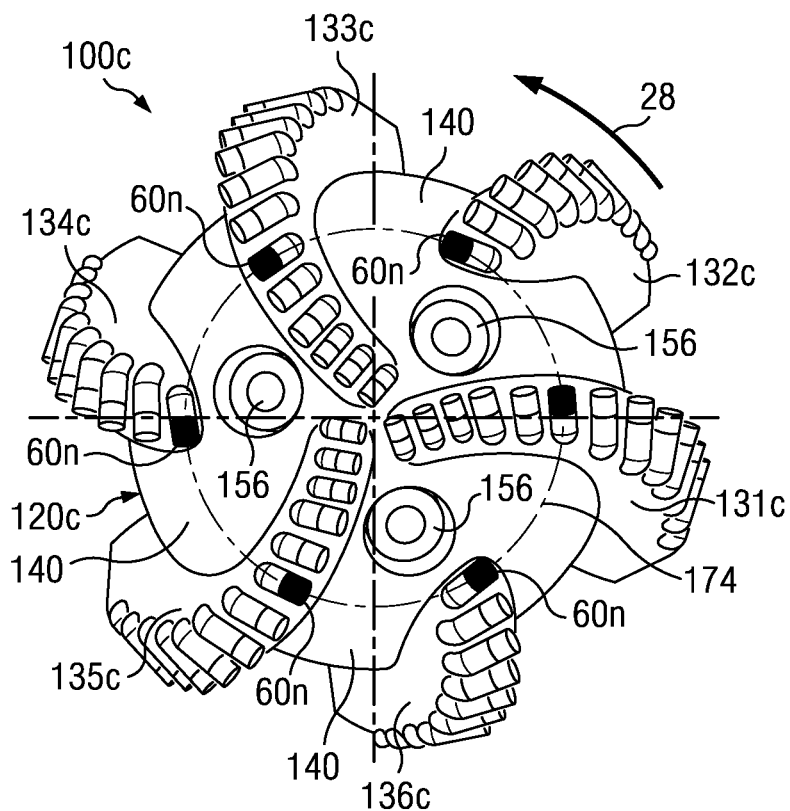
FIG. 27A is a schematic drawing showing an end view of a fixed cutter rotary drill bit incorporating teachings of the present disclosure.
Figure 27B:
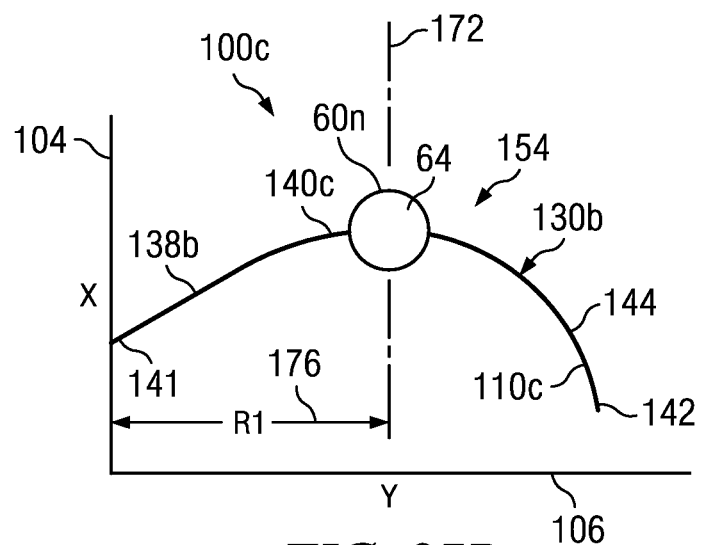
FIG. 27B is a schematic drawing showing portions of a bit face profile resulting from placing cutting elements proximate the nose portions of the drill bit in FIG. 27A in accordance with teachings of the present disclosure.

FIG. 27A is a schematic drawing showing an end view of fixed cutter rotary drill bit 100c. Fixed cutter rotary drill bit 100c may have a plurality of blades 131c-136c disposed on exterior portions of associated bit body 120c having different cutting elements 60 (such as 60i, 60o, 60s, 60g, 60c, 60n, 60na, 60nb, 60t) laid out or disposed in different spiral directions (some cutting elements following and some cutting elements reversing direction of bit rotation) according to the present disclosure (not expressly shown). Dotted circle 174 may correspond with respective nose point 171 on exterior portions of respective blades 131c-136c. Radius of dotted circle 174 may correspond with the distance between bit rotational axis 104 and nose axis 172 as shown in FIG. 27B.

For some applications, respective cutting elements 60n may be disposed closely proximate to nose points 171 on each blade 131c-136c. Resulting bit face profile 110c is shown in FIG. 27B.

For this embodiment, cutting elements 60n have approximately 100% overlap with each other on bit face profile 110c. Therefore, cutting elements 60n do not meet the requirement of "neighbor cutters" for purposes of multilevel force balancing techniques. However, installing a large number of cutting elements proximate the nose point of rotary drill bits and other downhole drilling tools may substantially improve stability during initial contact with a downhole formation or during transition drilling from a first generally hard formation from a first generally soft formation into a second generally harder formation.

For the other applications, nose cutters 60n may only be disposed on nose points associated with primary blades 131c, 133c and 135c (not expressly shown) at approximately the same angle relative to each other and relative to bit rotational axis 104. For such applications cutting elements 60n may be located at approximately the same radial distance from associated bit rotational axis 104 and at the height from reference line 108 extending generally perpendicular to bit rotational axis 104. For other applications two blades (not expressly shown) may be spaced approximately one hundred eighty degrees (180°) from each other or four blades (not expressly shown) may be spaced approximately ninety degrees (90°) from each other or five blades (not expressly shown) approximately seventy two degrees (72°) from each other or six blades (not expressly shown) may be spaced approximately sixty degrees) (60° from each other or seven blades (not expressly shown) may be spaced approximately 51.42° from each other, etc.

The above descriptions on cutter layout assumed cutter layout spiral generally follows the direction of bit rotation because most of today's PDC bits are designed this way. However, if the cutter layout spiral direction reverses bit rotation, the cutter layout principle described above may also be used. FIG. 31 depicts an example of a 6 blade bit whose cutter layout reverses bit rotation.

Algorithm 1: Two Blade Groups

Figure 32A:
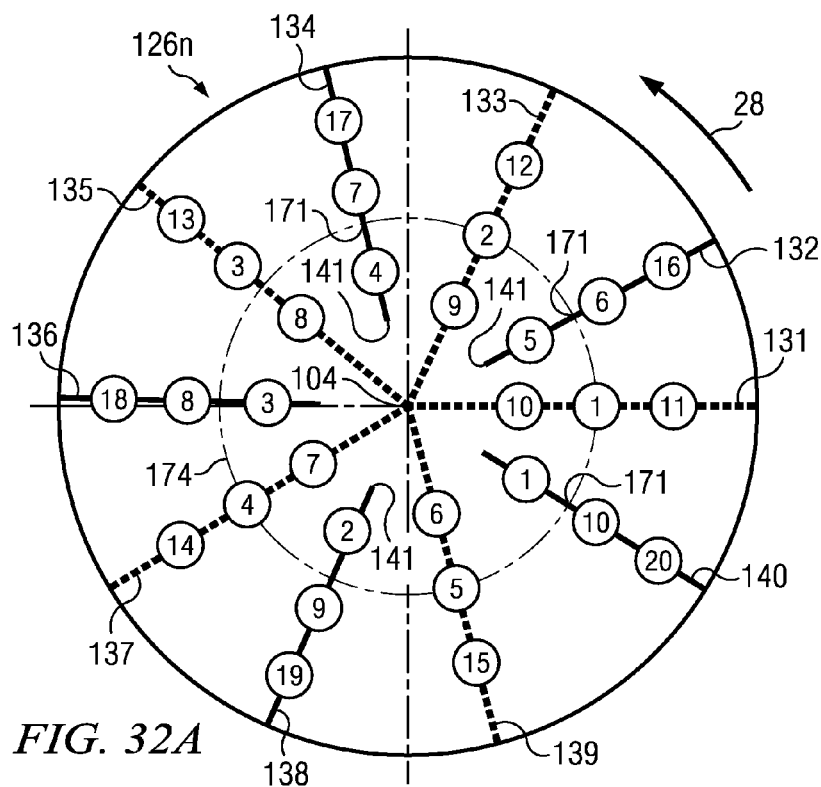
FIGS. 32A-32D are schematic drawings showing various examples for selecting locations to install cutting elements on exterior portions of a downhole drilling tool having ten blades using blade groups and cutter sets in accordance with teachings of the present disclosure.

In addition to layout of different cutting elements 60 (such as 60i, 60o, 60s, 60g, 60c, 60n, 60na, 60nb, 60t) in different spiral directions (some cutting elements following and some cutting elements reversing direction of bit rotation) according to the present disclosure, for multilevel force balancing embodiments, according to one embodiment, if an algorithm for two blade groups is used, then the preferred number of blades in each blade group should be as close as possible. For downhole drilling tool with ten (10) blades, the preferred two blade groups may be (1,3,5,7,9) and (2,4,6,8,10). If the primary blades are (1,3,5,7,9) and cutter layout starts from the nose point 171 or near nose point 171, then the preferred cutter set is [(1 3 5 7 9) (2 4 6 8 10)]. FIG. 32A shows cutting face 126n with resulting layout for nose cutters 1, 2, 3, 4 and 5 disposed at or near respective nose points 171 corresponding with circle 174 when a two blade groups' algorithm is used.

If the primary blades are (1,3,5,7,9) or 131, 133, 135, 137 and 139 as shown in FIG. 32A and layout cutter starts from a start point of one of the secondary blades 132, 134, 136, 138 or 140, then the preferred cutter set becomes [(2,4,6,8,10) (1,3,5,7,9)]. Other two blade groups may be used to layout or select locations for installing cutting elements on a downhole drilling with 10 blades. For example, two blade groups may be used because 10=4+6, the first blade group will have four blades and the second blade group will have six blades.

Algorithm 2: Pair Blade Groups

Figure 32B:
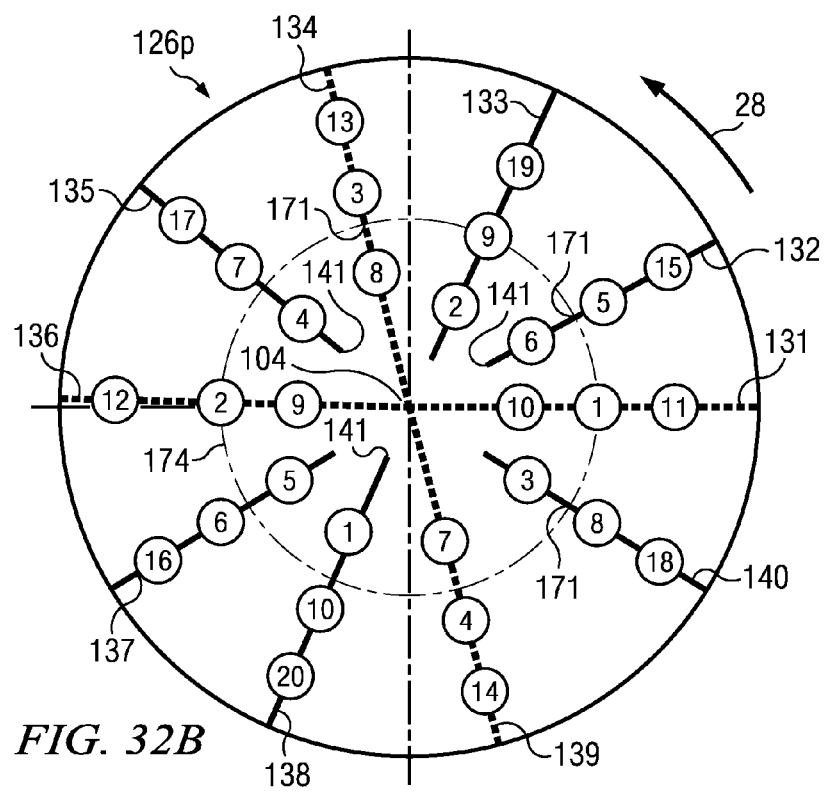

In addition to layout of different cutting elements 60 (such as 60i, 60o, 60s, 60g, 60c, 60n, 60na, 60nb, 60t) in different spiral directions (some cutting elements following and some cutting elements reversing direction of bit rotation) according to the present disclosure, for multilevel force balancing embodiments, according to one embodiment, there are five possible pair groups for a downhole drilling tool with ten blades: (1, 6), (2,7), (3, 8), (4,9), (5,10). If the primary blades are (1,4,6,9) as shown in FIG. 32B, then the preferred cutter set is [(1,6) (4,9) (2,7) (5,10) (3,8)].

As listed in Table 301 of FIG. 28A, there may be other types of cutter sets for a ten blade downhole drilling tool by reordering the blade groups, for example, cutter set [(1,6) (2,7) (3,8) (4,9) (5,10)] may be used for cutter layout. However, cutter set [(1,6) (2,7) (3,8) (4,9) (5,10)] may only be level three force balanced. The preferred cutter set [(1,6) (4,9) (2,7) (5,10) (3,8)] may be level four force balanced. Therefore, using the preferred cutter set for cutter layout ten blade downhole drilling tool may provide better lateral stability.

Algorithm 3: Three Blade Groups

Figure 32C:
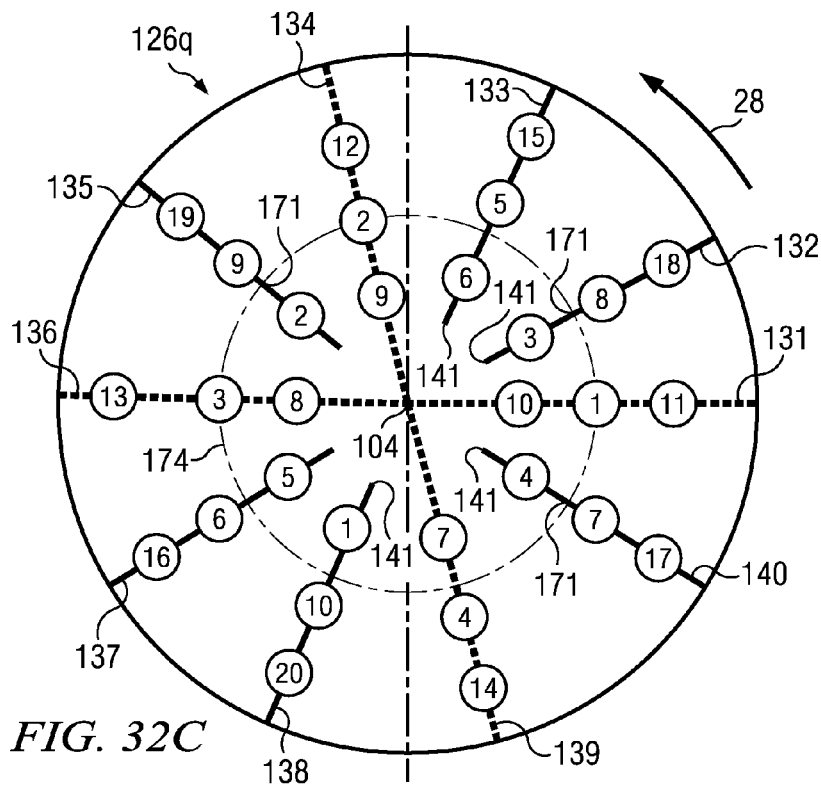

Cutting face 126q as shown in FIG. 32C four primary blades 131, 134, 136 and 139. The blades may be divided into three blade groups [(1,4,6,9) (2,5,8) (3,7,10)]. In addition to layout of different cutting elements 60 (such as 60i, 60o, 60s, 60g, 60c, 60n, 60na, 60nb, 60t) in different spiral directions (some cutting elements following and some cutting elements reversing direction of bit rotation) according to the present disclosure, for multilevel force balancing embodiments, according to one embodiment, the preferred cutter set is [(1, 4,6,9), (3,7,10), (2, 5, 8)] which is level four force balanced. FIG. 32C depicts the cutters layout when three groups algorithm is used.

As listed in Table 301 of FIG. 28B, there may be other types of cutter set for a ten blade downhole drilling tool using three blade groups. For example, cutter set [(1,3,6,8) (2,5,9) (4,7, 10)] may be used to layout cutters but it may be only level three force balanced.

Algorithm 4: Four Blade Groups

Figure 32D:
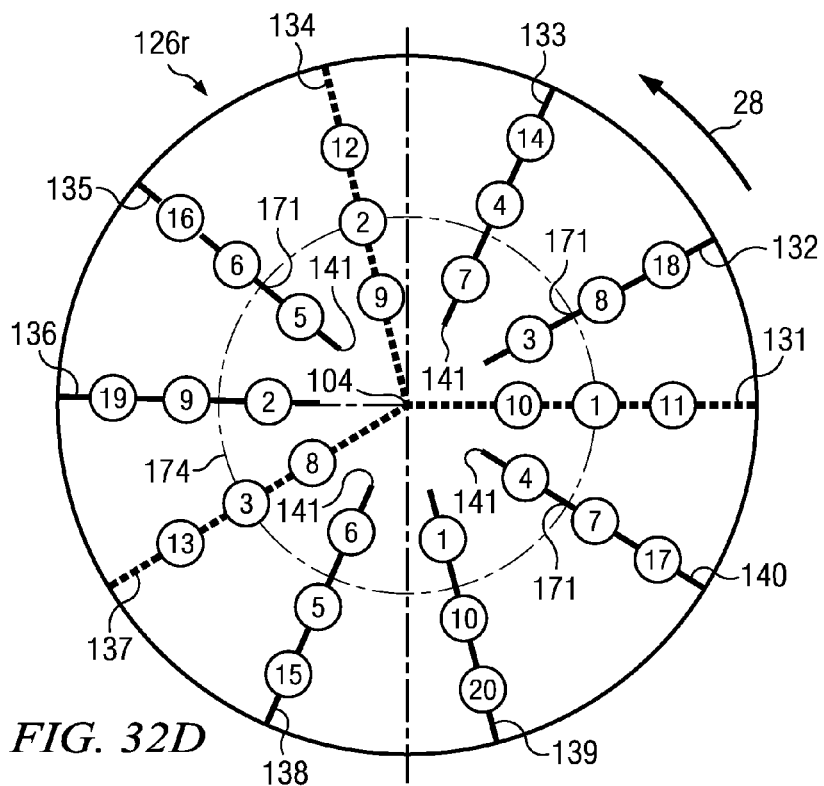

Cutting face in FIG. 32D has only three primary blades 131, 134 and 137. Four cutter groups and cutter set [(1,4,7) (3,8) (5,10) (2,6,9)] may be used to select or layout locations for installing cutting elements on exterior portions of blades 131-140, in addition to layout of different cutting elements 60 (such as 60i, 60o, 60s, 60g, 60c, 60n, 60na, 60nb, 60t) in different spiral directions (some cutting elements following and some cutting elements reversing direction of bit rotation) according to the present disclosure for a multilevel force balancing embodiment as described herein. This cutter set may only be level three force balanced. Examples of other cutter sets which may also be used are shown in Table 301 of FIG. 28B.

Other Algorithms: Five Blade Groups, Six Blade Groups and Seven Blade Groups

If the number of blades on a downhole drilling tool is M, then the maximum number of blade groups may be estimated by the integer part of M/2. For example, for a downhole drilling tool has fifteen (15) blades, the blades may be divided into a maximum of 7 groups. Therefore, for a downhole drilling tool with 15 blades, at least six algorithms may be used:

Two blade groups: 15=7+8;
Three blade groups: 15=5+5+5;
Four blade groups: 15=3+4+4+4;
Five blade groups: 15=3+3+3+3+3;
Six blade groups: 15=3+3+3+2+2+2;
Seven blade groups: 15=3+2+2+2+2+2+2;

Selected cutter sets for some of algorithms are listed in Table 301 in FIGS. 28A, 28B and 29. For multilevel force balancing embodiments, in addition to layout of different cutting elements 60 (such as 60i, 60o, 60s, 60g, 60c, 60n, 60na, 60nb, 60t) in different spiral directions (some cutting elements following and some cutting elements reversing direction of bit rotation) according to the present disclosure, selected cutter sets and algorithms as described herein may be used.

Blade Order Violations & Algorithm

There are two cases in which the above pre-defined blade orders, especially blade orders for inner cutter sets, may violate multilevel force balancing requirements.

Case 1: Minimal and Maximal Distance Between Two Neighbor Cutters on the Same Blade The distance between any two adjacent cutters (not on the same blade) on an associated composite cutting face profile is determined by a given design overlap ratio of neighbor cutting surface. Overlap ratio of two cutters is defined by the shared area divided by the sum of areas of two cutters. For example, 100% overlap of neighbor cutting surfaces results in zero distance between the two cutters having the same radius on the composite cutting face profile. The desired overlap between any two neighbor cutters on an associated cutting face profile is usually less than 100% and most often between 20% to 90% in accordance with teachings of the present disclosure.

The pre-defined overlap and pre-defined blade orders may lead to the distance between two neighbor cutters on the same blade being either too small or too large. If this distance is too small, there may be not enough space on a blade to install a cutting element. If this distance is too large, then at least one of the cutters may remove too much rock and may subject to increased forces as compared to cutters with proper overlap.

Satisfaction of distance requirement between two neighbor cutters on the same blade may lead to violation of blade orders, especially blade order for inner cutters. Iteration is usually needed to avoid this situation by carefully adjusting overlap ratio, cutter size, side rake angle and other design parameters.

Case 2: Incomplete Cutter Group or Incomplete Cutter Set

The pre-defined blade orders, either for inner cutters or for outer cutters, are repeated by cutter set. The number of cutters on a downhole drilling tool divided by the number of cutters in a cutter set may be not equal an integer. Several last cutters may not belong to any pre-defined cutter groups or cutter sets.

For example, for an eight blade on a downhole drilling tool using cutter set [(1,5) (3,7) (2,6) (4,8)], and starting layout cutters from the nose point, then the predefined blade orders for all inner cutters are: [8 4 6 2 7 3 5 1, 8 4 6 2 7 3 5 1]

However, if only 9 cutters may be put on inner blades and the resulted blade order for the 9 cutters becomes: [8 4 6 2 7 3 5 1, 8]. The last cutter (or the cutter closet to bit center), cutter 9 is on blade 8 and does not belong to any cutter group. The imbalance forces created by cutter 9 may not be balanced.

If the start radii of the secondary blades 2 and 6 are outside of the nose point, then the blade orders for inner cutters may become: [8 4 7 3 5 1, 7 3 5 1]. The first cutter set becomes incomplete. The imbalance forces associated with an incomplete cutter set may not be balanced.

Figure 35:
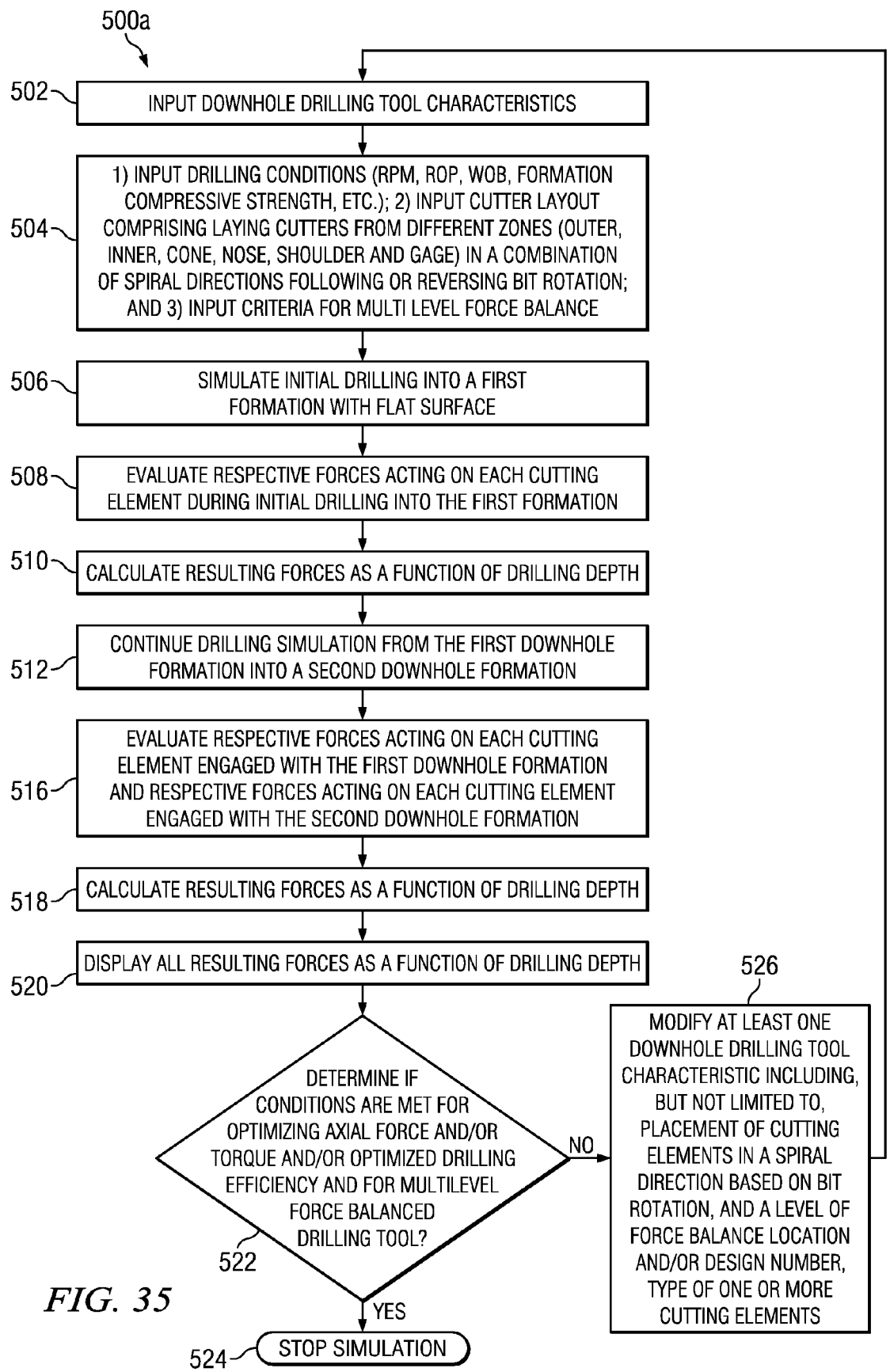
FIG. 35 is a process diagram showing one example of techniques or procedures which may be used to design various downhole drilling tools in accordance with teachings of the present disclosure.
Figure 36A:
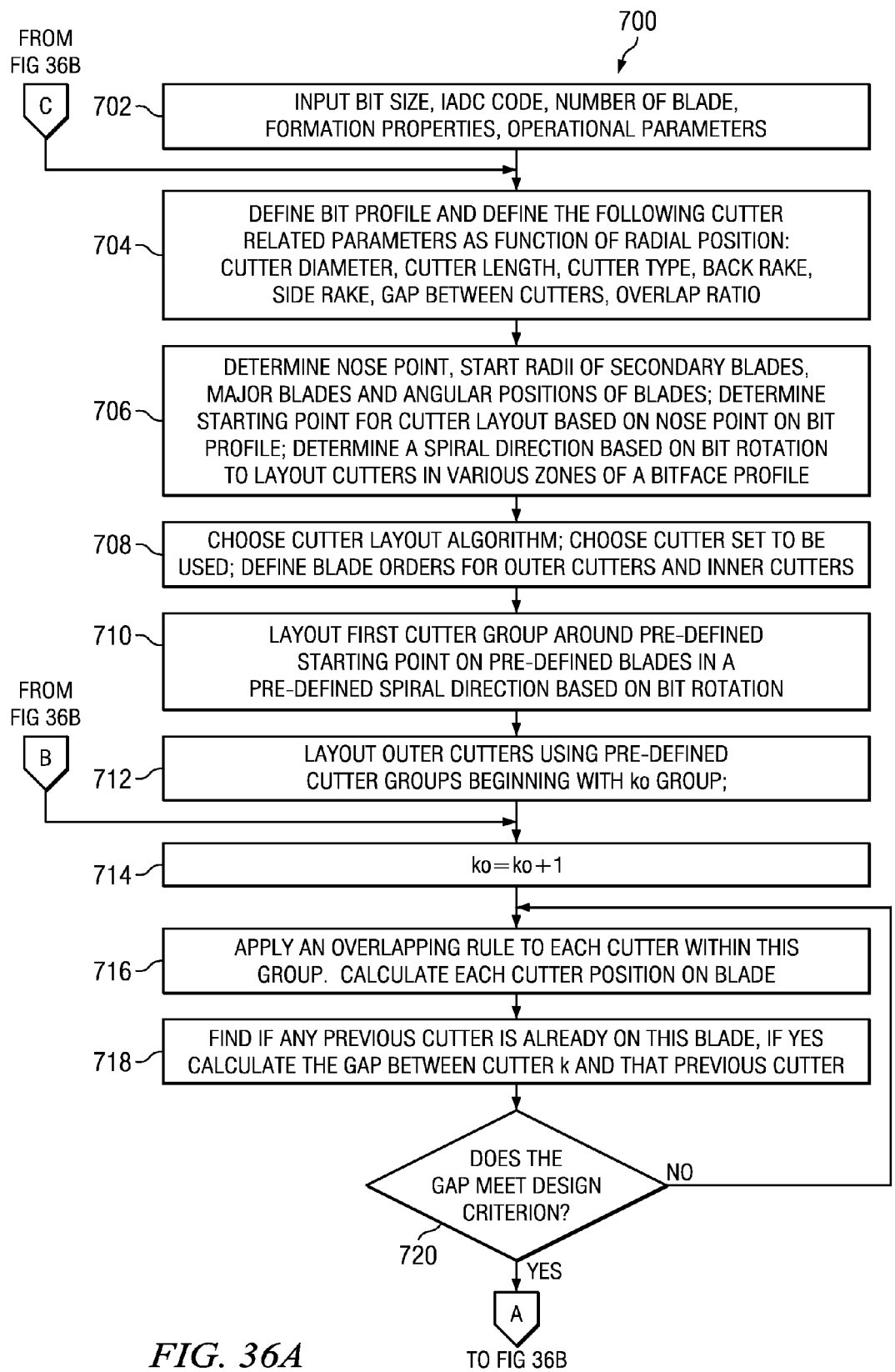
FIGS. 36A and 36B are process diagrams showing one example of methods of techniques which may be used to install cutting elements on exterior portions of the downhole drilling tool and to force balance a downhole drilling tool in accordance with teachings of the present disclosure.
Figure 36B:
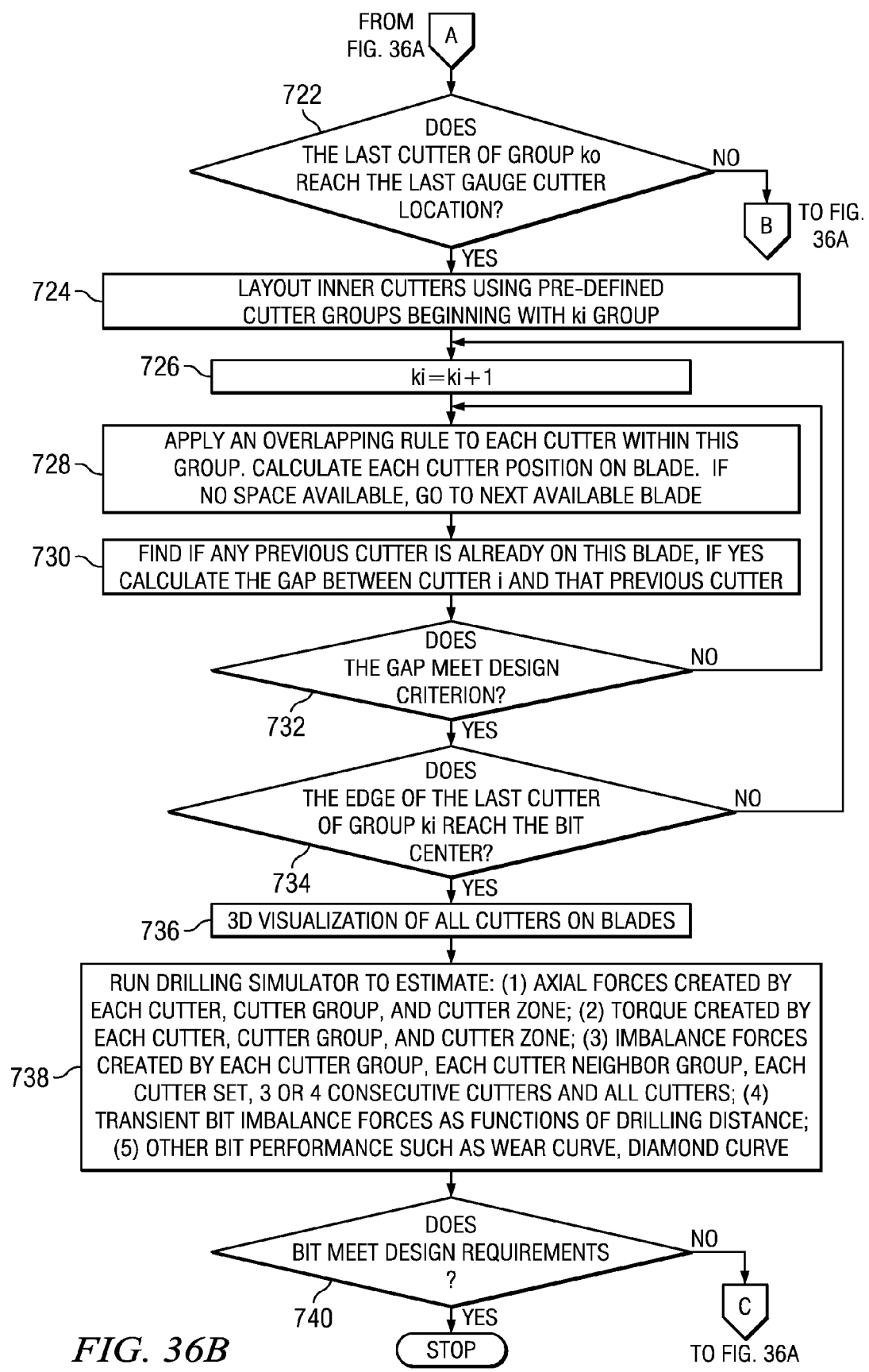

A downhole drilling tool of method 700 shown in FIGS. 35, 36A and 36B may be needed to avoid this situation by adjusting the starting point of cutter layout, overlap ratio for inner cutters, cutter size, side rake angle, phase angle and other design features according to the present embodiments.

Choice of Cutter Layout Algorithms

Many algorithms may be used for a downhole drilling tool with a given number of blades. For each cutter layout algorithm, there may be many cutter sets to choose from. A downhole drilling tool designer should first choose which algorithm to use and then choose which cutter set to use. Selected cutter sets for a given number of blades are listed if FIGS. 28A, 28B and 29.

Three rules should generally be followed for choosing a cutter layout algorithm and choosing a force balanced cutter set.

First Rule:

Preferred number of cutters in a blade group is either 2 or 3. If the number of blades is even, then pair blade group algorithm should be used. For example, for an eight blade bit, the preferred cutter layout algorithm should be pair blade group algorithm. If the number of blades is odd, then number of blade in each blade group should be either 2 or 3. For a downhole drilling tool with seven blades, the preferred number of blade groups should be three, namely, 7=3+2+2. Therefore, the three blade group algorithm should be used.

Second Rule:

The number of cutters in each cutter group should be as close as possible. For the two blade group algorithm, if the number of blades is even, then the first and second blade groups will have the same number of blades. If the number of blades is odd, then one blade group has K blades and another blade group has K+1 blades where 2K+1 equals the number of blades.

A downhole drilling tool with nine blades may be used to further demonstrate this rule. Two algorithms may be used as listed in FIGS. 28A and 28B:

Three blade groups: 9=3+3+3; and
Four blade groups: 9=3+2+2+2.

The three blade group algorithm may be better than the four blade group algorithm because the three blade group algorithm may create more symmetrical cutting structure than the four blade group algorithm.

Third Rule:

Level four force balanced cutter sets should be as preferred over level three force balanced cutter sets. This rule was demonstrated for a downhole drilling tool with eight blades in FIG. 22D. The preferred cutter set [(1,5)(3,7)(2,6)(4,8)] may be level four force balanced which should be used in cutter layout.

Figure 33:
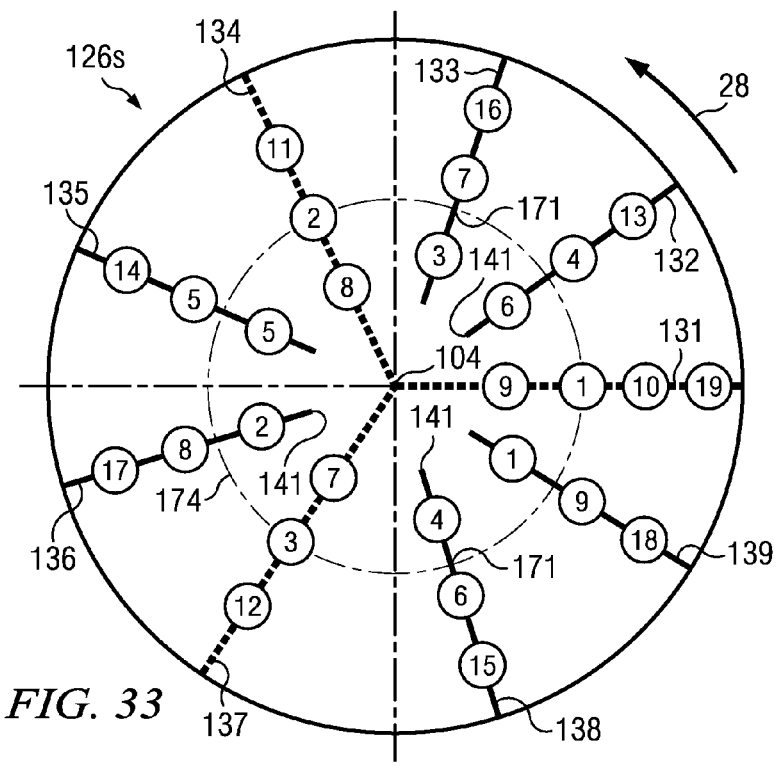
FIG. 33 is a schematic drawing showing one example of techniques to select locations for installing cutting elements on exterior portions of a downhole drilling tool having nine blades using three blade groups in accordance with teachings of the present disclosure.

Rule three may be further demonstrated for a downhole drilling tool with nine blades and imbalance forces created by any three neighbor cutter group: [(1,2,3)(2,3,4)(3,4,5)(4,5,6)(5,6,7)(6,7,8)(7,8,9)]. If the three cutter group algorithm and the preferred cutter set [(1,4,7)(2,5,8)(3,6,9)] are used, the cutter layout is shown in FIG. 33. Imbalance forces associated with any three neighbor cutters [1,2,3)(2,3,4)(3,4,5)(4,5,6)(5,6,7)(6,7,8),(7,8,9) may be balanced or minimized because the degrees of separation between any these cutters relative to rotational axis 104 is over one hundred eighty (180°) degrees.

Figure 34:
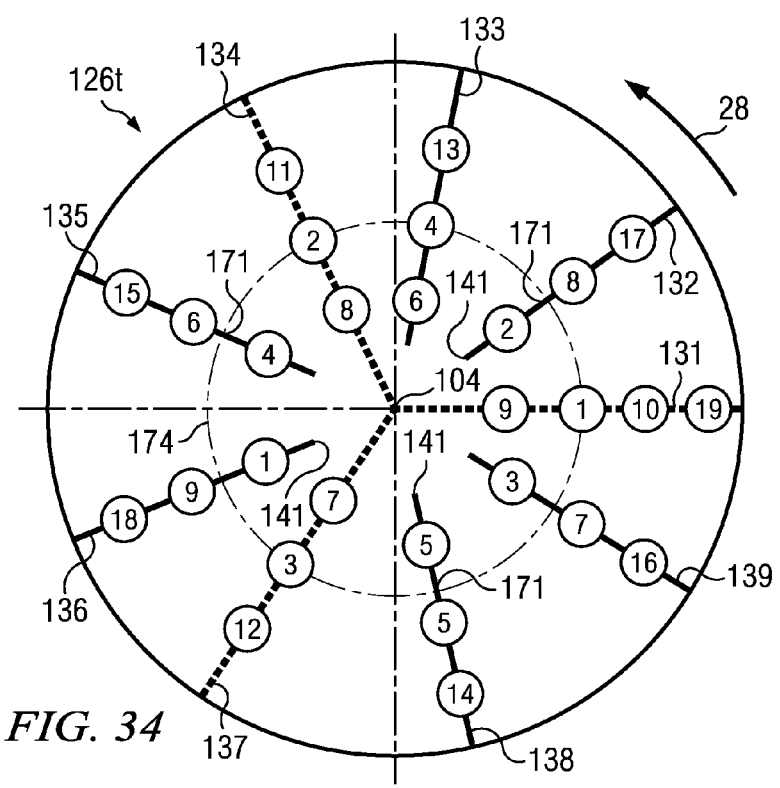
FIG. 34 is a schematic drawing showing one example of techniques to select locations for installing cutting elements on exterior portions of a downhole drilling tool having nine blades using four blade groups in accordance with teachings of the present disclosure.

On the other hand, FIG. 34 shows cutter layout where four group algorithm is used with cutter set [(1,4,7)(3,8)(5,9)(2,6)]. Among any three neighbor cutters (1,2,3)(2,3,4)(3,4,5)(4,5,6)(5,6,7)(6,7,8)(7,8,9) imbalance force associated with (2,3,4), (5,6,7) and (7,8,9) may not be balanced or minimized because three cutters are located on the same side of cutting face 110A.

Therefore, a nine blade bit designed by three group algorithm using cutter set [(1,4,7)(2,5,8)(3,6,9)] should be more stable than that designed by four group algorithm using cutter set [(1,4,7)(3,8)(5,9)(2,6)] using multilevel force balancing procedures.

Design Procedure for Embodiments with Multilevel Force Balanced Downhole Drilling Tool FIGS. 7A and 8A show various features associated with rotary drill bit 90a which may be force balanced using traditional one level force balancing techniques and traditional cutter layout procedures starting from bit rotational axis 104. FIGS. 24A-24D show examples of transient imbalance forces which have not been satisfactorily balanced based on simulations of rotary drill bit 90 while forming a wellbore through non-uniform downhole drilling conditions.

Rotary drills bits 90a and 100 may be generally described as eight blade fixed cutter rotary drill bits. Respective blades 91-98 on rotary drill bit 90a and blades 131-138 on rotary drill bit 100 may have the same configuration and dimensions relative to respective bit rotational axis 104. Rotary drill bit 90a and 100 may have the same number, size and type of cutting elements.

Figure 24A:
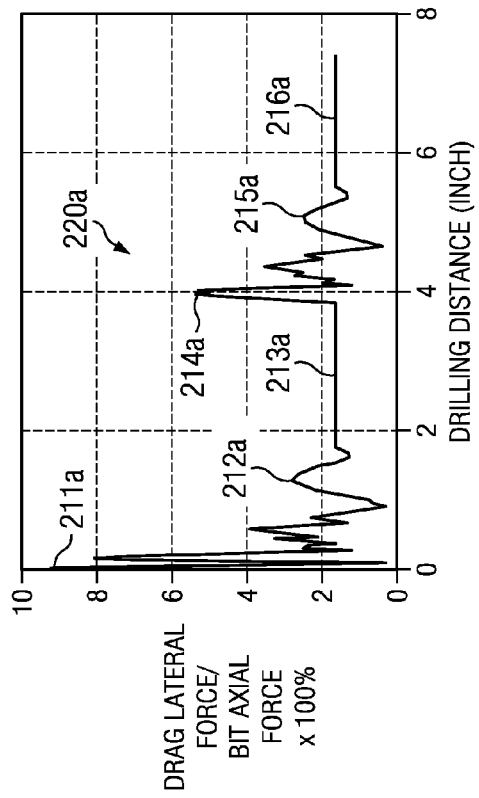
FIGS. 24A-24G are graphs showing imbalanced force levels during transition drilling which may result from installing cutting element on the drill bit shown in FIG. 7A and using prior art techniques to force balance such cutting elements.
Figure 24B:
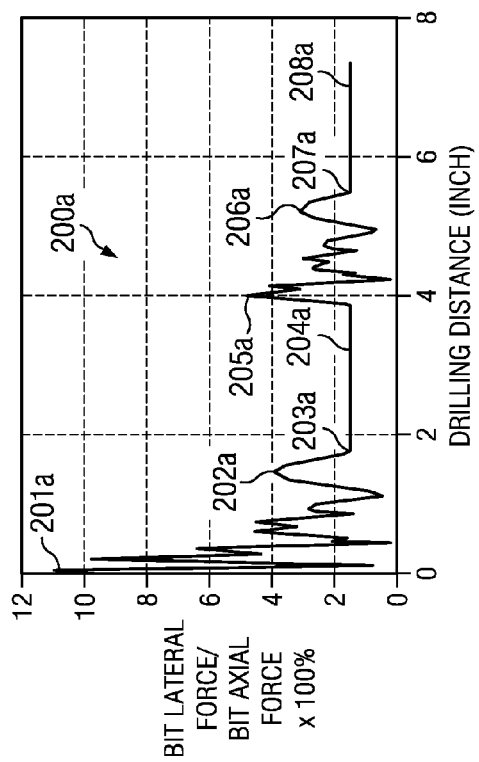
Figure 24C:
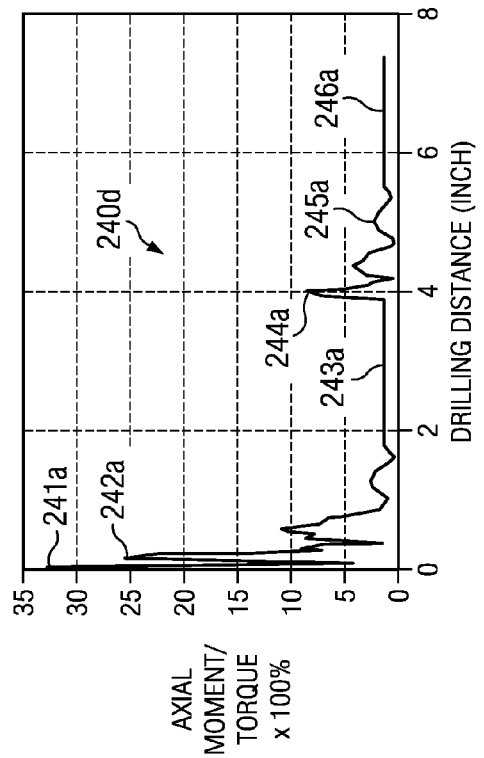
Figure 24D:
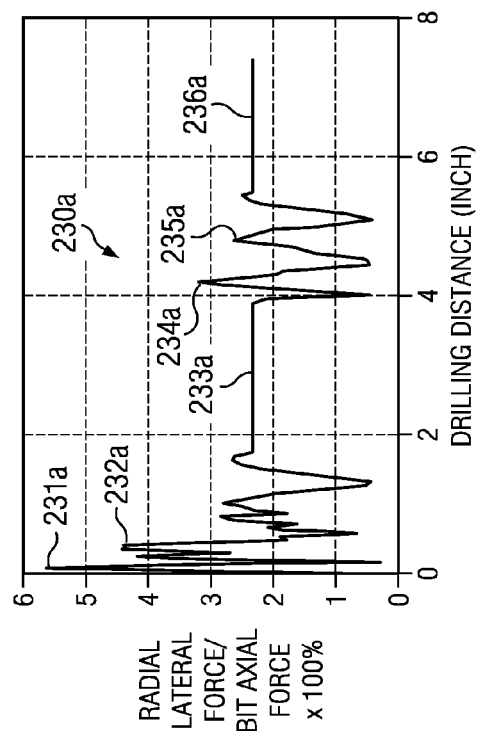
Figure 24E:
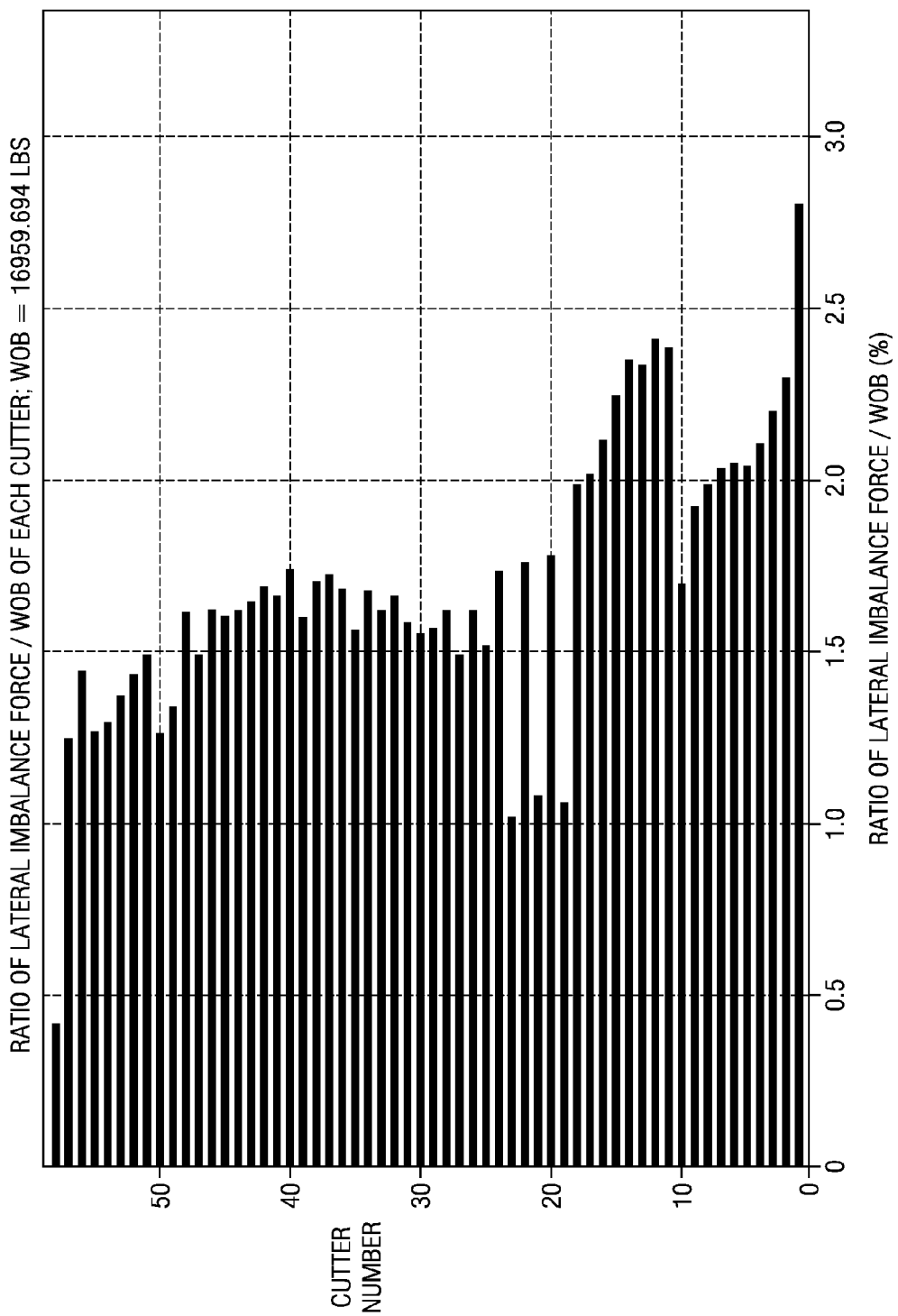
Figure 24F:
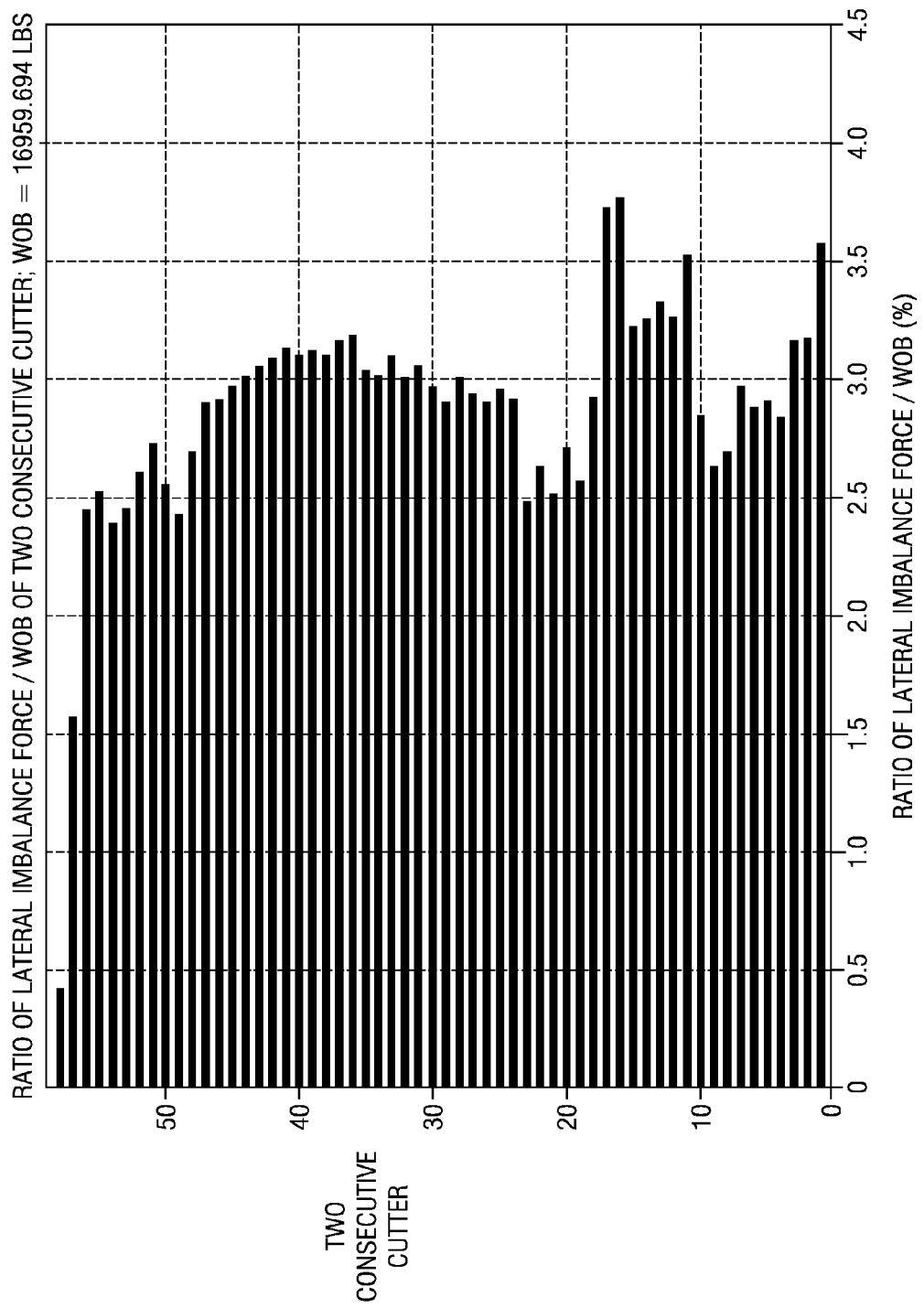
Figure 24G:
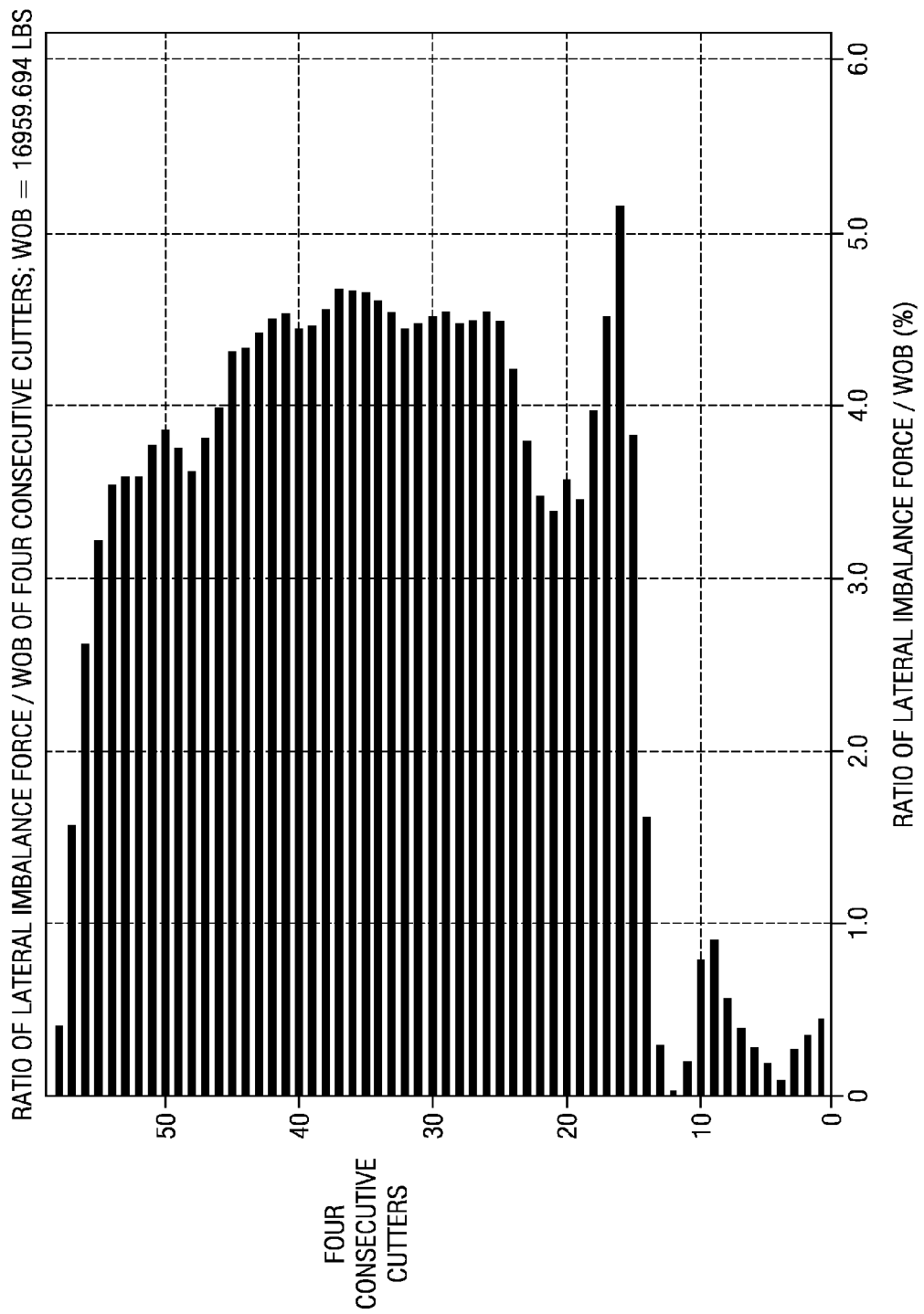

FIGS. 24A-24D show the bit imbalance forces during transition drilling of a generally non-uniform formation such as shown in FIGS. 19A-19C. FIG. 24E shows the magnitude of the lateral force ratio of each individual cutter when all of the cutters on composite bit face profile 126 drill into a uniform formation. FIG. 24F shows the magnitude of the lateral force ratio of any two consecutive neighbor groups of cutters when all of the cutters drill into a uniform formation. FIG. 24G shows the magnitude of the lateral force ratio of any four consecutive neighbor groups of cutters when all of the cutters drill into a uniform formation.

Except for some inner cutters (1-12), lateral imbalance forces associated with the four neighbor cutter groups are greater than lateral imbalances forces with each individual cutting element 1-75. The maximum lateral imbalance force shown in FIG. 24A may be as high as approximately 11% of the total axial force applied to rotary drill bit 90a. The maximum bending moment applied to rotary drill bit 90a may be as high as 35% of bit torque during initial engagement with the end of a wellbore. See FIG. 24D. During transition drilling from one downhole formation with a compressive strength of approximately 5,000 psi to a second downhole formation with a compressive strength of approximately 18,000 psi transient bit lateral imbalance forces may be as high as 5% of the bit axial force. The axial bending moment applied to fixed cutter rotary drill bit 90a during transit drilling from formation layer 41 to formation layer 42 may be approximately 7.5% of the associated bit torque. Bit imbalance forces only return to a satisfactory level when all cutting elements disposed on exterior portions of rotary drill bit 90a are engaged with a generally uniform downhole formation either formation layer 41 or 42.

Figure 25A:
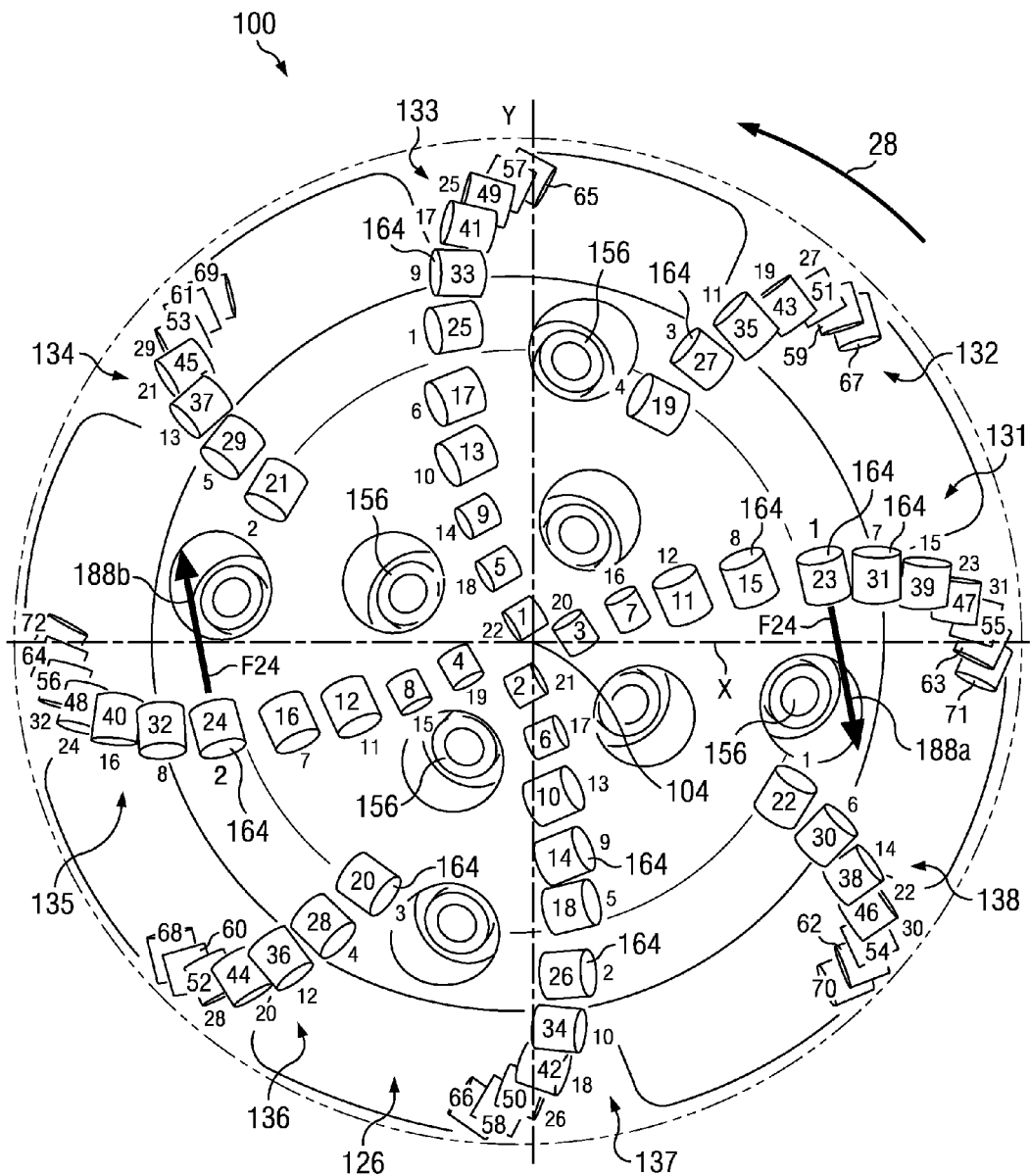
FIGS. 25A and 25B are schematic drawings showing one example of a fixed cutter rotary drill bit with cutting element disposed thereon in accordance with teachings of the present disclosure.
Figure 25B:
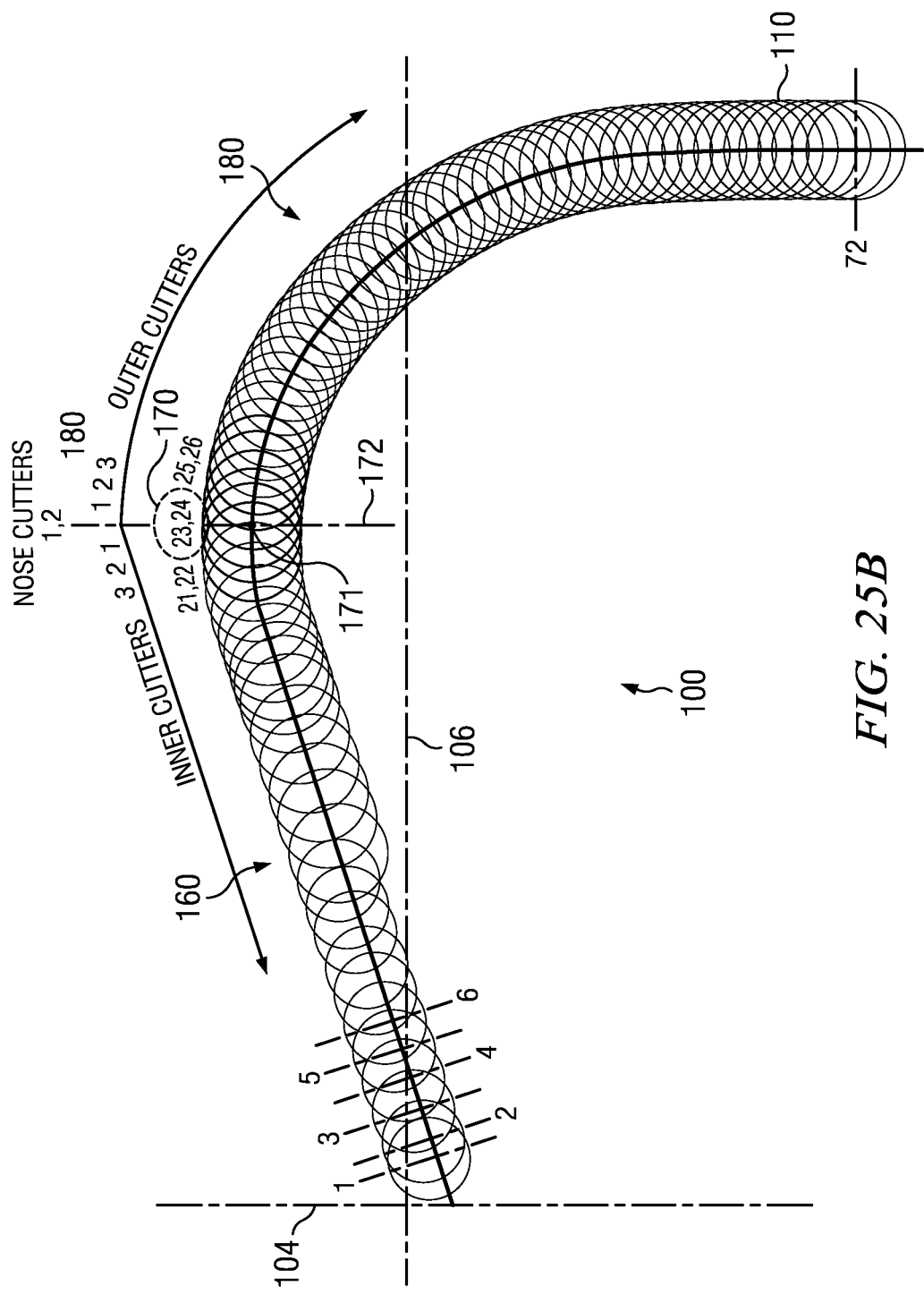

FIGS. 25A and 25B show various features associated with rotary drill bit 100 which may be multilevel force balanced in accordance with teachings of the present disclosure. FIGS. 26A-26J show various examples of imbalance forces acting on rotary drill bit 100 which may be substantially reduced (balanced) by designing and manufacturing fixed cutter rotary drill bit 100 based at least in part on multilevel force balancing techniques and cutter layout procedures incorporating teachings of the present disclosure.

FIGS. 25A and 25B show various features of rotary drill bit 100 which may have different cutting elements 60 (such as 60i, 60o, 60s, 60g, 60c, 60n, 60na, 60nb, 60t) disposed or located in different spiral directions (some cutting elements following and some cutting elements reversing direction of bit rotation) according to the present disclosure and further multilevel force balanced.

Locations for installing cutting elements 1-72 on cutting face 126 of rotary drill bit 100 may be selected starting from nose point 171 or nose axis 172 as described in sections above. See for example FIG. 28B.

In FIG. 25A two numbers are provided for each cutting element. The numbers written in front of cutting face 164 of each cutting element corresponds with the sequence in which locations were selected or laid out for installing each cutting element on respective blades 131-138. A second number is written on top of each cutting element corresponding with the sequence in which each cutting element may be installed on exterior portions of associated blade 131-138. Cutting elements are often installed in pockets or sockets disposed (not expressly shown) on exterior portions of a blade.

Fixed cutter rotary drill bit 100 may be generally described as rotary drill bit 90a with locations for installing cutting elements 1-72 redesigned using the pair group algorithm for an eight blade downhole drill tool shown on table 302 in FIG. 29. The preferred level four force balanced cutter set is [(1,5) (3,7) (2,6) (4,8)] on table 302. The starting point for installing cutting elements on the exterior portions of fixed cutter rotary drill bit 100 is preferably nose point 171 or nose axis 172 on composite bit face profile 110 as indicated in FIG. 25B. Nose cutters 1 and 2 as shown in FIG. 25B may correspond generally with nose cutters 60n as shown in FIG. 1B. In FIG. 25A respective phase angles represented as arrows 188a and 188b are shown extending from nose cutters 1 and 2 as shown in FIG. 25B. As previously noted, the pair group algorithm for an eight blades bit was used to select locations for installing cutting elements 1-72 on exterior portions of blades 131-138. Nose cutters 1 and 2 as shown in FIGS. 25A and 25B may also be described as the pair cutter group proximate nose point 171.

The location for installing cutting elements in outer segment 180 may be selected starting from nose cutter 2 on blade 135. Phase angle arrow 188b extends from nose cutter 2. For the embodiment shown in FIG. 25A, the location for installing the first outer cutter is selected on primary blade 133. The location for installing the second outer cutter is shown on blade 137.

Large bold numbers 1 and 2 in FIG. 25A correspond with nose cutters 1 and 2 in FIG. 25B. The location for installing additional cutting element for additional outer cutters may be selected in a direction corresponding with the direction of rotary drill bit 100 as indicated by arrow 28.

Inner cutters disposed on exterior portions of fixed cutter rotary drill bit 100 may be selected or laid out as shown in FIG. 25B extending from nose axis 172 to bit rotational axis 104.

FIGS. 26A-26D indicate that bit imbalance forces during transition drilling such as shown in FIGS. 18A and 19A-19C may be substantially reduced or balanced. The cutter numbers listed in FIGS. 26E-26J correspond with the sequence in which the cutting elements are installed on rotary drill bit 100 starting from a location proximate bit rotational axis 104.

Figure 26A:
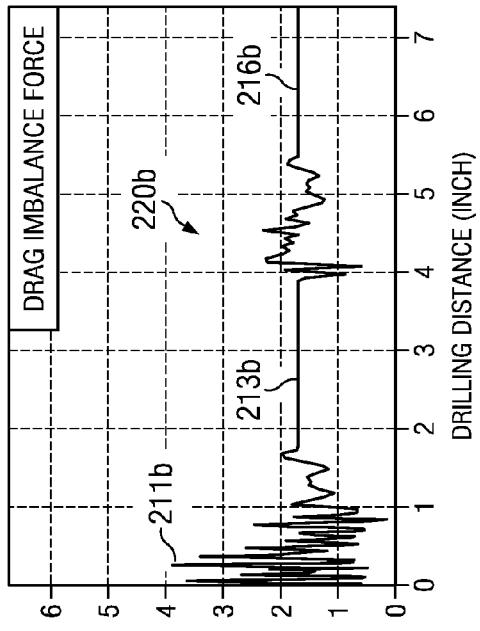
FIGS. 26A-26D are graphs showing reduced imbalance forces during transition drilling resulting from multilevel force balancing and installing cutting elements on the drill bit shown in FIGS. 25A and 25B in accordance with teachings of the present disclosure.
Figure 26B:
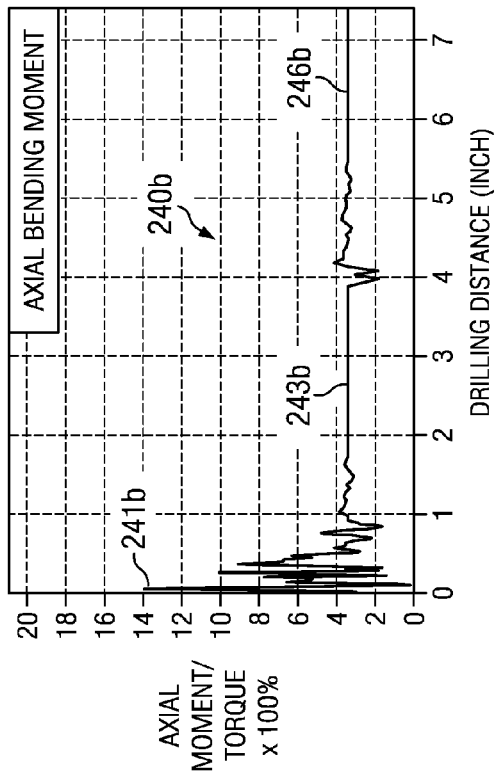
Figure 26C:
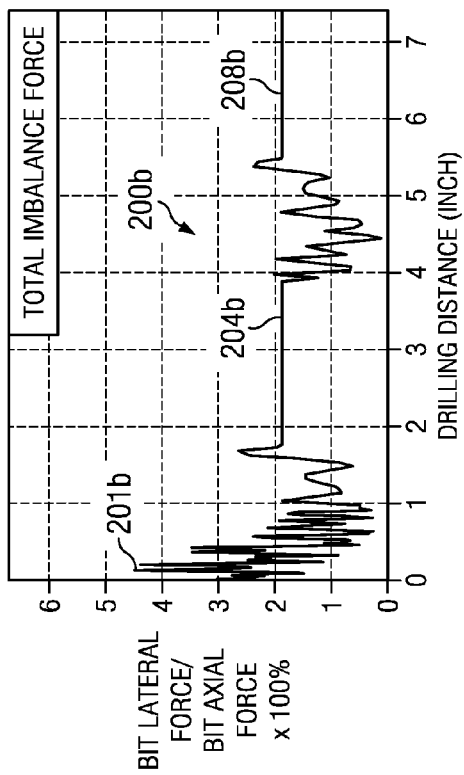
Figure 26D:
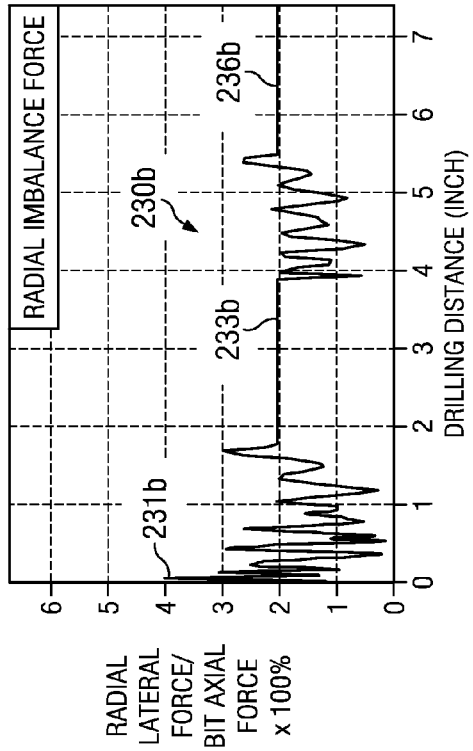
Figure 26E:
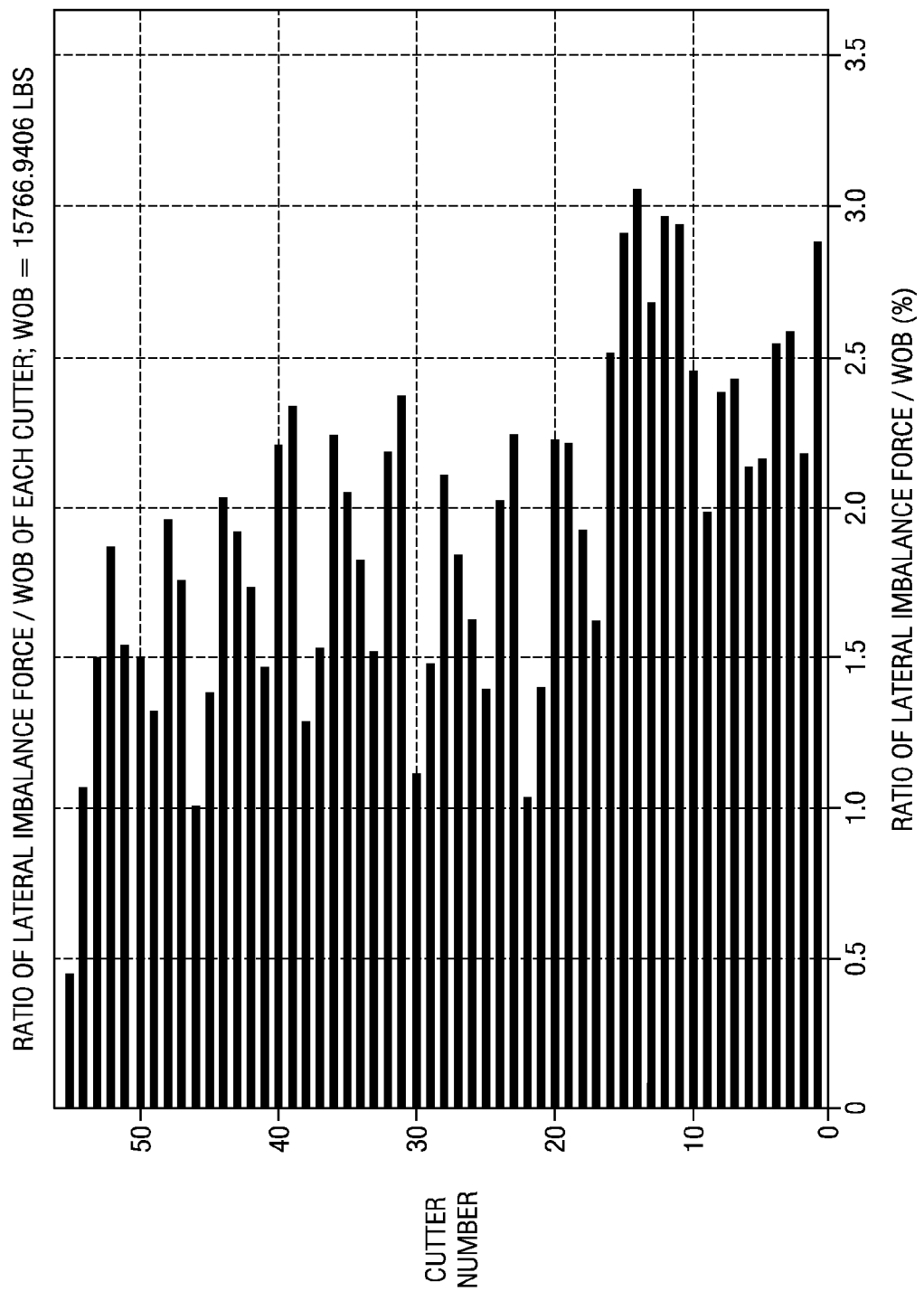
FIGS. 26E and 26F are graphs showing lateral forces and phase angles of each individual cutter of the drill bit shown in FIGS. 25A and 25B in accordance with teachings of the present disclosure.
Figure 26F:
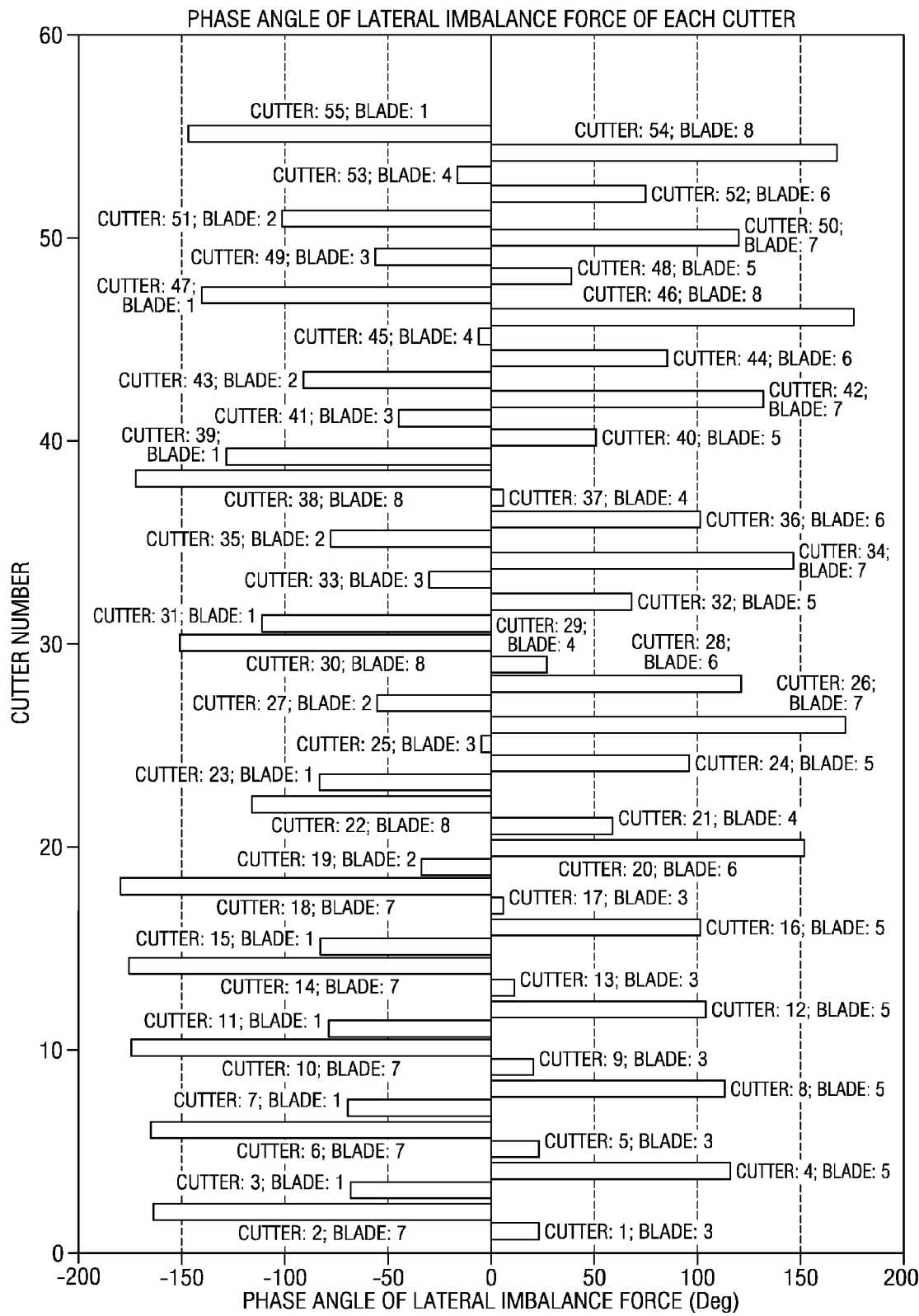

FIG. 26E shows the magnitude of the lateral force ratio of each individual cutter when all of the cutters drill into a uniform formation. The magnitude of the lateral force of each cutter is between approximately 1% and approximately 3% of the bit axial force. FIG. 26F shows the phase angle of the lateral force of each individual cutter.

Figure 26G:
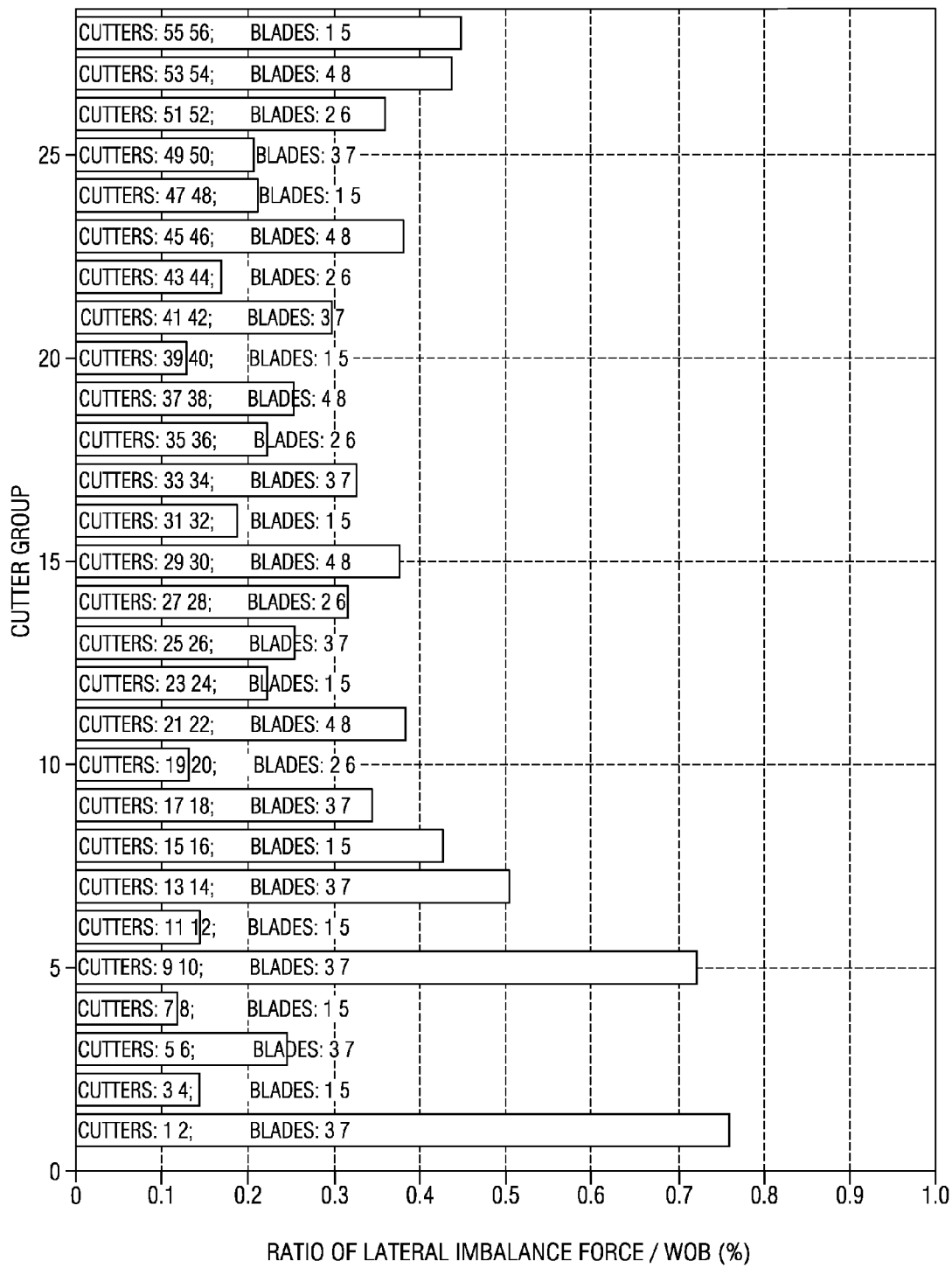
FIG. 26G is a graph showing level one force balancing of the drill bit shown in FIGS. 25A and 25B in accordance with teachings of the present disclosure.

FIG. 26G shows the magnitude of the lateral force ratio of each cutter group when all of the cutters drill into a uniform formation. The lateral force of each cutter group is less than that of an individual cutter in the same group. The magnitude of the lateral force for most cutter groups is between approximately 0.3% and approximately 0.77% of the bit axial force. Therefore, drill bit 100 is level one force balanced.

Figure 26H:
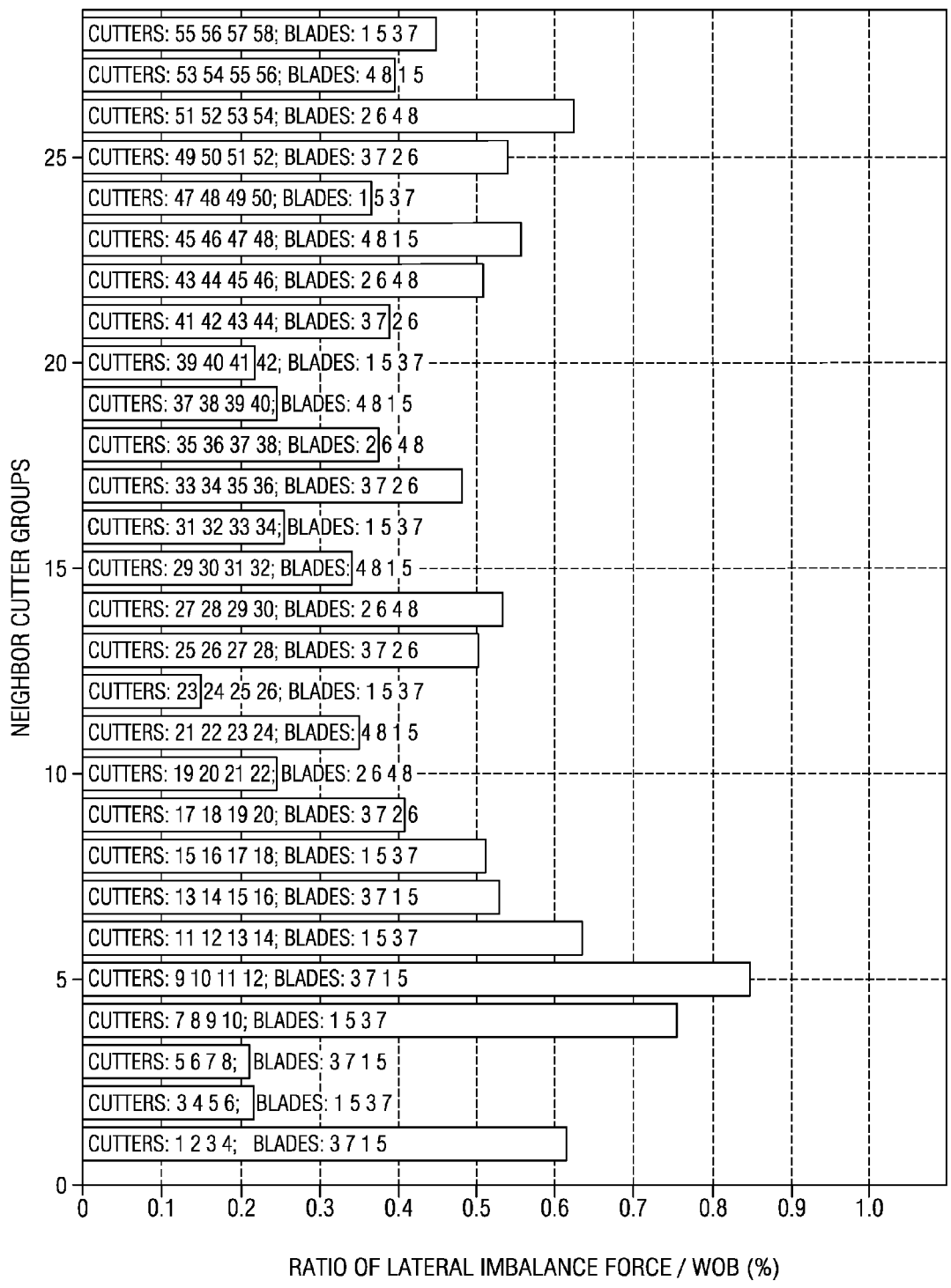
FIG. 26H is a graph showing level two force balancing of the drill bit shown in FIGS. 25A and 25B in accordance with teachings of the present disclosure.

FIG. 26H shows the magnitude of the lateral force ratio of any two consecutive neighbor groups of cutters when all of the cutters drill into a uniform formation. The lateral force of each of the two consecutive neighbor groups is less than that of an individual cutter in the same two neighbor groups. The magnitude of the lateral force for most two neighbor cutter groups is between approximately 0.45% and approximately 0.85% of the bit axial force. Therefore, drill bit 100 is level two force balanced.

Figure 26I:
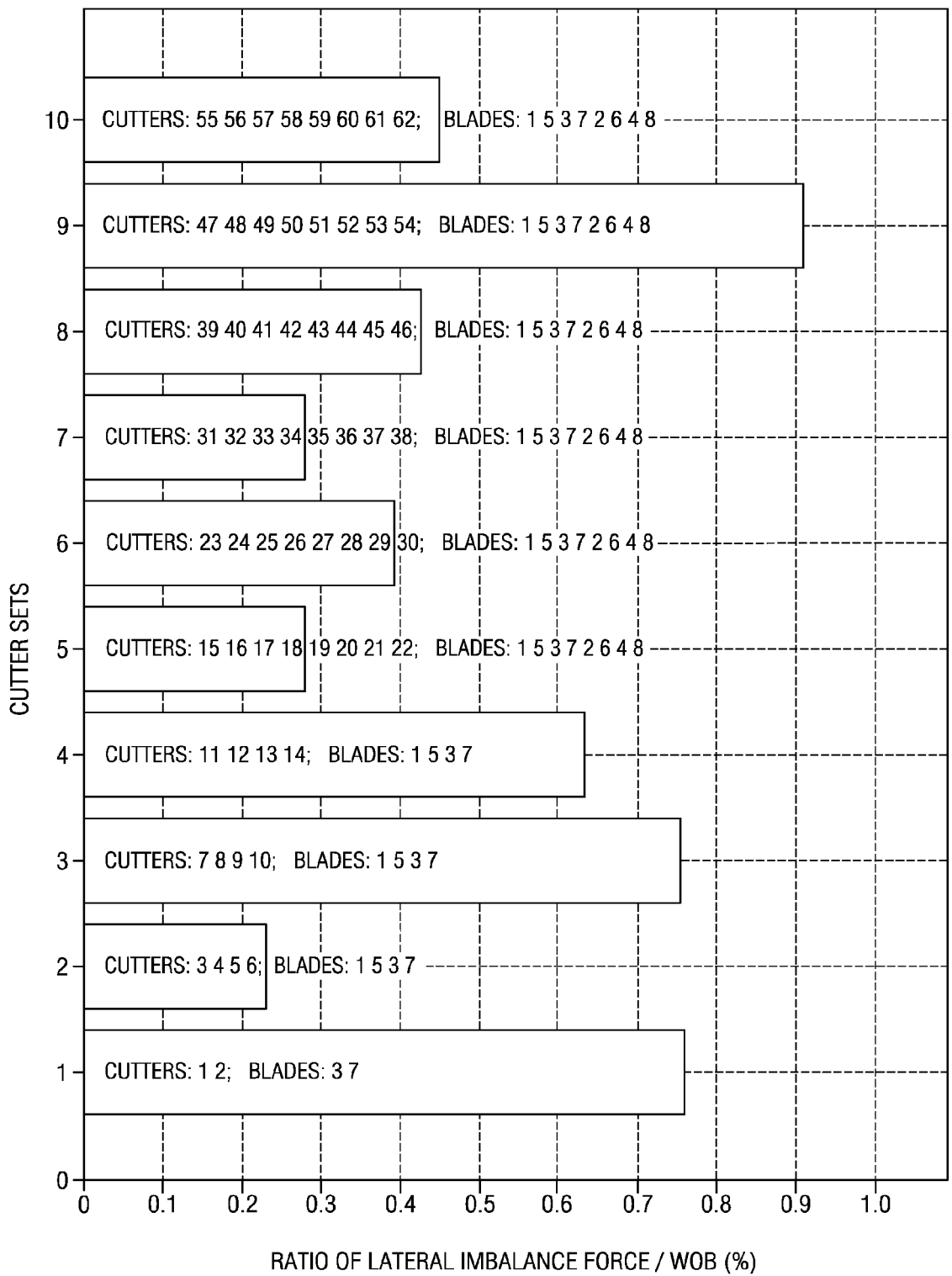
FIG. 26I is a graph showing level three force balancing of the drill bit shown in FIGS. 25A and 25B in accordance with teachings of the present disclosure.

FIG. 26I shows the magnitude of the lateral force ratio of each cutter set when all the cutters drill into a uniform formation. The lateral force of each cutter set is less than that of an individual cutter in the same set. The maximum magnitude of the lateral force for all cutter sets is less than approximately 0.91% of the bit axial force. Therefore, drill bit 100 is level three force balanced.

Figures 1, 26J:
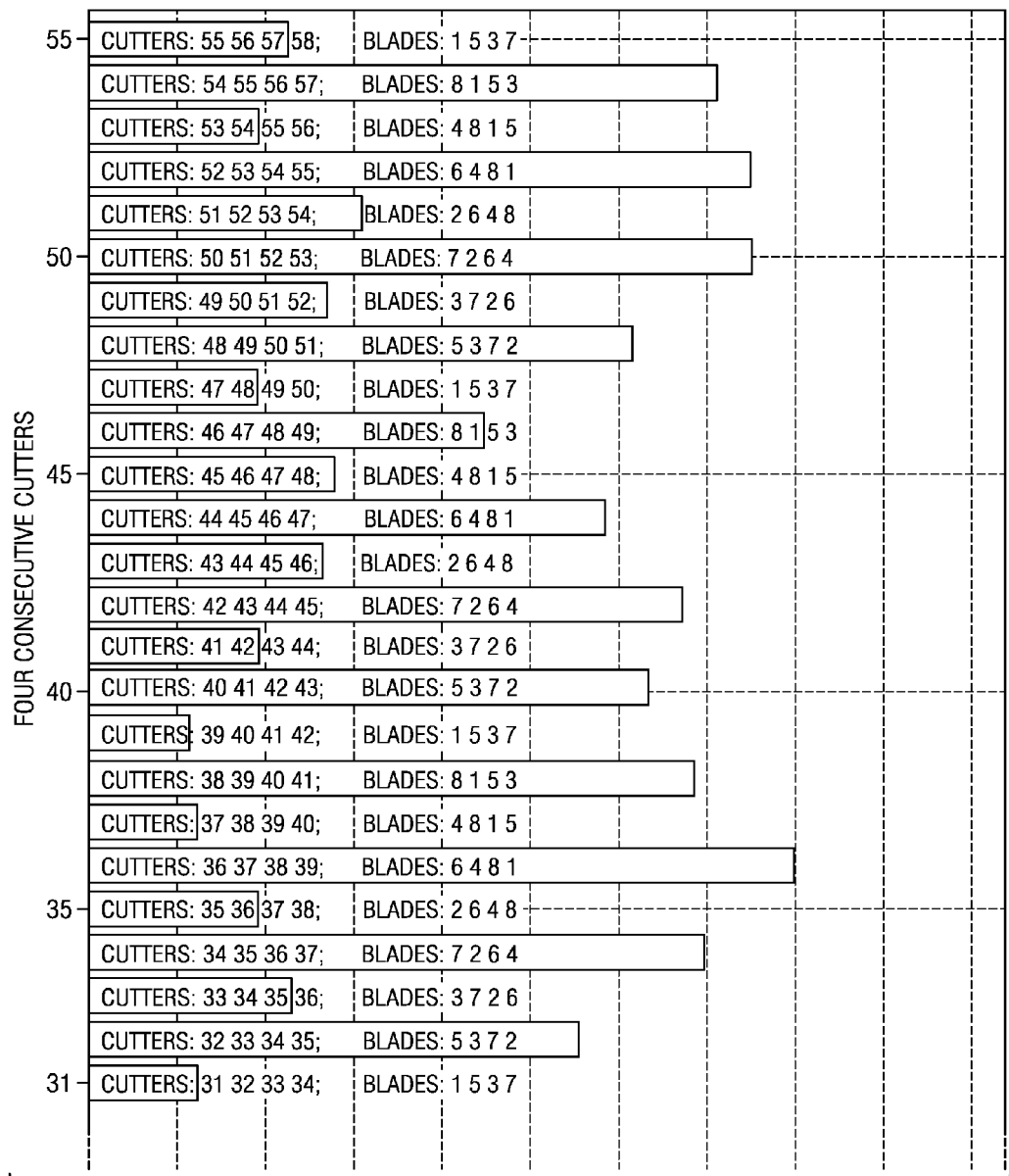
Figures 2, 26J:
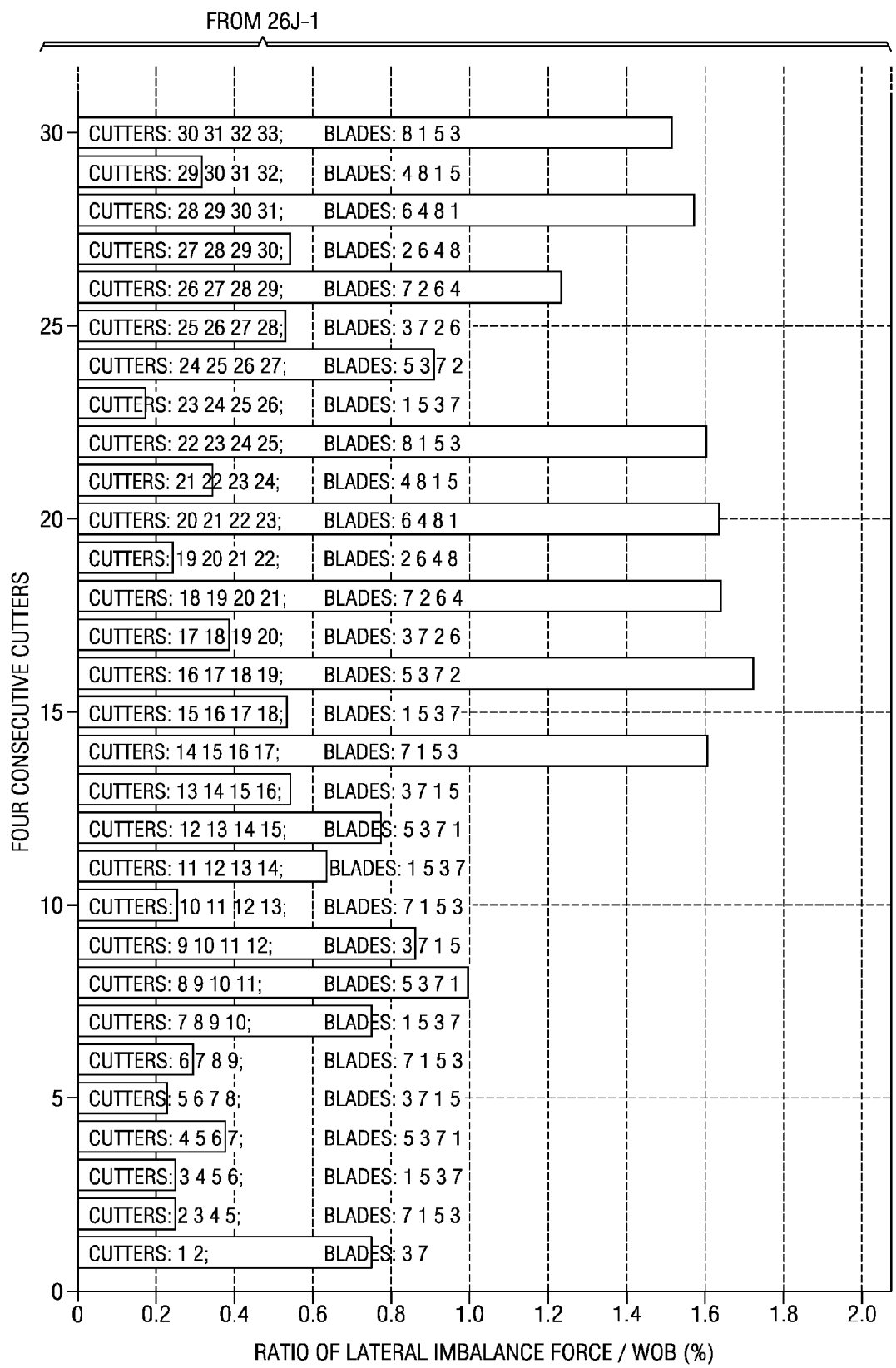

FIGS. 26J-1 and 26J-2 show the magnitude of the lateral force ratio of any four consecutive neighbor groups of cutters when all of the cutters drill into a uniform formation. The lateral force of each of the four consecutive neighbor cutters is less than the maximum lateral force of each individual cutter in the same four consecutive neighbor groups of cutters. The maximum magnitude of the lateral force for any four consecutive neighbor groups of cutters is less than approximately 1.72%, where most magnitudes of the lateral force are less than approximately 0.6% of the bit axial force. Therefore, drill bit 100 is level four force balanced.

Graph 200b of FIG. 26A shows the results of simulating drilling wellbores 30a and 30b as shown in FIG. 19A-19C using fixed cutter rotary drill bit 100. The maximum bit lateral imbalance force represented by peak 201b is approximately 4.5%. The remaining peaks associated with graph 200b are generally less than 3% which corresponds favorably with generally flat segments 204b and 208b when cutting elements 1-72 are engaged with generally uniform downhole formation layers 41 and 42 respectively. In graph 220b of FIG. 26B, the maximum drag lateral imbalance force at peak 21b is approximately only 4% of total bit axial force. FIG. 26B also shows that drag lateral imbalance force during generally flat segments 213b and 216b is less than 2% of total bit axial force. The same comments apply with respect to graphs 230b and 240b respectively shown in FIGS. 26C and 26D. The peak radial imbalance force is approximately 4% of the bit axial force at peak 231b. Transient axial bending moment at peak 241b is approximately 14%.

FIGS. 26A-26D also show that when all cutters are engaged with a uniform formation, either formation layer 41 (see sections 204b, 213b, 233b, 243b) or formation layer 42 (see sections 208b, 216b, 236b, 246b), the lateral imbalance force, the radial imbalance force, the drag imbalance force and the axial bending moment are all well balanced showing that drill bit 100 is level five force balanced. This type of "level five" force balancing is the same as traditional "one level" force balancing used in the design of prior downhole drill tools.

FIGS. 26A-26D also show that when all cutters are engaged with a non-uniform formation, from formation layer 41 to formation layer 42 where some of the cutting elements are in formation layer 42 and some of the cutting elements are in formation layer 41, the lateral imbalance force, the radial imbalance force, the drag imbalance force and the axial bending moment are all well balanced showing that drill bit 100 is level five force balanced. For example, between section 213b and section 216b of FIG. 26B, some of the cutting elements are in formation layer 42 and some of the cutting elements are in formation layer 41, the drag imbalance force of bit 100 is about 2.2% of the bit axial force. This type of "level five" force balancing is different from traditional "one level" force balancing used in the design of prior downhole drill tools.

For some applications, calculating the phase angle represented by arrows 188a and 188b in FIG. 25A of lateral imbalance forces acting on each cutting element may provide substantial benefits during multilevel force balancing embodiments of the present disclosure. FIG. 26E indicates that the magnitude of lateral force acting on cutter 23 (nose cutter 1 in FIG. 25B) is equal to approximately 2.4% of total bit axial force. As previously noted, bit axial force may often be considered approximately equal to weight on bit (WOB). The value of bit axial force is approximately 15,767 pounds. Therefore, the lateral force acting on cutter 23 is approximately three hundred and forty five pounds (345 lbs). FIG. 26E shows that the magnitude of lateral force acting on cutter 24 (nose cutter 2 in FIG. 25A) is approximately 2.28% of total bit axial force or approximately 320 pounds. From FIG. 26F, the phase angle of lateral force represented by arrow 188b acting on cutting element 23 is approximately −83.5°. The phase angle of lateral force represented by arrow 188a acting on cutter 24 is approximately 5.1°. Resulting lateral imbalance force associated with cutters 23 and 24 may be calculated as follows:

$F23$ on $x$ axis=$F23$ times $\cos(-83.5°)=40$ $F23$ on $y$ axis=$F23$ times $\sin(-83.5°)=351.7$ $F24$ on $x$ axis=$F24$ times $\cos(95.1°)=-28.4$ $F24$ on $y$ axis=$F24$ times $\sin(95.1°)=318.7$ Resulting force or total imbalance force=square root of $(F23\text{-}x+F24\text{-}x)^2+(F23\text{-}y+F24\text{-}y)^2=35$ lbs or 0.22% of WOB (15767 lbs).

A comparison of FIGS. 24G and 26J provides an even greater example of the improvement of lateral imbalance forces of greater reduction in the lateral imbalance forces associated with the four neighbor cutter groups on composite bit face profile 192 of rotary drill bit 90a as compared with the substantially reduced lateral imbalance forces associated with each four neighbor cutter group on composite bit profile 110 of rotary drill bit 100. The information shown in FIGS. 26F-26J further demonstrate the benefits of multilevel force balancing techniques to select or layout locations for installing cutting elements on a downhole drilling tool using multilevel force balancing techniques and selecting the first location for each cutting element proximate a nose point or nose axis of an associated composite cutting face profile.

Various cutter layout algorithms have been developed for the design of multilevel force balanced downhole drilling tools as described in copending PCT Patent Application entitled "Multilevel Force Balanced Downhole Drilling Tools and Methods," Serial No. PCT/US09/067,263 filed Dec. 4, 2009 may be used in conjunction with the teachings of the present disclosure. One common feature of these algorithms is starting cutter layout from a nose point or near a nose point to provide cutters in an associated nose zone arranged pseudo-symmetrical about the nose point and most pre-defined force balanced cutter sets follow from the nose zone cutter layout. Pseudo-symmetrical cutter layout around a nose point or nose axis may significantly enhance bit lateral stability during transit formation drilling.

A multilevel force balanced downhole drilling tool, according to the present disclosure, may have at least one of the following four levels: (a) at cutter group level where imbalance forces associated with cutters in each cutter group are balanced or minimized; (b) at two neighbor groups of cutter level where imbalance forces associated with any two neighbor groups of cutters on composite bit face profile are balanced or minimized (level two force balanced); (c) at cutter set level where imbalance force associated with cutters in a cutter set are balanced or minimized; and (d) at all cutters level where imbalance forces associated with all cutters are balanced or minimized (level five force balanced).

For some downhole drilling tools an additional level of force balancing may exist (level four force balanced). For example, for a bit with 8 blades using pair cutter groups, imbalance forces associated with any four neighbor cutters may be balanced or minimized. Another example is a bit with 9 blades using three cutter groups, imbalance forces associated with any three neighbor cutters may be balanced or minimized. FIG. 29 lists level four force balanced cutter set for given number of blades. Downhole drilling tools with level four force balanced are expected to be more stable even if one or more cutters are damaged during drilling.

In some embodiments of the present disclosure, a rotary drill bit or other downhole drilling tool may be designed based at least in part on simulations using selecting locations for laying out cutters and disposing cutters in various zones of a bit face profile in a spiral direction of bit rotation and in some embodiments further based on multilevel force balancing techniques to limit: (a) maximum transient lateral imbalance force to less than approximately 8% (and often preferably less than approximately 6%) of associated transient axial force; (b) lateral imbalance force, when all cutters are engaged with a general uniform downhole formation, to less than approximately 4% of bit actual force; (c) maximum transient radial lateral imbalance forces to less than approximately 6% (preferably less than approximately 4%) of associated transient axial force; (d) radial lateral imbalance force, when all cutters are engaged with a generally uniform downhole formation, to less than approximately 2.5% of associated bit axial force; (e) maximum transient drag lateral imbalance force to less than approximately 6% (and often preferably less than approximately 4%) of associated transient axial force; (f) drag lateral imbalance force while all cutters are engaged with a general uniform downhole formation to less than approximately 2.5% of associated bit axial force; (g) maximum axial movement to less than approximately 15% of associated transient torque; and (h) axial moment, when all cutters are engaged with a general uniform downhole formation, to less than approximately 4% of associated bit torque. Traditional, prior art force balancing techniques which use only one level such as all cutting elements engaged with a generally uniform downhole formation often only meet a limited number of the above conditions such as items (b), (d), (f) and (h).

FIG. 35 shows one example embodiment simulation method which may be used to design fixed cutter rotary drill bits and other downhole drilling tools based at least in part on laying out inner cutters 60i and outer cutters 60o in different spiral directions in relation to bit rotation 28 around bit rotational axis 104 to substantially reduce imbalance forces such as axial forces and torque acting on a rotary drill bit and other downhole drilling tools and in part based on at least a level of force balancing (in some embodiments multilevel force balancing).

Accordingly, in some embodiments, the present disclosure describes a method to design and manufacture a rotary drill bit operable to form a wellbore based on at least embodiments relating to laying out cutters in different spiral directions of rotation around the bit axis and multilevel force balancing. As shown in FIG. 35, an example method 500a may begin at step 502 by inputting into a computer (a general purpose computer or a special purpose computer (not expressly shown)) various characteristics of a downhole drilling tool such as rotary drill bits 100, core bit 500 and/or reamer 600. Examples of such downhole drilling tool characteristics are shown in Appendix A at the end of this Written Description.

At step 504 various downhole drilling conditions may be inputted into a computer (such as a general purpose computer or a special purpose computer). Examples of such downhole drilling conditions are shown in Appendix A. According to the present teachings, at step 504, additional conditions that may be inputted into a computer may comprise laying out different cutters, such as cone cutters 60c, nose cutters 60n, transit cutters 60t, shoulder cutters 60s and gage cutters 60g (or outer cutters 60o and inner cutters 60i) in different combinations of spiral directions following or reversing bit rotation 28. These conditions may be similar to those described in method 400 at step 404. According to the present method, at step 504, additional conditions that may be inputted into a computer may comprise parameters and/or criteria for a level of force balancing, which in some embodiments may include multilevel force balancing criteria.

At step 506 a drilling simulation may start with initial engagement between one or more cutters of a fixed cutter drill bit or other downhole drilling tool and a generally flat surface of a first downhole formation layer at the downhole end of a wellbore. A standard set of drilling conditions may include one hundred twenty (120) revolutions per minute (RPM), rate of penetration (ROP), thirty (30) feet per hour, first formation strength 5,000 psi and second formation strength 18,000 psi.

Respective forces acting on cutting elements disposed on the fixed cutter drill bit or other downhole drilling tool may be evaluated during initial contact between each cutting element and the first downhole formation. Respective forces acting on each cutting element may be evaluated versus depth of penetration of the rotary drill bit or other downhole drilling tool into the first downhole formation. The resulting forces acting on the associated rotary drill bit or other downhole drilling tool may then be calculated as a function of drilling depth at step 510.

The drilling simulation may continue to step 512 corresponding with forming the wellbore through the first downhole formation and into a second downhole formation. Respective forces acting on each cutting element engaged with the first downhole formation and respective forces acting on each cutting element engaged with the second downhole formation may then be evaluated at step 516. Resulting forces acting on the fixed cutter rotary drill bit or other downhole drilling tool may then be evaluated as a function of drilling depth in step 518. At step 520, resulting forces acting on the fixed cutter rotary drill bit or other downhole drilling tool may be displayed as a function of drilling depth.

If the resulting forces acting on the fixed cutter rotary drill bit or other downhole drilling tool meet design requirements for optimized axial forces and/or optimized torque forces and/or optimized drilling efficiency (e.g., cutter layout in combinations of different spiral directions), and optimal level of force balance (e.g., multilevel force balance), drilling tool at step 522, the simulation may stop. The downhole drill tool characteristics may then be used to design and manufacture the fixed cutter rotary drill bit or other downhole drilling tool in accordance with the teachings of the present disclosure.

If the resulting forces acting on the fixed rotary cutter drill bit or other downhole drilling tool do not meet design requirements for a drilling tool having optimized axial forces, optimized torque forces and a level of force balancing at step 522, the simulation may proceed to step 526 and at least one downhole drilling tool characteristic may be modified. For example, the spiral direction of cutter layout with respect to bit rotation of one or more zones of cutting elements may be modified. In addition, number of cutters, locations of cutters, cutter sets and/or cutter groups may be modified based on a level of force balance and/or multilevel force balance. Additionally, the configuration, dimensions and/or orientation of one or more blades disposed on exterior portions of the downhole drilling tool may be modified.

The simulation may then return to step 502 and method 500a may be repeated. If the simulations based on the modified downhole drilling tool characteristics are satisfactory at step 522, the simulation may stop. If the conditions for a drilling tool having optimized axial forces, optimized torque forces and optimized level of force balance, are not satisfied at step 522, further modifications may be made to at least one downhole drilling tool characteristic at step 526 and the simulation continued starting at step 502 and method 500a repeated until the conditions for optimized axial forces, optimized torque forces and optimized level of force balance of a downhole drilling tool are met at step 522.

In some embodiments of method 500a, optimized axial forces may be minimized or substantially reduced. In some embodiments of method 500a, optimized torque forces may be minimized or substantially reduced. In some embodiments of method 500a, bit stability may be increased due to less torque and axial force variations from gage cutters. In some embodiments of method 500a, optimized level of force balance may be obtained. In some embodiments of the method 500a, a combination of one or more of the above or all of the above advantages may be achieved.

FIGS. 36A and 36B show examples of methods, techniques or procedures which may be used to design fixed cutter rotary drill bits and other downhole drilling tools in accordance with teachings of the present disclosure to 1) minimize, substantially reduce torque on bits and further to 2) substantially reduce undesired bit imbalance forces during non-uniform downhole drilling conditions. An exemplary method 700 may begin at step 702 by inputting into a general purpose computer or a special purpose computer (not expressly shown) various characteristics of a downhole drilling tool such as rotary drill bits 90, 100, 100a, 100b, and 100c, core bit 500 and/or reamer 600 and drilling conditions. Examples of such downhole drilling tool characteristics and drilling conditions are shown in Appendix A at the end of this Written Description.

At step 704 various design parameters concerning associated cutting structures may be inputted into the general purpose computer or special purpose computer. Examples of such drilling tool design parameters are shown in Appendix A.

At step 706 specific details concerning an associated bit face profile or cutting face profile may be determined including location of the nose point, starting radii of secondary blades from an associated rotational axis, location of major blades and angular position of major blades and secondary blades relative to each other, initial layout for installing cutting elements on exterior portions of associated blades based on the nose point of the composite bit face profile or composite cutting face profile.

Step 706 may also comprise determining a spiral direction of bit rotation to layout cutters in each zone of a bit face profile. For example, outer cutters 60o may be laid out in one spiral direction while inner cutters 60i may be laid out in another spiral direction. Alternatively, cone cutters 60c, first portion zone nose cutters 60 na, nose cutters 60n, second portion nose zone cutters 60nb, shoulder cutters 60s and gage cutters 60g may each be laid out in different spiral directions (cutters in each zone may respectively be disposed following or reversing bit rotation 28).

At step 708 select blade group algorithm as shown in FIGS. 28A, 28B and 29. Cutter sets for use in multilevel force balancing are chosen FIGS. 28A, 28B and 29 along with defining blade order for selecting locations to installing outer cutters and inner cutters relative to an associated nose segment. At step 710 layout locations for inner cutters starting from the nose point based on initial composite cutting face profile and initial blade design. At step 712 select or layout outer cutters using predefined cutter groups beginning with group $K_0$ (the initial group). At step 714 layout additional cutter groups ($K_0$+1). At step 716 use appropriate cutting face overlapping rule for neighbor cutters within each cutter group and calculate position to install each cutter on the associated blade.

At step 718 determine if a cutter was previously installed on the blade. If yes, evaluate overlap between cutters being considered (cutter K) and the cutter previously installed on the blade. At step 720 compare cutter overlaps or gaps and determine if the overlap meets design criteria for the downhole drilling tool. If the answer is no, return to step 716. If the answer is yes, go to step 722.

At step 722 determine if the last cutter in each cutter group reaches an associate last gage cutter location on the associate gage pad. If the answer is yes, proceed to step 724. If the answer is no, return to step 714.

At step 724 layout the inner cutters using predefined cutter groups beginning with group $K_I$. At step 726 continue laying out the inner cutters until the cutting elements in each inner cutter group have been disposed on exterior portions of the associated blades. At step 728 apply the overlap rule to each cutter in the inner group. Calculate each cutter position on the associated blade. If sufficient space is not available on the blade to install the desired cutter, go to the next blade in rotation relative to the associate bit rotational axis.

At step 730 determine if the previous cutter is already on the blade. If yes, calculate the gap between the cutter being added and the previous cutter. At step 732 determine if the gap between the cutter being added and the previous cutter on the blade meets the required design criteria. If the answer is no, return to step 728. If the answer is yes, proceed to step 734.

At step 734 determine if the edge of the last cutter in the cutter group being considered reaches the bit rotational axis. If the answer is no, return to step 726. If the answer is yes, proceed to step 736.

At step 736 prepare a 3D visualization of the cutters disposed on exterior portions of all blades. See for example FIGS. 21A and 21B. At step 738 conduct a drilling simulation to estimate at least the following: (1) axial forces created by each cutter and/or each cutter group and/or cutter zone; (2) torque created by each cutter, cutter group and/or cutter zone and the entire; and (3) imbalance forces created by each cutter group, each neighbor cutter groups, each cutter set and each three or four neighbor cutter group on the associated composite cutting face profile and all cutters. Imbalance forces may be evaluated as a function of drilling distance. See FIGS. 26A-26J. The method may also comprise evaluating downhole drilling performance with other criteria such as wear curve and diamond curve. At step 740 determine if the downhole drilling tool meets desired design requirements. If the answer is no, return to step 704. If the answer is yes, stop and use the design data that was input in step 702, 704 and 706 to manufacture an associated downhole drilling tool.

Table 301 in FIGS. 28A and 28B lists selected cutter sets for fixed cutter rotary drill bits and other downhole drilling tools having between four blades and fifteen blades. Table 302 as shown in FIG. 29 lists the preferred level four forced balance cutter sets for downhole drilling tools with five blades to fifteen blades. For a downhole drilling tool with between five blades and fifteen blades there may be many satisfactory ways to lay out cutting elements or cutters on an associated bit face or cutting face in accordance with teachings of the present disclosure.

Force Balance Procedure

In most cases, downhole drilling tools designed using procedures such as shown in FIG. 15, FIG. 35 and FIGS. 36A-36B may satisfy requirements for reducing axial force and torque and for multilevel force balancing. However, if blade order is violated due to, for example, the start radii of secondary blades, then multilevel force balancing may be also violated. If this situation occurs, it may become necessary to modify the geometry and orientation of individual cutters or individual cutter groups. The following steps may be used:

(1) Evaluate imbalance forces contributed by each individual cutter and each cutter group, respectively;

(2) Identify which cutter or cutter group contributes most to bit imbalance forces;

(3) Modify back rake, or side rake, or cutter size of the cutter or cutters in the cutter group;

(4) Re-run drilling simulation to see if design requirements are met or not. If not, go back to step 1 and repeat the procedure.

If the above procedure could not balance the downhole drilling tool, then it may be necessary to re-run the computer cutter layout procedure of FIGS. 36A and 36B by changing some of the parameters used for cutter layout, such as start radii of secondary blades, cutter layout starting point, cutter overlap, cutter size, back rake and side rake.

Figure 37A:
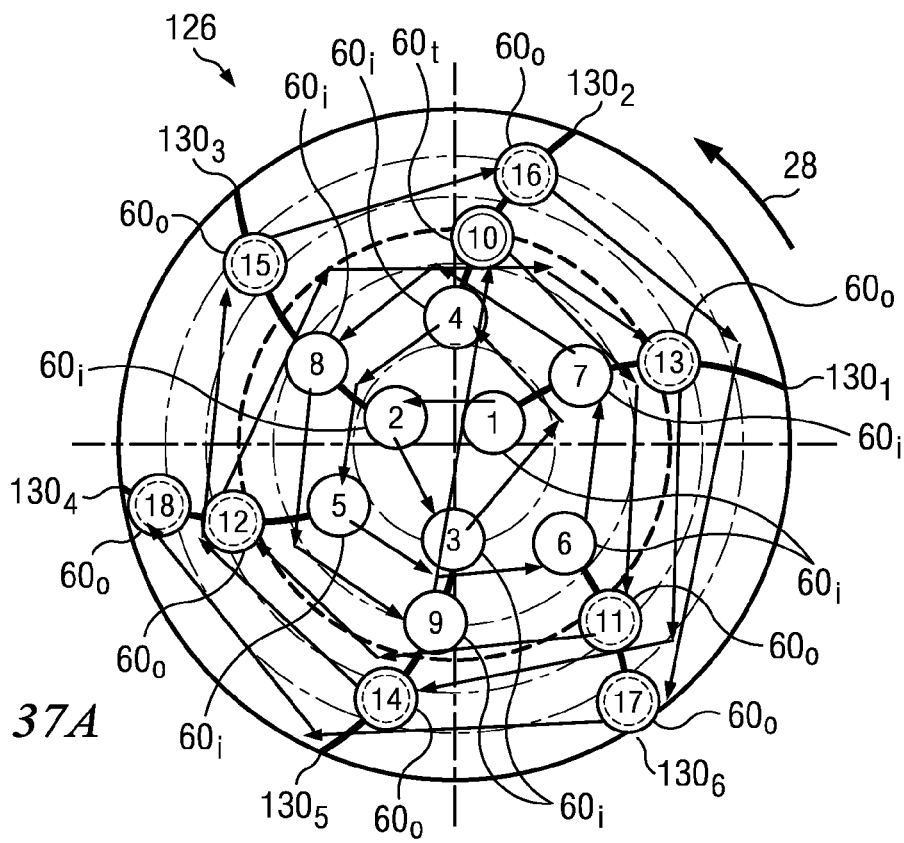
FIGS. 37A and 37B are schematic drawings showing examples of selecting or laying out locations for installing cutting elements relative to a spiral direction of bit rotation and relative to a nose point on an associated composite cutting face profile in accordance, wherein inner cutters are disposed in a spiral direction following bit rotation and outer cutters are disposed in a spiral direction opposite to bit rotation, both the inner and outer cutters further in force balanced cutter groups, incorporating teachings of the present disclosure.
Figure 37B:
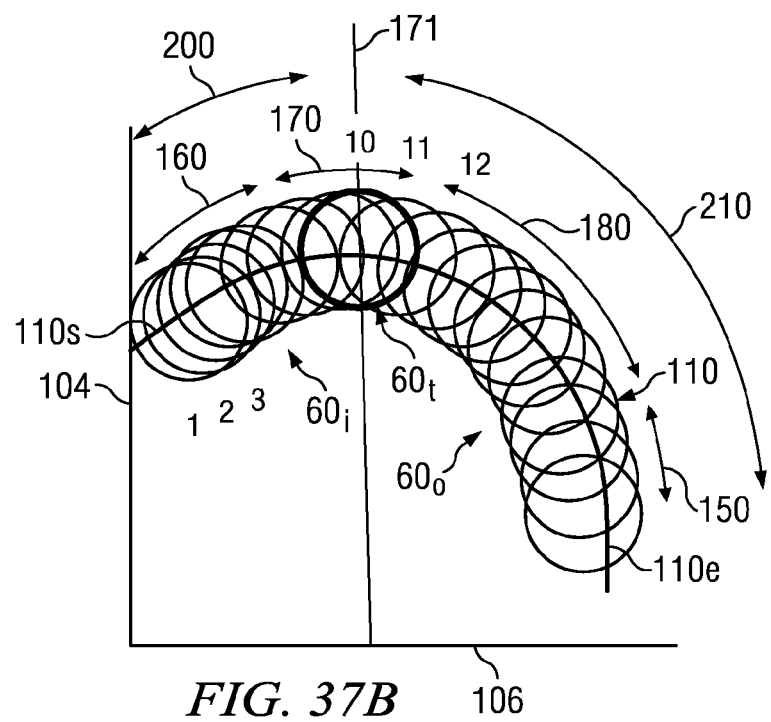

FIGS. 37A and 37B are schematic drawings showing an example embodiment of a drill bit or a well drilling tool made according to a method of the present disclosure (such as method 500a and/or 700) and may comprise selecting or laying out locations for installing cutting elements 60 relative to a spiral direction of bit rotation 28, wherein inner cutters 60i may be disposed in a direction following bit rotation 28 and outer cutters 60o may be disposed in a direction opposite to bit rotation and the method may further comprise layout of cutters in force balanced cutter group or in a force balanced cutter sets.

FIG. 37A depicts a schematic drawing showing an example composite bit face 126 (or cutting face) in accordance with teachings of the present disclosure comprising portions of bit body (e.g., bit body 100 as shown in FIG. 1B) contacting adjacent portions of a downhole formation. Layout of cutting elements 60 following or reversing a spiral direction of bit rotation 28 is shown. Each cutting element 60 is shown numbered 1-18. Outer cutters are depicted as 60o, inner cutters are depicted as 60i and transit cutters are depicted as 60t. Different types of circles (with solid or dotted lines) are used to visually locate cutters. For example, solid circles depict cone cutters 60c, double solid circles depict transit cutters 60t, and double solid-dotted circles depict outer cutters 60o. (Similar depictions are used in FIG. 38 and FIGS. 41-45).

As shown in the embodiment in the cutting face shown in FIG. 37A, a plurality of inner cutters 60i comprising cutting elements 1-9 may be disposed on respective portions of associated blades 130 ($130_1$-$130_6$) located in inner zone 200

(shown in FIG. 37B) in a spiral direction following bit rotation 28. As also depicted in the embodiment in FIG. 37A, are a plurality of outer cutters 60o comprising cutting elements 11-18 that may be disposed on respective portions of associated blades 130 ($130_1$-$130_6$) located in outer zone 210 (shown in FIG. 16B) in a spiral direction opposite to bit rotation. Cutting element 10 is referred to as a transit cutter 60t since it marks the transition of cutter layout direction from following the direction of bit rotation to reversing the direction of bit rotation.

In FIG. 37A, force balanced cutter groups include: (1 2 3), (4 5 6), (7 8 9), (10 11 12), (13 14 15) and (16 17 18). In this example, transit cutter 10 belongs to outer cutter group 60o and there is no transit zone.

FIG. 37B shows a schematic drawing of a bit face profile 110 as measured with respect to bit rotational axis 104 (y axis) from reference line 106 (x axis). FIG. 37B shows beginning of bit face profile 110s, end of bit face profile 110e, cone zone 160, nose zone 170, shoulder zone 180 and gage zone 150, each zone located on respective portions of one or more associated blades 130 ($130_1$-$130_6$). FIG. 37B also shows nose zone 170 having nose point 171 at a location on bit face profile 110 having maximum elevation on bit rotational axis 104 (y axis) from reference line 106 (x axis). Nose zone 170 may comprise a first portion 170a comprising locations on bit face profile 110 from nose point 171 toward the beginning of the bit face profile 110s and a second portion 170b comprising locations from nose point 171 toward end of the bit face profile 110e.

Accordingly, the present disclosure according to some embodiments describes a rotary drill bit (such as but not limited to 90, 100, 100a and 100b) operable to form a wellbore comprising: a bit body with a bit rotational axis 104 extending through the bit body, a plurality of blades 130 disposed on exterior portions of the bit body, each blade having respective cutting elements 60 disposed thereon, a bit face 126 and a bit face profile 110 comprising portions of the bit body contacting adjacent portions of a downhole formation, the bit face profile comprising a cone zone 160, a nose zone 170, a shoulder zone 180 and a gage zone 150, each zone located on respective portions of associated blades, the nose zone 170 having a nose point 171 at a location on the bit face profile having maximum elevation, the nose zone 170 having a first portion of the nose zone 170a comprising locations from the nose point 171 toward the beginning of the bit face profile 110s; the nose zone 170 having a second portion of the nose zone 170b comprising locations from the nose point 171 toward the end of the bit face profile 110e; a plurality of inner cutters 60i comprising cutting elements disposed on respective portions of associated blades located in the cone zone 160 and the first portion of the nose zone 170a; the inner cutters 60i disposed in a spiral direction following bit rotation 28; a plurality of outer cutters 60o comprising cutting elements disposed on respective portions of associated blades located in the shoulder zone 180, the gage zone 150, and the second portion of the nose zone 170b; the outer cutters 60o disposed in a spiral direction opposite to bit rotation.

Figure 38A:
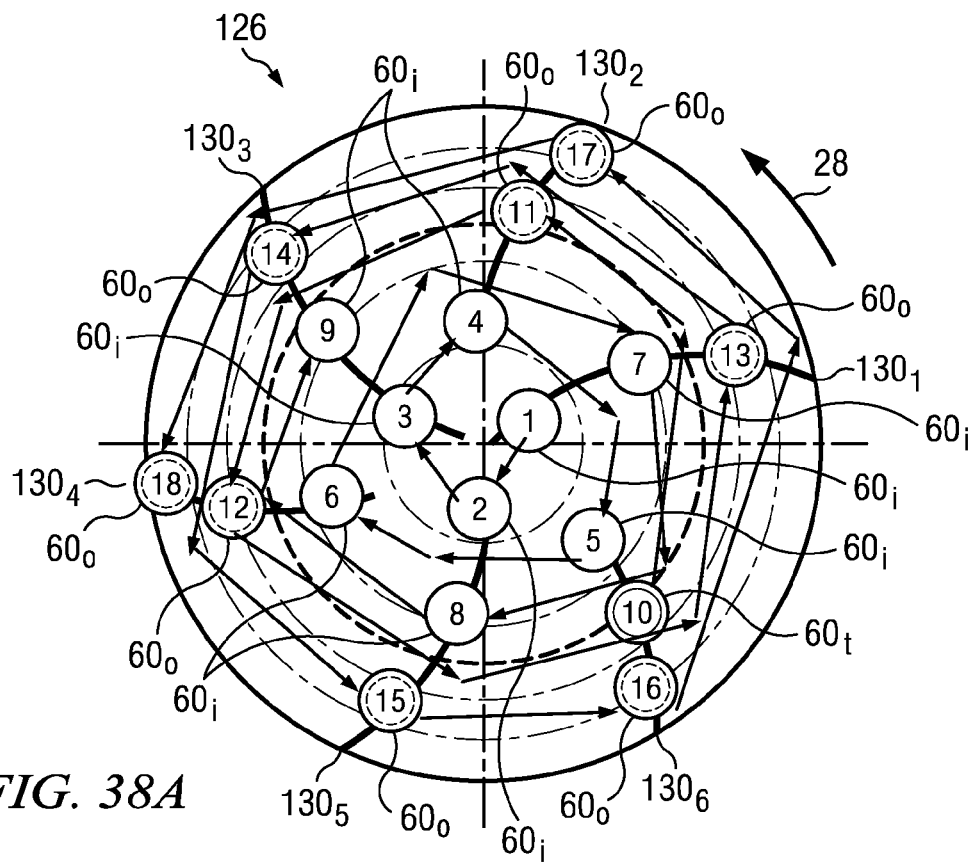
FIGS. 38A and 38B are schematic drawings showing examples of selecting or laying out locations for installing cutting elements relative to a spiral direction of bit rotation and relative to a nose point on an associated composite cutting face profile, wherein inner cutters are disposed in a spiral direction opposite to bit rotation and outer cutters are disposed in a spiral direction following bit rotation in force balanced cutter groups, both the inner and outer cutters further in force balanced cutter groups, in accordance with teachings of the present disclosure.
Figure 38B:
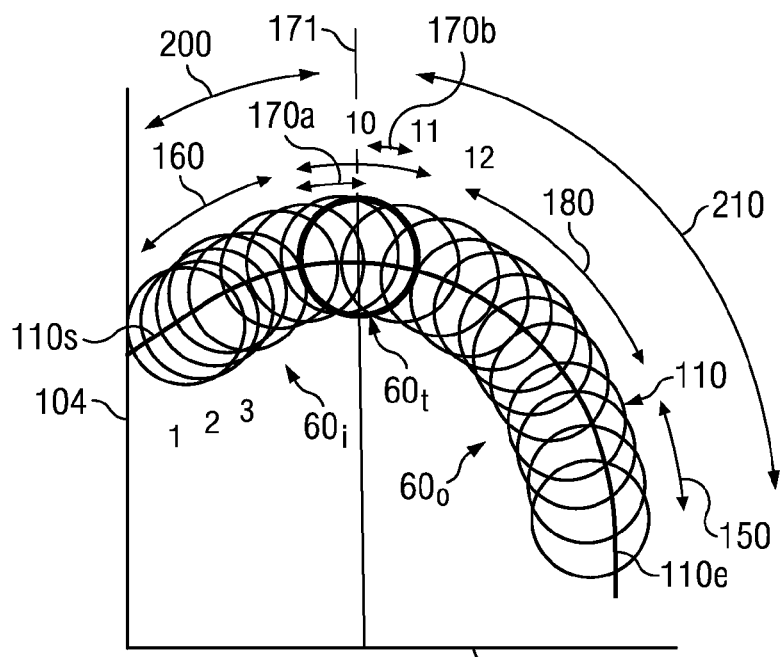

FIGS. 38A and 38B are schematic drawings showing another example embodiment of the present disclosure for selecting or laying out locations for installing cutting elements 60 relative to a spiral direction of bit rotation, wherein inner cutters 60i may be disposed in a direction opposite to bit rotation 28 and outer cutters 60o may be disposed in a direction following bit rotation. FIG. 38A depicts a schematic drawing showing an example composite bit face 126 (or cutting face) in accordance with teachings of the present disclosure comprising portions of bit body (e.g., bit body 100 as shown in FIG. 1B) contacting adjacent portions of a downhole formation. Layout of cutting elements 60 following or reversing a spiral direction of bit rotation 28 is shown. Each cutting element 60 is shown numbered 1-18 in FIG. 38A. In FIG. 38A, outer cutters are depicted as 60o, inner cutters are depicted as 60i and transit cutters are depicted as 60t.

As shown in the embodiment in the cutting face 126 shown in FIG. 38A, a plurality of inner cutters 60i comprising cutting elements 1-9 may be disposed on respective portions of associated blades 130 ($130_1$-$130_6$) located in inner zone 200 (shown in FIG. 38B) in a spiral direction opposite to bit rotation 28 in force balanced cutter sets or cutter groups: (1 2 3), (4 5 6), (7 8 9). As also depicted in the embodiment in FIG. 38A, are a plurality of outer cutters 60o comprising cutting elements 10-17 that may be disposed on respective portions of associated blades 130 ($130_1$-$130_6$) located in outer zone 210 (shown in FIG. 17B) in a spiral direction following bit rotation in force balanced cutter sets or cutter groups: (10 11 12), (13 14 15) and (16 17 18). Cutting element 10 is referred to as a transit cutter 60t since it marks the transition of cutter layout direction from reversing the direction of bit rotation to following the direction of bit rotation.

FIG. 38B shows a schematic drawing of a bit face profile 110 as measured with respect to bit rotational axis 104 (y axis) from reference line 106 (x axis). FIG. 38B shows beginning of bit face profile 110s, end of bit face profile 110e, cone zone 160, nose zone 170, shoulder zone 180 and gage zone 150, each zone located on respective portions of one or more associated blades 130 ($130_1$-$130_6$). FIG. 39B also shows nose zone 170 having nose point 171 at a location on bit face profile 110 having maximum elevation on bit rotational axis 104 (y axis) from reference line 106 (x axis). Nose zone 170 may comprise a first portion 170a comprising locations on bit face profile 110 from nose point 171 toward the beginning of the bit face profile 110s and a second portion 170b comprising locations from nose point 171 toward end of the bit face profile 110e.

Accordingly, the present disclosure according to some embodiments describes a rotary drill bit (such as but not limited to 90, 100, 100a and 100b) operable to form a wellbore comprising: a bit body with a bit rotational axis 104 extending through the bit body, a plurality of blades 130 disposed on exterior portions of the bit body, each blade having respective cutting elements 60 disposed thereon, a bit face 126 and a bit face profile 110 comprising portions of the bit body contacting adjacent portions of a downhole formation, the bit face profile comprising a cone zone 160, a nose zone 170, a shoulder zone 180 and a gage zone 150, each zone located on respective portions of associated blades, the nose zone 170 having a nose point 171 at a location on the bit face profile having maximum elevation, the nose zone 170 having a first portion of the nose zone 170a comprising locations from the nose point 171 toward the beginning of the bit face profile 110s; the nose zone 170 having a second portion of the nose zone 170b comprising locations from the nose point 171 toward the end of the bit face profile 110e; a plurality of inner cutters 60i comprising cutting elements disposed on respective portions of associated blades located in the cone zone 160 and the first portion of the nose zone 170a; the inner cutters 60i disposed in a spiral direction opposite to bit rotation 28, wherein cutter sets and/or cutter groups: (1 2 3), (4 5 6), (7 8 9) are force balanced; a plurality of outer cutters 60o comprising cutting elements disposed on respective portions of associated blades located in the shoulder zone 180, the gage zone 150, and the second portion of the nose zone 170b; the outer cutters 60o disposed in a spiral direction following bit rotation, wherein cutter sets and/or cutter groups (10 11 12), (13 14 15), (16 17 18) are force balanced.

FIGS. 39-45 depict examples for selecting or laying out locations for installing cutting elements relative to a bit rotational axis wherein inner cutters 60$i$ may be disposed in one spiral direction of bit rotation and outer cutters 60$o$ may be disposed in another spiral direction of bit rotation.

FIG. 39 depicts an example cutter layout of a rotary drill bit or a well tool having six blades 1-6, wherein blades 1, 3 and 5 are major blades or primary blades and blades 2, 4 and 6 are minor blades or secondary blades, wherein inner cutters 60$i$ are disposed in a spiral direction following bit rotation and outer cutters 60$o$ are disposed in a spiral direction opposite to bit rotation.

Figure 40:
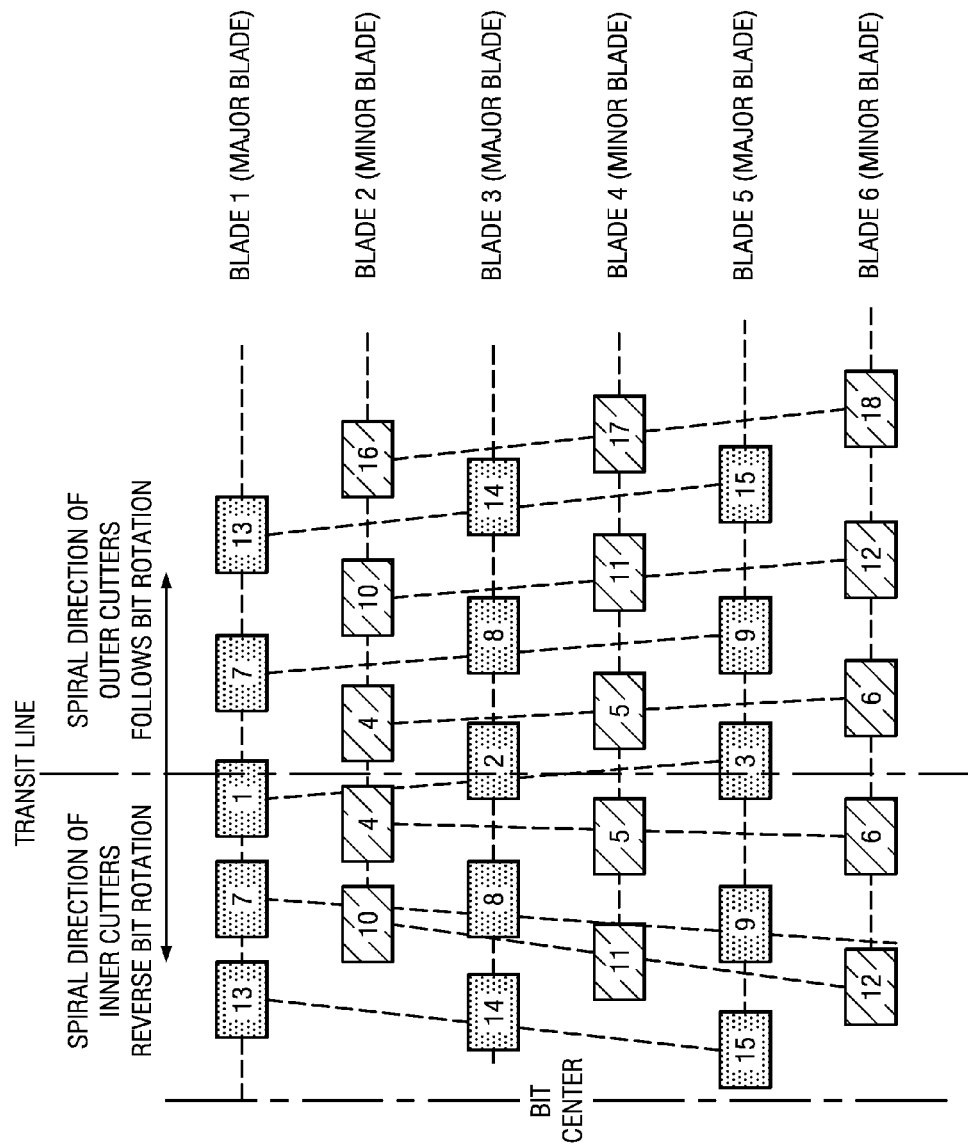
FIG. 40 shows a schematic drawings showing an example for selecting locations to install cutting elements on exterior portions of a downhole drilling tool having six blades using blade groups and cutter sets wherein inner cutters are disposed in a spiral direction opposite to bit rotation and outer cutters are disposed in a spiral direction following bit rotation, in accordance with teachings of the present disclosure.

FIG. 40 depicts an example cutter layout of a rotary drill bit or a well tool having six blades $130_1$-$130_6$, wherein blades $130_1$, $130_3$ and $130_5$ are major blades or primary blades and blades $130_2$, $130_4$ and $130_6$ are minor blades or secondary blades, wherein inner cutters 60$i$ are disposed in a spiral direction opposite to bit rotation and outer cutters 60$o$ are disposed in a spiral direction following bit rotation, and cutter groups or cutter sets are multilevel force balanced.

Figure 41:
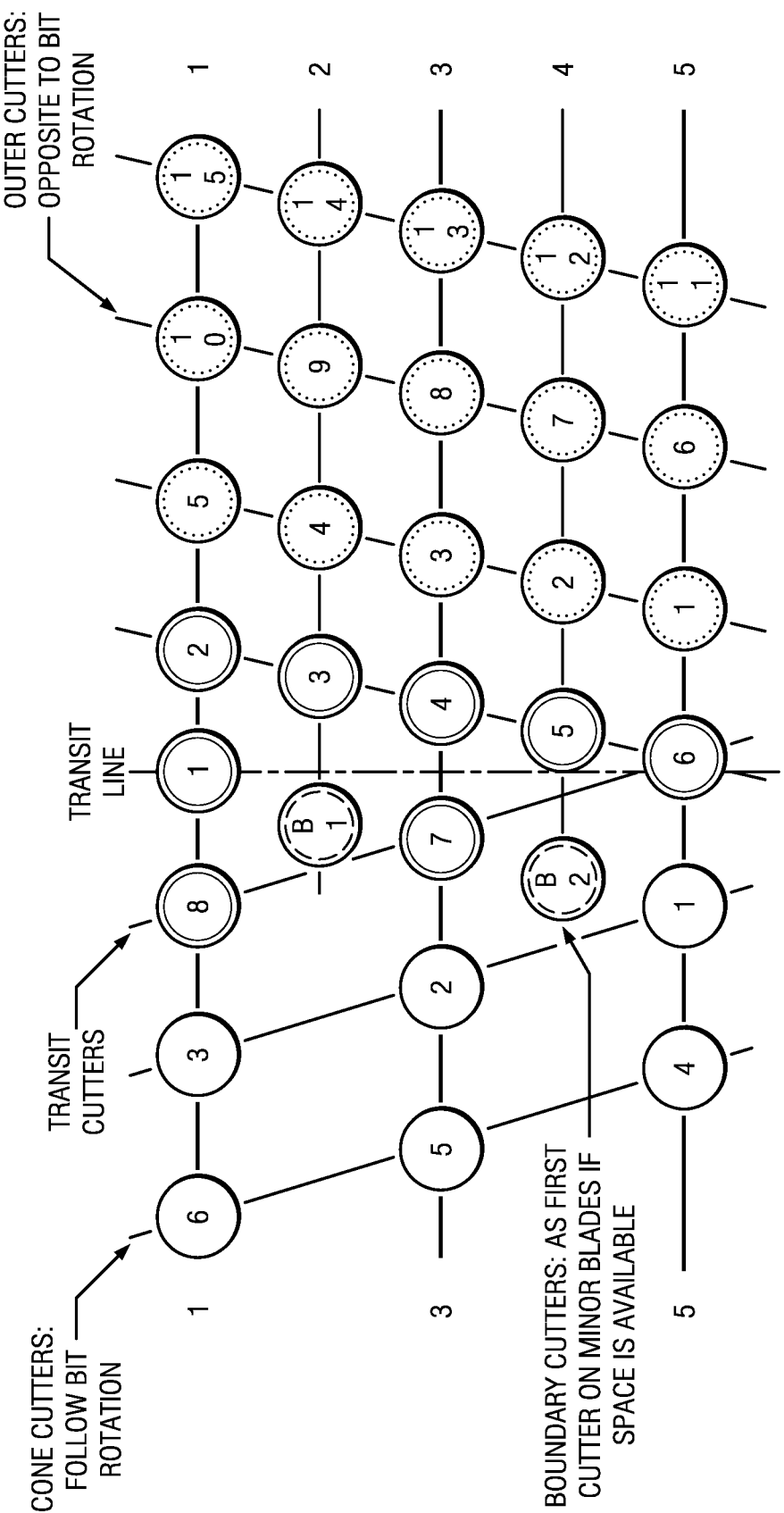
FIG. 41 shows a schematic drawings showing an example cutter layout algorithm in accordance with teachings of the present disclosure for selecting locations to install cutting elements on exterior portions of a downhole drilling tool having five blades wherein inner cutters are disposed in a spiral direction following bit rotation and outer cutters are disposed in a spiral direction opposite to bit rotation.

FIG. 41 depicts an example cutter layout algorithm of a rotary drill bit or a well tool having five blades $130_1$-$130_5$, wherein blades $130_1$, $130_3$ and $130_5$ are major blades or primary blades and blades $130_2$ and $130_4$ are minor blades or secondary blades, wherein cone cutters 60$c$ (depicted by solid circles with numbers 1-6) are disposed in a spiral direction following bit rotation, transit cutters 60$t$ deposited around "transit line" (depicted by double solid circles with numbers 1-8) and outer cutters 60$o$ (depicted by double solid-dotted circles with numbers 6-15) are disposed in a spiral direction opposite to bit rotation. In this example cutter layout, there are 8 transit cutters located within transit zone. However, only one cutter (cutter 1) acts as a true transit cutter since cutters 2-6 are outer cutters and cutters 7-8 are inner cutters. FIG. 41 also shows boundary cutters B1 and B2 which are cutters that may be placed to make sure there is enough space to meet the cutter overlap space rule. Boundary cutters may not be placed in locations if there not sufficient space to meet cutter overlap rule.

Figure 42:
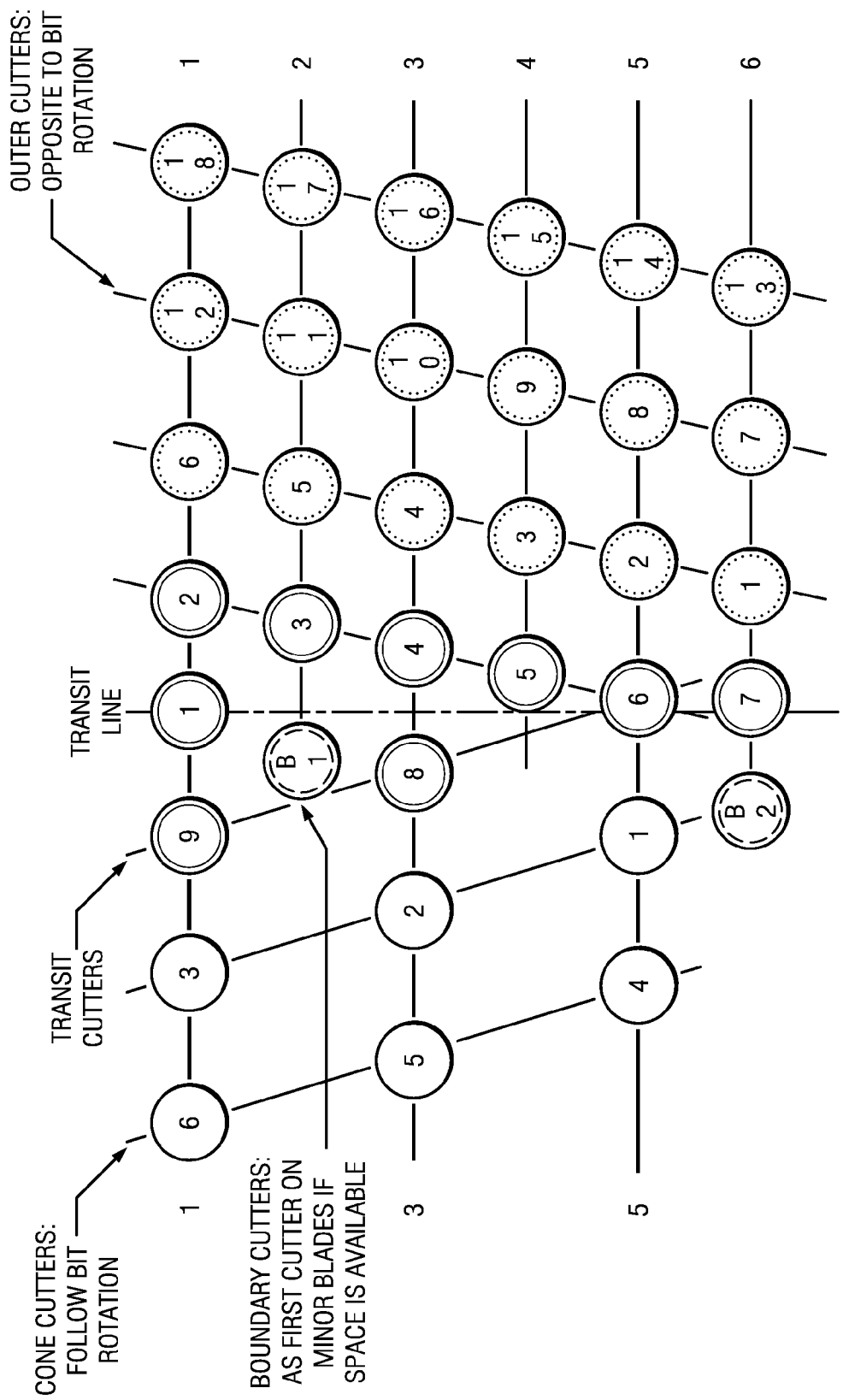
FIG. 42 shows a schematic drawings showing an example cutter layout algorithm in accordance with teachings of the present disclosure for selecting locations to install cutting elements on exterior portions of a downhole drilling tool having six blades wherein inner cutters are disposed in a spiral direction following bit rotation and outer cutters are disposed in a spiral direction opposite to bit rotation.

FIG. 42 depicts an example cutter layout algorithm of a rotary drill bit or a well tool having six blades $130_1$-$130_6$, wherein blades $130_k$, $130_3$ and $130_5$ are major blades or primary blades and blades $130_2$, $130_4$ and $130_6$ are minor blades or secondary blades, wherein cone cutters 60$c$ (depicted by solid circle with numbers 1-6) are disposed in a spiral direction following bit rotation, transit cutters 60$t$ deposited around "transit line" (depicted by double solid circles with numbers 1-9) and outer cutters 60$o$ (depicted by double solid-dotted circles with numbers 7-18) are disposed in a spiral direction opposite to bit rotation. In this example cutter layout, there are 9 transit cutters located within transit zone. However, only two cutters (cutter 1 and 7) act as true transit cutters because cutters 2-6 are considered to be outer cutters and cutters 8-9 are considered to be inner cutters. FIG. 42 also shows boundary cutters B1 and B2 which are cutters that may be placed to make sure there is enough space to meet the cutter overlap space rule.

Figure 43:
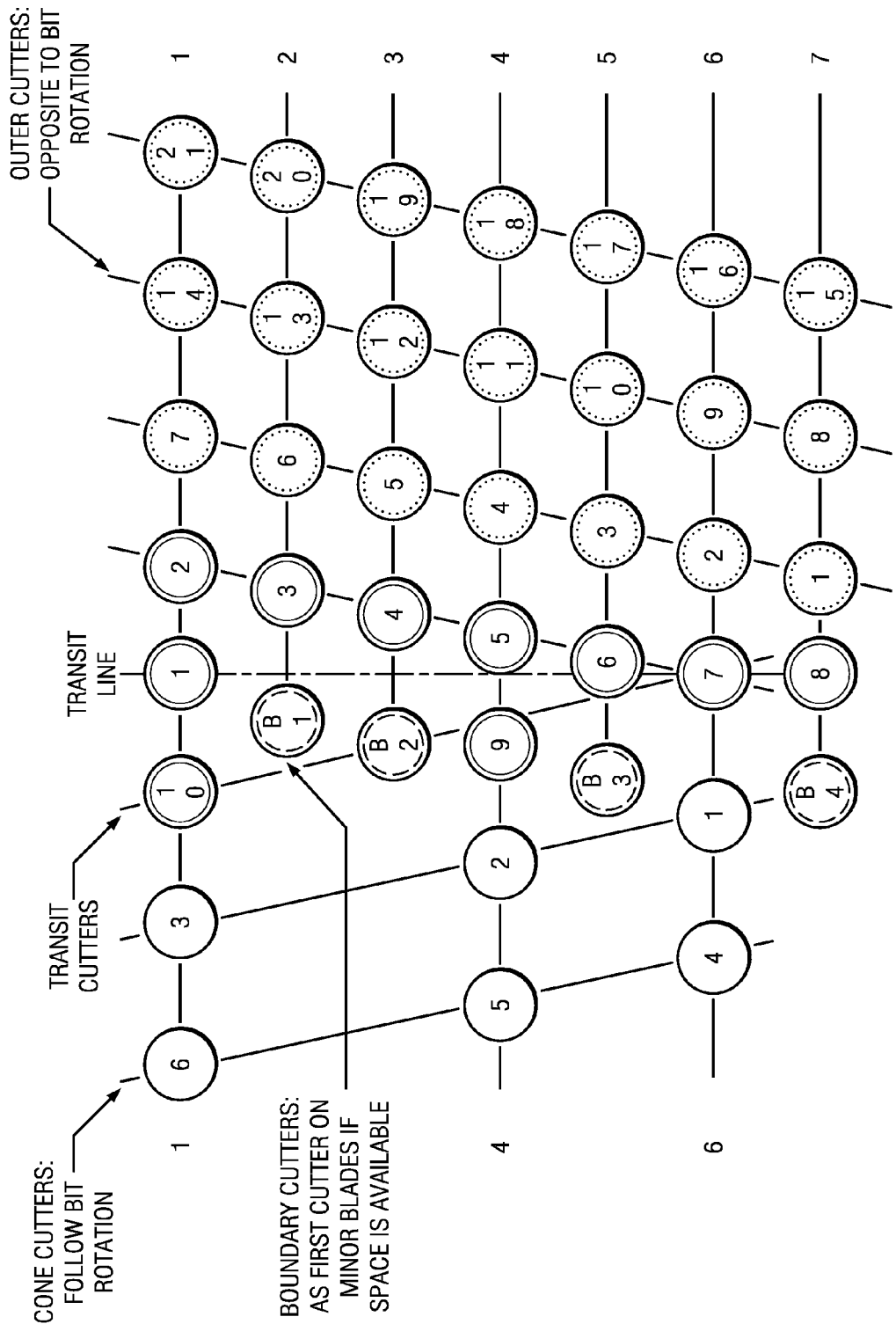
FIG. 43 shows a schematic drawings showing an example cutter layout algorithm in accordance with teachings of the present disclosure for selecting locations to install cutting elements on exterior portions of a downhole drilling tool having seven blades wherein inner cutters are disposed in a spiral direction following bit rotation and outer cutters are disposed in a spiral direction opposite to bit rotation.

FIG. 43 depicts an example cutter layout algorithm of a rotary drill bit or a well tool having seven blades $130_1$-$130_7$, wherein blades $130_1$, $130_4$ and $130_6$ are major blades or primary blades and blades $130_2$, $130_3$, $130_5$ and $130_7$ are minor blades or secondary blades, wherein cone cutters 60$c$ (depicted by solid circle with numbers 1-6) are disposed in a spiral direction following bit rotation, transit cutters 60$t$ deposited around "transit line" (depicted by double solid circles with numbers 1-10) and outer cutters 60$o$ (depicted by double solid-dotted circles with numbers 8-21) are disposed in a spiral direction opposite to bit rotation. In this example cutter layout, there are 10 transit cutters located within transit zone. However, only two cutters (cutter 1 and cutter 8) act as true transit cutters because cutters 2-7 are considered to be outer cutters and cutters 9-10 are considered to be inner cutters. FIG. 43 also shows boundary cutters B1-B4 which are cutters that may be placed to make sure there is enough space to meet the cutter overlap space rule.

Figure 44:
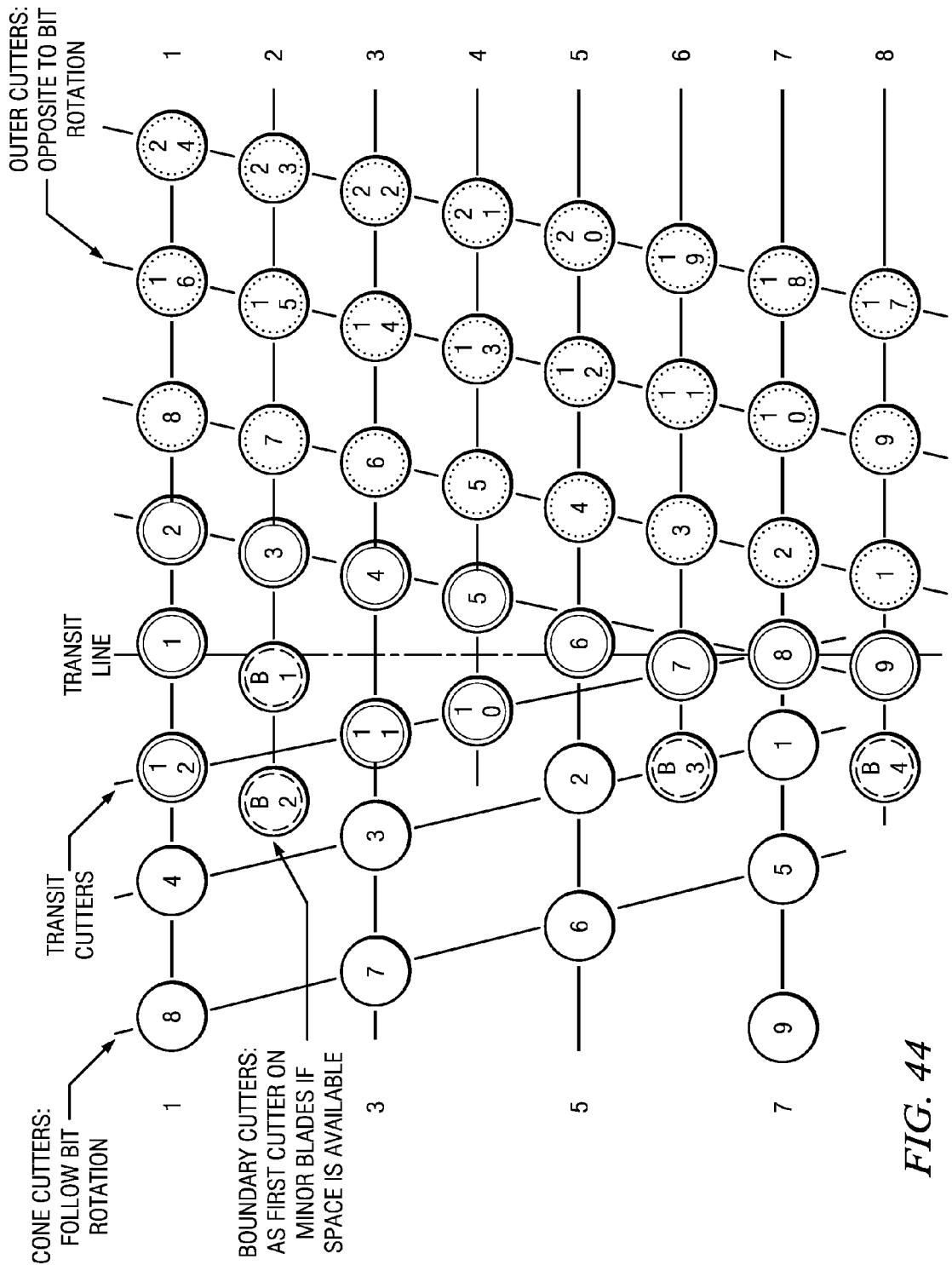
FIG. 44 shows a schematic drawings showing an example cutter layout algorithm in accordance with teachings of the present disclosure for selecting locations to install cutting elements on exterior portions of a downhole drilling tool having eight blades wherein inner cutters are disposed in a spiral direction following bit rotation and outer cutters are disposed in a spiral direction opposite to bit rotation.

FIG. 44 depicts an example cutter layout algorithm of a rotary drill bit or a well tool having eight blades $130_1$-$130_8$, wherein blades $130_1$, $130_3$, $130_5$ and $130_7$ are major blades or primary blades and blades $130_2$, $130_4$, $130_6$ and $130_8$ are minor blades or secondary blades, wherein cone cutters 60$c$ (depicted solid circles with numbers 1-9) are disposed in a spiral direction following bit rotation, transit cutters 60$t$ deposited around "transit line" (depicted by double solid circles with numbers 1-12) and outer cutters 60$o$ (depicted by double solid-dotted circles with numbers 9-24) are disposed in a spiral direction opposite to bit rotation. In this example cutter layout, there are 12 transit cutters located within transit zone. However, only three cutters (cutter 1, 8, 9) act as true transit cutters because cutters 2-7 are considered to be outer cutters and cutters 10-12 are considered to be inner cutters. FIG. 44 also shows boundary cutters B1-B4 which are cutters that may be placed to make sure there is enough space to meet the cutter overlap space rule.

Figure 45:
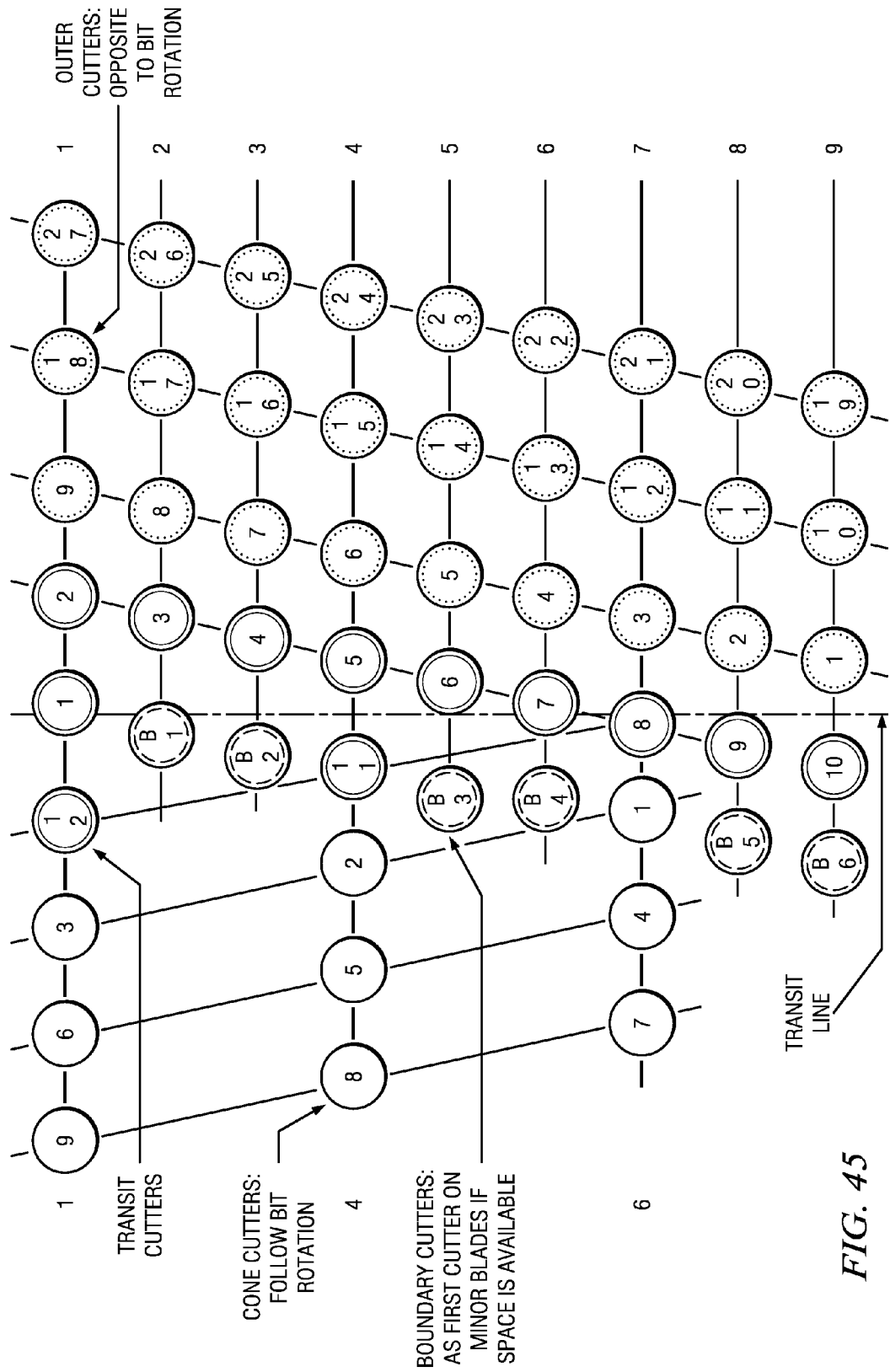
FIG. 45 shows a schematic drawings showing an example cutter layout algorithm in accordance with teachings of the present disclosure for selecting locations to install cutting elements on exterior portions of a downhole drilling tool having nine blades wherein inner cutters are disposed in a spiral direction following bit rotation and outer cutters are disposed in a spiral direction opposite to bit rotation.

FIG. 45 depicts an example cutter layout algorithm of a rotary drill bit or a well tool having nine blades $130_1$-$130_9$, wherein blades $130_1$, $130_4$ and $130_6$ are major blades or primary blades and blades $130_2$, $130_3$, $130_5$, $130_7$, $130_8$ and $130_9$ are minor blades or secondary blades, wherein cone cutters 60$c$ (depicted by solid circles with numbers 1-9) are disposed in a spiral direction following bit rotation, transit cutters 60$t$ deposited around "transit line" (depicted by double solid circles with numbers 1-12) and outer cutters 60$o$ (depicted by double solid-dotted circles with numbers 10-27) are disposed in a spiral direction opposite to bit rotation. FIG. 45 also shows boundary cutters B1-B6 which are cutters that may be placed to make sure there is enough space to meet the cutter overlap space rule.

Although the present disclosure and its advantages have been described in detail, it should be understood that various changes, substitutions and alternations can be made herein without departing from the spirit and scope of the disclosure as defined by the following claims.

APPENDIX A

DOWNHOLE DRILLING TOOL CHARACTERISTICS
DESIGN PARAMETERS

| | | | |
|---|---|---|---|
| bit face profile | cutting depth | cutting face profile | cutter phase angle |
| bit geometry | cutting structure | bit face geometry | gap between cutters |

APPENDIX A-continued

| | | | |
|---|---|---|---|
| cutter diameter | cutter groups | cutting face geometry | cutter overlap ratio |
| cutter radial position | force balanced cutter groups | worn (dull) bit data | nose point |
| blade (length, number, spiral, width) | neighbor cutters | cutter length | start radii of secondary blades |
| bottom hole assembly | neighbor cutter groups | cutter type | bit size |
| cutter (type, size, number) | level three force balanced | cutter length | hydraulic flow areas |
| cutter density | level four force balances | back rake angle | hydraulic flow rate |
| cutter location (cone, nose, shoulder, gage pad) | cutter sets | side rake angle | |
| cutter orientation (back rake, side rake) | force balanced cutter sets | IADC Bit Model | |
| cutting face surface area | blade groups | impact arrestor (type,. size, number) | |

DRILLING CONDITIONS
OPERATING PARAMETERS

| | | | |
|---|---|---|---|
| axial penetration rate | weight on bit (WOB) | torque on bit (TOB) | tilt rate |
| rate of penetration (ROP) | revolutions per minute (RPM) | lateral or side penetration rate | |
| rotational speed (RPM) | straight hole drilling | | |

DRILLING CONDITIONS
WELLBORE PROPERTIES

| | | | |
|---|---|---|---|
| bottom hole configuration | inside diameter | straight hole | |

DRILLING CONDITIONS
FORMATION PROPERTIES

| | | | |
|---|---|---|---|
| compressive strength | formation strength | porosity | shale plasticity |
| down dip angle | inclination | rock pressure | up dip angle |
| layer thickness | lithology | rock strength | hard stringers |
| formation plasticity | number of layers | first layer second layer | |

EXAMPLES OF COMPUTER MODELS TO EVALUATE CUTTER FORCES AND DRILL BIT IMBALANCE FORCES
1. Glowka D. A., "Use of Single-Cutter Data in the Analysis of PDC Bit Designs: Part 1—Development of a PDC Cutting Force Model," *SPE Journal of Petroleum Technology*, 41 (1989) pp. 797-849.
2. Behr S. M., Warren T. M., Sinor L. A., Brett, J. F, "., "3D PDC Bit Model Predicts Higher Cutter Loads", SPE Drilling & Completion, No. 4, Vol. 8, March 1993.
3. Clayton R., Chen S. and Lefort G., "New Bit Design, Cutter Technology Extend PDC Applications to Hard Rock Drilling", SPE/IADC 91840, February 2005
4. Chen S., Arfele R., Glass K., "Modeling of the Effects of Cutting Structure, Impact Arrestor, and Gage Geometry on PDC Bit Steerability", paper AADE-07-NTCE-10 presented at 2007 AADE Technical Conference held in Houston, TX, Apr. 10-12, 2007.
5. Chen S., Collins G. J., Thomas M. B., "Reexamination of PDC Bit Walk in Directional and Horizontal Wells", IADC/SPE 112641, March 2008.

What is claimed is:

1. A downhole drilling tool operable to form a wellbore comprising:
   a bit body with a bit rotational axis extending through the bit body;
   a plurality of blades disposed on exterior portions of the bit body;
   each blade having multiple cutting elements disposed thereon;
   a bit face profile comprising a first bit face profile zone and a second bit face profile zone;
   a first plurality of cutting elements disposed within the first bit face profile zone on multiple blades, all of the cutting elements within the first bit face profile zone disposed in a first spiral pattern following a first rotational direction; and
   a second plurality of cutting elements disposed within the second bit face profile zone on multiple blades, all of the cutting elements within the second bit face profile zone disposed in a second spiral pattern following a second rotational direction opposed to the first rotational direction.

2. The downhole drilling tool of claim 1, wherein the first and second bit face profile zones are each selected from the group consisting of an outer zone, an inner zone, a cone zone, a nose zone, a shoulder zone, a gage zone, a transit zone and combinations thereof.

3. The downhole drilling tool of claim 2, wherein:
   the cutting elements disposed on the cone zone comprise respective cone cutting elements;
   the cutting elements disposed on the nose zone comprise respective nose cutting elements;
   the cutting elements disposed on the shoulder zone comprise respective shoulder cutting elements;
   the one or more cutting elements disposed on the gage zone comprise respective gage cutting elements;

the cone zone, the nose zone, the shoulder zone and the gage zone located on respective portions of associated blades on the bit face profile;

the nose zone comprising a nose point at a location on the bit face profile having maximum elevation;

the nose zone comprising a first portion comprising locations from the nose point to the bit rotational axis, having nose cutting elements comprising respective nose first portion cutting elements disposed thereon;

the nose zone comprising a second portion comprising locations from the nose point toward the end of the bit face profile, having nose cutting elements comprising respective nose second portion cutting elements;

a plurality of inner cutting elements comprising the nose first portion cutting elements and the cone cutting elements; and a plurality of outer cutting elements comprising the nose second portion cutting elements, the shoulder cutting elements, and the gage cutting elements, the inner cutting elements placed in the first spiral pattern; and the outer cutting elements placed in flail the second spiral pattern.

4. The downhole drilling tool of claim 3, wherein the first spiral pattern follows a direction of bit rotation and the second spiral pattern follows a direction opposite to bit rotation.

5. The downhole drilling tool of claim 3, wherein the first spiral pattern follows a direction opposite to bit rotation and the second spiral pattern follows a direction of bit rotation.

6. The downhole drilling tool of claim 1, wherein each respective cutting element produces an axial force, a lateral force and a bending moment acting on the bit body while forming the wellbore, the first plurality and second plurality of cutting elements disposed at least in part on a level of force balancing resulting in respective force balanced cutter groups or cutter sets.

7. The downhole drilling tool of claim 6, wherein the level of force balancing comprises level of force balancing selected from a group consisting of a first level of force balancing, a second level of force balancing, a third level of force balancing, a fourth level of force balancing, a fifth level of force balancing, multilevel force balancing and any combinations thereof.

8. The downhole drilling tool of claim 6, wherein the level of force balancing comprises a first level of force balancing.

9. The downhole drilling tool of claim 6, wherein the level of force balancing comprises a second level of force balancing.

10. The downhole drilling tool of claim 6, wherein the level of force balancing comprises a third level of force balancing.

11. The downhole drilling tool of claim 6, wherein the level of force balancing comprises a fourth level of force balancing.

12. The downhole drilling tool of claim 6, wherein the level of force balancing comprises a fifth level of force balancing.

13. The downhole drilling tool of claim 6, wherein the level of force balancing comprises multilevel force balancing.

14. The downhole drilling tool of claim 1, wherein the downhole drilling tool is selected from the group consisting of a rotary drill bit, a core bit, a reamer, a downhole opener, a fixed cutter drill bit, a drag bit, a PDC drill bit, a matrix drill bit and a steel body PDC drill bit.

15. A rotary drill bit operable to form a wellbore comprising:

a bit body with a bit rotational axis extending through the bit body;

a plurality of blades disposed on exterior portions of the bit body;

each blade having multiple cutting elements disposed thereon;

a bit face profile comprising a first hit face profile zone and a second bit face profile zone;

a first plurality of cutting elements disposed within the first bit face profile zone on multiple blades, all of the cutting elements within the first bit face profile zone disposed in a first spiral pattern following a first rotational direction; and a second plurality of cutting elements disposed within the second bit face profile zone on multiple blades, all of the cutting elements within the second bit face profile zone disposed in a second spiral pattern following a second rotational direction opposed to the first rotational direction.

16. A rotary drill bit operable to form a wellbore comprising:

a bit body with a bit rotational axis extending through the bit body;

a plurality of blades disposed on exterior portions of the bit body;

each blade having respective cutting elements disposed thereon;

a bit face profile comprising a cone zone, a nose zone, a shoulder zone and a gage zone;

the cone zone, the nose zone, the shoulder zone and the gage zone located on respective portions of associated blades;

the nose zone having a nose point at a location on the bit face profile having maximum elevation;

the nose zone having a first portion of the nose zone comprising locations from the nose point to the bit rotational axis;

the nose zone having a second portion of the nose zone comprising locations from the nose point toward the end of the bit face profile;

a plurality of inner cutters comprising cutting elements disposed on respective portions of associated blades located in the cone zone and the first portion of the nose zone, all of the cutting elements disposed on respective portions of associated blades located in the cone zone and the first portion of the nose zone disposed in a first spiral pattern following a first rotational direction; and a plurality of outer cutters comprising cutting elements disposed on respective portions of associated blades located in the shoulder zone, the gage zone, and the second portion of the nose zone, all of the cutting elements disposed on respective portions of associated blades located in the shoulder zone, the gage zone, and the second portion of the nose zone disposed in a second spiral pattern following a second rotational direction opposed to the first rotational directions.

17. The rotary drill bit of claim 16, wherein the first spiral pattern follows a direction of bit rotation and the second spiral pattern follows a direction opposite to bit rotation.

18. The rotary drill bit of claim 16, wherein the first spiral pattern follows a direction opposite to bit rotation and the second spiral pattern follows a direction of bit rotation.

19. The rotary drill bit of claim 16, further comprising:

at least one transit cutter comprising a cutting element disposed at a location on the bit body wherein layout of cutting elements transits from the first spiral pattern to the second spiral pattern.

20. The rotary drill bit of claim 19, wherein the at least one transit cutter is disposed in a direction of rotation opposite to bit rotation.

21. The rotary drill bit of claim 19, wherein the at least one transit cutter is disposed in a direction of rotation following bit rotation.

22. The rotary drill bit of claim 16, wherein each respective cutting element produces an axial force, a lateral force and a bending moment acting on the bit body while forming the wellbore, the plurality of respective cutting elements disposed at least in part on a level of force balancing resulting in respective force balanced cutter groups or cutter sets.

23. The rotary drill bit of claim 16, wherein:
  each of the inner cutters produces a respective axial force, a respective lateral force and a respective bending moment acting on the rotary drill bit while forming the wellbore;
  the inner cutters disposed at least in part on a level of force balancing resulting in force balanced cutter groups or cutter sets;
  each of the outer cutters produces a respective axial force, a respective lateral force and a respective bending moment acting on the rotary drill bit while forming the wellbore; and
  the outer cutters disposed at least in part on a level of force balancing resulting in force balanced cutter groups or cutter sets.

24. The rotary drill bit of claim 22, wherein a respective force balanced cutter group comprises a group of cutters comprising three consecutive neighbor cutting elements.

25. The rotary drill bit of claim 24, wherein force balancing each respective cutter group of three consecutive neighbor cutting elements minimizes imbalance forces associated with the each respective cutter group of three consecutive neighbor cutting elements acting on the rotary drill bit.

26. The rotary drill bit of claim 22, wherein a respective force balanced cutter group comprises a group of cutters comprising four consecutive neighbor cutting elements.

27. The rotary drill bit of claim 26, wherein force balancing each respective cutter group of four consecutive neighbor cutting elements minimizes imbalance forces associated with the each respective cutter group of four consecutive neighbor cutting elements acting on the rotary drill bit.

28. The rotary drill bit of claim 16, wherein the level of force balancing comprises level of force balancing selected from a group consisting of a first level of force balancing, a second level of force balancing, a third level of force balancing, a fourth level of force balancing, a fifth level of force balancing, multilevel force balancing and any combinations thereof.

29. A rotary drill bit operable to form a wellbore comprising:
  a bit body with a bit rotational axis extending through the bit body;
  a plurality of blades disposed on exterior portions of the bit body;
  each blade having respective cutting elements disposed thereon;
  a bit face profile comprising a cone zone, a nose zone, a shoulder zone and a gage zone;
  the cone zone, the nose zone, the shoulder zone and the gage zone located on respective portions of associated blades;
  the nose zone having a nose point at a location on the bit face profile having maximum elevation;
  the nose zone having a first portion of the nose zone comprising locations from the nose point to the bit rotational axis;
  the nose zone having a second portion of the nose zone comprising locations from the nose point toward the end of the bit face profile;
  a plurality of inner cutters comprising cutting elements disposed on respective portions of associated blades located in the cone zone and the first portion of the nose zone, all of the cutting elements disposed on respective portions of associated blades located in the cone zone and the first portion of the nose zone disposed in a first spiral pattern following a direction opposite to bit rotation; and
  a plurality of outer cutters comprising cutting elements disposed on respective portions of associated blades located in the shoulder zone, the gage zone, and the second portion of the nose zone, all of the cutting elements disposed on respective portions of associated blades located in the shoulder zone, the gage zone, and the second portion of the nose zone disposed in a second spiral pattern following a direction of bit rotation;
  all respective cutting elements further disposed at locations following multilevel force balancing criteria.

30. A rotary drill bit operable to form a wellbore comprising:
  a bit body with a bit rotational axis extending through the bit body;
  a plurality of blades disposed on exterior portions of the bit body;
  each blade having respective cutting elements disposed thereon;
  a bit face profile comprising a cone zone, a nose zone, a shoulder zone and a gage zone;
  the cone zone, the nose zone, the shoulder zone and the gage zone located on respective portions of associated blades;
  the nose zone having a nose point at a location on the bit face profile having maximum elevation;
  the nose zone having a first portion of the nose zone comprising locations from the nose point to the bit rotational axis;
  the nose zone having a second portion of the nose zone comprising locations from the nose point toward the end of the bit face profile;
  a plurality of inner cutters comprising cutting elements disposed on respective portions of associated blades located in the cone zone and the first portion of the nose zone, all of the cutting elements disposed on respective portions of associated blades located in the cone zone and the first portion of the nose zone disposed in a first spiral pattern following a direction of bit rotation; and
  a plurality of outer cutters comprising cutting elements disposed on respective portions of associated blades located in the shoulder zone, the gage zone, and the second portion of the nose zone, all of the cutting elements disposed on respective portions of associated blades located in the shoulder zone, the gage zone, and the second portion of the nose zone disposed in a second spiral pattern following a direction opposite to bit rotation;
  all respective cutting elements further disposed at locations following multilevel force balancing criteria.

* * * * *

UNITED STATES PATENT AND TRADEMARK OFFICE
CERTIFICATE OF CORRECTION

PATENT NO. : 8,720,611 B2
APPLICATION NO. : 12/969054
DATED : May 13, 2014
INVENTOR(S) : Shilin Chen It is certified that error appears in the above-identified patent and that said Letters Patent is hereby corrected as shown below:

IN THE CLAIMS: Please replace Claims 3 and 16, Col. 62, line 59 and Col. 64, line 17, with the following amended claims:

3. The downhole drilling tool of Claim 3, wherein:
the cutting elements disposed on the cone zone comprise respective cone cutting elements;
the cutting elements disposed on the nose zone comprise respective nose cutting elements;
the cutting elements disposed on the shoulder zone comprise respective shoulder cutting elements;
the one or more cutting elements disposed on the gage zone comprise respective gage cutting elements;
the cone zone, the nose zone, the shoulder zone and the gage zone located on respective portions of associated blades on the bit face profile;
the nose zone comprising a nose point at a location on the bit face profile having maximum elevation;
the nose zone comprising a first portion comprising locations from the nose point to the bit rotational axis, having nose cutting elements comprising respective nose first portion cutting elements disposed thereon;
the nose zone comprising a second portion comprising locations from the nose point toward the end of the bit face profile, having nose cutting elements comprising respective nose second portion cutting elements;
a plurality of inner cutting elements comprising the nose first portion cutting elements and the cone cutting elements; and
a plurality of outer cutting elements comprising the nose second portion cutting elements, the shoulder cutting elements, and the gage cutting elements,
the inner cutting elements placed in the first spiral pattern; and
the outer cutting elements placed in [[flail]] the second spiral pattern.

16. A rotary drill bit operable to form a wellbore comprising:
a bit body with a bit rotational axis extending through the bit body;
a plurality of blades disposed on exterior portions of the bit body;
each blade having respective cutting elements disposed thereon;

Signed and Sealed this
Second Day of September, 2014

Michelle K. Lee
*Deputy Director of the United States Patent and Trademark Office* a bit face profile comprising a cone zone, a nose zone, a shoulder zone and a gage zone;
the cone zone, the nose zone, the shoulder zone and the gage zone located on respective portions of associated blades;
the nose zone having a nose point at a location on the bit face profile having maximum elevation;
the nose zone having a first portion of the nose zone comprising locations from the nose point to the bit rotational axis;
the nose zone having a second portion of the nose zone comprising locations from the nose point toward the end of the bit face profile;
a plurality of inner cutters comprising cutting elements disposed on respective portions of associated blades located in the cone zone and the first portion of the nose zone, all of the cutting elements disposed on respective portions of associated blades located in the cone zone and the first portion of the nose zone disposed in a first spiral pattern following a first rotational direction; and
a plurality of outer cutters comprising cutting elements disposed on respective portions of associated blades located in the shoulder zone, the gage zone, and the second portion of the nose zone, all of the cutting elements disposed on respective portions of associated blades located in the shoulder zone, the gage zone, and the second portion of the nose zone disposed in a second spiral pattern following a second rotational direction opposed to the first rotational direction[[s]].